US012805014B2

(12) United States Patent
Wang et al.

(10) Patent No.: US 12,805,014 B2
(45) Date of Patent: Nov. 17, 2026

(54) ARRAY SUBSTRATE AND DISPLAY APPARATUS

(71) Applicant: BOE Technology Group Co., Ltd., Beijing (CN)

(72) Inventors: Dongfang Wang, Beijing (CN); Ce Ning, Beijing (CN); Guangcai Yuan, Beijing (CN); Xue Dong, Beijing (CN); Lizhong Wang, Beijing (CN); Fengjuan Liu, Beijing (CN); Hehe Hu, Beijing (CN); Wei Liu, Beijing (CN); Yuting Fu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 364 days.

(21) Appl. No.: 18/690,601

(22) PCT Filed: May 31, 2023

(86) PCT No.: PCT/CN2023/097339

§ 371 (c)(1),
(2) Date: Mar. 8, 2024

(87) PCT Pub. No.: WO2024/243838

PCT Pub. Date: Dec. 5, 2024

(65) Prior Publication Data

US 2026/0052771 A1 Feb. 19, 2026

(51) Int. Cl.
*H10D 86/40* (2025.01)
*H10D 86/60* (2025.01)

(52) U.S. Cl.
CPC ........... *H10D 86/441* (2025.01); *H10D 86/60* (2025.01)

(58) Field of Classification Search
CPC ............................ H10D 86/441; H10D 86/60
See application file for complete search history.

(56) References Cited

U.S. PATENT DOCUMENTS 10,700,153 B2 * 6/2020 Chen ........................ G09G 3/32
10,825,838 B2 * 11/2020 Wang .................. H10D 86/441
(Continued)

FOREIGN PATENT DOCUMENTS

CN 106531692 A 3/2017
CN 104332477 B 5/2017
(Continued)

OTHER PUBLICATIONS

International Search Report & Written Opinion mailed Jan. 18, 2024, regarding PCT/CN2023/097339.

*Primary Examiner* — Ibrahim A Khan
(74) *Attorney, Agent, or Firm* — Intellectual Valley Law, P.C.

(57) ABSTRACT

An array substrate is provided. The array substrate includes a base substrate; a signal line; a buffer layer; an active layer; a second signal line; a first passivation layer; a planarization layer; a pixel electrode; a first via extending through the buffer layer, and exposing at least a part of the signal line; and a second via extending through the first passivation layer, and exposing at least a part of the pixel electrode. With respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate.

19 Claims, 125 Drawing Sheets

(56) References Cited

U.S. PATENT DOCUMENTS

| | | | | |
|---|---|---|---|---|
| 11,003,265 | B2 * | 5/2021 | Lee | G06F 3/041 |
| 11,476,282 | B2 * | 10/2022 | Hara | G02F 1/134363 |
| 12,300,701 | B2 * | 5/2025 | Ai | G02F 1/136227 |
| 12,328,992 | B2 * | 6/2025 | Hu | H10K 50/865 |
| 2014/0159086 | A1 * | 6/2014 | Yu | G02F 1/136209<br>257/98 |
| 2017/0068135 | A1 * | 3/2017 | Jung | G02F 1/134309 |
| 2019/0326336 | A1 * | 10/2019 | Xi | H10D 86/0231 |
| 2020/0152664 | A1 * | 5/2020 | Kim | G02F 1/13624 |
| 2021/0249445 | A1 * | 8/2021 | Suzuki | H10D 30/6723 |
| 2021/0327923 | A1 * | 10/2021 | Suzuki | H10D 30/6755 |
| 2024/0049528 | A1 * | 2/2024 | Tsai | H10K 59/121 |
| 2024/0297181 | A1 * | 9/2024 | Suzuki | H10D 30/6723 |

FOREIGN PATENT DOCUMENTS

| | | | |
|---|---|---|---|
| CN | 107797344 | A | 3/2018 |
| CN | 108039353 | A | 5/2018 |
| CN | 104393000 | B | 6/2018 |
| CN | 111640764 | A | 9/2020 |
| CN | 112051690 | A | 12/2020 |
| CN | 114335027 | A | 4/2022 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/097339, filed May 31, 2023, the contents of which are incorporated by reference in the entirety.

TECHNICAL FIELD

The present invention relates to display technology, more particularly, to an array substrate and a display apparatus.

BACKGROUND

Liquid crystal display panel has found a wide variety of applications. Typically, a liquid crystal display panel includes a counter substrate and an array substrate facing each other. Thin film transistors, gate lines, data lines, pixel electrodes, common electrodes, and common electrode signal lines are disposed on the array substrate and counter substrate. Between the two substrates, a liquid crystal material is injected to form a liquid crystal layer. One common problem associated with the liquid crystal display panel is light leakage. To prevent light leakage, a black matrix is placed on the counter substrate. A liquid crystal display panel having a larger black matrix can better prevent light leakage. However, an aperture ratio of the liquid crystal display apparatus is reduced by using a black matrix with a larger area.

Organic Light Emitting Diode (OLED) display is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of signal lines and a plurality of second signal lines crossing over each other, defining a plurality of subpixels; the array substrate comprises a base substrate; a signal line on the base substrate; a buffer layer on a side of the signal line away from the base substrate; an active layer on a side of the buffer layer away from the base substrate; a second signal line on a side of the active layer away from the signal line; a first passivation layer on a side of the second signal line away from the base substrate; a planarization layer on a side of the second signal line away from the active layer; a pixel electrode on a side of the planarization layer away from the base substrate; a first via extending through at least the buffer layer, and exposing at least a part of the signal line; and a second via extending through at least the first passivation layer, and exposing at least a part of the pixel electrode; wherein with respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate.

Optionally, the signal line comprises a first portion and a second portion; the first portion is a portion of the signal line in the first via; the second portion is connected to the first portion; along an extension direction of the second signal line, the first portion has a first line width; the second portion has a second line width; and the first line width is greater than the second line width.

Optionally, the second signal line in some embodiments includes a main body and a protrusion protruding away from the main body; the main body extends along an extension direction of the second signal line; the protrusion protrudes away from the main body along a direction different from the extension direction of the second signal line; an orthographic projection of the main body on the base substrate spaces apart an orthographic projection of the protrusion on the base substrate from an orthographic projection of the first via on the base substrate; and the orthographic projection of the protrusion on the base substrate spaces apart an orthographic projection of the signal line on the base substrate from an orthographic projection of the second via on the base substrate.

Optionally, an orthographic projection of the active layer on the base substrate at least partially overlaps with the orthographic projection of the protrusion on the base substrate, Optionally, the active layer comprises a first electrode region, a second electrode region, and a channel region between the first electrode region and the second electrode region; the first electrode region comprising a first electrode, and the second electrode region comprising a second electrode; wherein the channel region, at least a portion of the first electrode, and at least a portion of the second electrode are parts of a unitary structure; and at least a portion of the first electrode and at least a portion of the second electrode comprise a same material as the channel region, and are subject to a process that make them conductive; the first electrode extends to the first via to connect to the signal line; and the pixel electrode extends to the second via to connect to the second electrode.

Optionally, the array substrate further comprises a light shield; wherein the light shield is in a same layer as the signal line; and an orthographic projection of the light shield on the base substrate at least partially overlaps with the orthographic projection of the second signal line on the base substrate.

Optionally, the array substrate further comprises a light shield; wherein an orthographic projection of the light shield on the base substrate at least partially overlaps with an orthographic projection of a portion of the second signal line on the base substrate; and along an extension direction of the signal line, at least one of two boundaries of the orthographic projection of the portion of the second signal line on the base substrate is completely between two boundaries of the orthographic projection of the light shield on the base substrate.

Optionally, the array substrate further comprises a light shield; wherein a minimum distance between the light shield and the signal line is in a range of 1.0 μm to 5.0 μm.

Optionally, the array substrate further comprises a third via extending through at least the planarization layer; wherein an orthographic projection of the third via on the base substrate partially overlaps with an orthographic projection of the light shield on the base substrate.

Optionally, the buffer layer comprises a first part and a second part; the first part is a side of the first via; the first part spaces apart the second part from the first via; an orthographic projection of the first part on the base substrate at least partially overlaps with an orthographic projection of the signal line on the base substrate; an orthographic projection of the second part on the base substrate is non-overlapping with the orthographic projection of the signal line on the base substrate; and a first height of the first part relative to a surface of the base substrate is greater than a second height of the second part relative to the surface of the base substrate.

Optionally, the signal line has an average line width in a range of 0.7 μm to 3.5 μm.

Optionally, the channel region, at least a portion of the first electrode, and at least a portion of the second electrode comprise $M1O_aN_b$, wherein M1 is a single metal or a combination of metals, $a>0$, and $b\geq 0$; and at least a portion of the first electrode and at least a portion of the second electrode are subject to a lightly doped drain process.

Optionally, the first electrode comprises a first electrode part and a second electrode part electrically connected together; and the first electrode part and the second electrode part are made of different materials.

Optionally, the first electrode part comprises $M1O_aN_b$, wherein M1 is a single metal or a combination of metals, $a>0$, and $b\geq 0$; the second electrode part comprises a metallic material; and the first electrode part, at least a portion of the second electrode, and the channel region are parts of the unitary structure.

Optionally, the first electrode part at least partially extends into the second electrode part.

Optionally, the array substrate further comprises an insulating layer on a side of the active layer away from the base substrate; a gate electrode on a side of the insulating layer away from the active layer; and a via extending through the insulating layer and the buffer layer, exposing a surface of a portion of the signal line; wherein the first electrode part is in a same layer as the gate electrode; the first electrode part extends to the via to connect to the signal line.

Optionally, the array substrate further comprises an insulating layer on a side of the active layer away from the base substrate; a gate electrode on a side of the insulating layer away from the active layer; an inter-layer dielectric layer on a side of the gate electrode away from the insulating layer; and a via extending through the inter-layer dielectric layer, the insulating layer and the buffer layer, exposing a surface of a portion of the signal line; wherein the first electrode part is in a layer on a side of the inter-layer dielectric layer away from the insulating layer; and the first electrode part extends to the via to connect to the signal line.

Optionally, the second electrode comprises a third electrode part and a fourth electrode part electrically connected together; and the third electrode pan and the fourth electrode part are made of different materials.

Optionally, the third electrode part comprises $M1O_aN_b$, wherein M1 is a single metal or a combination of metals, $a>0$, and $b\geq 0$; the fourth electrode part comprises a metallic material; and at least a portion of the first electrode, the channel region, and the third electrode part, are parts of the unitary structure.

Optionally, the array substrate further comprises an insulating layer on a side of the active layer away from the base substrate; a gate electrode on a side of the insulating layer away from the active layer; an inter-layer dielectric layer on a side of the gate electrode away from the insulating layer; and a via extending through the inter-layer dielectric layer and the insulating layer, exposing a surface of a portion of the third electrode part; wherein the fourth electrode part is in a layer on a side of the inter-layer dielectric layer away from the insulating layer; and the fourth electrode part extends to the via to connect to the third electrode part.

Optionally, the channel region, an entirety of the first electrode, and an entirety of the second electrode are parts of the unitary structure.

Optionally, the array substrate further comprises a via extending through the buffer layer, exposing a surface of a portion of the signal line; wherein the first electrode part extends to the via to connect to the signal line.

Optionally, the array substrate further comprises an insulating layer on the base substrate, and a gate electrode on a side of the insulating layer away from the base substrate; wherein an entirety of a combination of the signal line, the channel region, the first electrode, and the second electrode are between the insulating layer and the base substrate; the signal line, the channel region, the first electrode, and the second electrode are all in direct contact with a surface of the base substrate; and the signal line, the channel region, the first electrode, and the second electrode are all in direct contact with a surface of the insulating layer.

Optionally, in a cross-section along a plane perpendicular to the base substrate and perpendicular to a length direction along which the signal line extends, and intersecting the signal line, the first electrode covers an upper surface of at least a portion of the signal line; and an orthographic projection of the first electrode on the base substrate at least partially overlaps with an orthographic projection of the signal line on the base substrate.

Optionally, in a cross-section along a plane perpendicular to the base substrate and perpendicular to a length direction along which the signal line extends, and intersecting the signal line, the signal line covers an upper surface of at least a portion of the first electrode; and an orthographic projection of the signal line on the base substrate at least partially overlaps with an orthographic projection of the first electrode on the base substrate.

Optionally, the array substrate further comprises a pixel electrode electrically connected to the second electrode; wherein the pixel electrode, the channel region, at least a portion of the first electrode, and at least a portion of the second electrode are in a same layer and are parts of the unitary structure.

Optionally, the array substrate further comprises a gate electrode on a side of the active layer away from the base substrate; a passivation layer on a side of the gate electrode away from the base substrate; and a common electrode on a side of the passivation layer away from the base substrate; wherein the common electrode and the pixel electrode are configured to form an electrical field in response to a voltage at the second electrode, thereby driving image display in a subpixel.

Optionally, the array substrate further comprises a common electrode configured to be provided with a low voltage signal; wherein the common electrode, the channel region, at least a portion of the first electrode, and at least a portion of the second electrode are in a same layer and comprise a same material.

Optionally, the array substrate further comprises a gate electrode on a side of the active layer away from the base substrate; a passivation layer on a side of the gate electrode away from the base substrate; a pixel electrode on a side of the passivation layer away from the base substrate; and a via extending through at least the passivation layer, exposing a surface of a portion of the second electrode; wherein the pixel electrode extends to the via to connect to the second electrode; and the common electrode and the pixel electrode are configured to form an electrical field in response to a voltage at the second electrode, thereby driving image display in a subpixel.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the array substrate includes a base substrate; a signal line, an active layer on the base substrate; and an organic planarization layer on a side of the first electrode, the active layer, and the second electrode away from the signal line.

Figure 1A:
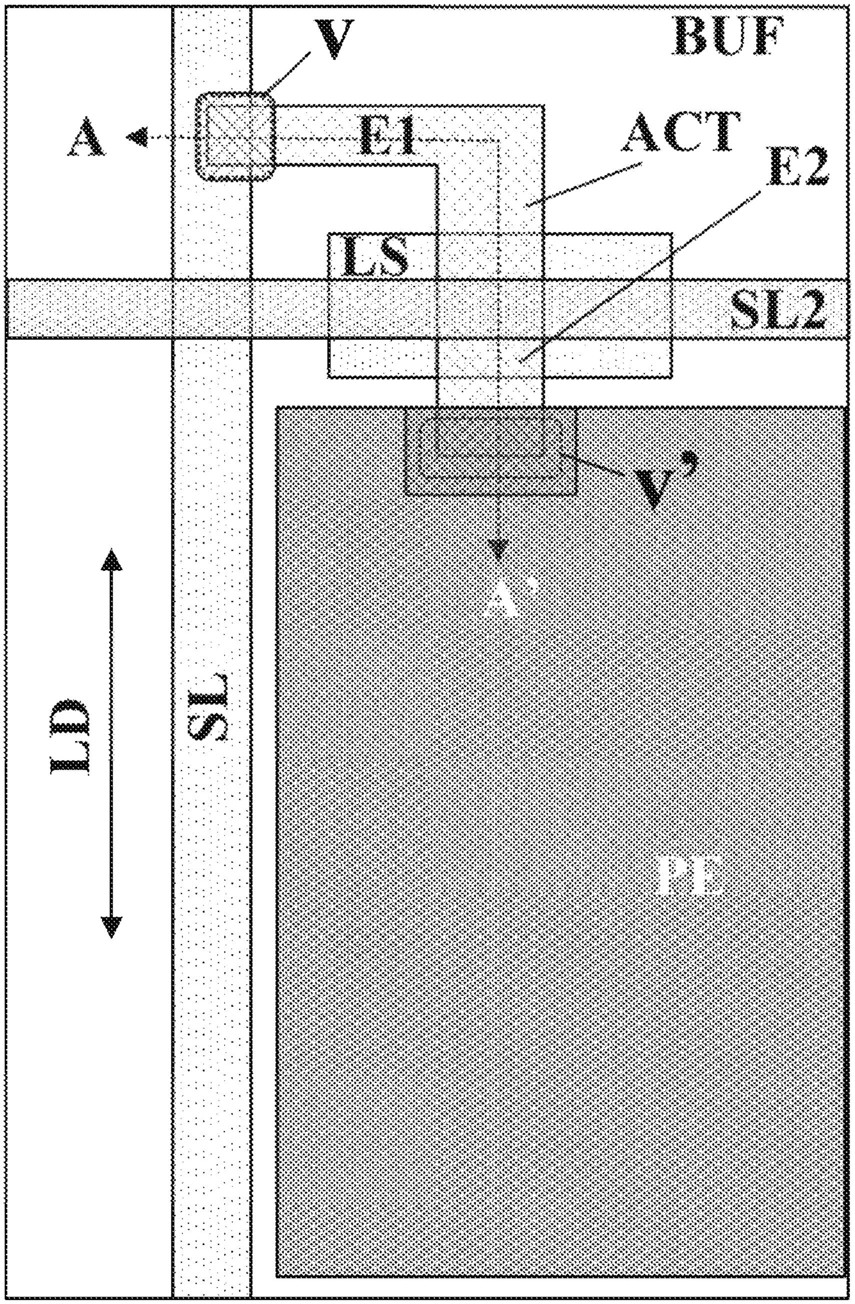
FIG. 1A is a plan view of an array substrate in some embodiments according to the present disclosure.
Figure 2:
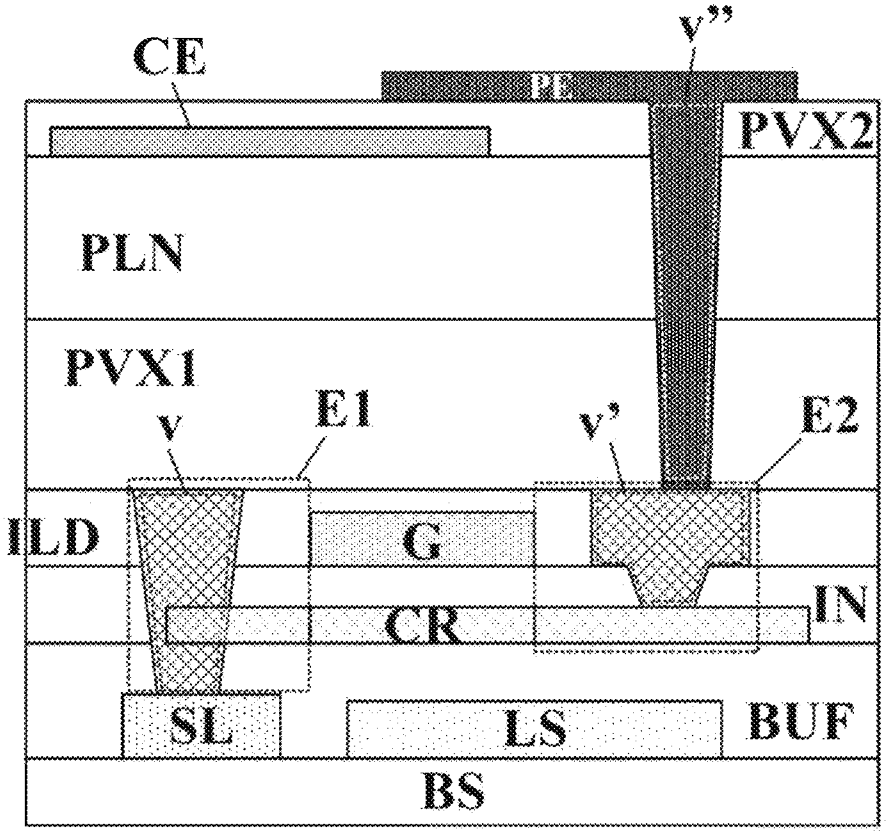
FIG. 2 is a cross-sectional view of an array substrate in some embodiments according to the present disclosure.

FIG. 1A is a plan view of an array substrate in some embodiments according to the present disclosure. FIG. 2 is a cross-sectional view of an array substrate in some embodiments according to the present disclosure. FIG. 2 may be a cross-sectional view along an A-A' line in FIG. 1A. Referring to FIG. 1A and FIG. 2, the array substrate in some embodiments includes a base substrate BS; a signal line SL (e.g., a data line configured to provide a data signal to a transistor) on the base substrate BS; a buffer layer BUF on a side of the signal line SL away from the base substrate BS; an active layer ACT on a side of the buffer layer BUF away from the base substrate BS. The active layer ACT includes a first electrode region, a second electrode region, and a channel region CR between the first electrode region and the second electrode region. The first electrode region includes a first electrode E1, and the second electrode region includes a second electrode E2. The array substrate in some embodiments further includes an insulating layer IN (e.g., a gate insulating layer) on a side of the active layer ACT (e.g., on a side of the first electrode E1, the channel region CR, and the second electrode E2) away from the buffer layer BUF.

In some embodiments, the array substrate further includes a gate electrode G on a side of the insulating layer IN away from the channel region CR. The gate electrode G defines the area of the channel region CR. For example, an orthographic projection of the gate electrode G on the base substrate substantially overlaps with an orthographic projection of the channel region CR on the base substrate BS.

In some embodiments, the array substrate further includes a light shield LS on the base substrate BS. Optionally, the light shield LS is in a same layer as the signal line SL, e.g., formed in a same patterning process using a same mask plate, and/or using a same material. The light shield LS is configured to prevent light from irradiating on the channel region CR. Optionally, an orthographic projection of the light shield LS on the base substrate BS is at least partially (e.g., at least 50%, at least 60%, at least 70%, at least 80%, at least 90%, at least 95%, at least 98%, at least 99%, or 100%) overlaps with an orthographic projection of the channel region CR on the base substrate BS.

In some embodiments, the array substrate further includes an inter-layer dielectric layer ILD on a side of the gate electrode G away from the base substrate BS; a first passivation layer PVX1 on a side of the inter-layer dielectric layer ILD away from the base substrate BS; a planarization layer PLN on a side of the first passivation layer PVX1 away from the inter-layer dielectric layer ILD; a second passivation layer PVX2 on a side of the planarization layer PLN away from the first passivation layer PVX1; and a pixel electrode PE on a side of the second passivation layer PVX2 away from the planarization layer PLN. The pixel electrode PE optionally extends through at least the second passivation layer PVX2, the planarization layer PLN, and the first passivation layer PVX1 to connect to the second electrode E2.

In some embodiments, the array substrate further includes a common electrode CE on a side of the planarization layer PLN away from the first passivation layer PVX1. Optionally, the common electrode CE is on a side of the second passivation layer PVX2 closer to the planarization layer PLN.

In some embodiments, the array substrate further includes a second signal line SL2. In some embodiments, the second signal line SL2 is a gate line configured to provide a gate driving signal to the transistor. In some embodiments, the gate electrode is a portion of the gate line GL. An orthographic projection of the channel region CR on the base substrate overlaps with an orthographic projection the gate electrode on the base substrate.

The present array substrate may be implemented in various appropriate display panels. Appropriate array substrates include a liquid crystal display array substrate, an organic light emitting diode array substrate, a micro light emitting diode array substrate, and a mini light emitting diode array substrate.

In some embodiments, the array substrate is a liquid crystal display array substrate. The pixel electrode PE is a pixel electrode in a respective subpixel of a plurality of subpixels in the liquid crystal display array substrate. The common electrode CE is a common electrode in the liquid crystal display array substrate. In one example, the common electrode CE is an electrode extending throughout the plurality of subpixels in the liquid crystal display array substrate.

In some embodiments, the array substrate is a light emitting diode display array substrate. The pixel electrode PE is an anode of a respective light emitting diode of a plurality of light emitting diodes in the light emitting diode display array substrate. The common electrode CE is a cathode in the light emitting diode display array substrate. In one example, the common electrode is a cathode extending throughout a plurality of subpixels in the light emitting diode display array substrate, In another example, the common electrode CE is on a side of a light emitting layer and the pixel electrode PE away from the base substrate BS.

Various appropriate semiconductor materials and various appropriate fabricating methods may be used to make the channel region CR. In some embodiments, the semiconductor material includes $M1O_aN_b$, wherein M1 is a single metal or a combination of metals, a>0, and b≥0, O standing for oxygen element, N standing for nitrogen element, e.g., the semiconductor material is a metal oxide material or a metal oxynitride material. Examples of appropriate metal oxide materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, In2O3:Sn, In2O3:Mo, Cd2SnO4, ZnO:Al, TiO2:Nb, and Cd—Sn—O. Examples of appropriate metal oxynitride materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. In one example, the channel region CR includes indium gallium zinc oxide.

Various appropriate conductive materials and various appropriate fabricating methods may be used to make the first electrode E1 or the second electrode E2. Examples of appropriate conductive materials include a metal, an alloy, a metal oxide, and any combination thereof. Examples of appropriate conductive materials for making the first electrode E1 or the second electrode E2 include, but are not limited to, molybdenum, aluminum, titanium gold, copper, hafnium, tantalum, alloys such as aluminum Neodymium (AlNd), molybdenum Niobium (MoNb), and laminates such as a molybdenum-neodymium-copper laminated structure, a MTD (molybdenum-titanium-niobium) laminated structure, a MTD molybdenum-nickel-titanium-copper laminated structure, a molybdenum-nickel-titanium-copper-molybdenum-nickel-titanium laminated structure, a molybdenum-neodymium-copper-MTD laminated structure, a molybdenum-aluminum-aluminum laminated structure, molybdenum-aluminum-molybdenum laminated structure, a MoNb-copper-MoNb laminated structure, and a AlNd-molybdenum-AlNd laminated structure.

In some embodiments, the conductive material for making the first electrode E1 or the second electrode E2 includes $MIO_aN_b$, wherein MI is a single metal or a combination of metals, a>0, and b≥0, O standing for oxygen element, N standing for nitrogen element, e.g., the conductive material is a metal oxide material or a metal oxynitride material. Examples of appropriate metal oxide materials include, but are not limited to, indium gallium zinc oxide, zinc oxide, gallium oxide, indium oxide, HfInZnO (HIZO), InGaZnO (IGZO), crystalline InZnO, amorphous InZnO, ZnO:F, In2O3:Sn, In2O3:Mo, Cd2SnO4, ZnO:Al, TiO2:Nb, Cd—Sn—O, InGaO(IGO), InGaZnSnO(IGZTO), Lanthanide doped oxide semiconductor (Ln—OS). The crystallinity can be amorphous, partially crystalline, or crystalline. Examples of appropriate metal oxynitride materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. In one example, the first electrode E1 or the second electrode E2 includes indium gallium zinc oxide.

In some embodiments, when the channel region CR, the first electrode E1 or the second electrode E2 include $M1O_aN_b$ the first electrode E1 or the second electrode E2 differs from the channel region CR in that the first electrode E1 or the second electrode E2 is subject to a process to make it more conductive. The channel region CR has a conductivity different from a conductivity of the first electrode E1 and different from a conductivity of the second electrode E2. In one example, when the channel region CR, the first electrode E1 or the second electrode E2 include $M1O_aN_b$, the $M1O_aN_b$ in the first electrode E1 or the second electrode E2 is subject to a lightly doped drain process (e.g., a lightly-doping ion implantation process). In another example, when the channel region CR, the first electrode E1 or the second electrode E2 include $M1O_aN_b$, the $M1O_aN_b$ in the first electrode E1 or the second electrode E2 is subject to an annealing process. In another example, when the channel region CR, the first electrode E1 or the second electrode E2 include $M1O_aN_b$, the $M1O_aN_b$ in the first electrode E1 or the second electrode E2 is subject to an oxide supplementation process. Optionally, the lightly doped drain process is performed using a doping concentration in a range of approximately $1\times10^{15}$ atoms/cm$^3$ to approximately $1\times10^{20}$ atoms/cm$^3$, e.g., approximately $1\times10^{15}$ atoms/cm$^3$ to approximately $1\times10^{16}$ atoms/cm$^3$, approximately $1\times10^{16}$ atoms/cm$^3$ to approximately $1\times10^{17}$ atoms/cm$^3$, approximately $1\times10^{17}$ atoms/cm$^3$ to approximately $1\times10^{18}$ atoms/cm$^3$, approximately $1\times10^{18}$ atoms/cm$^3$ to approximately $1\times10^{20}$ atoms/cm$^2$, and approximately $1\times10^{19}$ atoms/cm$^3$ to approximately $1\times10^{20}$ atoms/cm$^3$. Optionally, the lightly doped drain process is performed using an n-type dopant for enhancing conductivity. Examples of n-type dopants include a Group VA element of the Periodic Table of the Elements including nitrogen (N), phosphorous (P), arsenic (As), antimony (Sb), and bismuth (Bi).

Figure 3:
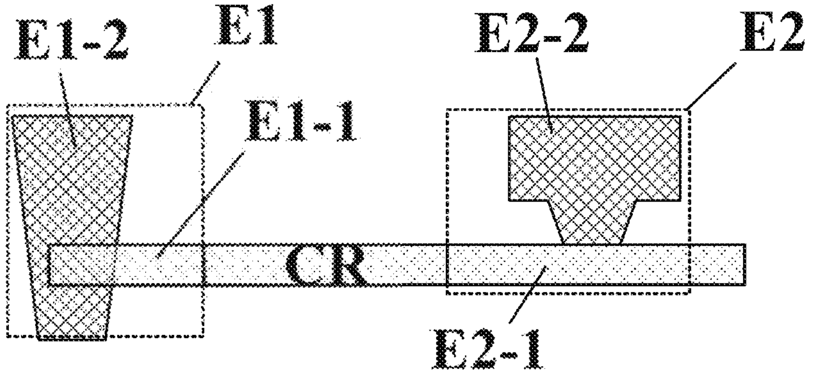
FIG. 3 is a schematic diagram illustrating the structure of a first electrode, a channel region, and a second electrode in the array substrate depicted in FIG. 2.

FIG. 3 is a schematic diagram illustrating the structure of a first electrode, a channel region, and a second electrode in the array substrate depicted in FIG. 2. In some embodiments, referring to FIG. 1A, FIG. 2, and FIG. 3, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

In some embodiments, referring to FIG. 1A, FIG. 2, and FIG. 3, the second electrode E2 includes a third electrode part E2-1 and a fourth electrode part E2-2 electrically connected together. The third electrode part E2-1 and the fourth electrode part E2-2 are made of different materials. Optionally, the fourth electrode part E2-2 is in direct contact with the third electrode part B2-1, and is on a side of the third electrode part E2-1 away from the base substrate BS Various appropriate conductive materials and various appropriate fabricating methods may be used to make the first electrode part E1-1 or the third electrode part E2-1. In some embodiments, the conductive material for making the first electrode part E1-1 or the third electrode part E2-1 includes $M1O_aN_b$, wherein M1 is a single metal or a combination of metals, a>0, and b≥0, e.g., the conductive material is a metal oxide material or a metal oxynitride material. In some embodiments, when the channel region CR, the first electrode part E1-1, and the third electrode part E2-1 include $M1O_aN_b$, the first electrode part E1-1 or the third electrode part E2-1 differs from the channel region CR in that the first electrode part E1-1 or the third electrode part E2-1 is subject to a process to make it more conductive. In one example, when the channel region CR, the first electrode part E1-1 or the third electrode part E2-1 include $M1O_aN_b$, the $M1O_aN_b$ in the first electrode part E1-1 or the third electrode part E2-1 is subject to a lightly doped drain process (e.g., a lightly-doping ion implantation process).

Various appropriate conductive materials and various appropriate fabricating methods may be used to make the second electrode part E1-2 or the fourth electrode part E2-2. Examples of appropriate conductive materials include a metal, an alloy, a metal oxide, and any combination thereof. In one example, the second electrode part E1-2 or the fourth electrode part E2-2 includes a molybdenum-neodymium-copper laminated structure, a MTD-copper laminated structure, or a molybdenum-neodymium-copper-MTD laminated structure.

Various appropriate conductive materials and various appropriate fabricating methods may be used to make the buffer layer BUF. For example, an insulating material may be deposited on the substrate by a plasma-enhanced chemical vapor deposition (PECVD) process. Examples of materials suitable for making the buffer layer BUF include, but are not limited to, silicon oxide (SiOx), silicon nitride (SiNx), or a combination thereof. Optionally, the buffer layer BUF may have a single-layer structure or a stacked-layer structure including two or more sub-layers (e.g., a stacked-layer structure including a silicon oxide sublayer and a silicon nitride sublayer). Optionally, the thickness of the buffer layer BUF is in a range of approximately 300 nm to approximately 600 nm. For example, the buffer layer BUF may include a silicon oxide sub-layer having a thickness that is 1% to 90% of a total thickness of the buffer layer BUF. In one example, the buffer layer BUF has a stacked-layer structure including a silicon oxide sublayer and a silicon nitride sublayer, In another example, the buffer layer BUF has a stacked-layer structure including a first silicon oxide sublayer and a second silicon oxide sublayer. The present inventor discovers that a buffer layer BUF having a stacked-layer structure including two or more sub-layers can prevent surface oxidation of the signal line by the silicon oxide material.

Various appropriate insulating materials and various appropriate fabricating methods may be used for making the planarization layer PLN. For example, an insulating material may be deposited on the substrate by a plasma-enhanced chemical vapor deposition process.

Examples of appropriate insulating materials include organic insulating materials such as a resin material.

In some embodiments, the array substrate includes a via v extending through at least the buffer layer BUF. The second electrode part E1-2 is at least partially in the via v. Optionally, the second electrode part E1-2 extends to the via v to connect to the signal line SL. In one example as depicted in FIG. 2, the via v extends through the inter-layer dielectric layer ILD, the insulating layer IN, and the buffer layer BUF. In another example, the second electrode part E1-2 is formed subsequent to forming the gate electrode G. For example, the second electrode part E1-2 is in a layer on a side of the gate electrode G away from the base substrate BS.

In some embodiments, the array substrate includes a via v' extending through at least the insulating layer IN. The fourth electrode part E2-2 is at least partially in the via v'.

Optionally, the fourth electrode part E2-2 extends to the via v' to connect to the third electrode part E2-1. In one example as depicted in FIG. 2, the via v' extends through the inter-layer dielectric layer ILD and the insulating layer IN.

Figure 1B:
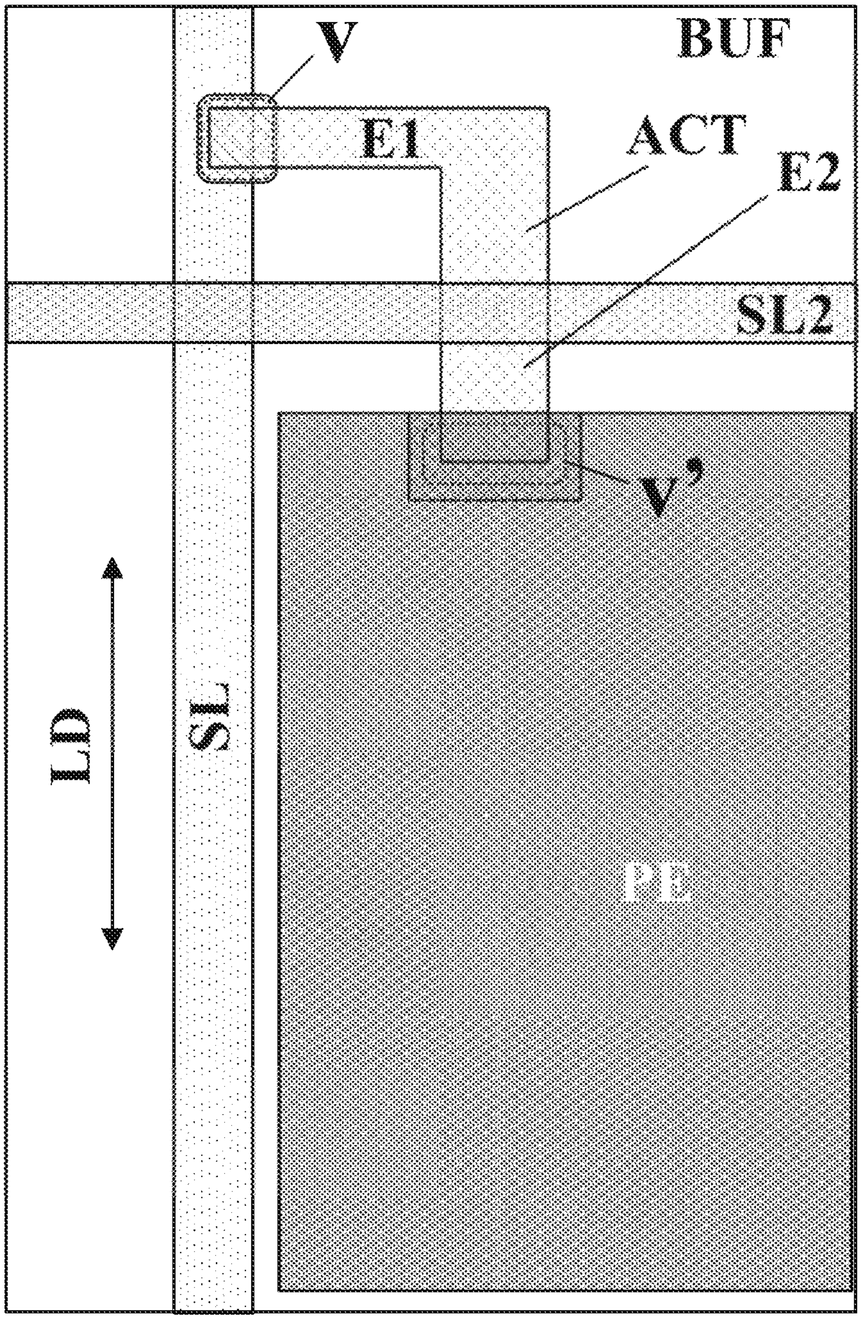
FIG. 1B is a plan view of an array substrate in some embodiments according to the present disclosure.

FIG. 1B is a plan view of an array substrate in some embodiments according to the present disclosure, The structure of the array substrate depicted in FIG. 1B is similar to the structure of the array substrate depicted in FIG. 1A except that the array substrate depicted in FIG. 1B is absent of a light shield.

Figure 1C:
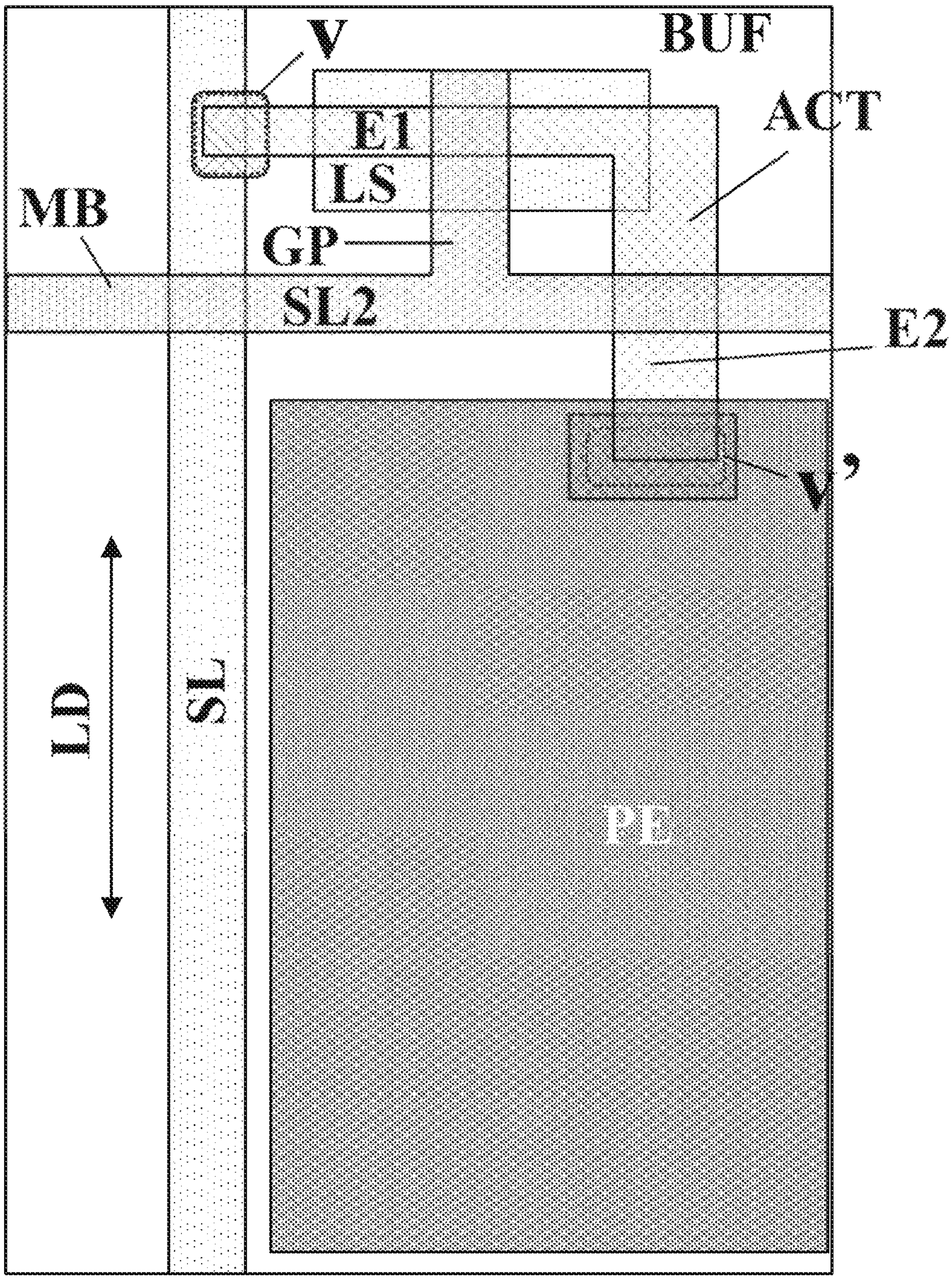
FIG. 1C is a plan view of an array substrate in some embodiments according to the present disclosure.

FIG. 1C is a plan view of an array substrate in some embodiments according to the present disclosure. The structure of the array substrate depicted in FIG. 1C is similar to the structure of the array substrate depicted in FIG. 1A except that the array substrate depicted in FIG. 1C has a double gate thin film transistor. As shown in FIG. 1C, two portions of the gate electrode are parts of the second signal line SL2. The second signal line SL2 includes a protrusion protruding from a main body of the second signal line along a direction substantially parallel to the length direction LD. An orthographic projection of the protrusion on the base substrate overlaps with an orthographic projection of one of two portions of the active layer ACT on the base substrate.

Figure 1D:
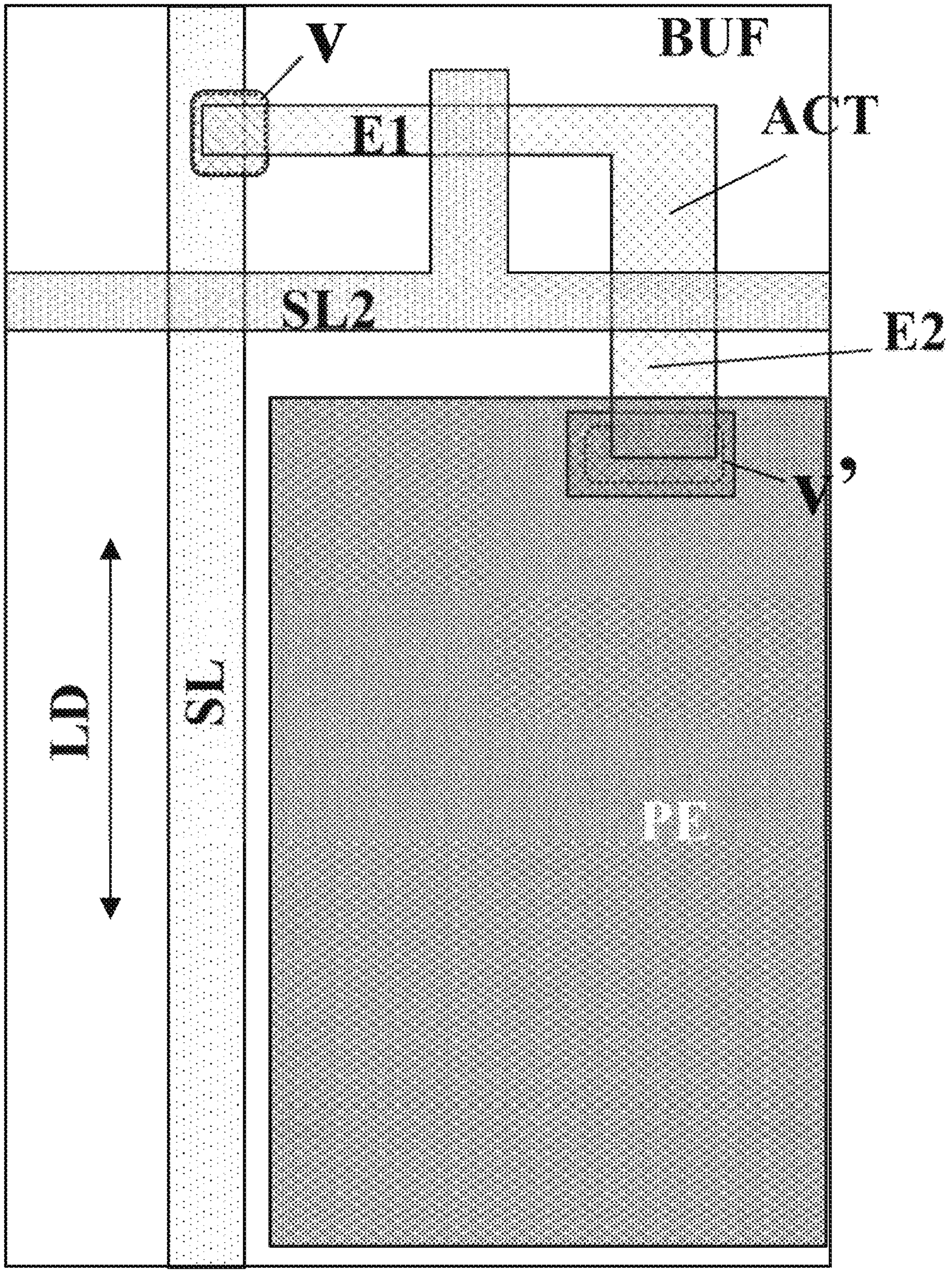
FIG. 1D is a plan view of an array substrate in some embodiments according to the present disclosure.

FIG. 1D is a plan view of an array substrate in some embodiments according to the present disclosure. The structure of the array substrate depicted in FIG. 1D is similar to the structure of the array substrate depicted in FIG. 1C except that the array substrate depicted in FIG. 1D is absent of a light shield.

Figure 1E:
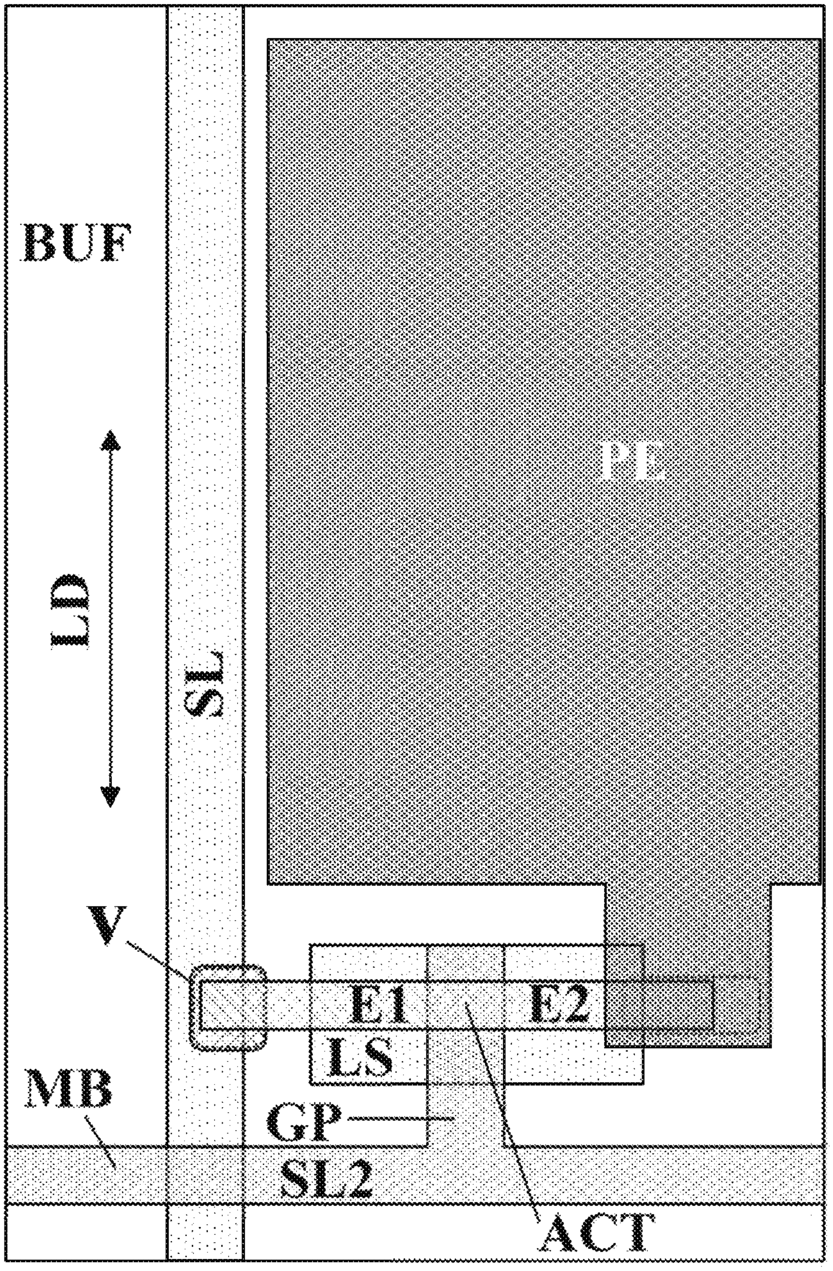
FIG. 1E is a plan view of an array substrate in some embodiments according to the present disclosure.

FIG. 1E is a plan view of an array substrate in some embodiments according to the present disclosure. The structure of the array substrate depicted in FIG. 1E is similar to the structure of the array substrate depicted in FIG. 1C. In the array substrates depicted in FIG. 1C and FIG. 1E, the second signal line SL2 includes a protrusion GP protruding away from a main body MB of the second signal line SL2, The main body MB extends along a direction, e.g., substantially perpendicular to the length direction LD, the protrusion GP extends along a direction, e.g., substantially parallel to the length direction LD, The protrusion GP includes a portion that functions as, e.g., a gate electrode for the transistor. In the array substrate depicted in FIG. 1C, the protrusion GP and the pixel electrode PE electrically connected to a same transistor are on two different sides with respect to the main body MB. In the array substrate depicted in FIG. 1E, the protrusion GP and the pixel electrode PE electrically connected to a same transistor are on a same side with respect to the main body MB.

Figure 1F:
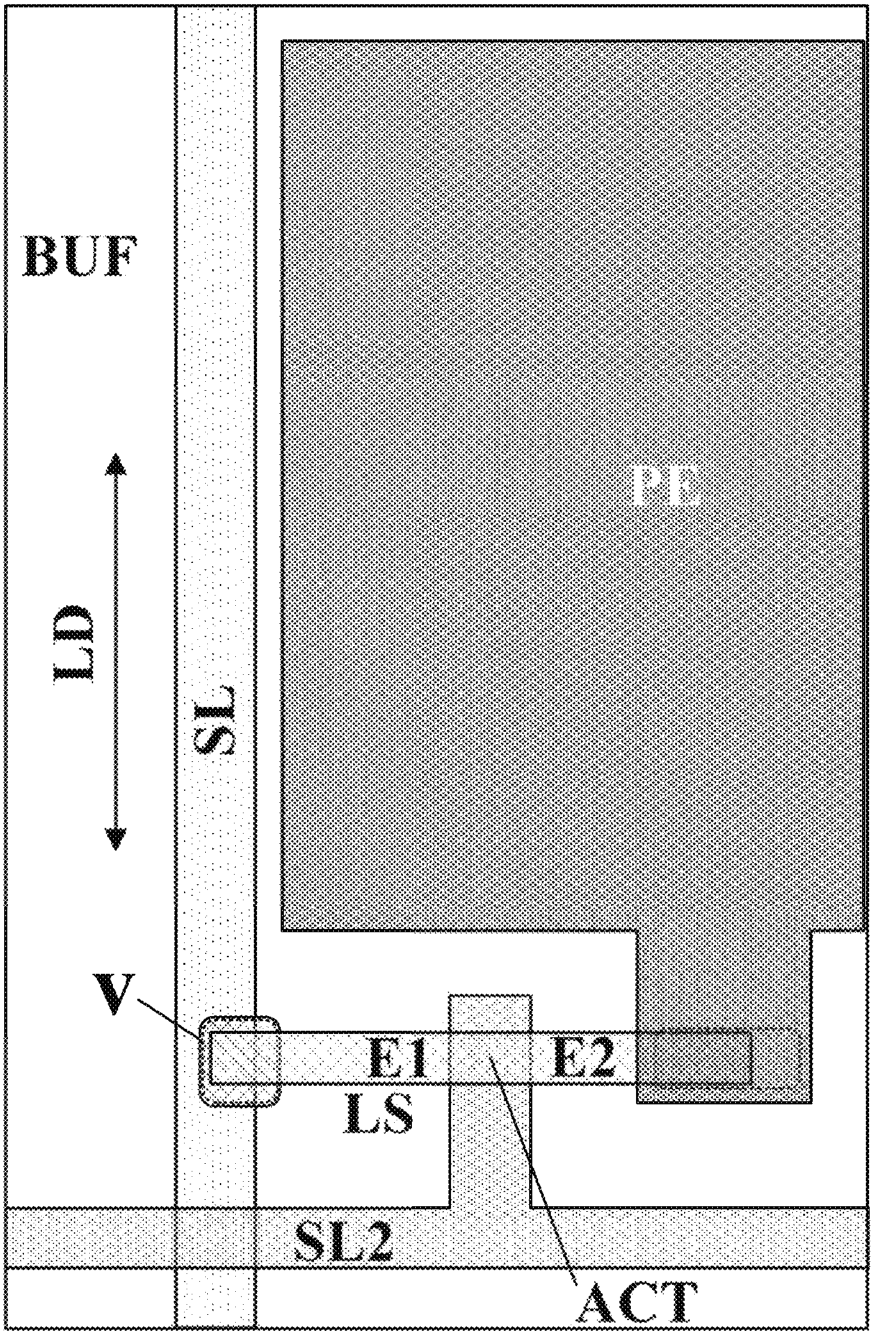
FIG. 1F is a plan view of an array substrate in some embodiments according to the present disclosure.

FIG. 1F is a plan view of an array substrate in some embodiments according to the present disclosure. The structure of the array substrate depicted in FIG. 1F is similar to the structure of the array substrate depicted in FIG. 1E except that the array substrate depicted in FIG. 1F is absent of a light shield.

In some embodiments, the insulating layer IN is formed to extend substantially throughout the array substrate, as shown in FIG. 2.

In some embodiments, the insulating layer does not extend substantially throughout the array substrate. For example, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate.

Figure 4:
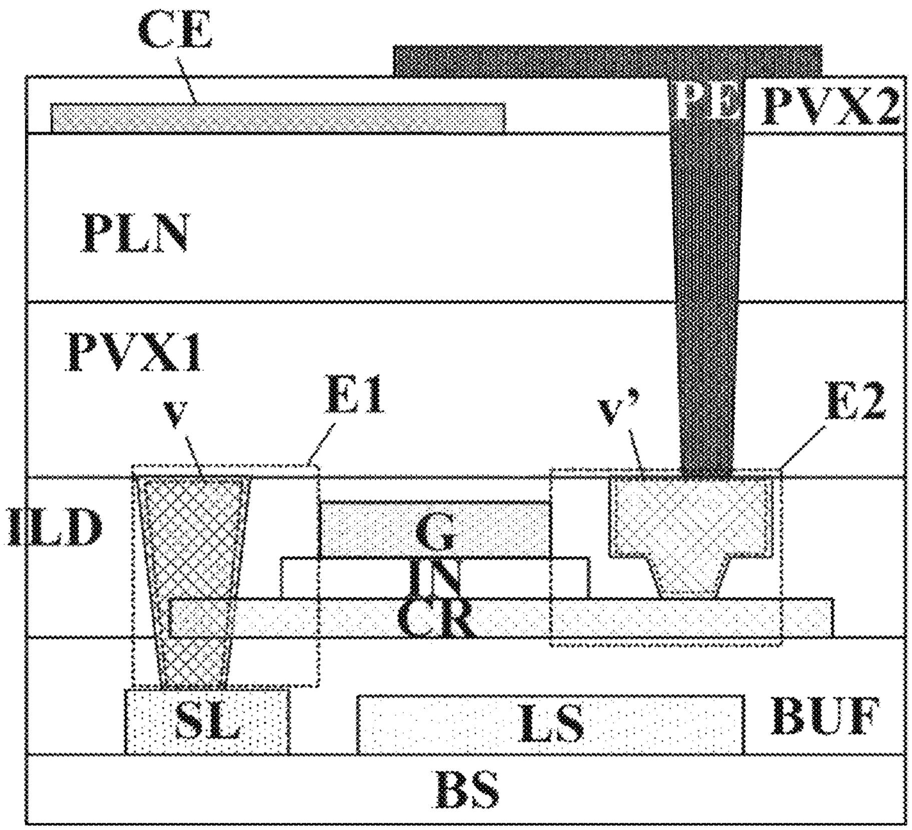
FIG. 4 is a cross-sectional view of an array substrate in some embodiments according to the present disclosure.

FIG. 4 is a cross-sectional view of an array substrate in some embodiments according to the present disclosure. The structure shown in FIG. 4 is similar to the structure shown in FIG. 2, but differs from the structure shown in FIG. 2 at least in that the insulating layer IN does not extend substantially throughout the array substrate depicted in FIG. 4.

Figure 5:
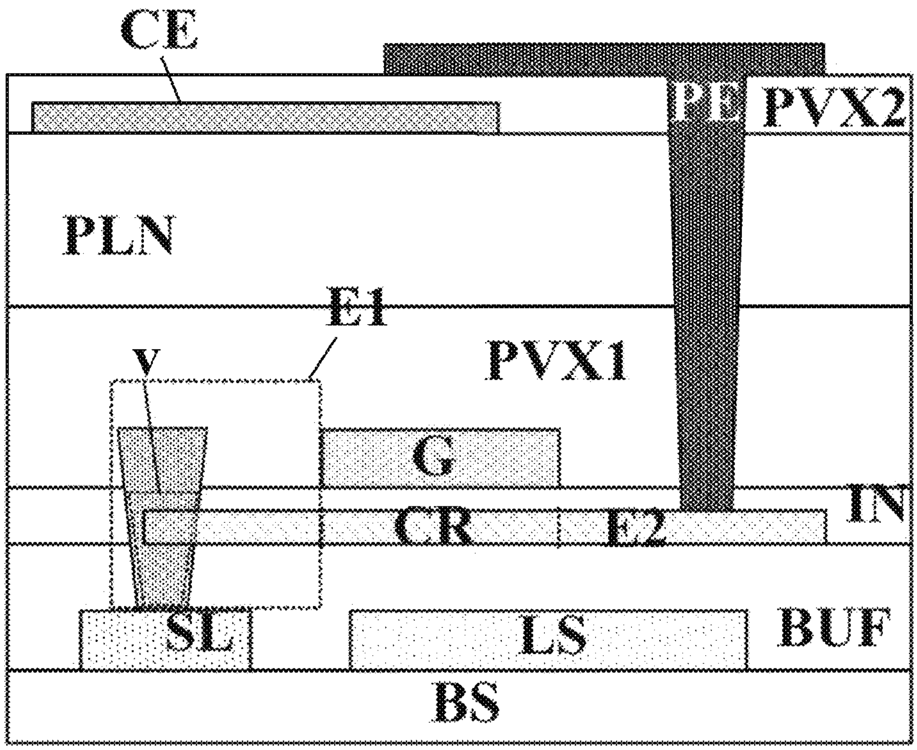
FIG. 5 is a cross-sectional view of an array substrate in some embodiments according to the present disclosure.
Figure 6:
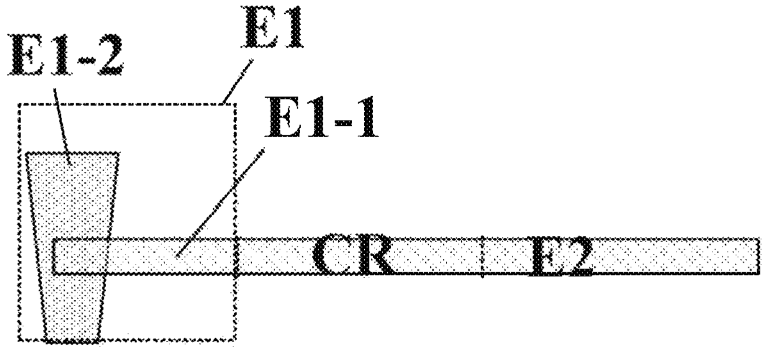
FIG. 6 is a schematic diagram illustrating the structure of a first electrode, a channel region, and a second electrode in the array substrate depicted in FIG. 5.

FIG. 5 is a cross-sectional view of an array substrate in some embodiments according to the present disclosure, FIG. 5 may be a cross-sectional view along an A-A' line in FIG. 1A. FIG. 6 is a schematic diagram illustrating the structure of a first electrode, a channel region, and a second electrode in the array substrate depicted in FIG. 5. Referring to FIG. 5 and FIG. 6, in some embodiments, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

Various appropriate conductive materials and various appropriate fabricating methods may be used to make the first electrode part E1-1 or the second electrode E2. In some embodiments, the conductive material for making the first electrode part E1-1 or the second electrode E2 includes $M1O_aN_b$, wherein M1 is a single metal or a combination of metals, $a>0$, and $b\geq0$, e.g., the conductive material is a metal oxide material or a metal oxynitride material. In some embodiments, when the channel region CR, the first electrode part E1-1, and the second electrode E2 include $M1O_aN_b$, the first electrode part E1-1 or the second electrode E2 differs from the channel region CR in that the first electrode part E1-1 or the second electrode E2 is subject to a process to make it more conductive. In one example, when the channel region CR, the first electrode part E1-1 or the second electrode E2 include $M1O_aN_b$, the $M1O_aN_b$ in the first electrode part E1-1 or the second electrode E2 is subject to a lightly doped drain process (e.g., a lightly-doping ion implantation process).

Various appropriate conductive materials and various appropriate fabricating methods may be used to make the second electrode part E1-2. Examples of appropriate conductive materials include a metal, an alloy, a metal oxide, and any combination thereof. In one example, the second electrode part E1-2 includes a molybdenum-neodymium-copper laminated structure, a MTD-copper laminated structure, or a molybdenum-neodymium-copper-MTD laminated structure.

In some embodiments, the array substrate includes a via v extending through at least the buffer layer BUF. The second electrode part E1-2 is at least partially in the via v. Optionally, the second electrode part E1-2 extends to the via v to connect to the signal line SL. In one example as depicted in FIG. 5, the via v extends through the insulating layer IN and the buffer layer BUF. In another example, the second electrode part E1-2 and the gate electrode G are in a same layer and comprise a same electrode material. In another example, the second electrode part E1-2 and the gate electrode G are formed in a same patterning process using a same mask plate.

Referring to FIG. 5, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, and a second electrode E2 (e.g., a drain electrode of a transistor) on a side of the buffer layer BUF away from the base substrate BS; an insulating layer IN (e.g., a gate insulating layer) on a side of at least the channel region CR (e.g., on a side of the first electrode E1, the channel region CR, and the second electrode E2) away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; a common electrode CE on a side of the planarization layer PLN away from the first passivation layer PVX1; a second passivation layer PVX2 on a side of the common electrode CE away from the planarization layer PLN; and a pixel electrode PE on a side of the second passivation layer PVX2 away from common electrode CE.

Figure 7:
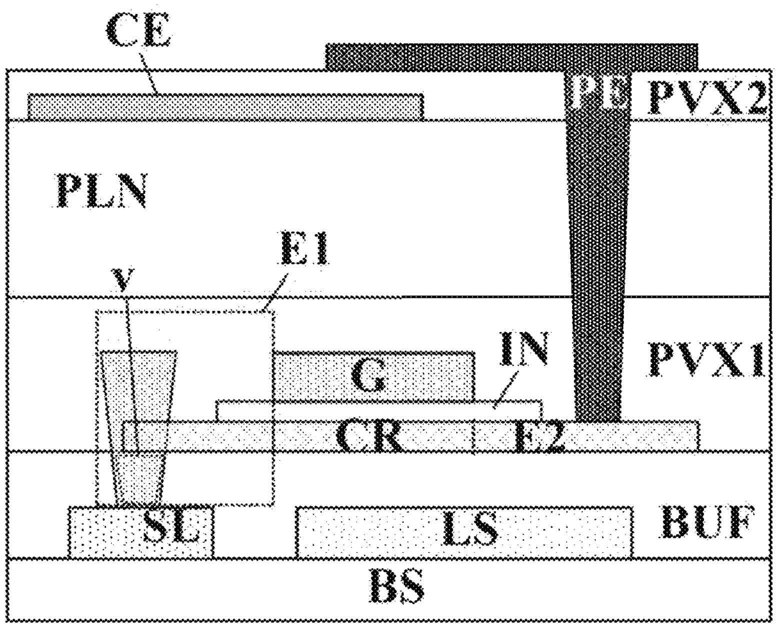
FIG. 7 is a cross-sectional view of an array substrate in some embodiments according to the present disclosure.

FIG. 7 is a cross-sectional view of an array substrate in some embodiments according to the present disclosure. The structure shown in FIG. 7 is similar to the structure shown in FIG. 5, but differs from the structure shown in FIG. 5 at least in that the insulating layer IN does not extend substantially throughout the array substrate depicted in FIG. 7.

Figure 8:
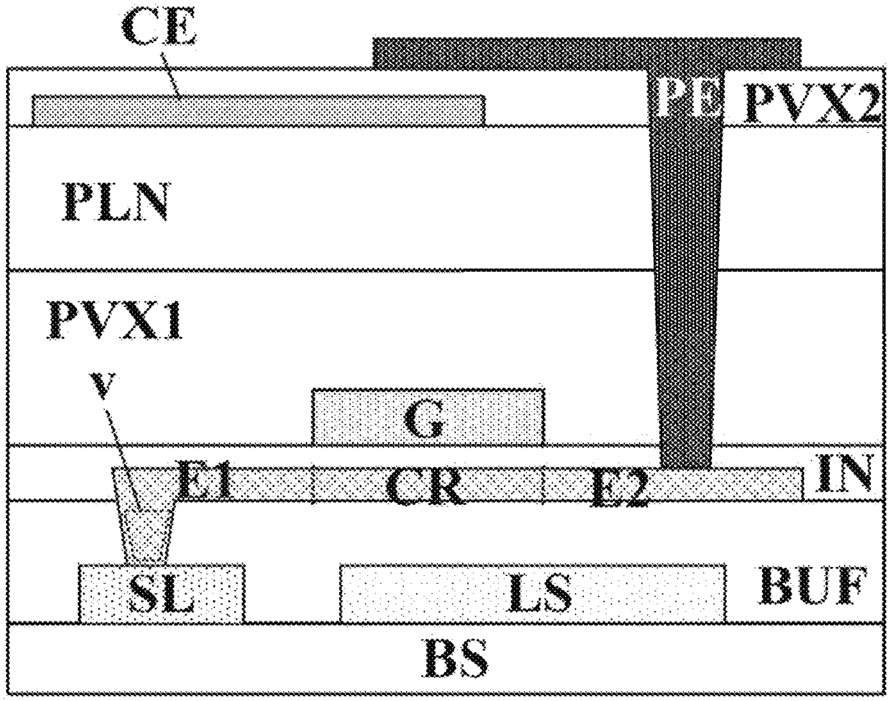
FIG. 8 is a cross-sectional view of an array substrate in some embodiments according to the present disclosure.

FIG. 8 is a cross-sectional view of an array substrate in some embodiments according to the present disclosure, Referring to FIG. 8, in some embodiments, the channel region CR, the first electrode E1, and the second electrode E2 include $M1O_aN_b$. The channel region CR, the first electrode E1, and the second electrode E2 are parts of a unitary structure. Optionally, the first electrode E1 or the second electrode E2 differs from the channel region CR in that the first electrode E1 or the second electrode E2 is subject to a process to make it more conductive.

In some embodiments, the array substrate includes a via v extending through at least the buffer layer BUF, The first electrode E1 at least partially in the via v. Optionally, the first electrode E1 extends to the via v to connect to the signal line SL.

Referring to FIG. 8, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, and a second electrode E2 (e.g., a drain electrode of a transistor) on a side of the buffer layer BUF away from the base substrate BS; an insulating layer IN (e.g., a gate insulating layer) on a side of at least the channel region CR (e.g., on a side of the first electrode E1, the channel region CR, and the second electrode E2) away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; a common electrode CE on a side of the planarization layer PLN away from the first passivation layer PVX1; a second passivation layer PVX2 on a side of the common electrode CE away from the planarization layer PLN; and a pixel electrode PE on a side of the second passivation layer PVX2 away from the planarization layer PLN.

Figure 9:
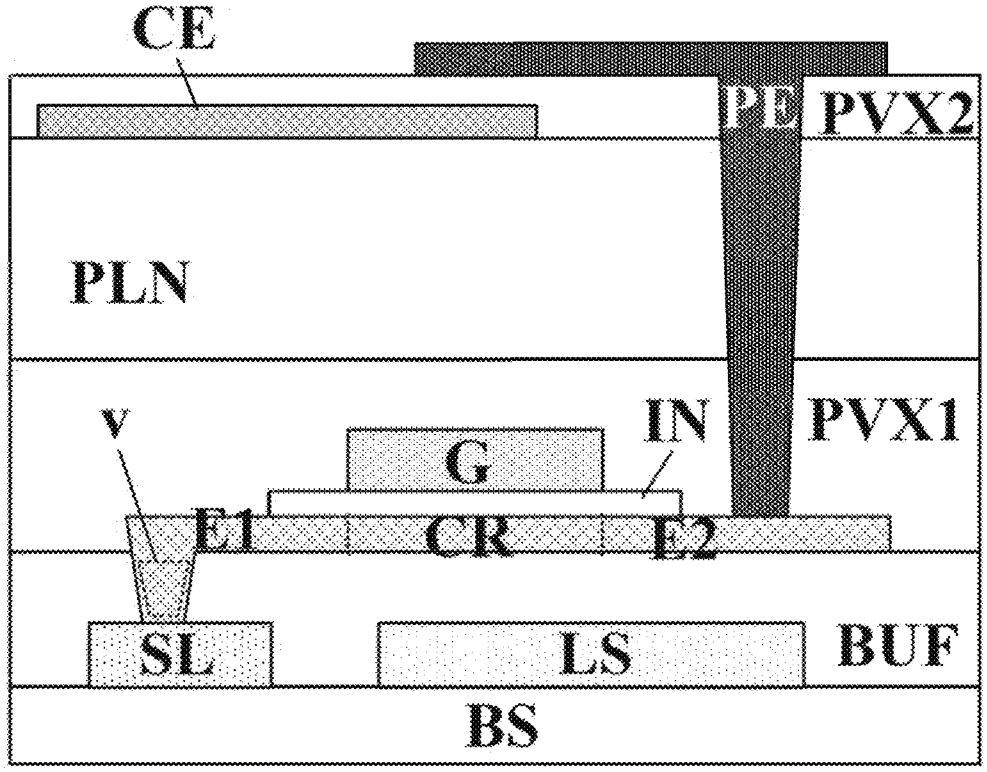
FIG. 9 is a cross-sectional view of an array substrate in some embodiments according to the present disclosure.

FIG. 9 is a cross-sectional view of an array substrate in some embodiments according to the present disclosure. The structure shown in FIG. 9 is similar to the structure shown in FIG. 8, but differs from the structure shown in FIG. 8 at least in that the insulating layer IN does not extend substantially throughout the array substrate depicted in FIG. 9.

Figure 10:
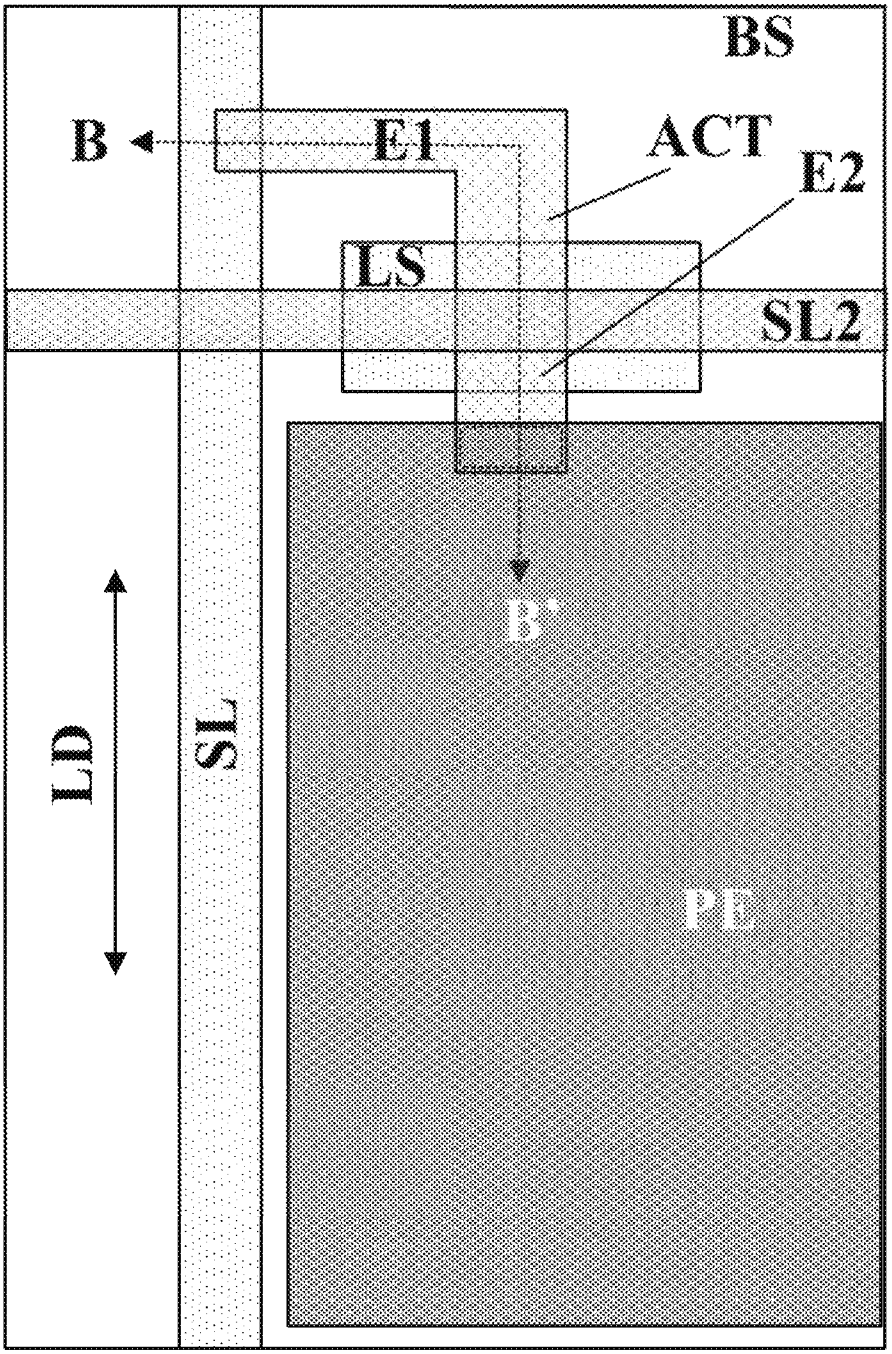
FIG. 10 is a plan view of an array substrate in some embodiments according to the present disclosure.
Figure 11:
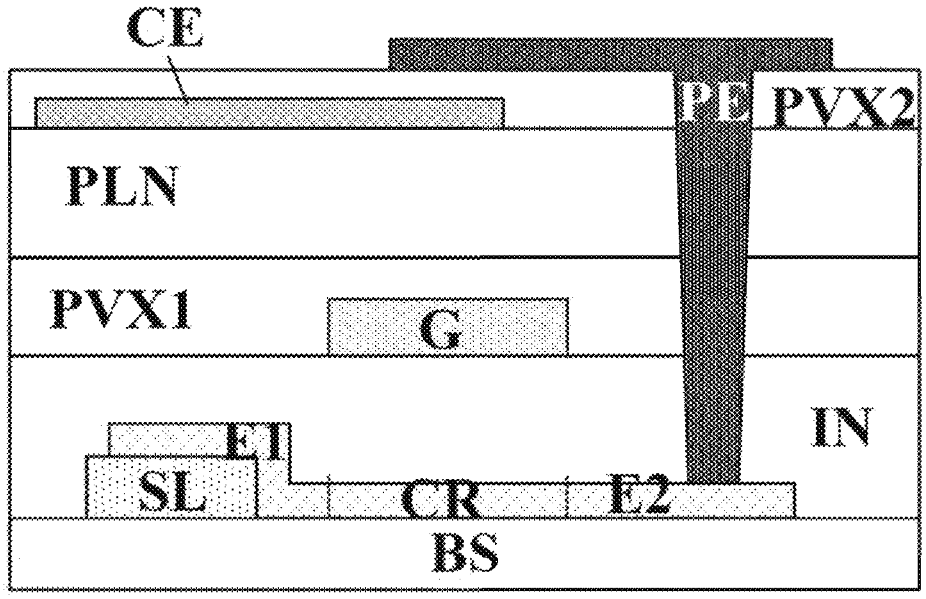
FIG. 11 is a cross-sectional view of an array substrate in some embodiments according to the present disclosure.

FIG. 10 is a plan view of an array substrate in some embodiments according to the present disclosure. FIG. 11 is a cross-sectional view of an array substrate in some embodiments according to the present disclosure. FIG. 11 may be a cross-section along a B-B' line in FIG. 10. Referring to FIG. 10 and FIG. 11, the array substrate in some embodiments includes a base substrate BS; a signal line SL (e.g., a data line configured to provide a data signal to a transistor) on the base substrate BS; a first electrode E1 (e.g., a source electrode of a transistor), a channel region CR, and a second electrode E2 (e.g., a drain electrode of a transistor) on a side of the signal line SL away from the base substrate BS; an insulating layer IN (e.g., a gate insulating layer) on a side of at least the channel region CR (e.g., on a side of the first electrode EL, the channel region CR, and the second electrode E2) away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; a common electrode CE on a side of the planarization layer PLN away from the first passivation layer PVX1; a second passivation layer PVX2 on a side of the common electrode CE away from the planarization layer PLN; and a pixel electrode PE on a side of the second passivation layer PVX2 away from the planarization layer PLN.

Figure 12:
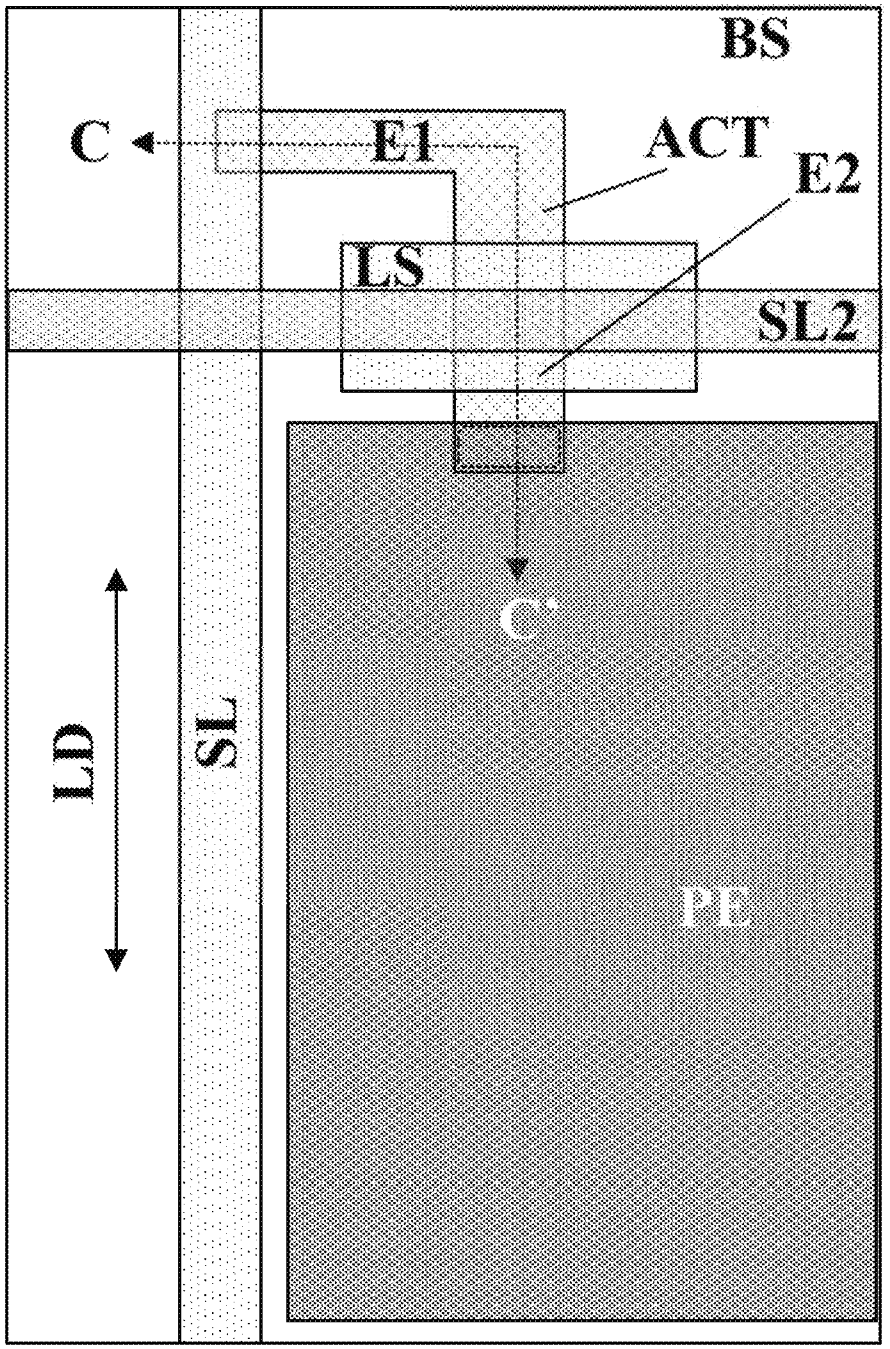
FIG. 12 is a plan view of an array substrate in some embodiments according to the present disclosure.
Figure 13:
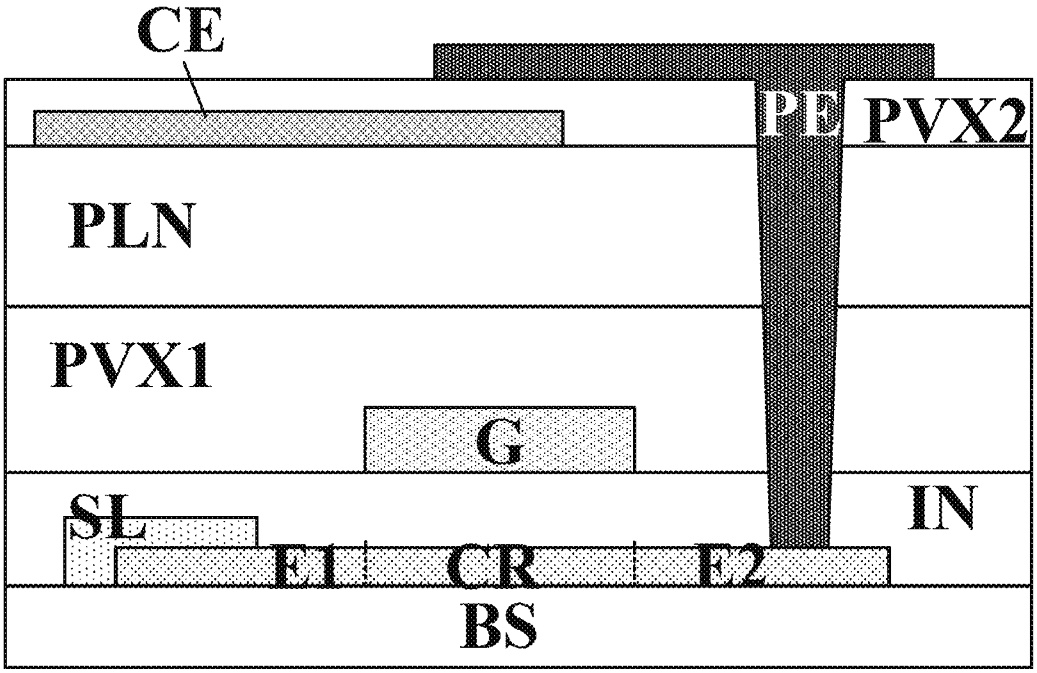
FIG. 13 is a cross-sectional view of an array substrate in some embodiments according to the present disclosure.

FIG. 12 is a plan view of an array substrate in some embodiments according to the present disclosure. FIG. 13 is a cross-sectional view of an array substrate in some embodiments according to the present disclosure. FIG. 13 may be a cross-section along a C-C' line in FIG. 12. Referring to FIG. 12 and FIG. 13, the array substrate in some embodiments includes a base substrate BS; first electrode E1 (e.g., a source electrode of a transistor), a channel region CR, and a second electrode E2 (e.g., a drain electrode of a transistor) on the base substrate BS; a signal line SL (e.g., a data line configured to provide a data signal to a transistor) on a side of at least the first electrode E1 away from the base substrate BS; an insulating layer IN (e.g., a gate insulating layer) on a side of the signal line SL, the first electrode EL, the channel region CR, and the second electrode E2 away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; a common electrode CE on a side of the planarization layer PLN away from the first passivation layer PVX1; a second passivation layer PVX2 on a side of the common electrode CE away from the planarization layer PLN; and a pixel electrode PE on a side of the second passivation layer PVX2 away from the planarization layer PLN.

Referring to FIG. 10, FIG. 11, FIG. 12, and FIG. 13, in some embodiments, the channel region CR, the first electrode E1, and the second electrode E2 include $M1O_aN_b$. The channel region CR, the first electrode E1, and the second electrode E2 are parts of a unitary structure. Optionally, the first electrode E1 or the second electrode E2 differs from the channel region CR in that the first electrode E1 or the second electrode E2 is subject to a process to make it more conductive.

Referring to FIG. 10, FIG. 11, FIG. 12, and FIG. 13, in some embodiments, the signal line SL is in direct contact with the first electrode E1. In the example depicted in FIG. 12 and FIG. 13, an entirety of a combination of the signal line SL, the channel region CR, the first electrode E1, and the second electrode E2 are between the insulating layer IN and the base substrate BS. The signal line SL, the channel region CR, the first electrode E1, and the second electrode E2 are all in direct contact with a surface (e.g., an upper surface) of the base substrate BS. Optionally, the signal line SL, the channel region CR, the first electrode E1, and the second electrode E2 are all in direct contact with a surface (e.g., a lower surface) of the insulating layer IN.

Referring to FIG. 10 and FIG. 11, in a cross-section along a plane perpendicular to the base substrate BS and perpendicular to a length direction LD along which the signal line SL extends, and intersecting the signal line SL (e.g., the cross-section as shown in FIG. 11), the first electrode E1 covers an upper surface of at least a portion of the signal line SL, and optionally further covers at least one of two lateral surfaces of the signal line SL. An orthographic projection of the first electrode E1 on the base substrate BS at least partially overlaps with an orthographic projection of the signal line SL on the base substrate BS.

Referring to FIG. 12 and FIG. 13, in a cross-section along a plane perpendicular to the base substrate BS and perpendicular to a length direction LD along which the signal line SL extends, and intersecting the signal line SL (e.g., the cross-section as shown in FIG. 13), the signal line SL covers an upper surface of at least a portion of the first electrode E1, and optionally further covers at least a lateral surface of the first electrode E1. An orthographic projection of the signal line SL on the base substrate BS at least partially overlaps with an orthographic projection of the first electrode E1 on the base substrate BS.

In array substrate depicted in FIG. 1A to FIG. ID, FIG. 2 to FIG. 13, Various appropriate conductive materials and various appropriate fabricating methods may be used to make the common electrode CE or the pixel electrode PE. In some embodiments, the conductive material for making the first electrode E1 or the second electrode E2 includes $M1O_aN_b$, wherein M1 is a single metal or a combination of metals, a>0, and b≥0, e.g., the conductive material is a metal oxide material or a metal oxynitride material. Examples of appropriate metal oxide materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, In2O3:Sn, In2O3:Mo, Cd2SO4, ZnO:Al, TiO2:Nb, and Cd—Sn—O. Examples of appropriate metal oxynitride materials include, but are not limited to, zine oxynitride, indium oxynitride, gallium oxynitride, tin oxynitride, cadmium oxynitride, aluminum oxynitride, germanium oxynitride, titanium oxynitride, silicon oxynitride, or combination thereof. In one example, the common electrode CE includes indium gallium zinc oxide or indium zinc oxide. In another example, the pixel electrode PE includes indium tin oxide or indium zinc oxide.

Figure 14A:
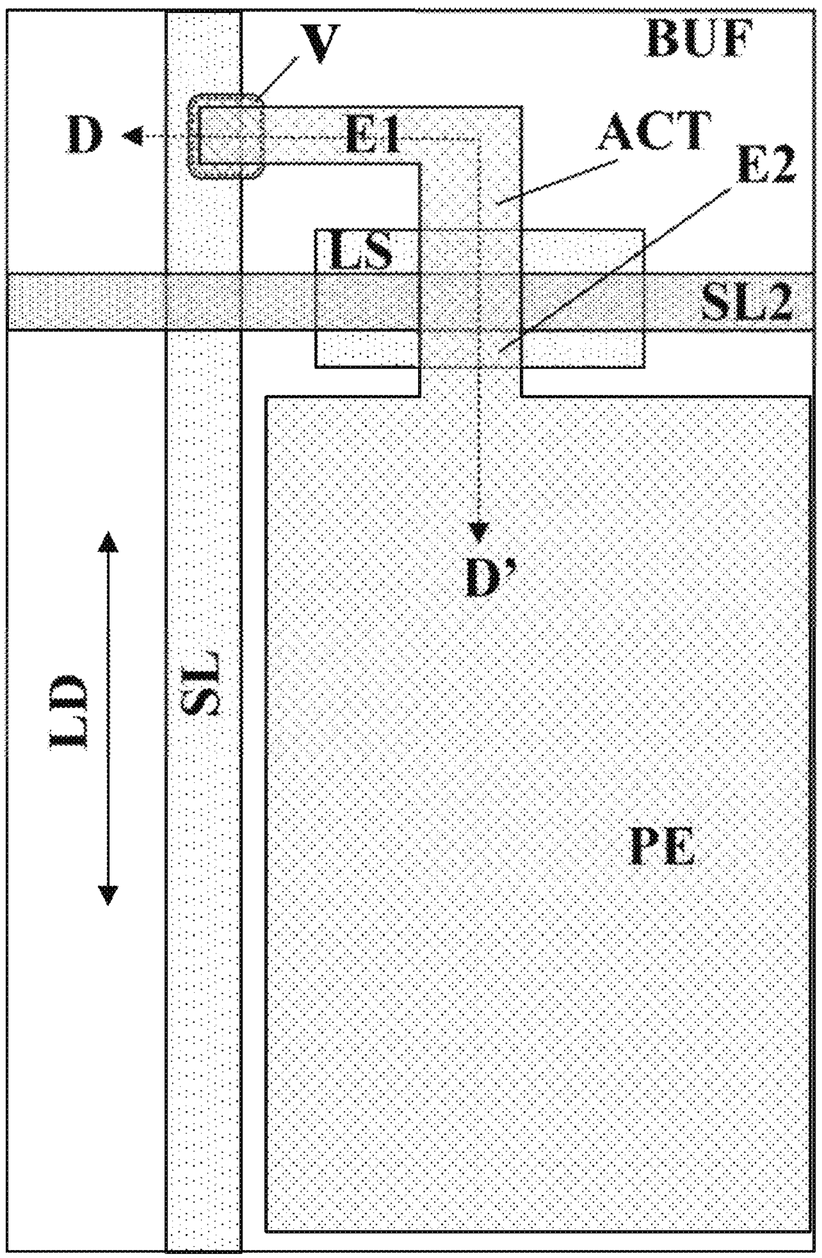
FIG. 14A is a plan view of an array substrate in some embodiments according to the present disclosure.
Figure 15:
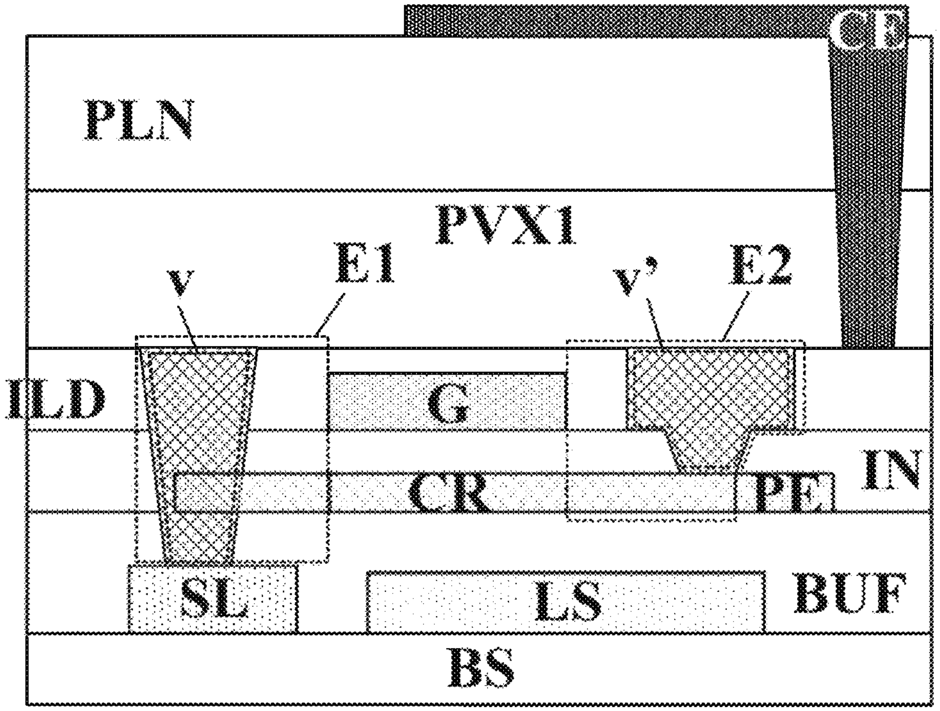
FIG. 15 is a cross-sectional view of an array substrate in some embodiments according to the present disclosure.

FIG. 14A is a plan view of an array substrate in some embodiments according to the present disclosure. FIG. 15 is a cross-sectional view of an array substrate in some embodiments according to the present disclosure. FIG. 15 may be a cross-sectional view along a D-D' line in FIG. 14A. Referring to FIG. 14A and FIG. 15, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, a second electrode E2 (e.g., a drain electrode of a transistor), and a pixel electrode PE on a side of the buffer layer BUF away from the base substrate BS; an insulating layer IN (e.g., a gate insulating layer) on a side of at least the channel region CR and the pixel electrode PE away from the buffer layer BUF; a gate electrode G on a side of the insulating layer IN away from the channel region CR; an inter-layer dielectric layer ILD on a side of the gate electrode G away from the insulating layer IN; a first passivation layer PVX1 on a side of the inter-layer dielectric layer ILD away from the insulating layer IN; a planarization layer PLN on a side of the first passivation layer PVX1 away from the inter-layer dielectric layer ILD; and a common electrode CE on a side of the planarization layer PLN away from the first passivation layer PVX1.

In some embodiments, when the channel region CR, the first electrode E1 or the second electrode E2 include $M1O_aN_b$, the first electrode E1 or the second electrode E2 differs from the channel region CR in that at least a portion of the first electrode E1 or a portion of the second electrode E2 is subject to a process to make it more conductive. In one example, when the channel region CR, the first electrode E1 or the second electrode E2 include $M1O_aN_b$, at least a portion of the $M1O_aN_b$ in the first electrode E1 or the second electrode E2 is subject to a lightly doped drain process (e.g., a lightly-doping ion implantation process).

Figure 16:
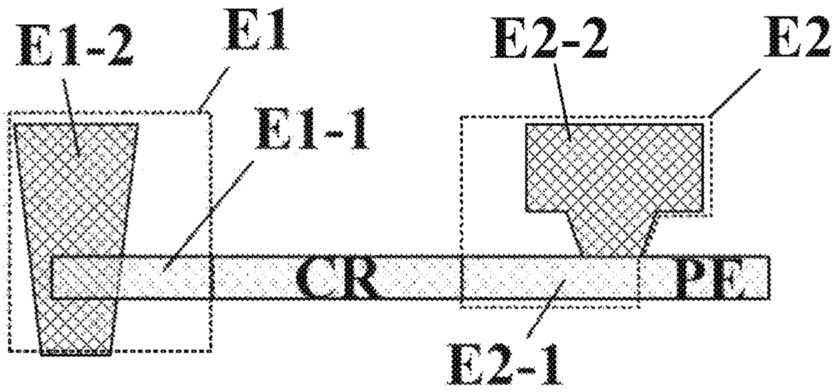
FIG. 16 is a schematic diagram illustrating the structure of a first electrode, a channel region, and a second electrode in the array substrate depicted in FIG. 15.

FIG. 16 is a schematic diagram illustrating the structure of a first electrode, a channel region, and a second electrode in the array substrate depicted in FIG. 15. In some embodiments, referring to FIG. 14A, FIG. 15, and FIG. 16, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

In some embodiments, referring to FIG. 14A, FIG. 15, and FIG. 16, the second electrode E2 includes a third electrode part E2-1 and a fourth electrode part E2-2 electrically connected together. The third electrode part E2-1 and the fourth electrode part E2-2 are made of different materials. Optionally, the fourth electrode part E2-2 is in direct contact with the third electrode part E2-1, and is on a side of the third electrode part E2-1 away from the base substrate BS.

The structure of the array substrate shown in FIG. 14A and FIG. 15 is similar to the structure of the array substrate shown in FIG. 1A and FIG. 2, but differs from the structure of the array substrate shown in FIG. 1A and FIG. 2 at least in that the pixel electrode PE is in a same layer as the channel region CR, at least a portion of the first electrode E1, or at least a portion of the second electrode E2 in the array substrate shown in FIG. 14A and FIG. 15.

In some embodiments, the pixel electrode PE, the channel region CR, at least a portion of the first electrode E1, and at least a portion of the second electrode E2 are parts of a unitary structure. In some embodiments, the pixel electrode PE, the channel region CR, at least a portion of the first electrode E1, and at least a portion of the second electrode E2 include $M1O_aN_b$. Optionally, the pixel electrode PE, at least a portion of the first electrode E1, or at least a portion of the second electrode E2 differs from the channel region CR in that the pixel electrode PE, at least a portion of the first electrode E1, or at least a portion of the second electrode E2 is subject to a process to make it more conductive. In one example, the pixel electrode PE, the channel region CR, at least a portion of the first electrode E1, and at least a portion of the second electrode E2 include indium gallium tin oxide.

In some embodiments, the second electrode part E1-2 and the fourth electrode part E2-2 are formed subsequent to forming the gate electrode G. For example, the second electrode part E1-2 and the fourth electrode part E2-2 are in a layer on a side of the gate electrode G away from the base substrate BS.

Figure 14B:
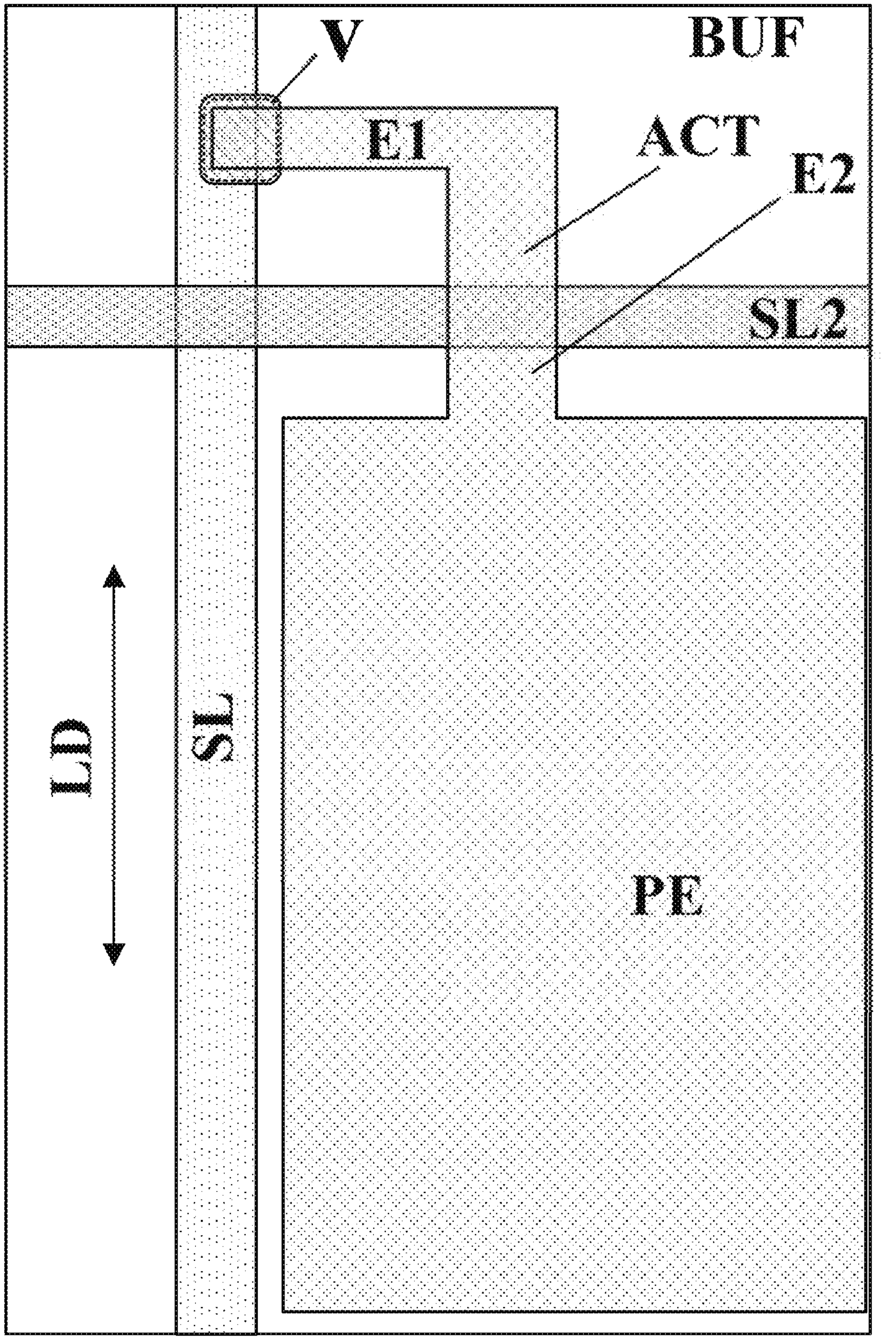
FIG. 14B is a plan view of an array substrate in some embodiments according to the present disclosure.

FIG. 14B is a plan view of an array substrate in some embodiments according to the present disclosure. The structure of the array substrate depicted in FIG. 14B is similar to the structure of the array substrate depicted in FIG. 14A except that the array substrate depicted in FIG. 14B is absent of a light shield.

Figure 14C:
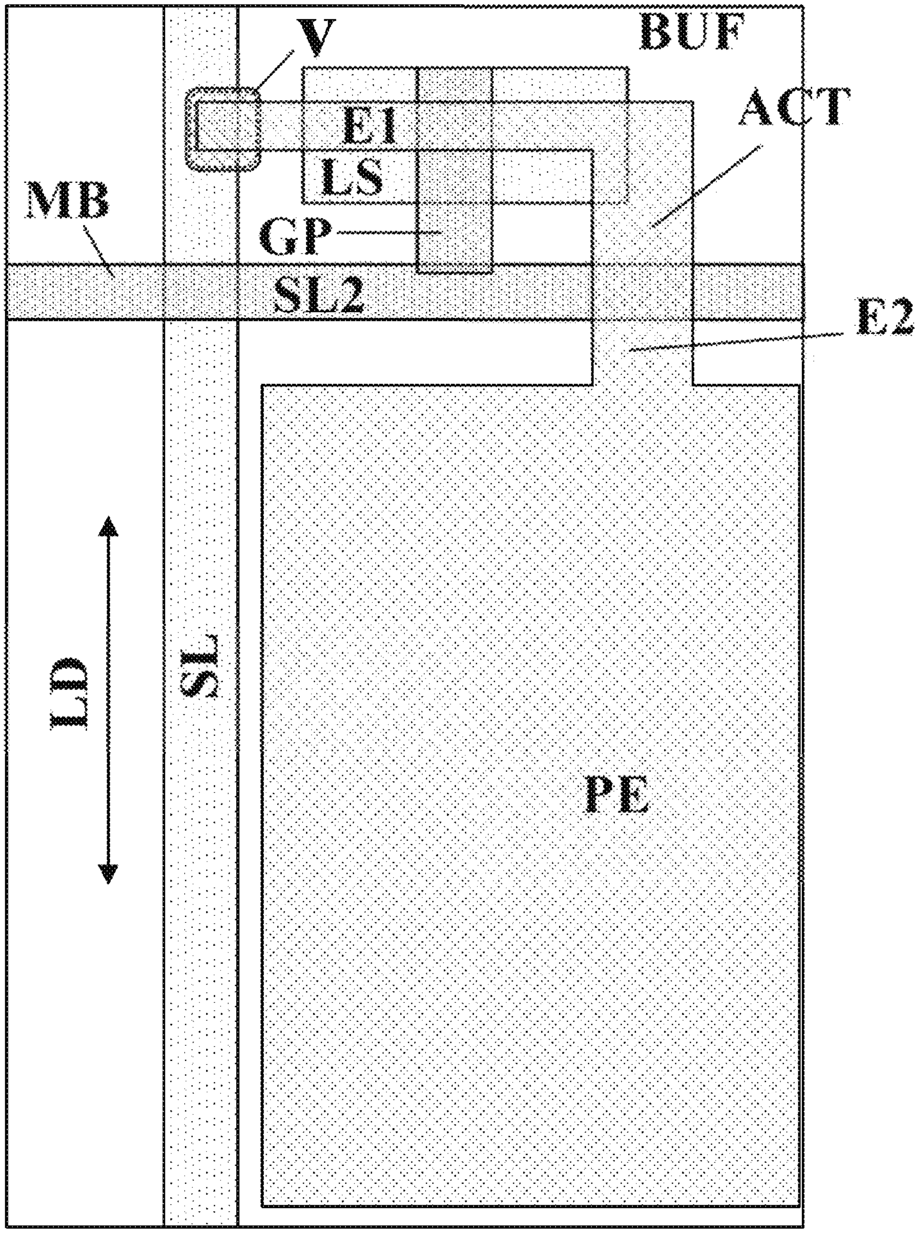
FIG. 14C is a plan view of an array substrate in some embodiments according to the present disclosure.

FIG. 14C is a plan view of an array substrate in some embodiments according to the present disclosure. The structure of the array substrate depicted in FIG. 14C is similar to the structure of the array substrate depicted in FIG. 14A except that the array substrate depicted in FIG. 14C has a double gate thin film transistor. As shown in FIG. 14C, two portions of the gate electrode are parts of the second signal line SL2. The second signal line SL2 includes a protrusion protruding from a main body of the second signal line along a direction substantially parallel to the length direction LD. An orthographic projection of the protrusion on the base substrate overlaps with an orthographic projection of one of two portions of the active layer ACT on the base substrate.

Figure 14D:
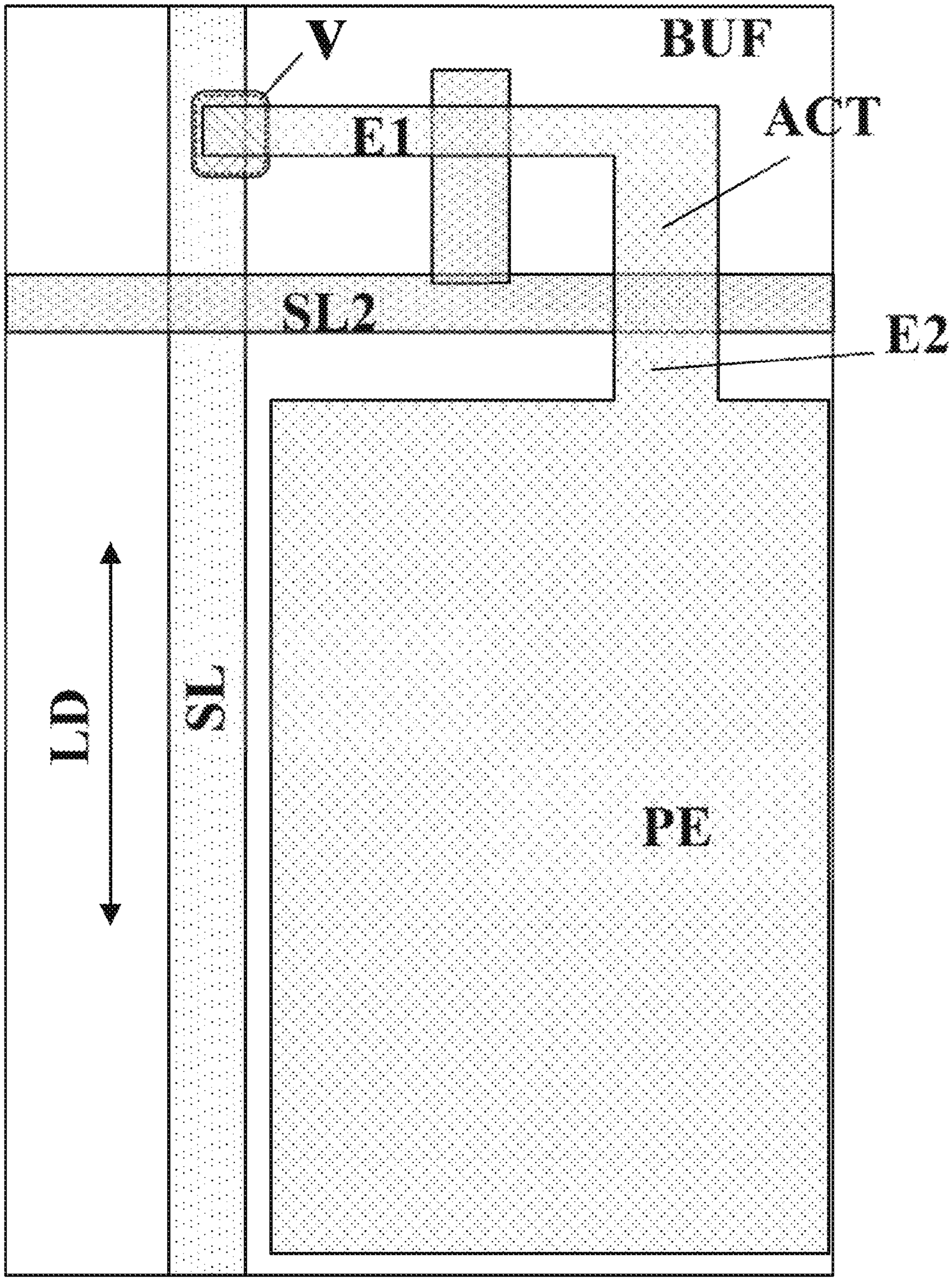
FIG. 14D is a plan view of an array substrate in some embodiments according to the present disclosure.

FIG. 14D is a plan view of an array substrate in some embodiments according to the present disclosure. The structure of the array substrate depicted in FIG. 14D is similar to the structure of the array substrate depicted in FIG. 14C except that the array substrate depicted in FIG. 14D is absent of a light shield.

Figure 14E:
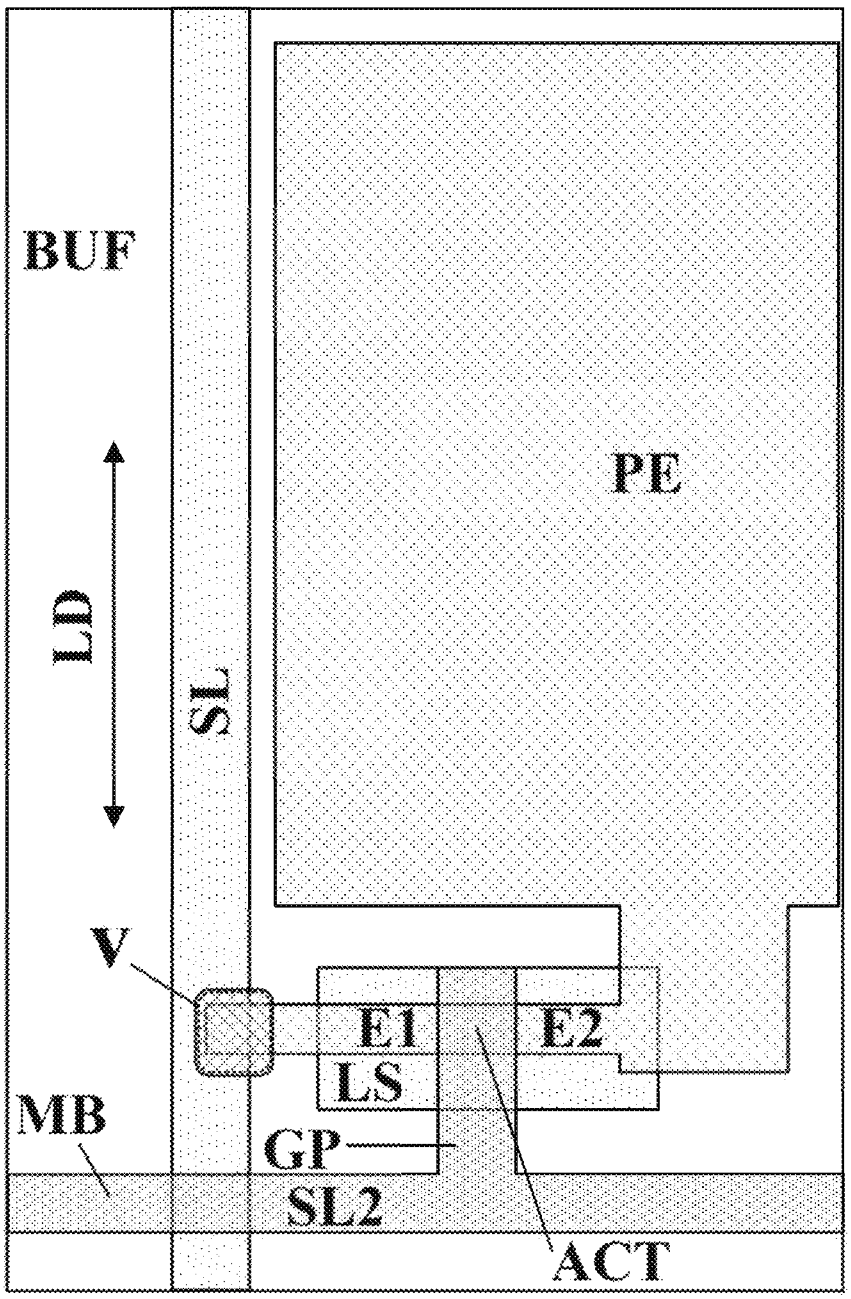
FIG. 14E is a plan view of an array substrate in some embodiments according to the present disclosure.

FIG. 14E is a plan view of an array substrate in some embodiments according to the present disclosure. The structure of the array substrate depicted in FIG. 14B is similar to the structure of the array substrate depicted in FIG. 14C. In the array substrates depicted in FIG. 14C and FIG. 14E, the second signal line SL2 includes a protrusion GP protruding away from a main body MB of the second signal line SL2. The main body MB extends along a direction, e.g., substantially perpendicular to the length direction LD, the protrusion GP extends along a direction, e.g., substantially parallel to the length direction LD. The protrusion GP includes a portion that functions as, e.g., a gate electrode for the transistor. In the array substrate depicted in FIG. 14C, the protrusion GP and the pixel electrode PE electrically connected to a same transistor are on two different sides with respect to the main body MB. In the array substrate depicted in FIG. 14E, the protrusion GP and the pixel electrode PE electrically connected to a same transistor are on a same side with respect to the main body MB.

Figure 14F:
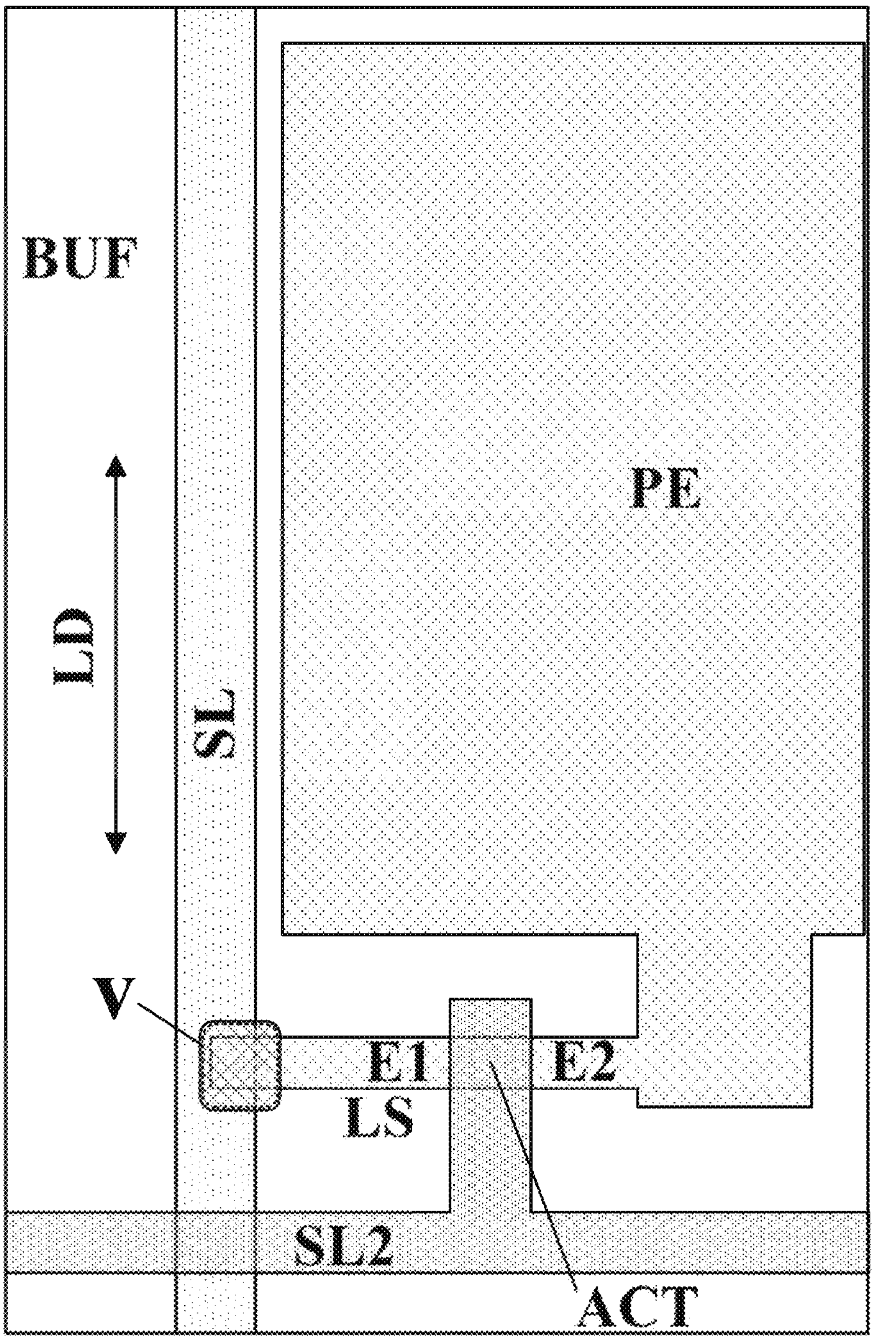
FIG. 14F is a plan view of an array substrate in some embodiments according to the present disclosure.

FIG. 14F is a plan view of an array substrate in some embodiments according to the present disclosure. The structure of the array substrate depicted in FIG. 14F is similar to the structure of the array substrate depicted in FIG. 14E except that the array substrate depicted in FIG. 14F is absent of a light shield.

In some embodiments, the insulating layer IN is formed to extend substantially throughout the array substrate, as shown in FIG. 15.

In some embodiments, the insulating layer does not extend substantially throughout the array substrate. For example, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate.

Figure 17:
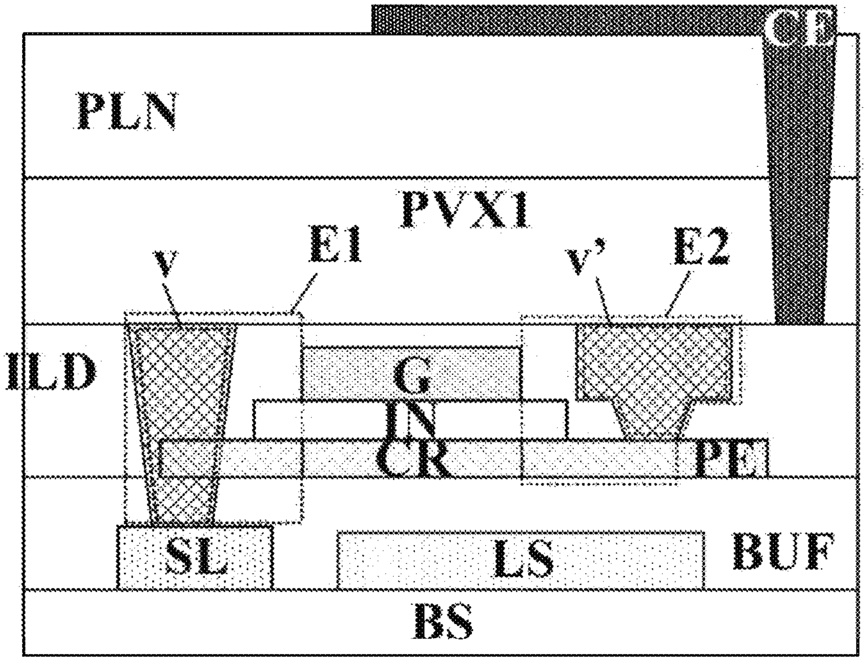
FIG. 17 is a cross-sectional view of an array substrate in some embodiments according to the present disclosure.

FIG. 17 is a cross-sectional view of an array substrate in some embodiments according to the present disclosure. The structure shown in FIG. 17 is similar to the structure shown in FIG. 15, but differs from the structure shown in FIG. 15 at least in that the insulating layer IN does not extend substantially throughout the array substrate depicted in FIG. 17.

Figure 18:
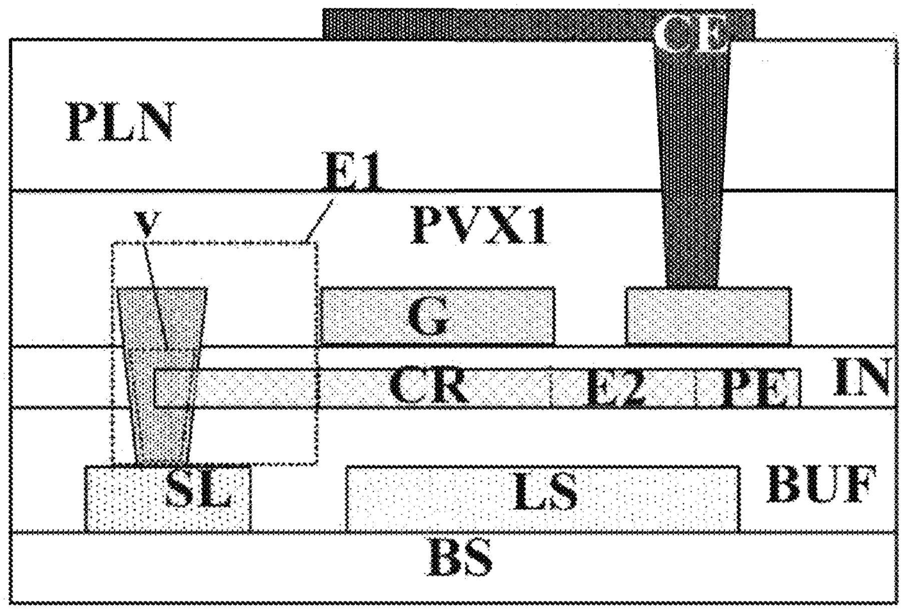
FIG. 18 is a cross-sectional view of an array substrate in some embodiments according to the present disclosure.
Figure 19:
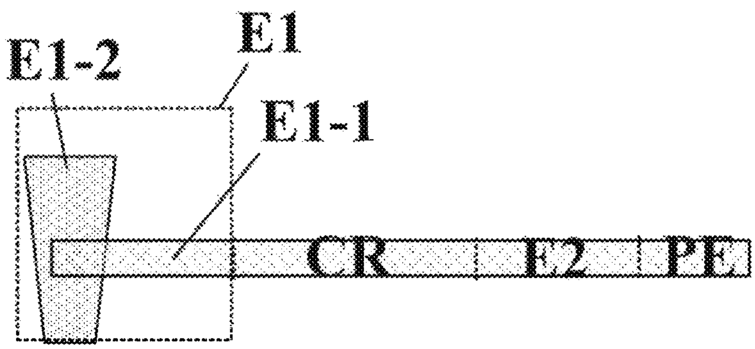
FIG. 19 is a schematic diagram illustrating the structure of a first electrode, a channel region, and a second electrode in the array substrate depicted in FIG. 18.

FIG. 18 is a cross-sectional view of an array substrate in some embodiments according to the present disclosure. FIG. 18 may be a cross-sectional view along a D-D' line in FIG. 14A. FIG. 19 is a schematic diagram illustrating the structure of a first electrode, a channel region, and a second electrode in the array substrate depicted in FIG. 18. Referring to FIG. 18 and FIG. 19, in some embodiments, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

Referring to FIG. 18, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, a second electrode E2 (e.g., a drain electrode of a transistor), and a pixel electrode PE on a side of the buffer layer BUF away from the base substrate BS; an insulating layer IN (e.g., a gate insulating layer) on a side of at least the channel region CR and the pixel electrode PE away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; and a common electrode CE on a side of the planarization layer PLN away from the first passivation layer PVX1.

In some embodiments, when the channel region CR, the first electrode E1 or the second electrode E2 include $M1O_aN_b$, the first electrode E1 or the second electrode E2 differs from the channel region CR in that at least a portion of the first electrode E1 or a portion of the second electrode E2 is subject to a process to make it more conductive. In one example, when the channel region CR, the first electrode E1 or the second electrode E2 include $M1O_aN_b$, at least a portion of the $M1O_aN_b$ in the first electrode E1 or the second electrode E2 is subject to a lightly doped drain process (e.g., a lightly-doping ion implantation process).

The structure of the array substrate shown in FIG. 18 and FIG. 19 is similar to the structure of the array substrate shown in FIG. 5 and FIG. 6, but differs from the structure of the array substrate shown in FIG. 5 and FIG. 6 at least in that the pixel electrode PE is in a same layer as the channel region CR, at least a portion of the first electrode E1, or at least a portion of the second electrode E2 in the array substrate shown in FIG. 18 and FIG. 19.

In some embodiments, the second electrode part E1-2 and the gate electrode G are in a same layer and comprise a same electrode material. In another example, the second electrode part E1-2 and the gate electrode G are formed in a same patterning process using a same mask plate.

Figure 20:
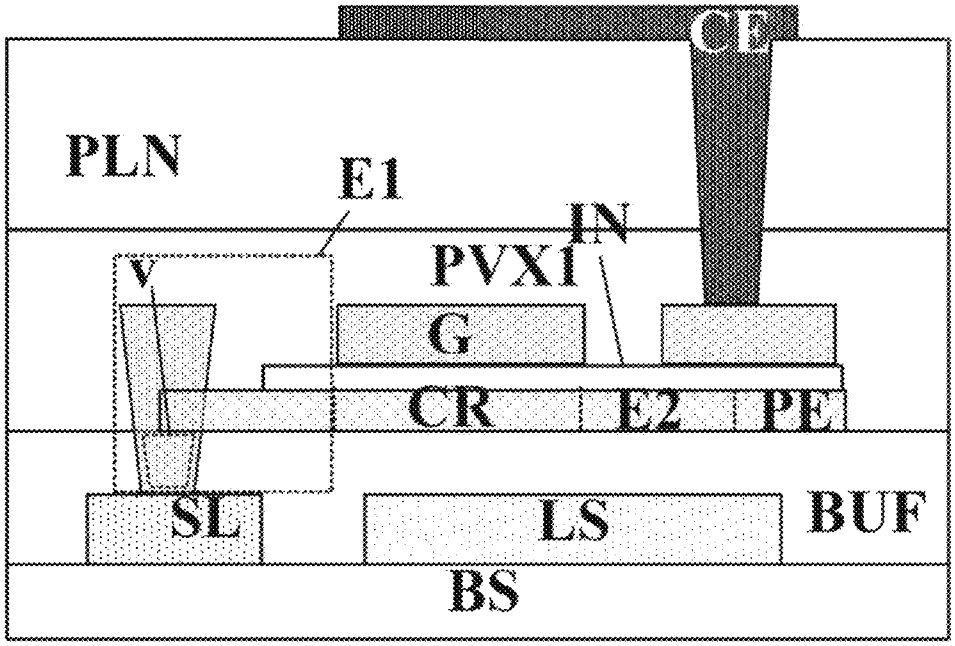
FIG. 20 is a cross-sectional view of an array substrate in some embodiments according to the present disclosure.

FIG. 20 is a cross-sectional view of an array substrate in some embodiments according to the present disclosure. The structure shown in FIG. 20 is similar to the structure shown in FIG. 18, but differs from the structure shown in FIG. 18 at least in that the insulating layer IN does not extend substantially throughout the array substrate depicted in FIG. 20.

Figure 21:
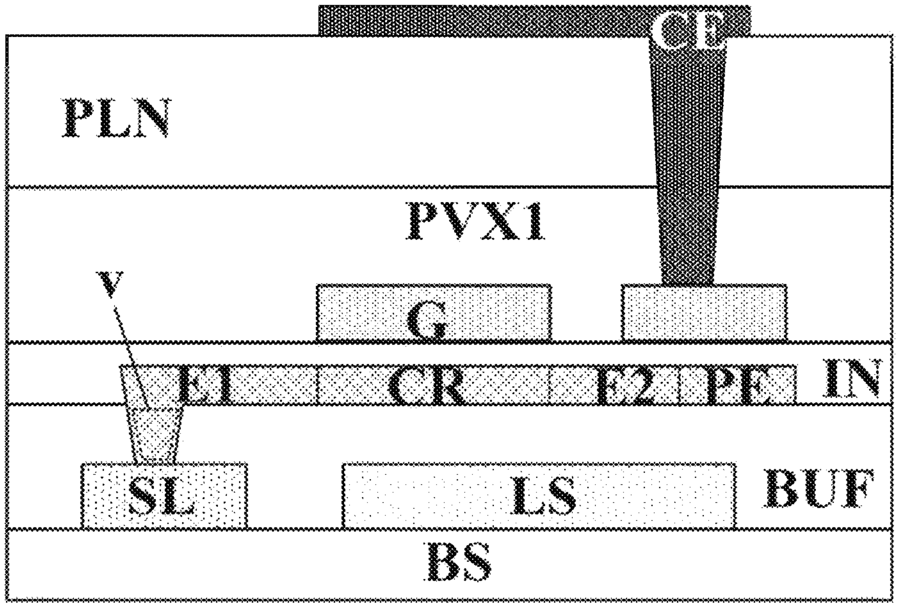
FIG. 21 is a cross-sectional view of an array substrate in some embodiments according to the present disclosure.

FIG. 21 is a cross-sectional view of an array substrate in some embodiments according to the present disclosure. Referring to FIG. 21, in some embodiments, the pixel electrode PE, the channel region CR, the first electrode E1, and the second electrode E2 include $M1O_aN_b$. The pixel electrode PE, the channel region CR, the first electrode E1, and the second electrode E2 are parts of a unitary structure, Optionally, pixel electrode PE, the first electrode E1 or the second electrode E2 differs from the channel region CR in that pixel electrode PE, at least a portion of the first electrode E1, or at least a portion of the second electrode E2 is subject to a process to make it more conductive.

In some embodiments, the array substrate includes a via v extending through at least the buffer layer BUF. The first electrode E1 at least partially in the via v. Optionally, the first electrode E1 extends to the via v to connect to the signal line SL.

Referring to FIG. 21, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a pixel electrode PE, a first electrode E1 (e.g., a source electrode of a transistor), a channel region CR, and a second electrode E2 (e.g., a drain electrode of a transistor) on a side of the buffer layer BUF away from the base substrate BS; an insulating layer IN (e.g., a gate insulating layer) on a side of at least the channel region CR and the pixel electrode PE away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; and a common electrode CE on a side of the planarization layer PLN away from the first passivation layer PVX1.

Figure 22:
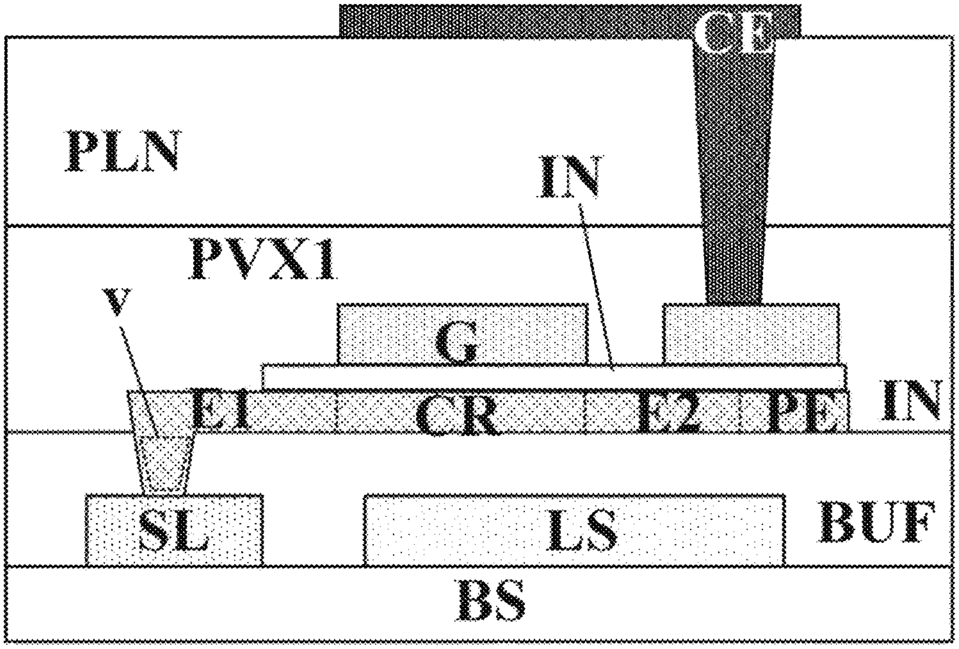
FIG. 22 is a cross-sectional view of an array substrate in some embodiments according to the present disclosure.

FIG. 22 is a cross-sectional view of an array substrate in some embodiments according to the present disclosure. The structure shown in FIG. 22 is similar to the structure shown in FIG. 21, but differs from the structure shown in FIG. 21 at least in that the insulating layer IN does not extend substantially throughout the array substrate depicted in FIG. 22.

Figure 23:
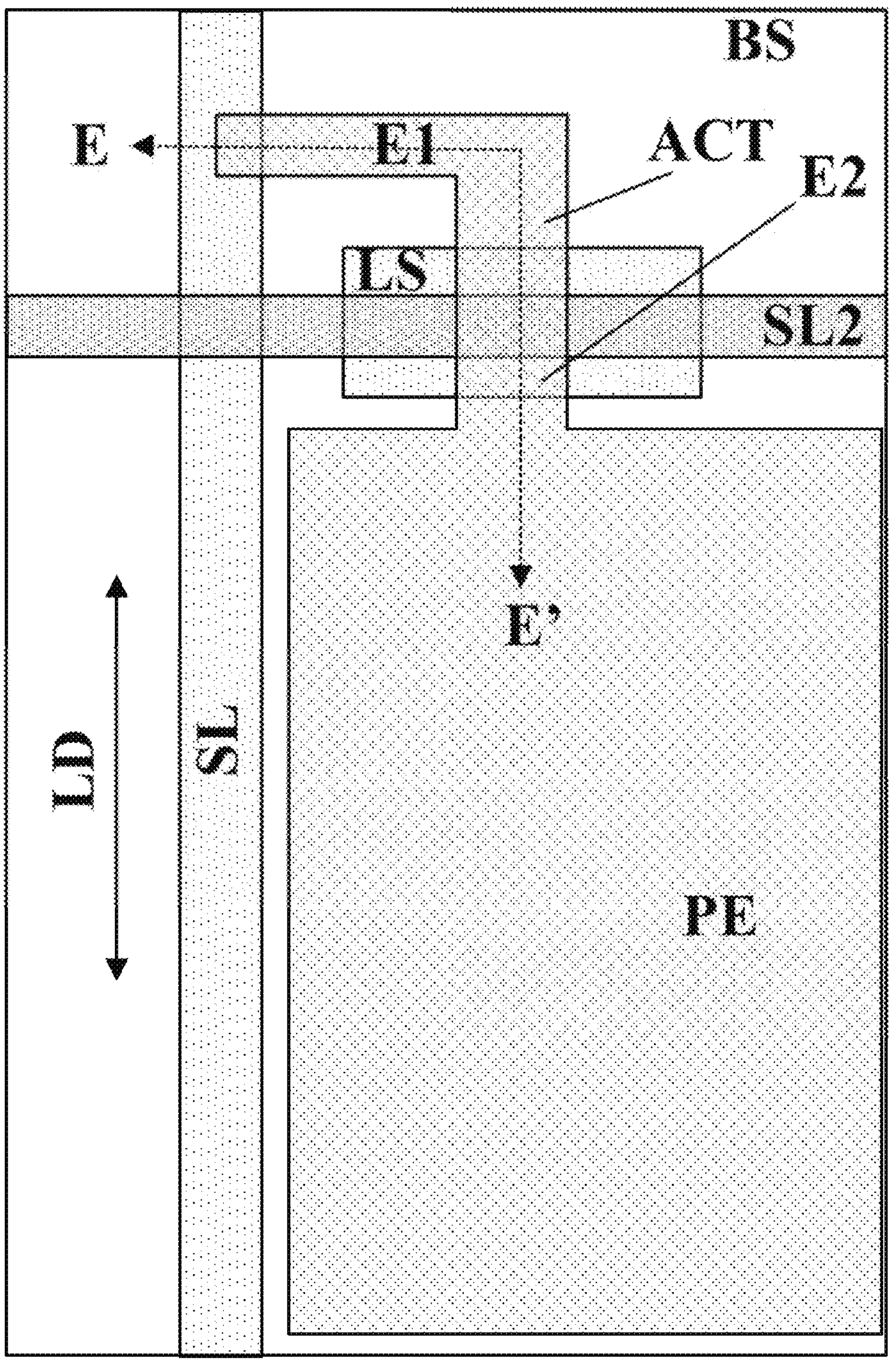
FIG. 23 is a plan view of an array substrate in some embodiments according to the present disclosure.
Figure 24:
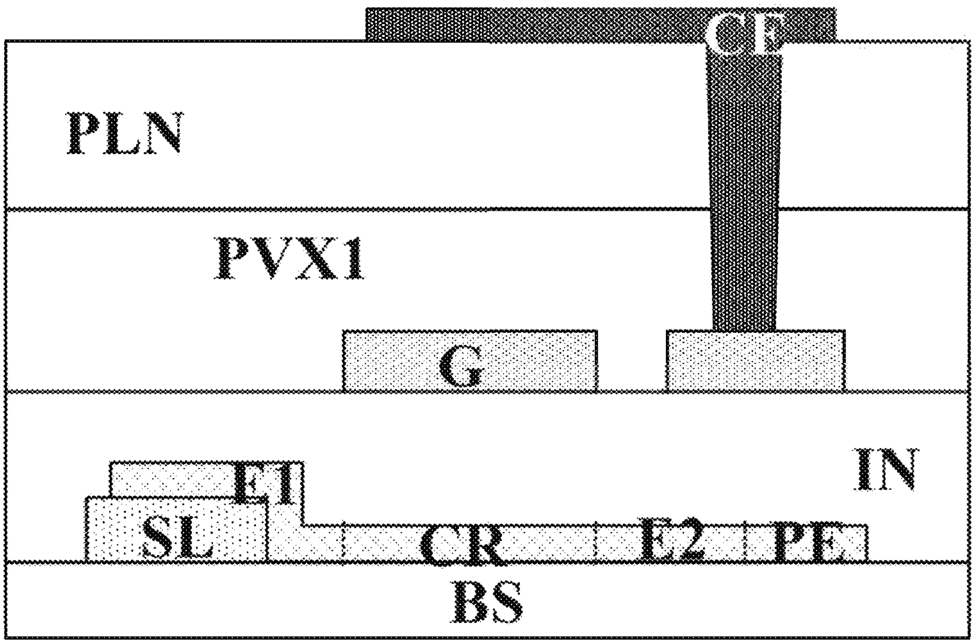
FIG. 24 is a cross-sectional view of an array substrate in some embodiments according to the present disclosure.

FIG. 23 is a plan view of an array substrate in some embodiments according to the present disclosure, FIG. 24 is a cross-sectional view of an array substrate in some embodiments according to the present disclosure. FIG. 24 may be a cross-section along a E-E' line in FIG. 23, Referring to FIG. 23 and FIG, 24, the array substrate in some embodiments includes a base substrate BS; a signal line SL (e.g., a data line configured to provide a data signal to a transistor) on the base substrate BS; a pixel electrode PE, a first electrode E1 (e.g., a source electrode of a transistor), a channel region CR, and a second electrode E2 (e.g., a drain electrode of a transistor) on a side of the signal line SL away from the base substrate BS; an insulating layer IN (e.g., a gate insulating layer) on a side of at least the channel region CR and the pixel electrode PE away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; and a common electrode CE on a side of the planarization layer PLN away from the first passivation layer PVX1.

Figure 25:
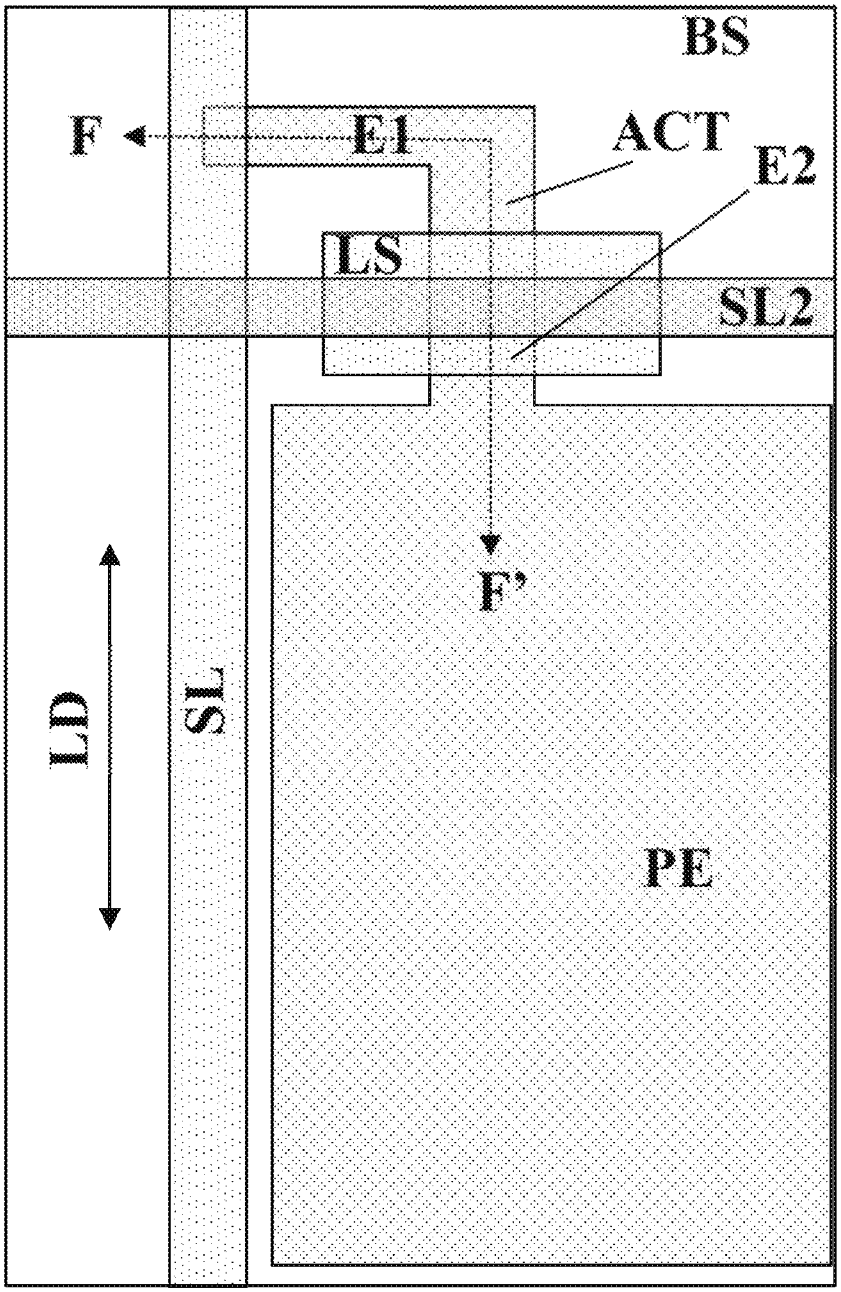
FIG. 25 is a plan view of an array substrate in some embodiments according to the present disclosure.
Figure 26:
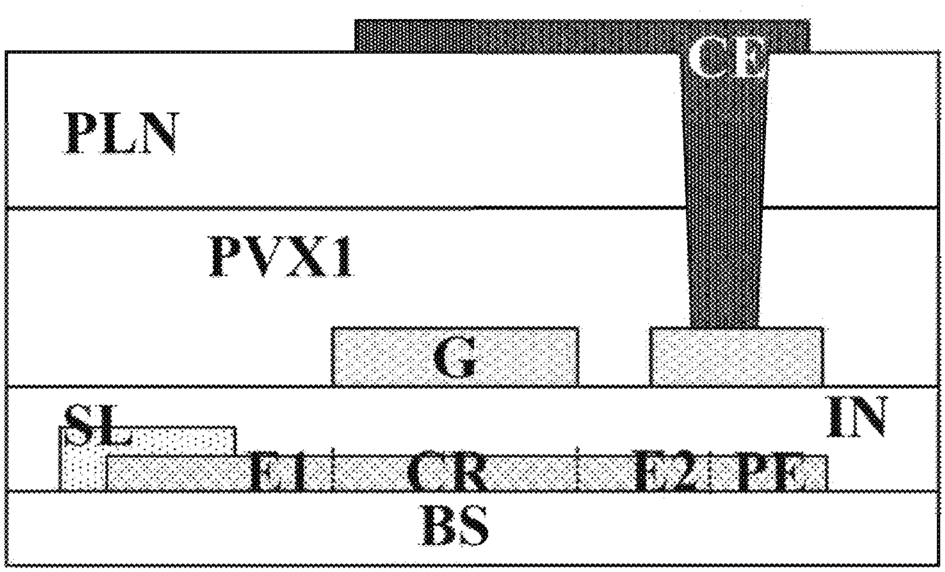
FIG. 26 is a cross-sectional view of an array substrate in some embodiments according to the present disclosure.

FIG. 25 is a plan view of an array substrate in some embodiments according to the present disclosure. FIG. 26 is a cross-sectional view of an array substrate in some embodiments according to the present disclosure. FIG. 26 may be a cross-section along a F-F' line in FIG. 25, Referring to FIG. 25 and FIG. 26, the array substrate in some embodiments includes a base substrate BS; a pixel electrode PE, a first electrode E1 (e.g., a source electrode of a transistor), a channel region CR, and a second electrode E2 (e.g., a drain electrode of a transistor) on the base substrate BS; a signal line SL (e.g., a data line configured to provide a data signal to a transistor) on a side of at least the first electrode E1 away from the base substrate BS; an insulating layer IN (e.g., a gate insulating layer) on a side of the signal line SL, the pixel electrode PE, the first electrode E1, the channel region CR, and the second electrode E2 away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; and a common electrode CE on a side of the planarization layer PLN away from the first passivation layer PVX1.

Referring to FIG. 23, FIG. 24, FIG. 25, and FIG. 26, in some embodiments, the pixel electrode PE, the channel region CR, the first electrode E1, and the second electrode E2 include $M1O_aN_b$. The pixel electrode PE, the channel region CR, the first electrode E1, and the second electrode E2 are parts of a unitary structure. Optionally, the pixel electrode PE, the first electrode E1 or the second electrode E2 differs from the channel region CR in that the pixel electrode, at least a portion of the first electrode E1 or at least a portion of the second electrode E2 are subject to a process to make it more conductive.

Referring to FIG. 23, FIG. 24, FIG. 25, and FIG. 26, in some embodiments, the signal line SL is in direct contact with the first electrode E1. In the example depicted in FIG. 25 and FIG. 26, an entirety of a combination of the signal line SL, the pixel electrode PE, the channel region CR, the first electrode E1, and the second electrode E2 are between the insulating layer IN and the base substrate BS. The signal line SL, the pixel electrode PE, the channel region CR, the first electrode E1, and the second electrode E2 are all in direct contact with a surface (e.g., an upper surface) of the base substrate BS. Optionally, the signal line SL, the pixel electrode PE, the channel region CR, the first electrode E1, and the second electrode E2 are all in direct contact with a surface (e.g., a lower surface) of the insulating layer IN.

Referring to FIG. 23 and FIG. 24, in a cross-section along a plane perpendicular to the base substrate BS and perpendicular to a length direction LD along which the signal line SL extends, and intersecting the signal line SL (e.g., the cross-section as shown in FIG. 24), the first electrode E1 covers an upper surface of at least a portion of the signal line SL, and optionally further covers at least one of two lateral surfaces of the signal line SL. An orthographic projection of the first electrode E1 on the base substrate BS at least partially overlaps with an orthographic projection of the signal line SL on the base substrate BS.

Referring to FIG. 25 and FIG. 26, in a cross-section along a plane perpendicular to the base substrate BS and perpendicular to a length direction LD along which the signal line SL extends, and intersecting the signal line SL (e.g., the cross-section as shown in FIG. 26), the signal line SL covers an upper surface of at least a portion of the first electrode E1, and optionally further covers at least a lateral surface of the first electrode E1. An orthographic projection of the signal line SL on the base substrate BS at least partially overlaps with an orthographic projection of the first electrode E1 on the base substrate BS.

Figure 27A:
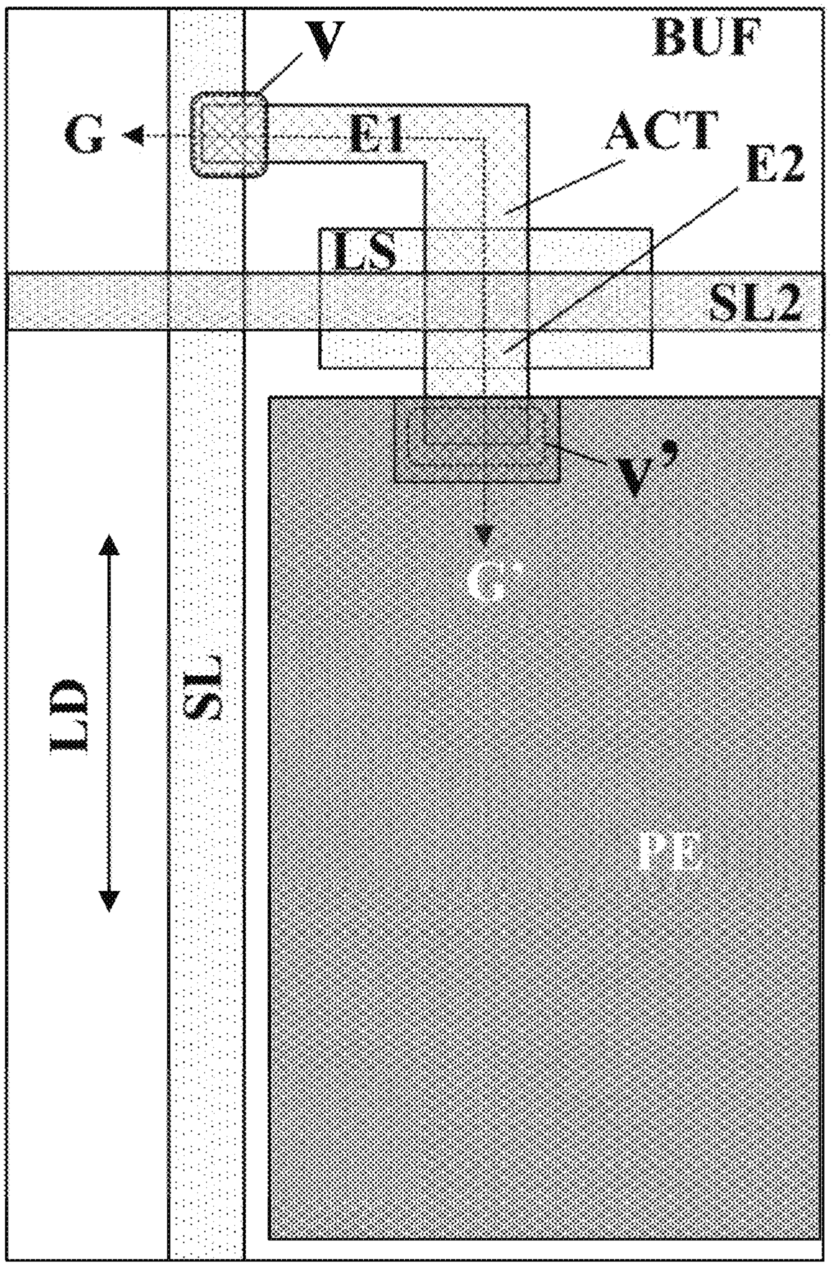
FIG. 27A is a plan view of an array substrate in some embodiments according to the present disclosure.
Figure 28:
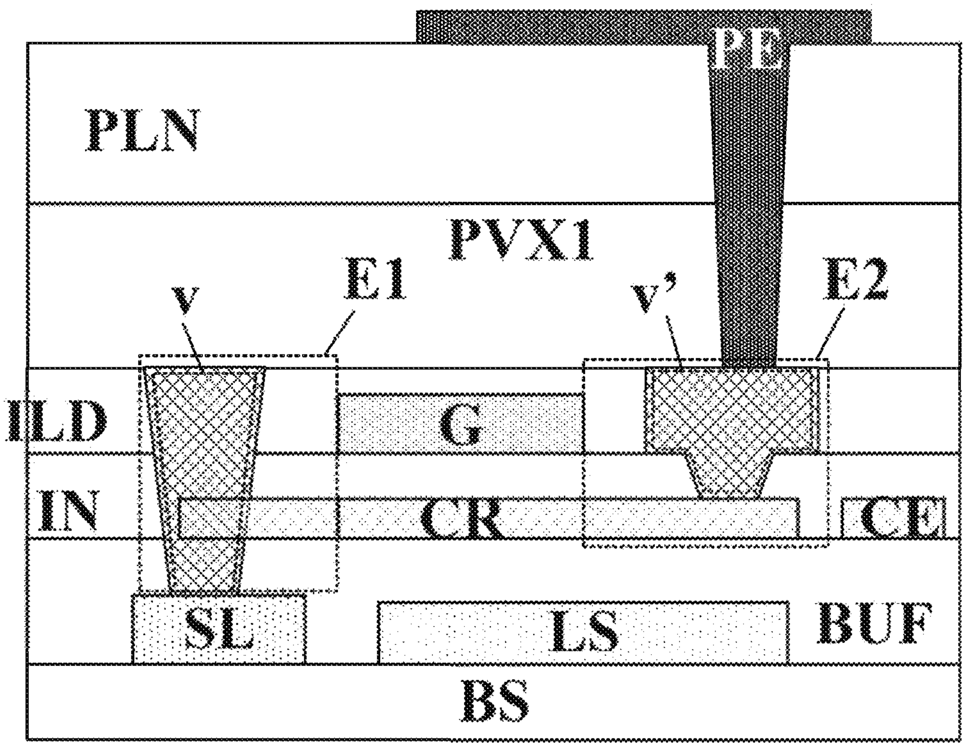
FIG. 28 is a cross-sectional view of an array substrate in some embodiments according to the present disclosure.

FIG. 27A is a plan view of an array substrate in some embodiments according to the present disclosure. FIG. 28 is a cross-sectional view of an array substrate in some embodiments according to the present disclosure, FIG. 28 may be a cross-sectional view along a G-G' line in FIG. 27A. Referring to FIG. 27A and FIG. 28, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, a second electrode E2 (e.g., a drain electrode of a transistor), and a common electrode CE on a side of the buffer layer BUF away from the base substrate BS; an insulating layer IN (e.g., a gate insulating layer) on a side of at least the channel region CR and the common electrode CE away from the buffer layer BUF; a gate electrode G on a side of the insulating layer IN away from the channel region CR; an inter-layer dielectric layer ILD on a side of the gate electrode G away from the insulating layer IN; a first passivation layer PVX1 on a side of the inter-layer dielectric layer ILD away from the insulating layer IN; a planarization layer PLN on a side of the first passivation layer PVX1 away from the inter-layer dielectric layer ILD; and a pixel electrode PE on a side of the planarization layer PLN away from the first passivation layer PVX1.

In some embodiments, when the channel region CR, the first electrode E1 or the second electrode E2 include $M1O_aN_b$, the first electrode E1 or the second electrode E2 differs from the channel region CR in that at least a portion of the first electrode E1 or a portion of the second electrode E2 is subject to a process to make it more conductive. In one example, when the channel region CR, the first electrode E1 or the second electrode E2 include $M1O_aN_b$, at least a portion of the $M1O_aN_b$ in the first electrode E1 or the second electrode E2 are subject to a lightly doped drain process (e.g., a lightly-doping ion implantation process).

Figure 29:
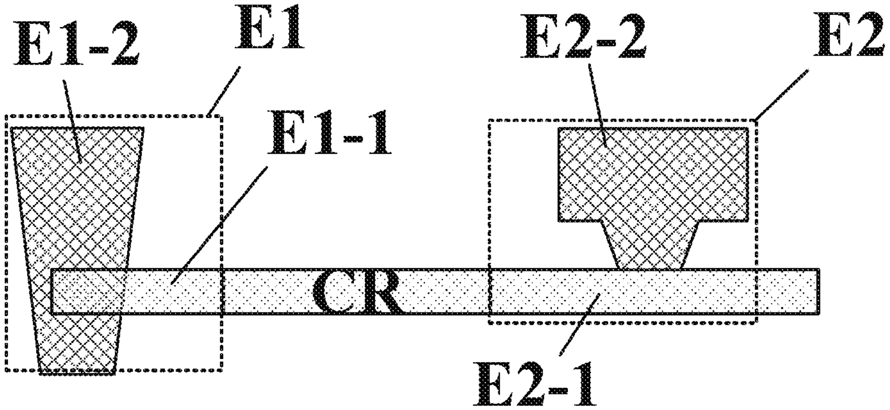
FIG. 29 is a schematic diagram illustrating the structure of a first electrode, a channel region, and a second electrode in the array substrate depicted in FIG. 28.

FIG. 29 is a schematic diagram illustrating the structure of a first electrode, a channel region, and a second electrode in the array substrate depicted in FIG. 28. In some embodiments, referring to FIG. 27A, FIG. 28, and FIG. 29, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

In some embodiments, referring to FIG. 27A, FIG. 28, and FIG. 29, the second electrode E2 includes a third electrode part E2-1 and a fourth electrode part E2-2 electrically connected together. The third electrode part E2-1 and the fourth electrode part E2-2 are made of different materials. Optionally, the fourth electrode part E2-2 is in direct contact with the third electrode part E2-1, and is on a side of the third electrode part E2-1 away from the base substrate BS.

In the array substrate shown in FIG. 27A and FIG. 28, the common electrode CE is in a same layer as the channel region CR, at least a portion of the first electrode E1, or at least a portion of the second electrode E2, and the pixel electrode PE is on a side of the first passivation layer PVX1 away from the channel region CR, at least a portion of the first electrode E1, or at least a portion of the second electrode E2. In the array substrate shown in FIG. 14A and FIG. 15, the pixel electrode PE is in a same layer as the channel region CR, at least a portion of the first electrode E1, or at least a portion of the second electrode E2, and the common electrode CE is on a side of the first passivation layer PVX1 away from the channel region CR, at least a portion of the first electrode E1, or at least a portion of the second electrode E2.

In some embodiments, the channel region CR, at least a portion of the first electrode E1, and at least a portion of the second electrode E2 are parts of a unitary structure. In some embodiments, the common electrode CE, the channel region CR, at least a portion of the first electrode E1, and at least a portion of the second electrode E2 include $M1O_aN_b$. Optionally, the common electrode CE, at least a portion of the first electrode E1, or at least a portion of the second electrode E2 differs from the channel region CR in that the common electrode CE, at least a portion of the first electrode E1, or at least a portion of the second electrode E2 is subject to a process to make it more conductive. In one example, the common electrode CE, the channel region CR, at least a portion of the first electrode E1, and at least a portion of the second electrode E2 include indium gallium tin oxide.

In some embodiments, the second electrode part E1-2 and the fourth electrode part E2-2 are formed subsequent to forming the gate electrode G. For example, the second electrode part E1-2 and the fourth electrode part E2-2 are in a layer on a side of the gate electrode G away from the base substrate BS.

Figure 27B:
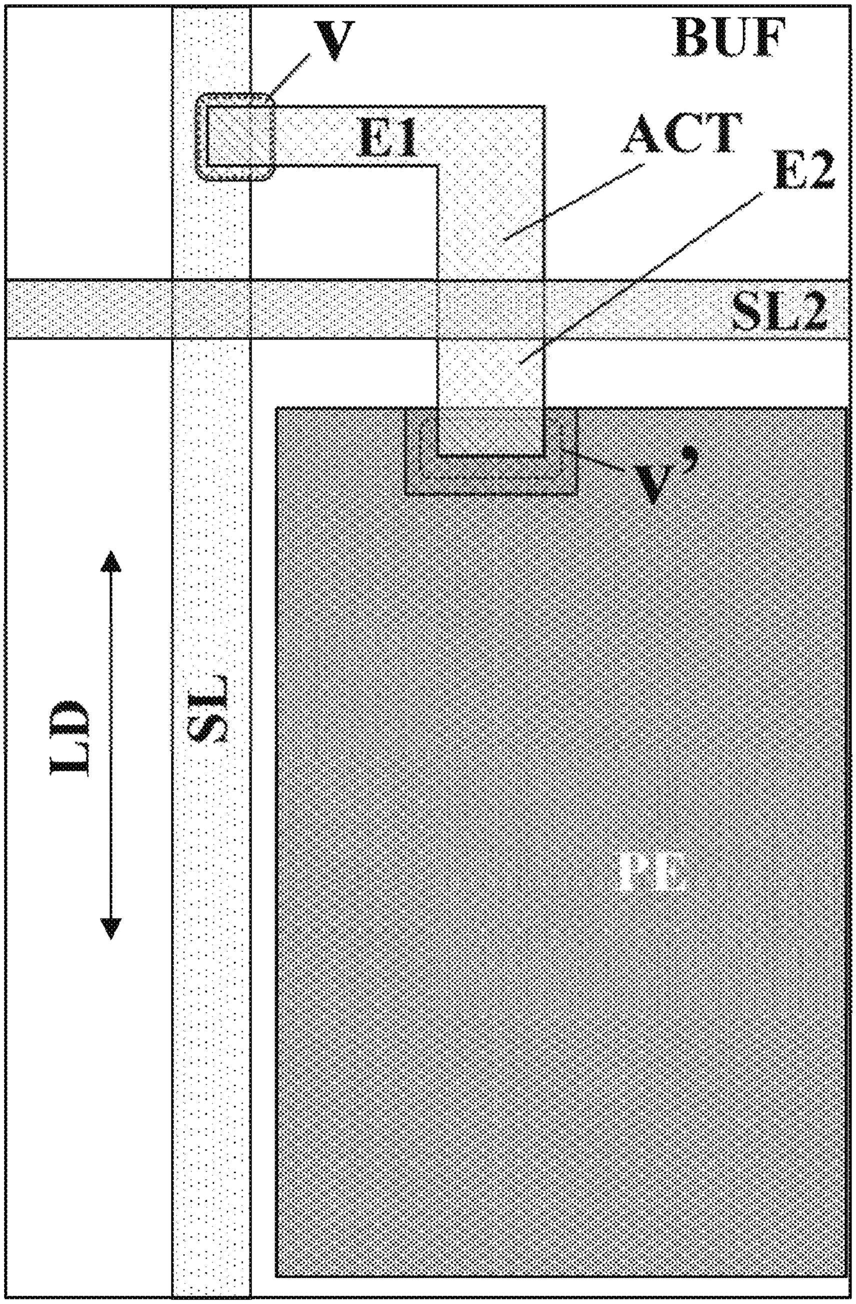
FIG. 27B is a plan view of an array substrate in some embodiments according to the present disclosure.

FIG. 27B is a plan view of an array substrate in some embodiments according to the present disclosure. The structure of the array substrate depicted in FIG. 27B is similar to the structure of the array substrate depicted in FIG. 27A except that the array substrate depicted in FIG. 27B is absent of a light shield.

Figure 27C:
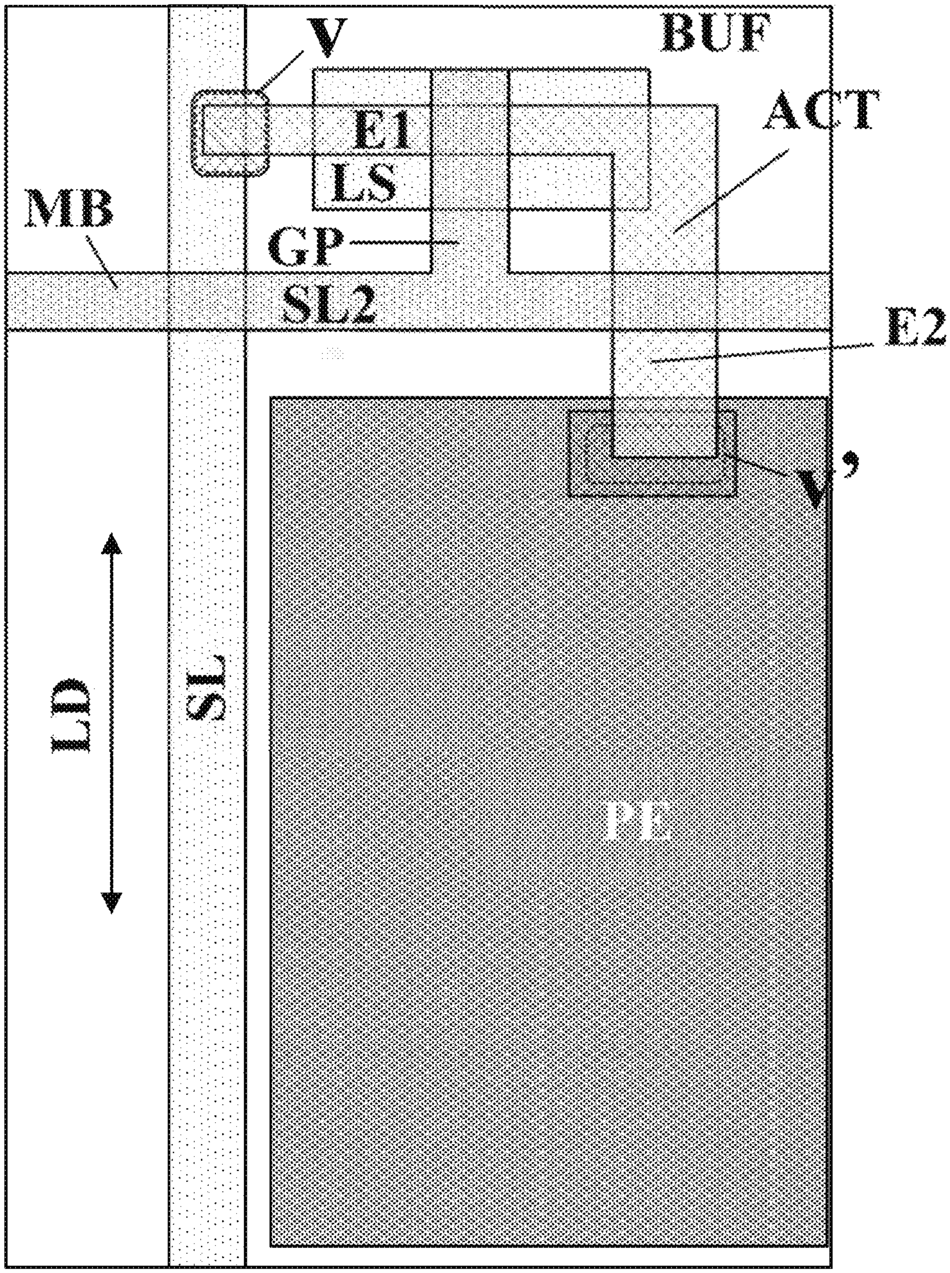
FIG. 27C is a plan view of an array substrate in some embodiments according to the present disclosure.

FIG. 27C is a plan view of an array substrate in some embodiments according to the present disclosure, The structure of the array substrate depicted in FIG. 27C is similar to the structure of the array substrate depicted in FIG. 27A except that the array substrate depicted in FIG. 27C has a double gate thin film transistor. As shown in FIG. 27C, two portions of the gate electrode are parts of the second signal line SL2. The second signal line SL2 includes a protrusion protruding from a main body of the second signal line along a direction substantially parallel to the length direction LD. An orthographic projection of the protrusion on the base substrate overlaps with an orthographic projection of one of two portions of the active layer ACT on the base substrate.

Figure 27D:
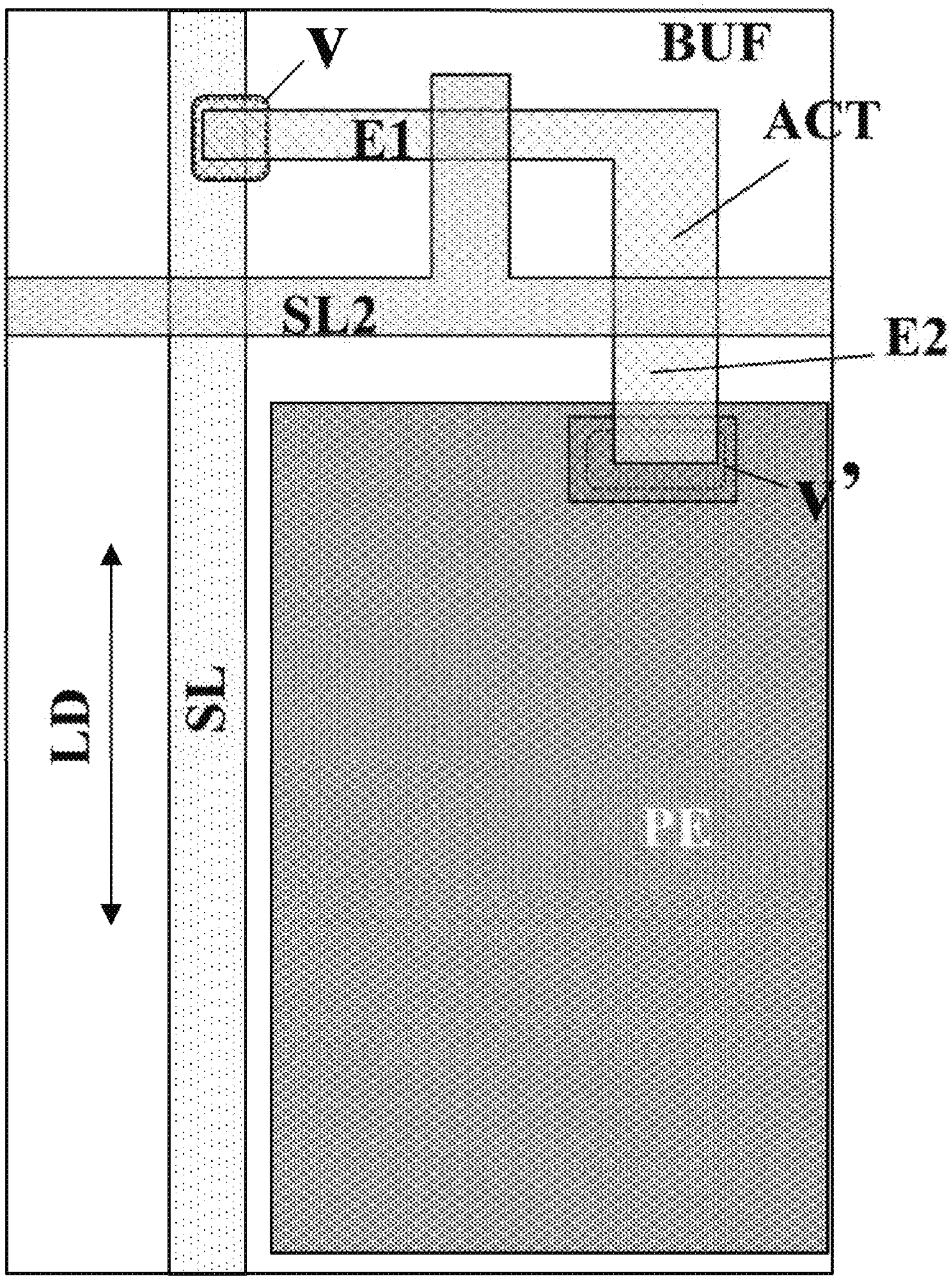
FIG. 27D is a plan view of an array substrate in some embodiments according to the present disclosure.

FIG. 27D is a plan view of an array substrate in some embodiments according to the present disclosure. The structure of the array substrate depicted in FIG. 27D is similar to the structure of the array substrate depicted in FIG. 27C except that the array substrate depicted in FIG. 27D is absent of a light shield.

Figure 27E:
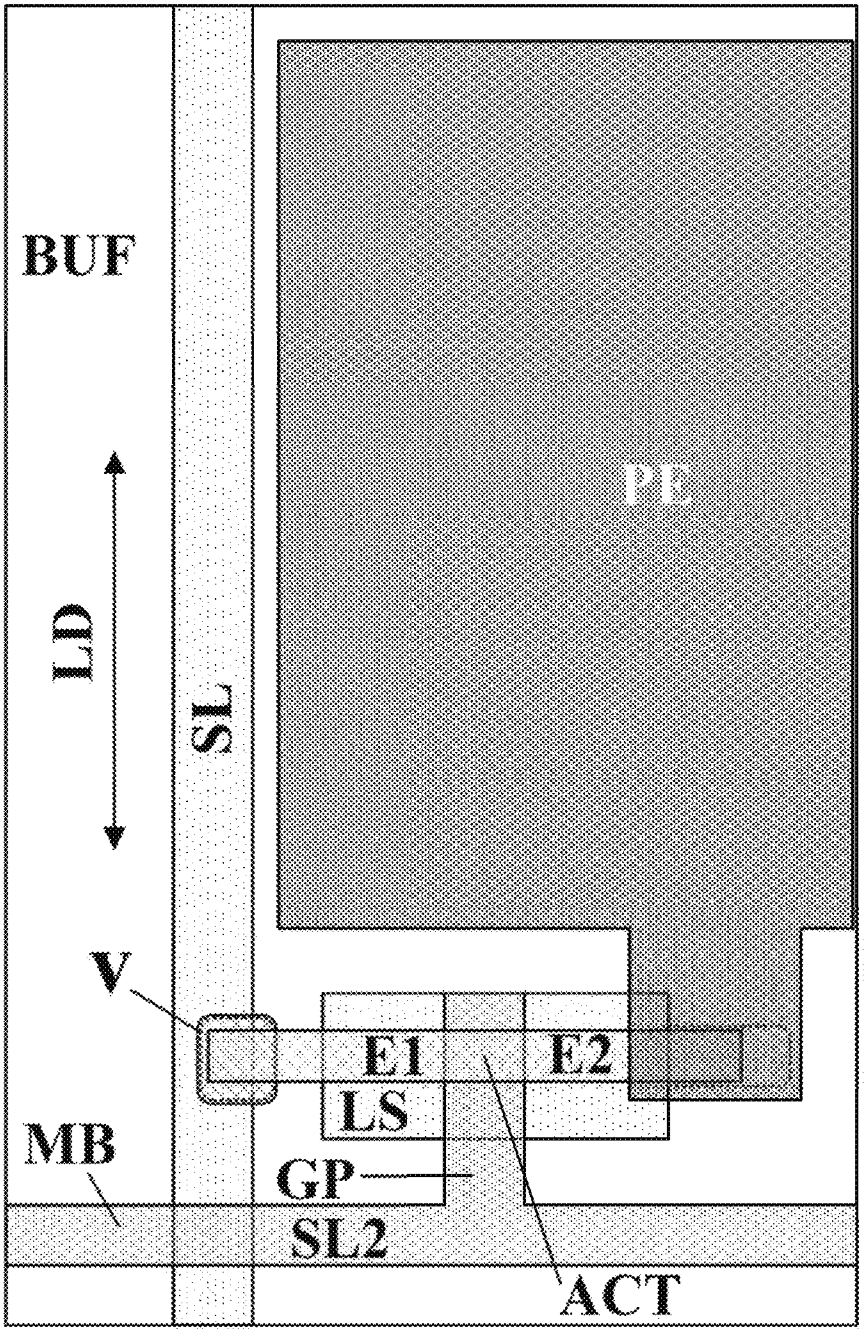
FIG. 27E is a plan view of an array substrate in some embodiments according to the present disclosure.

FIG. 27E is a plan view of an array substrate in some embodiments according to the present disclosure. The structure of the array substrate depicted in FIG. 27E is similar to the structure of the array substrate depicted in FIG. 27C. In the array substrates depicted in FIG. 27C and FIG. 27E, the second signal line SL2 includes a protrusion GP protruding away from a main body MB of the second signal line SL2. The main body MB extends along a direction, e.g., substantially perpendicular to the length direction LD, the protrusion GP extends along a direction, e.g., substantially parallel to the length direction LD. The protrusion GP includes a portion that functions as, e.g., a gate electrode for the transistor. In the array substrate depicted in FIG. 27C, the protrusion GP and the pixel electrode PE electrically connected to a same transistor are on two different sides with respect to the main body MB. In the array substrate depicted in FIG. 27E, the protrusion GP and the pixel electrode PE electrically connected to a same transistor are on a same side with respect to the main body MB.

Figure 27F:
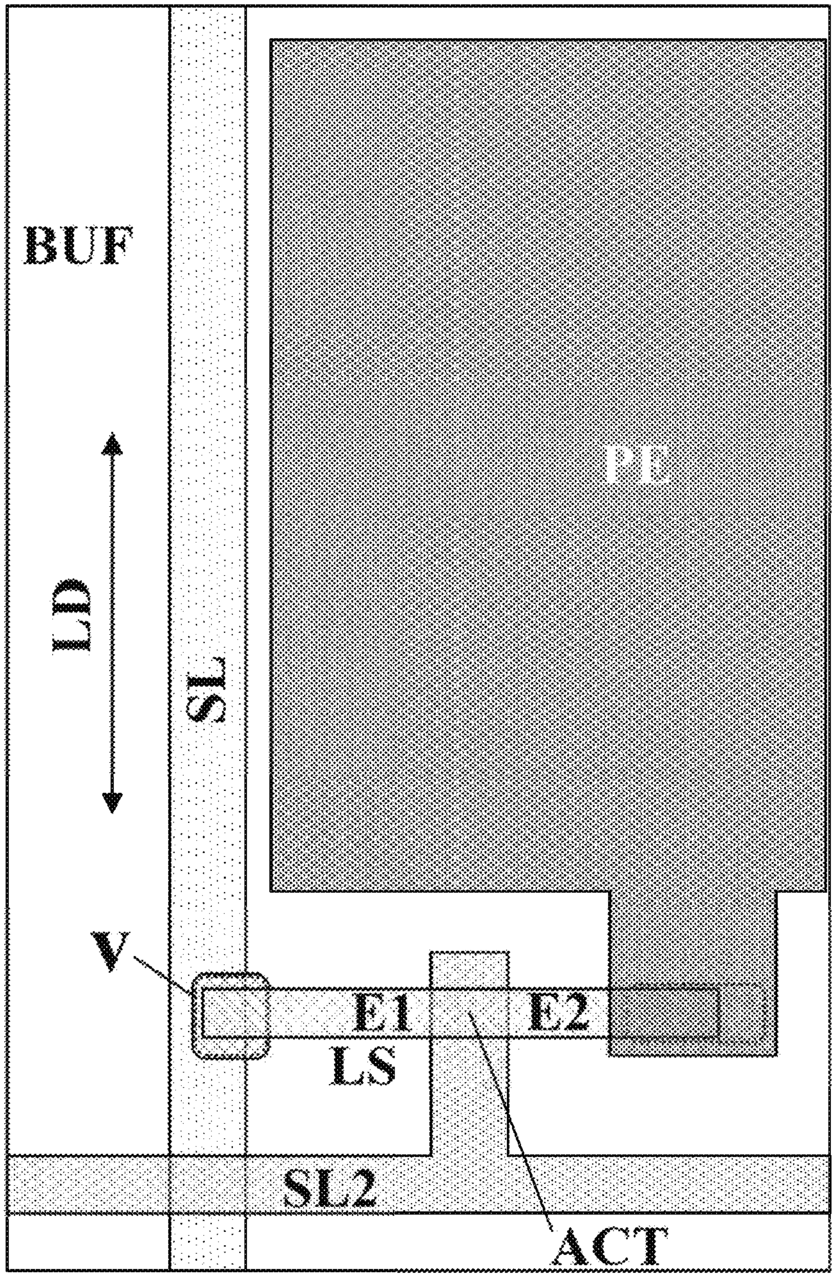
FIG. 27F is a plan view of an array substrate in some embodiments according to the present disclosure.

FIG. 27F is a plan view of an array substrate in some embodiments according to the present disclosure. The structure of the array substrate depicted in FIG. 27F is similar to the structure of the array substrate depicted in FIG. 27E except that the array substrate depicted in FIG. 27F is absent of a light shield.

In some embodiments, the insulating layer IN is formed to extend substantially throughout the array substrate, as shown in FIG. 28.

In some embodiments, the insulating layer does not extend substantially throughout the array substrate. For example, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate.

Figure 30:
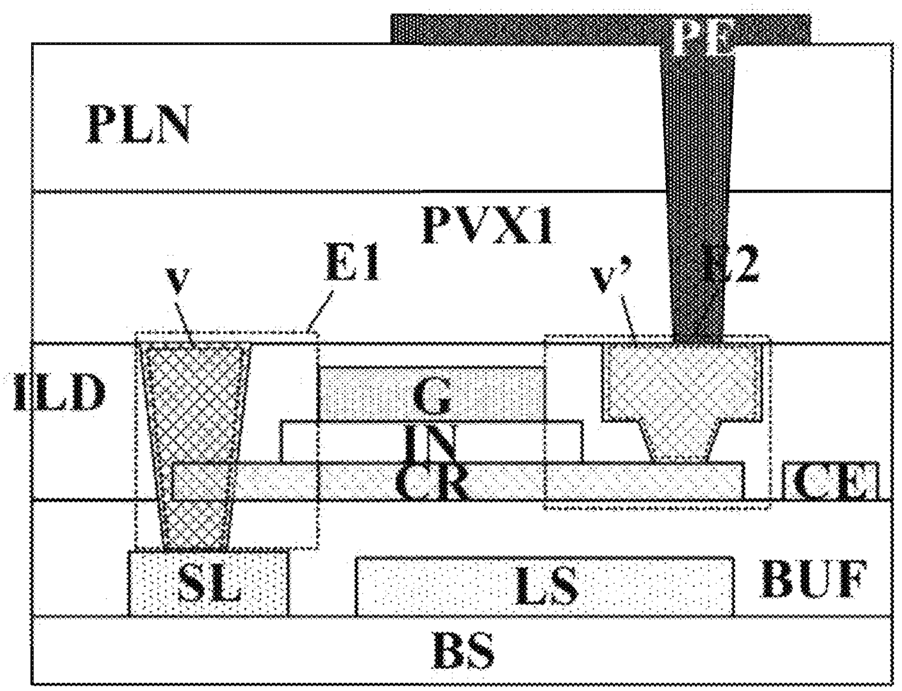
FIG. 30 is a cross-sectional view of an array substrate in some embodiments according to the present disclosure.

FIG. 30 is a cross-sectional view of an array substrate in some embodiments according to the present disclosure. The structure shown in FIG. 30 is similar to the structure shown in FIG. 28, but differs from the structure shown in FIG. 28 at least in that the insulating layer IN does not extend substantially throughout the array substrate depicted in FIG. 30.

Figure 31:
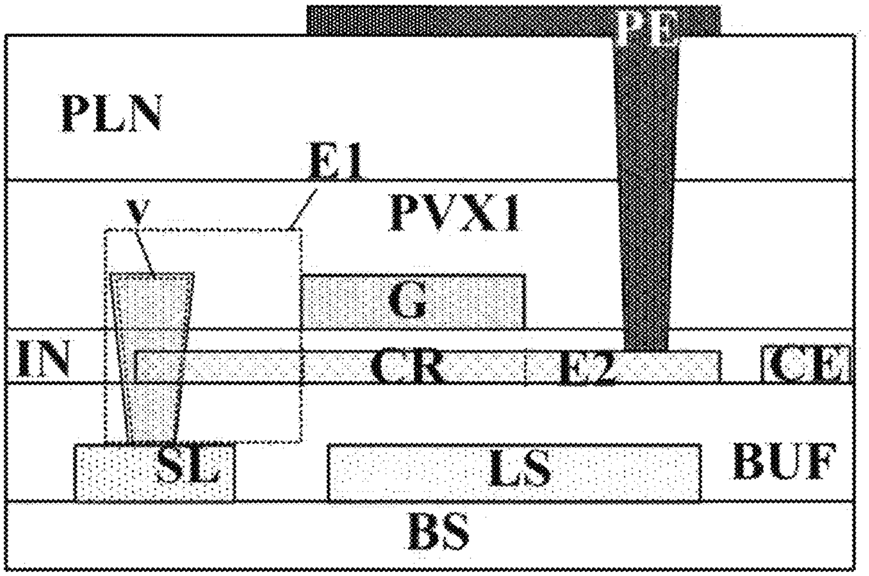
FIG. 31 is a cross-sectional view of an array substrate in some embodiments according to the present disclosure.
Figure 32:
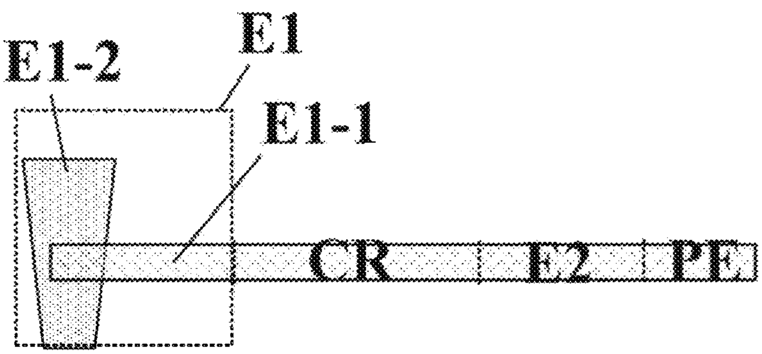
FIG. 32 is a schematic diagram illustrating the structure of a first electrode, a channel region, and a second electrode in the array substrate depicted in FIG. 31.

FIG. 31 is a cross-sectional view of an array substrate in some embodiments according to the present disclosure. FIG. 31 may be a cross-sectional view along a G-G' line in FIG. 27A. FIG. 32 is a schematic diagram illustrating the structure of a first electrode, a channel region, and a second electrode in the array substrate depicted in FIG. 31. Referring to FIG. 31 and FIG. 32, in some embodiments, the first electrode E1 includes a first electrode part E1-1 and a second electrode part E1-2 electrically connected together. The first electrode part E1-1 and the second electrode part E1-2 are made of different materials. Optionally, the first electrode part E1-1 at least partially extends into the second electrode part E1-2.

Referring to FIG. 31, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a first electrode E1 (e.g., a source electrode of a transistor), a channel region CR, a second electrode E2 (e.g., a drain electrode of a transistor), and a common electrode CE on a side of the buffer layer BUF away from the base substrate BS; an insulating layer IN (e.g., a gate insulating layer) on a side of at least the channel region CR and the common electrode CE away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; and a pixel electrode PE on a side of the planarization layer PLN away from the first passivation layer PVX1.

In some embodiments, when the channel region CR, the first electrode E1 or the second electrode E2 include $M1O_aN_b$, the first electrode E1 or the second electrode E2 differs from the channel region CR in that at least a portion of the first electrode E1 or a portion of the second electrode E2 is subject to a process to make it more conductive. In one example, when the channel region CR, the first electrode E1 or the second electrode E2 include $M1O_aN_b$, at least a portion of the $M1O_aN_b$ in the first electrode E1 or the second electrode E2 is subject to a lightly doped drain process (e.g., a lightly-doping ion implantation process).

In the array substrate shown in FIG. 31 and FIG. 32, the common electrode CE is in a same layer as the channel region CR, at least a portion of the first electrode E1, or at least a portion of the second electrode E2, and the pixel electrode PE is on a side of the first passivation layer PVX1 away from the channel region CR, at least a portion of the first electrode E1, or at least a portion of the second electrode E2. In the array substrate shown in FIG. 18 and FIG. 19, the pixel electrode PE is in a same layer as the channel region CR, at least a portion of the first electrode E1, or at least a portion of the second electrode E2, and the common electrode CE is on a side of the first passivation layer PVX1 away from the channel region CR, at least a portion of the first electrode E1, or at least a portion of the second electrode E2.

In some embodiments, the second electrode part E1-2 and the gate electrode G are in a same layer and comprise a same electrode material. In another example, the second electrode part E1-2 and the gate electrode G are formed in a same patterning process using a same mask plate.

Figure 33:
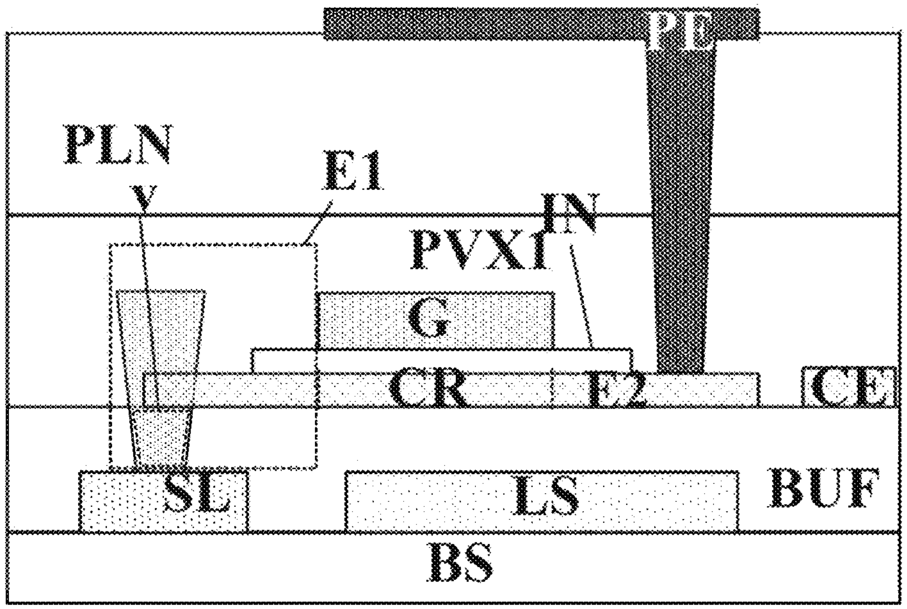
FIG. 33 is a cross-sectional view of an array substrate in some embodiments according to the present disclosure.

FIG. 33 is a cross-sectional view of an array substrate in some embodiments according to the present disclosure. The structure shown in FIG. 33 is similar to the structure shown in FIG. 31, but differs from the structure shown in FIG. 31 at least in that the insulating layer IN does not extend substantially throughout the array substrate depicted in FIG. 33.

Figure 34:
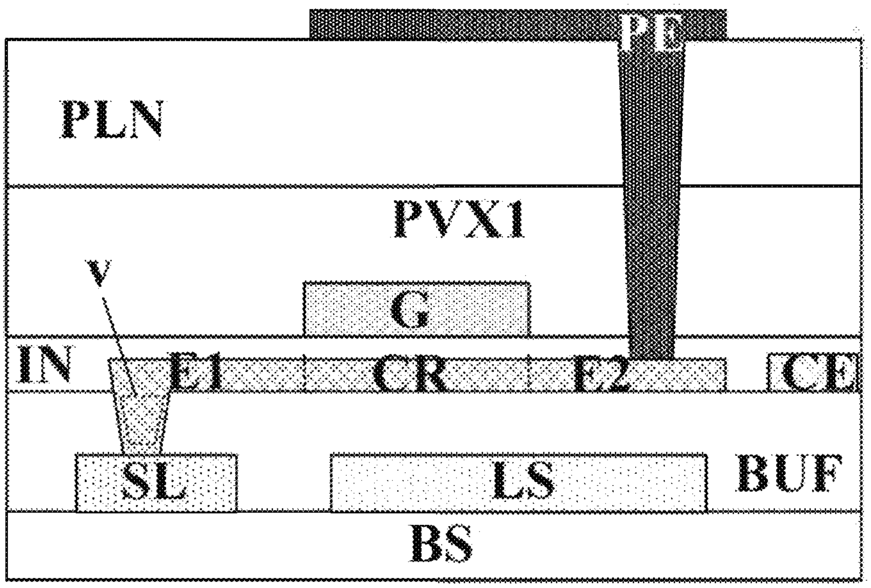
FIG. 34 is a cross-sectional view of an array substrate in some embodiments according to the present disclosure.

FIG. 34 is a cross-sectional view of an array substrate in some embodiments according to the present disclosure. Referring to FIG. 34, in some embodiments, the common electrode CE, the channel region CR, the first electrode E1, and the second electrode E2 include $M1O_aN_b$. The channel region CR, the first electrode E1, and the second electrode E2 are parts of a unitary structure. Optionally, the common electrode CE, the first electrode E1 or the second electrode E2 differs from the channel region CR in that common electrode CE, at least a portion of the first electrode E1, or at least a portion of the second electrode E2 are subject to a process to make it more conductive.

In some embodiments, the array substrate includes a via v extending through at least the buffer layer BUF. The first electrode E1 at least partially in the via v. Optionally, the first electrode E1 extends to the via v to connect to the signal line SL.

Referring to FIG. 34, the array substrate in some embodiments includes a base substrate BS; a signal line SL (e.g., a data line configured to provide a data signal to a transistor) and a light shield LS on the base substrate BS; a buffer layer BUF on a side of the signal line SL and the light shield LS away from the base substrate BS; a common electrode CE, a first electrode E1 (e.g., a source electrode of a transistor), a channel region CR, and a second electrode E2 (e.g., a drain electrode of a transistor) on a side of the buffer layer BUF away from the base substrate BS; an insulating layer IN (e.g., a gate insulating layer) on a side of at least the channel region CR and the common electrode CE away from the buffer layer BUF; a gate electrode G on a side of the insulating layer IN away from the buffer layer BUF; a first passivation layer PVX1 on a side of the gate electrode G away from the insulating layer IN; a planarization layer PLN on a side of the first passivation layer PVX1 away from the insulating layer IN; and a pixel electrode PE on a side of the planarization layer PLN away from the first passivation layer PVX1.

Figure 35:
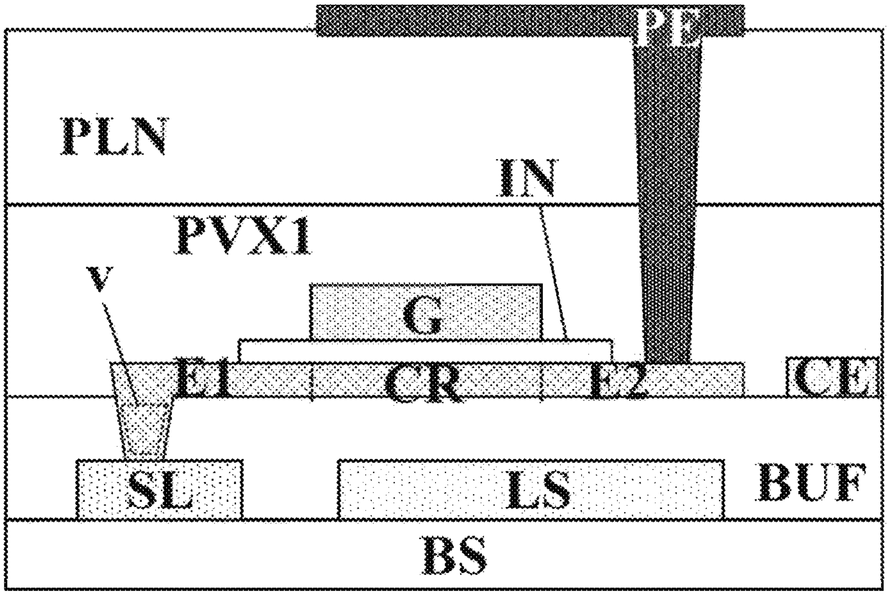
FIG. 35 is a cross-sectional view of an array substrate in some embodiments according to the present disclosure.

FIG. 35 is a cross-sectional view of an array substrate in some embodiments according to the present disclosure. The structure shown in FIG. 35 is similar to the structure shown in FIG. 34, but differs from the structure shown in FIG. 34 at least in that the insulating layer IN does not extend substantially throughout the array substrate depicted in FIG. 35.

Figure 36:
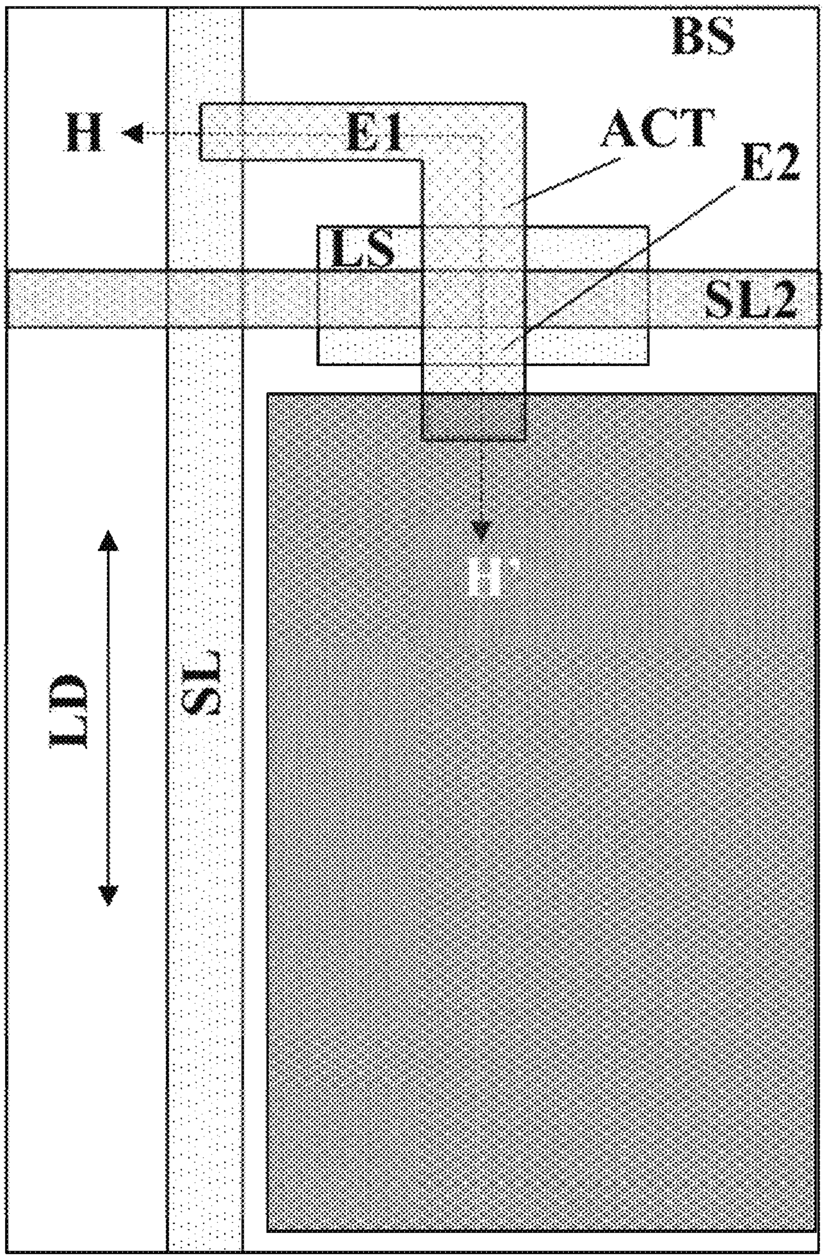
FIG. 36 is a plan view of an array substrate in some embodiments according to the present disclosure.
Figure 37:
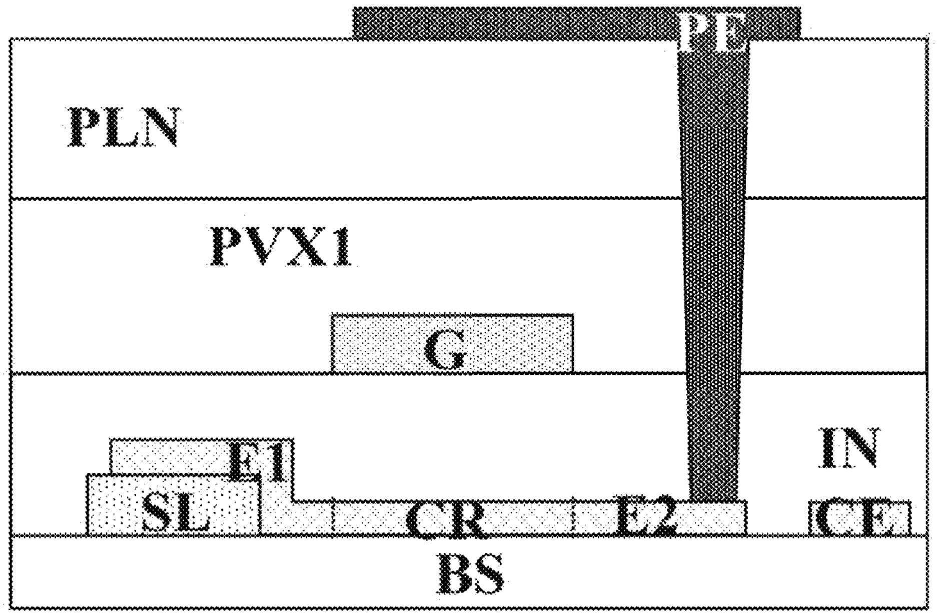
FIG. 37 is a cross-sectional view of an array substrate in some embodiments according to the present disclosure.

FIG. 36 is a plan view of an array substrate in some embodiments according to the present disclosure. FIG. 37 is a cross-sectional view of an array substrate in some embodiments according to the present disclosure. FIG. 37 may be a cross-section along an H-H' line in FIG. 36. Referring to FIG. 36 and FIG. 37, the array substrate in some embodiments includes a base substrate BS; a signal line SL (e.g., a data line configured to provide a data signal to a transistor) on the base substrate BS; a common electrode CB, a first electrode E1 (e.g., a source electrode of a transistor), a channel region CR, and a second electrode E2 (e.g., a drain electrode of a transistor) on a side of the signal line SL away from the base substrate BS; an insulating layer IN (e.g., a gate insulating layer) on a side of at least the channel region CR and the common electrode CE away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; and a pixel electrode PE on a side of the planarization layer PLN away from the first passivation layer PVX1.

Figure 38:
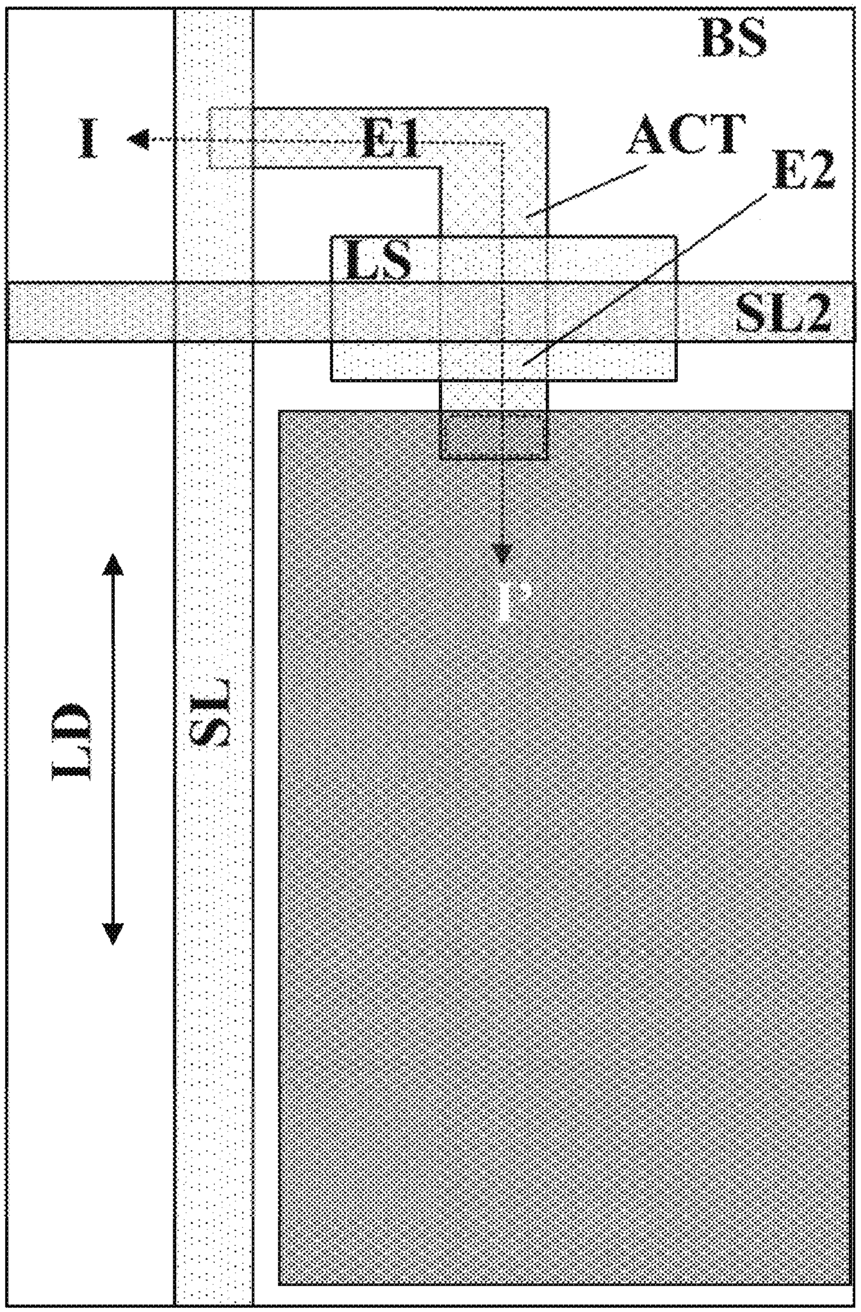
FIG. 38 is a plan view of an array substrate in some embodiments according to the present disclosure.
Figure 39:
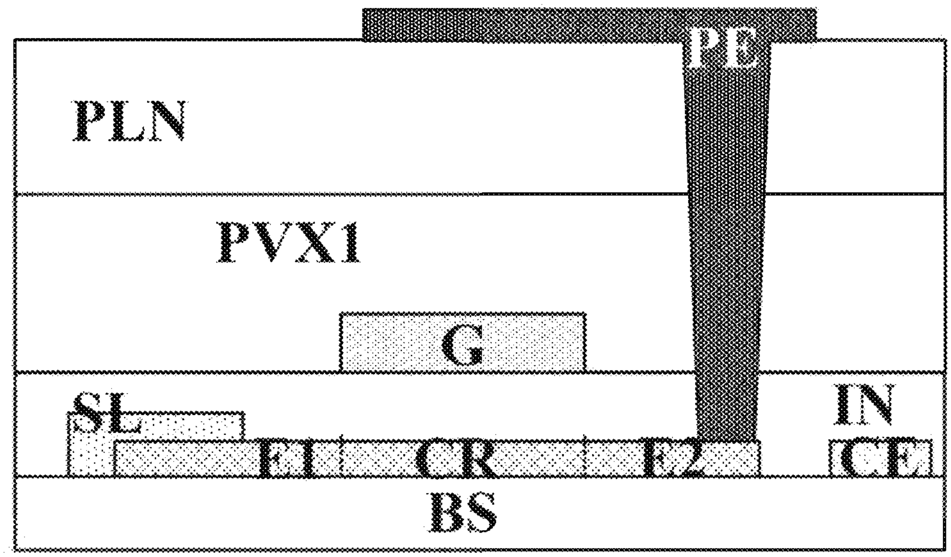
FIG. 39 is a cross-sectional view of an array substrate in some embodiments according to the present disclosure.
Figure 40A:
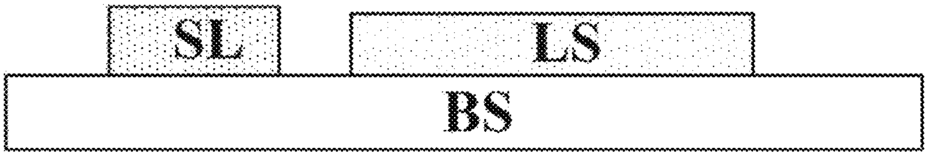
FIG. 40A to FIG. 40H illustrate a process of fabricating an array substrate in some embodiments according to the present disclosure.
Figure 40B:
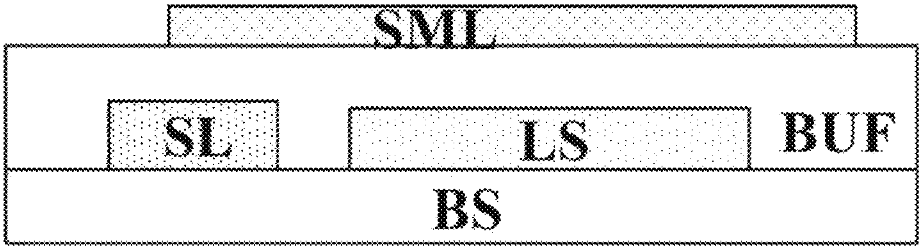
Figure 40C:
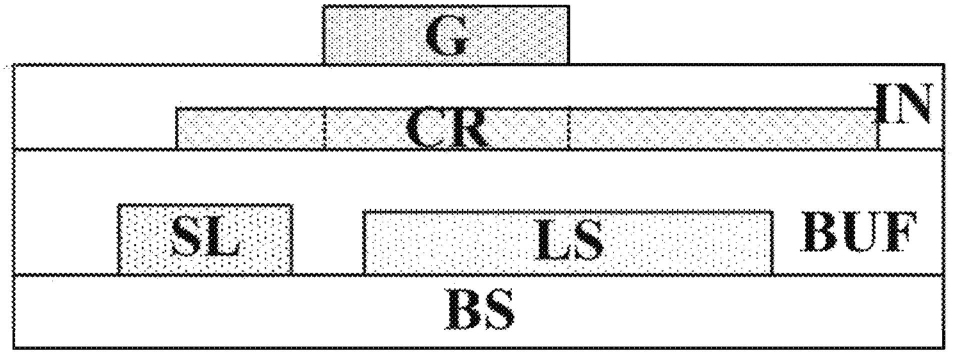
Figure 40D:
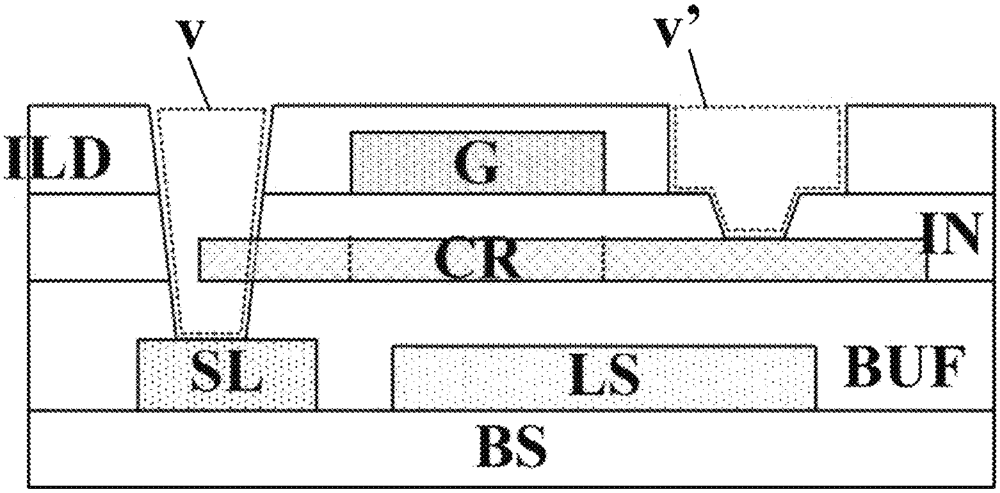
Figure 40E:
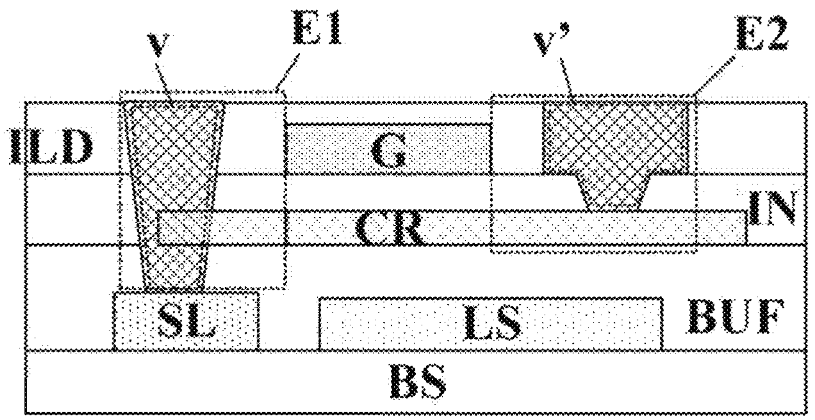
Figure 40F:
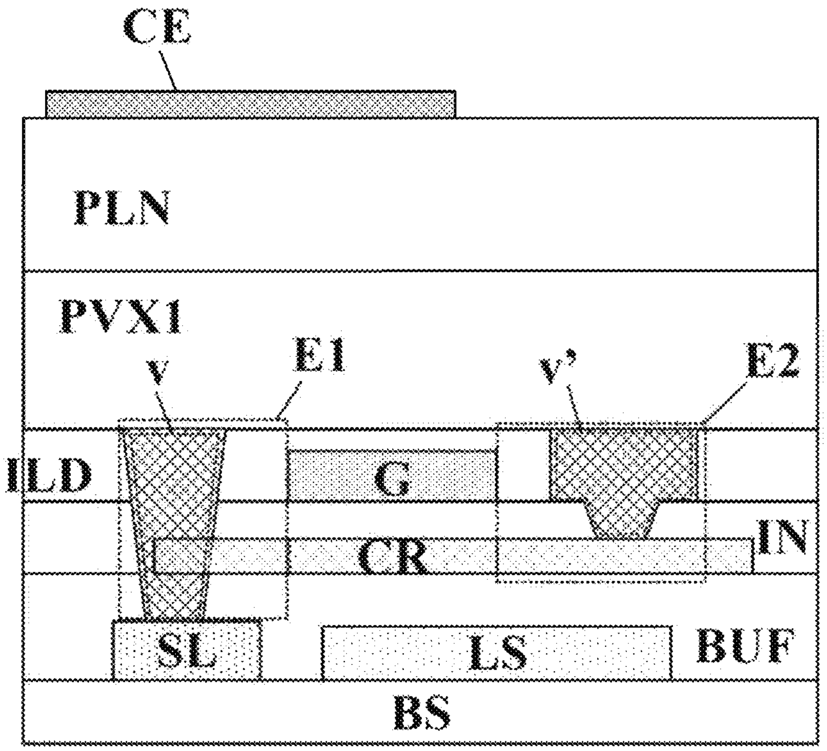
Figure 40G:
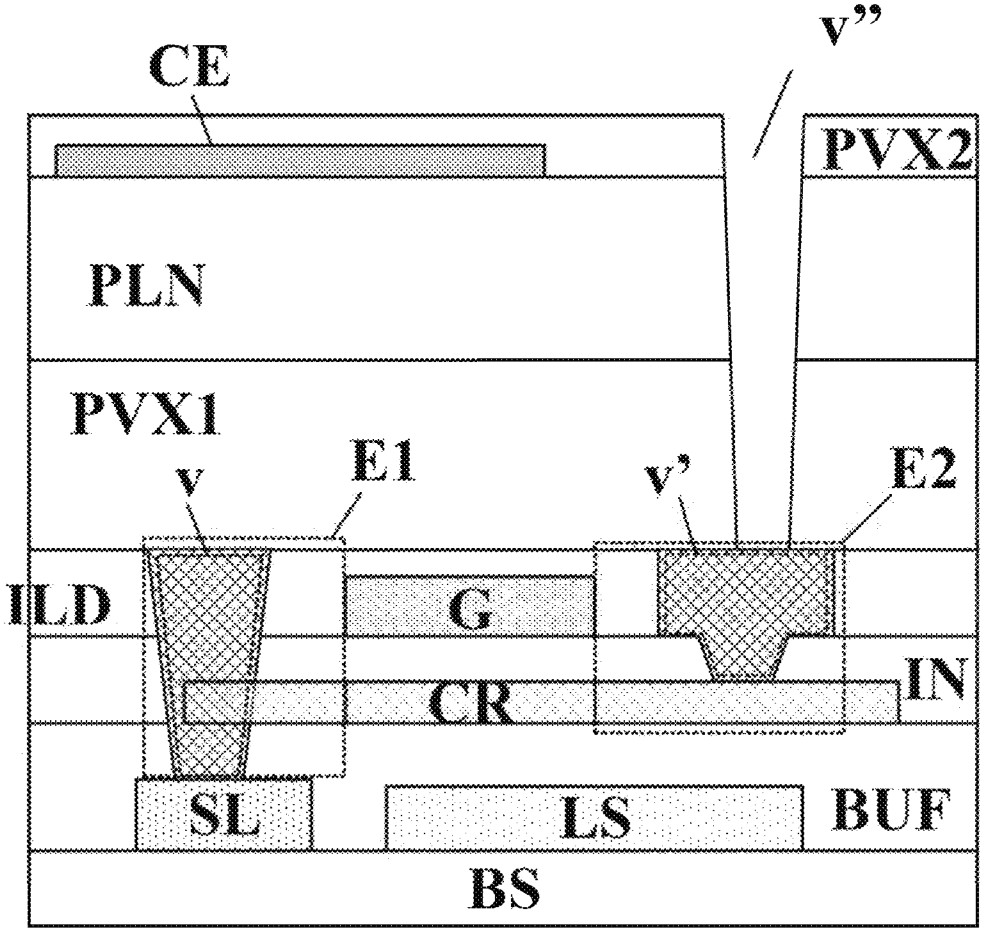
Figure 40H:
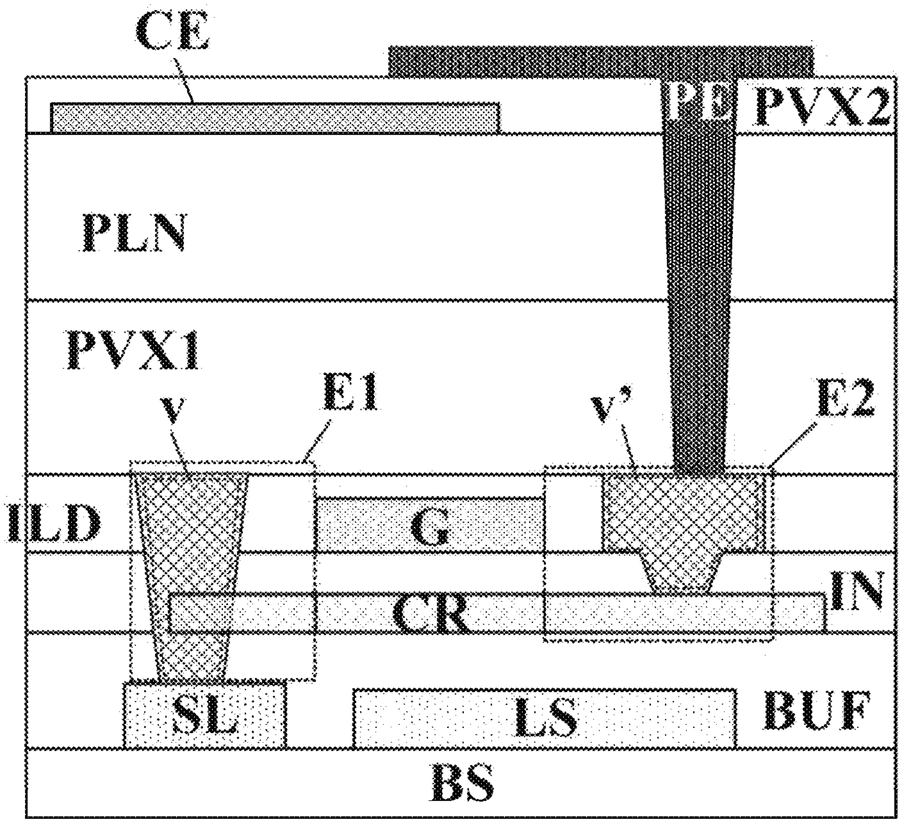
Figure 41A:
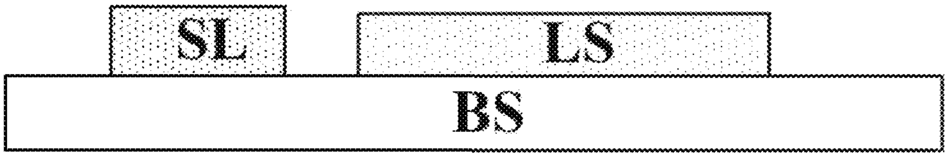
FIG. 41A to FIG. 41H illustrate a process of fabricating an array substrate in some embodiments according to the present disclosure.
Figure 41B:
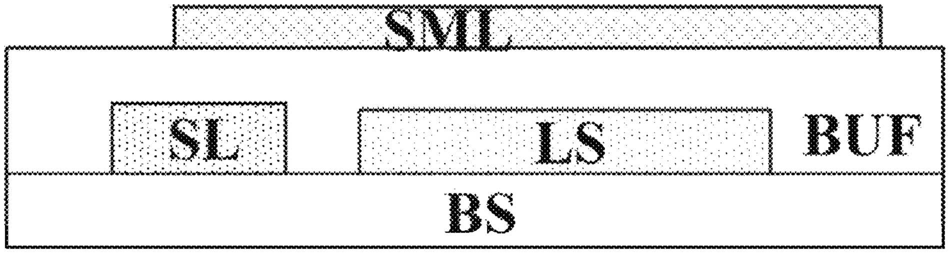
Figure 41C:
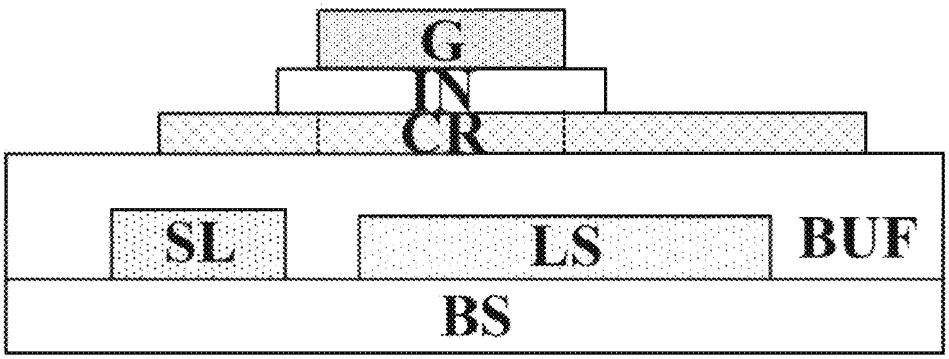
Figure 41D:
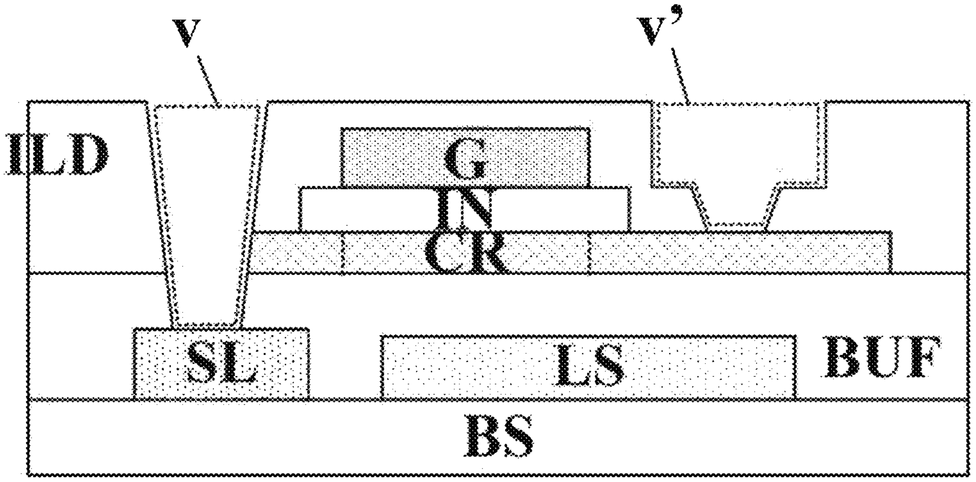
Figure 41E:
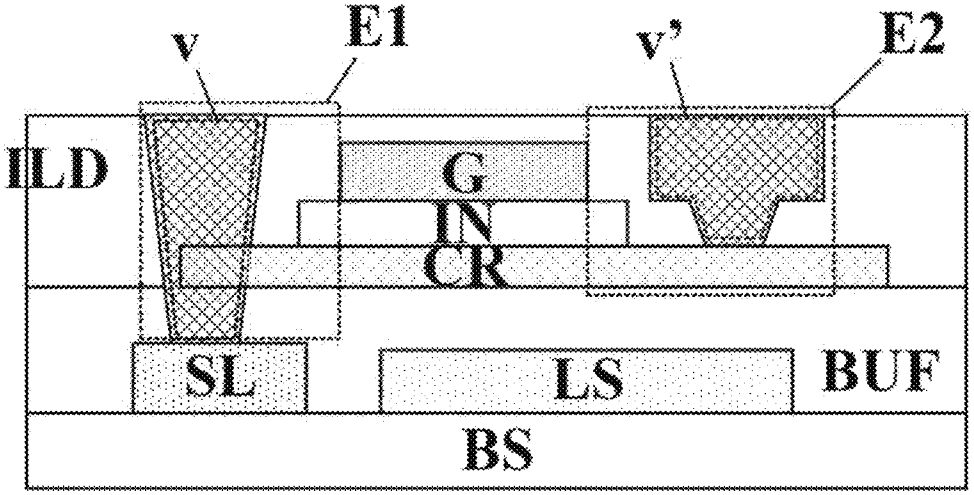
Figure 41F:
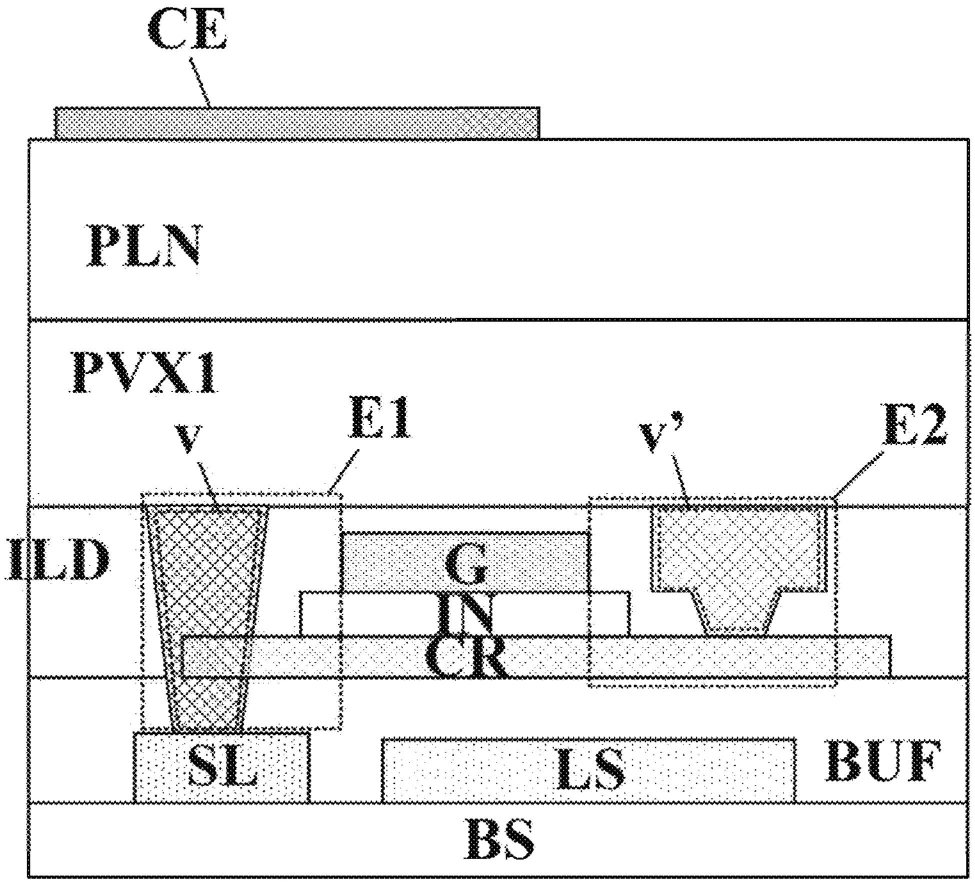
Figure 41G:
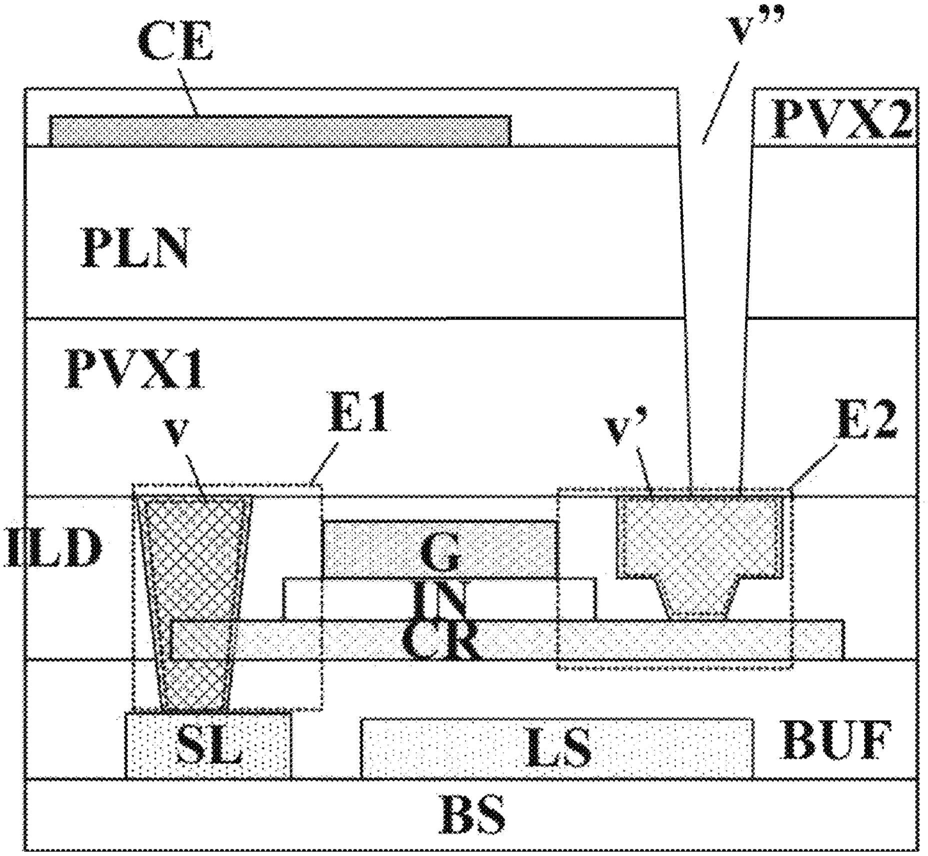
Figure 41H:
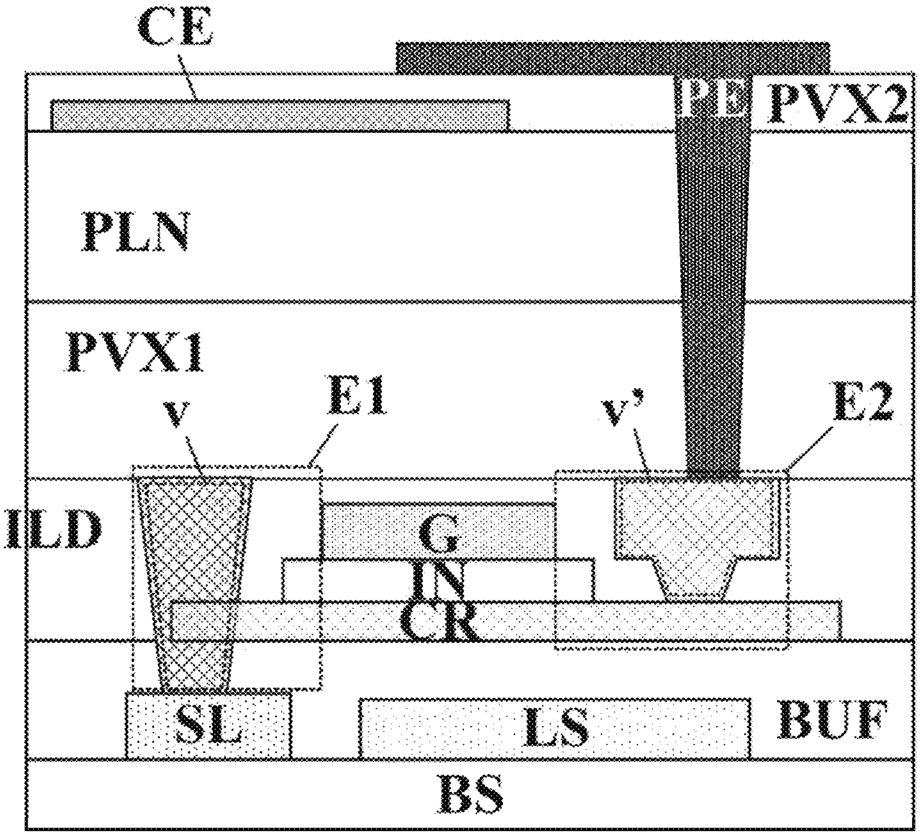
Figure 42A:
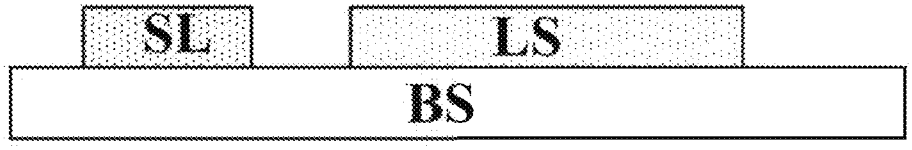
FIG. 42A to FIG. 42G illustrate a process of fabricating an array substrate in some embodiments according to the present disclosure.
Figure 42B:
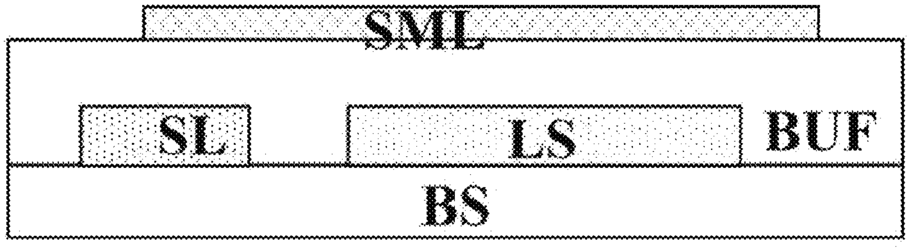
Figure 42C:
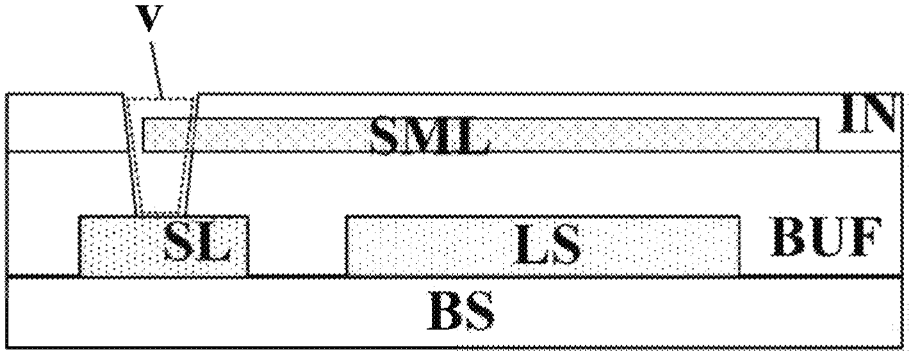
Figure 42D:
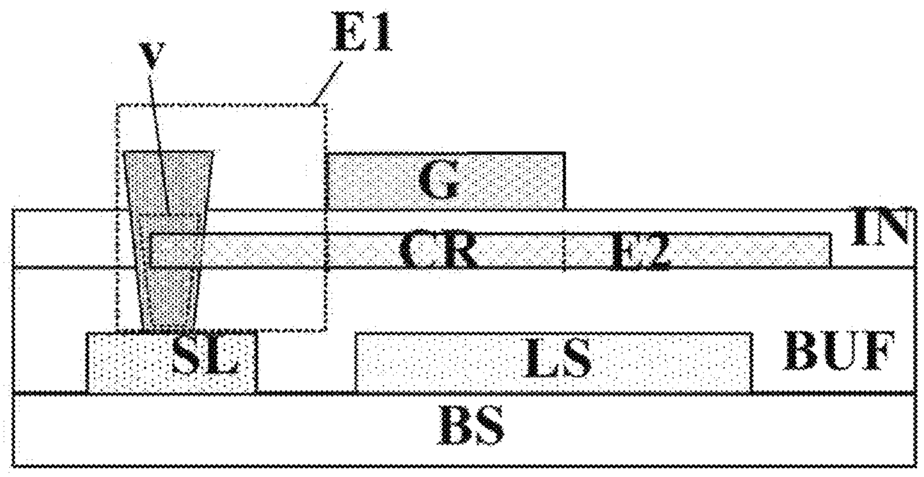
Figure 42E:
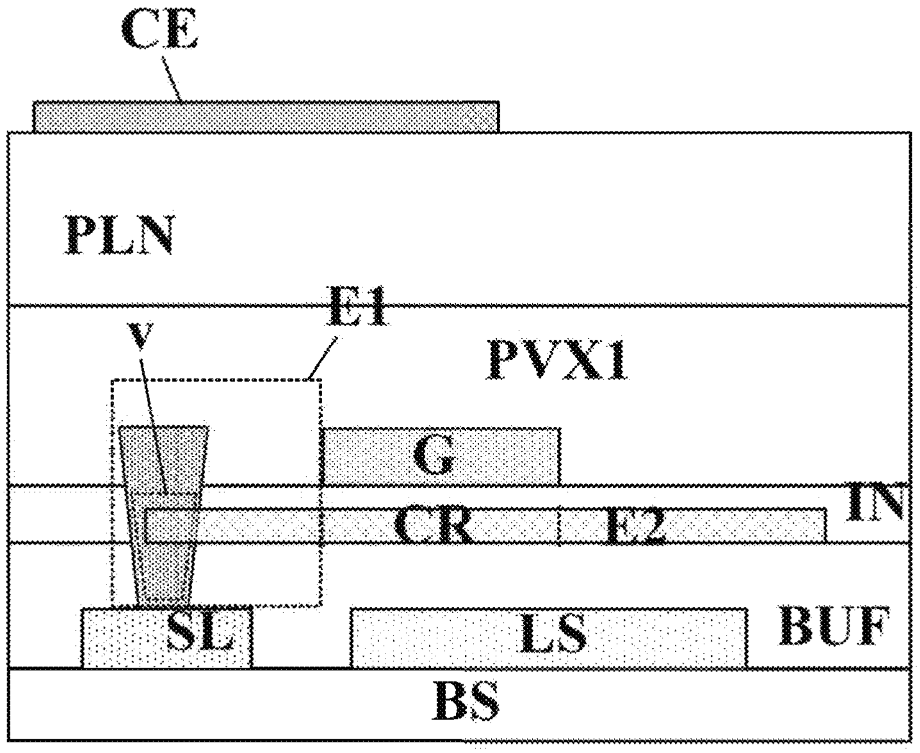
Figure 42F:
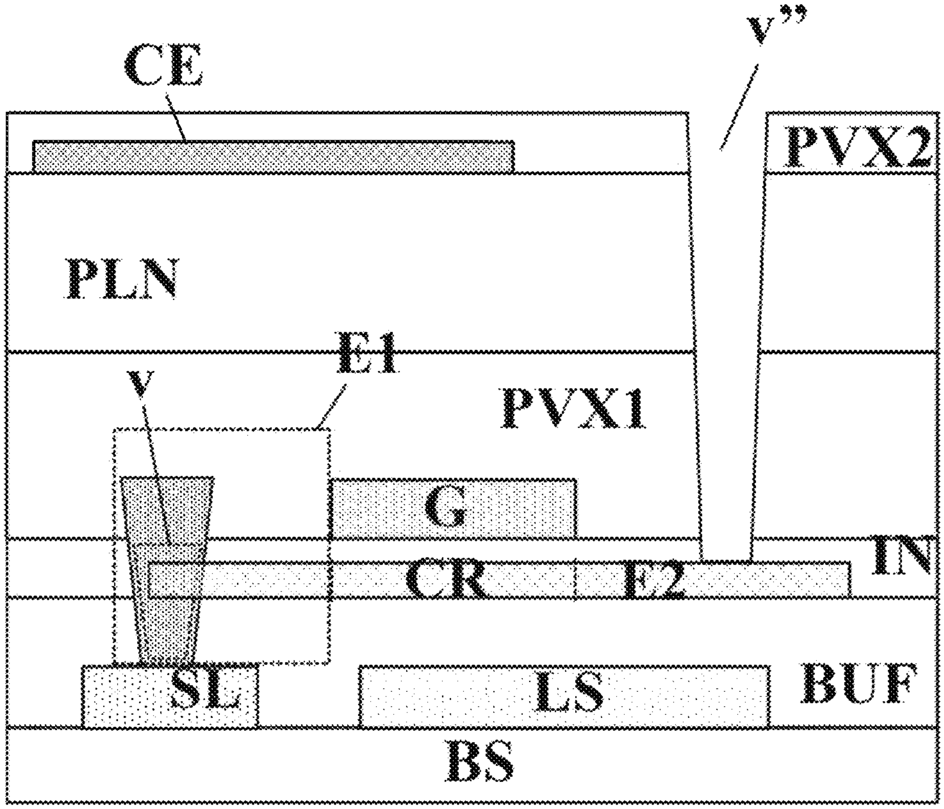
Figure 42G:
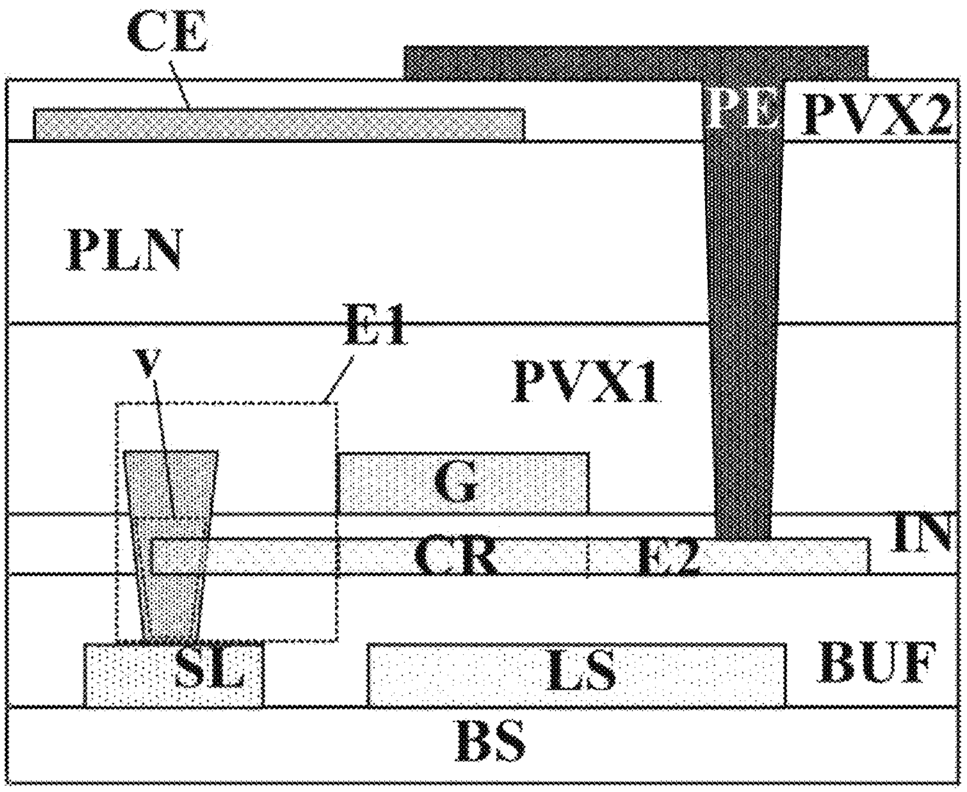
Figure 43A:
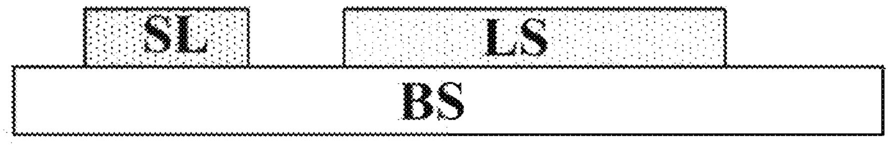
FIG. 43A to FIG. 43G illustrate a process of fabricating an array substrate in some embodiments according to the present disclosure.
Figure 43B:
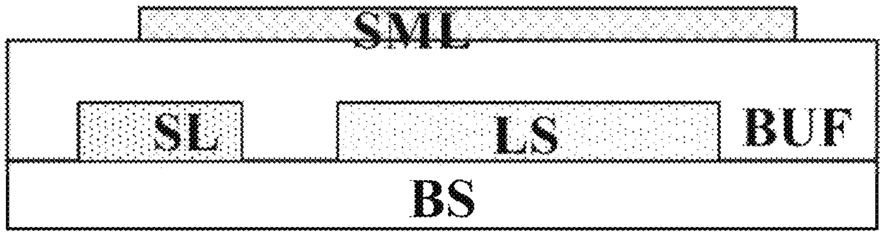
Figure 43C:
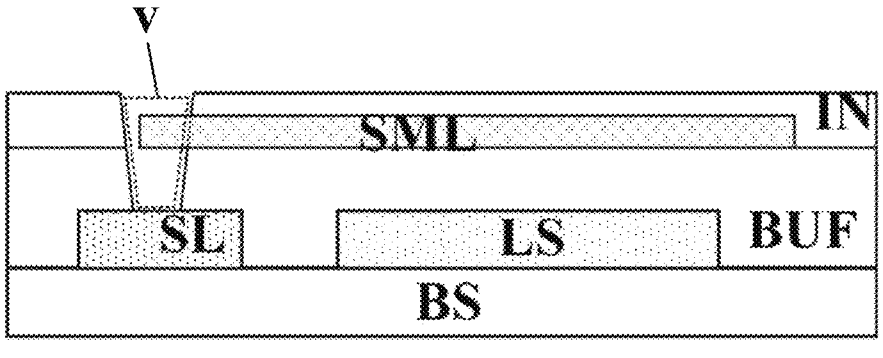
Figure 43D:
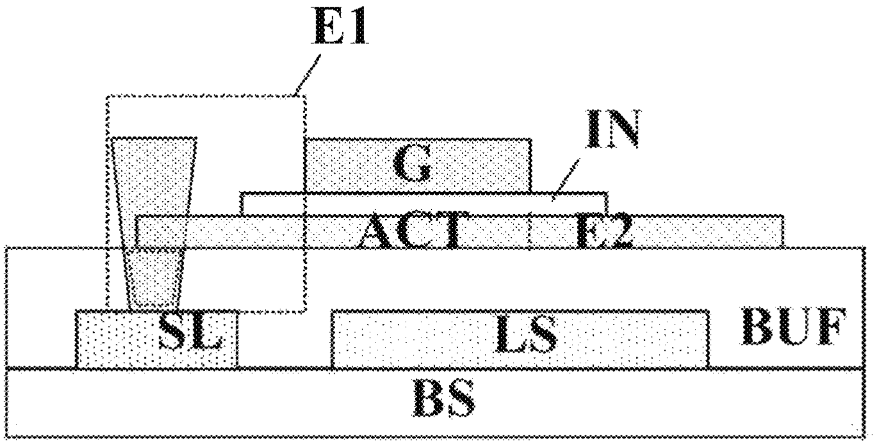
Figure 43E:
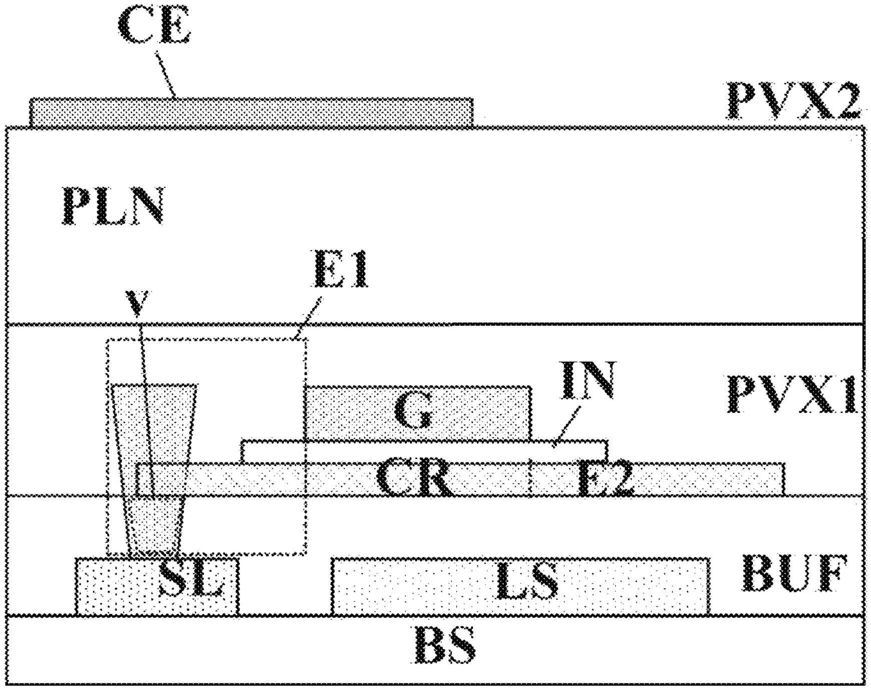
Figure 43F:
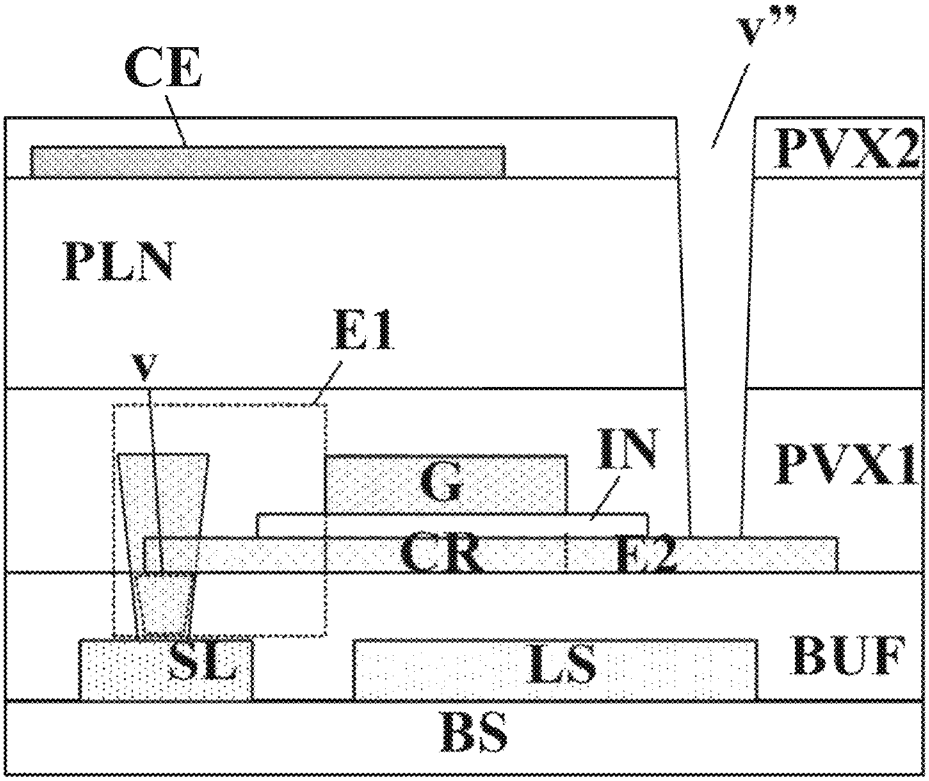
Figure 43G:
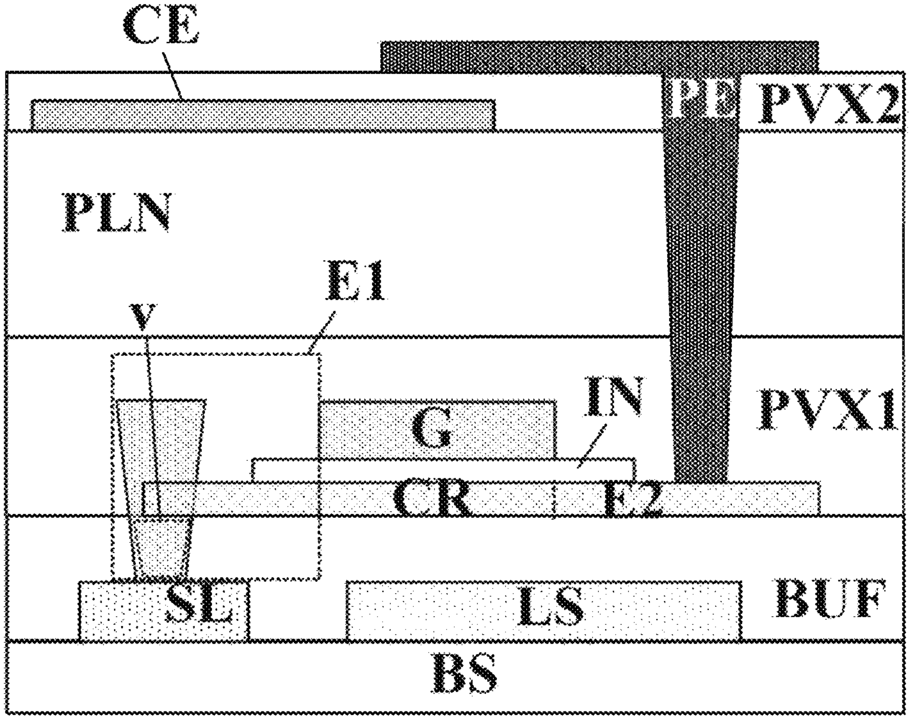
Figure 44A:
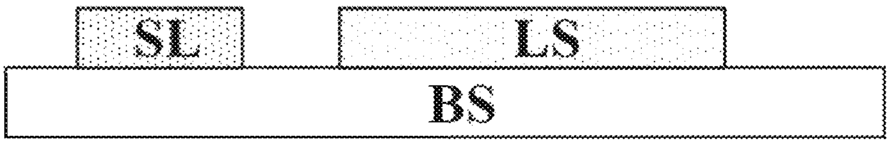
FIG. 44A to FIG. 44G illustrate a process of fabricating an array substrate in some embodiments according to the present disclosure.
Figure 44B:
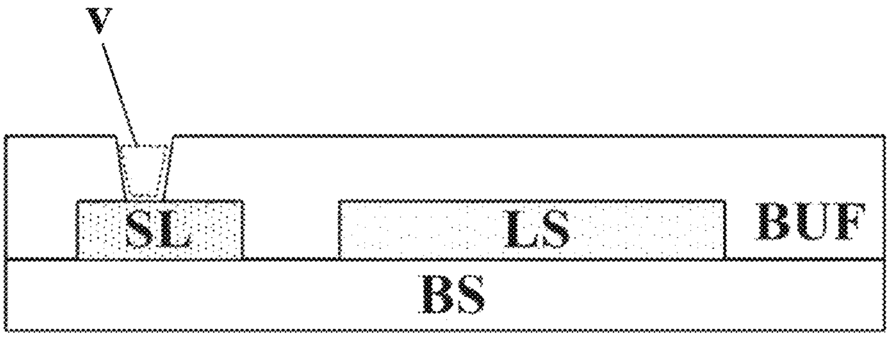
Figure 44C:
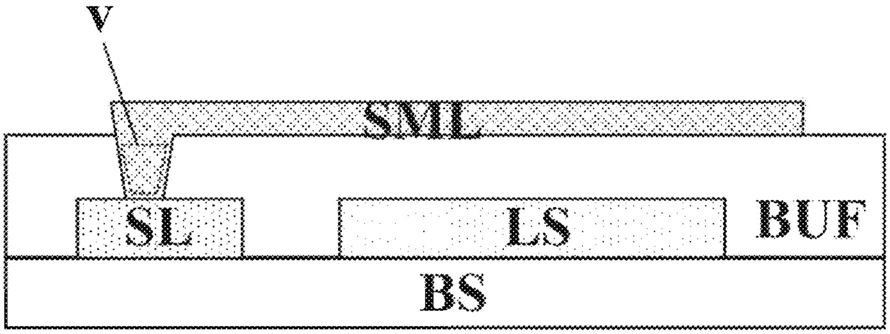
Figure 44D:
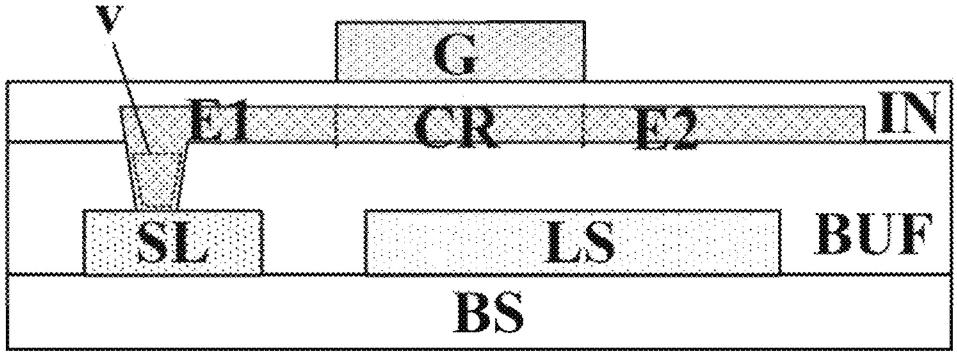
Figure 44E:
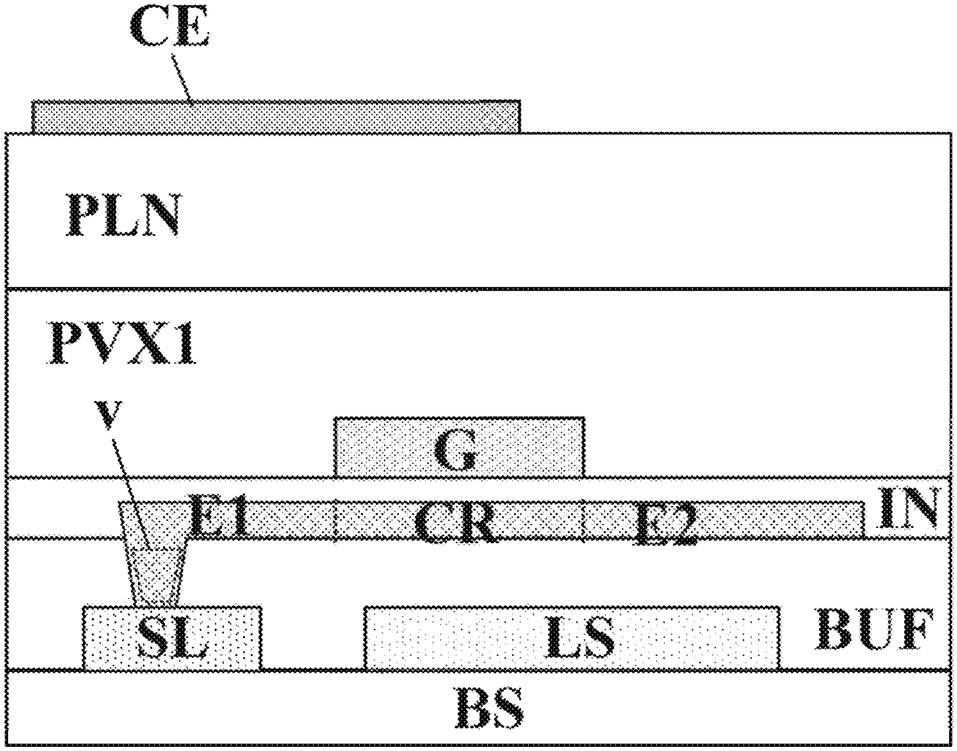
Figure 44F:
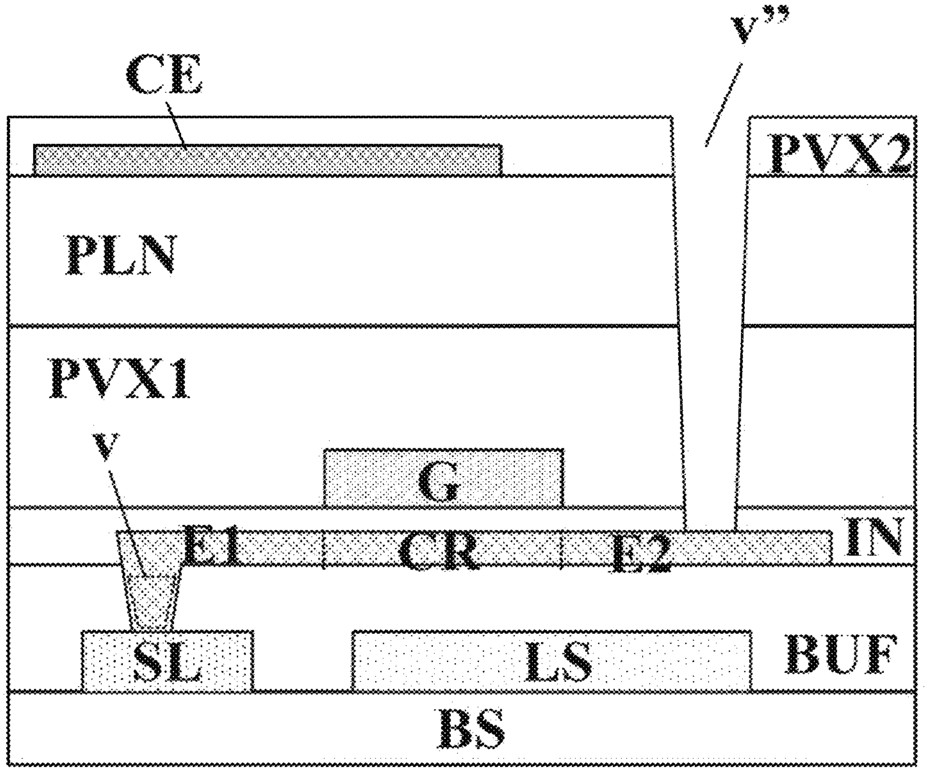
Figure 44G:
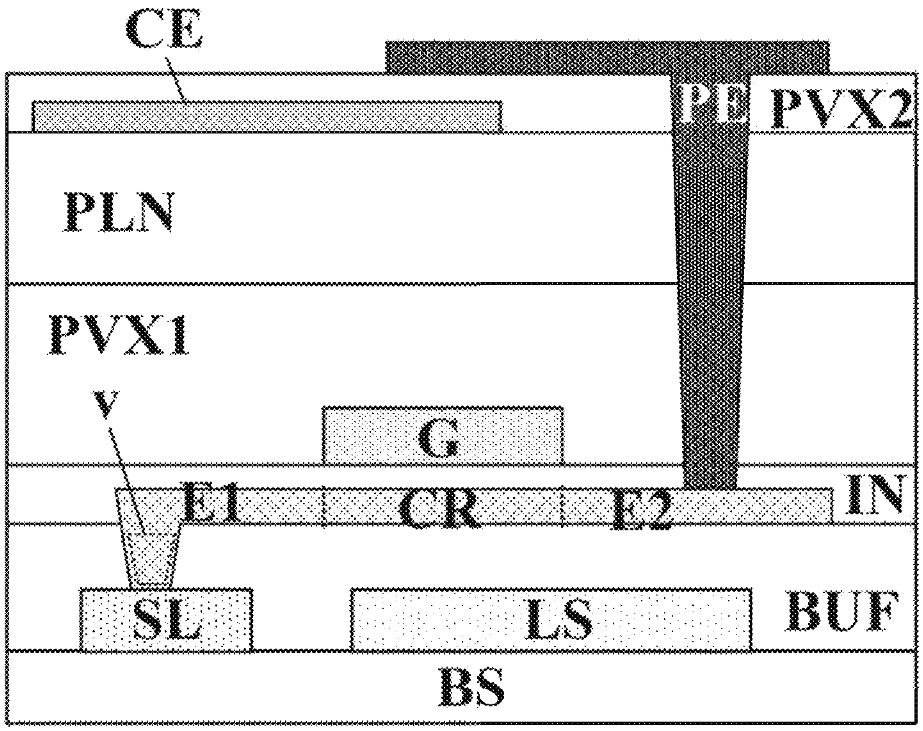
Figure 45A:
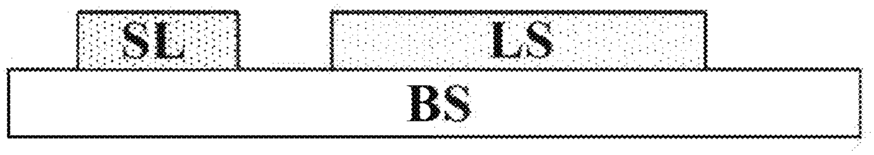
FIG. 45A to FIG. 45G illustrate a process of fabricating an array substrate in some embodiments according to the present disclosure.
Figure 45B:
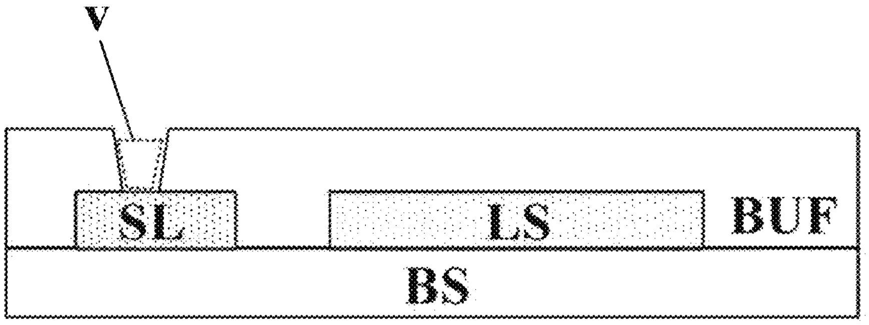
Figure 45C:
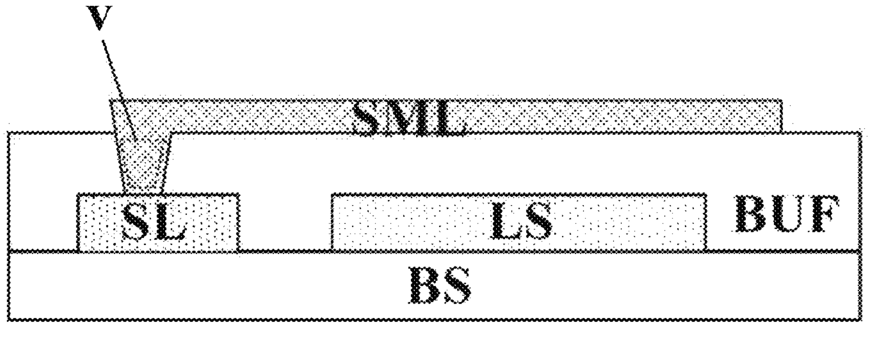
Figure 45D:
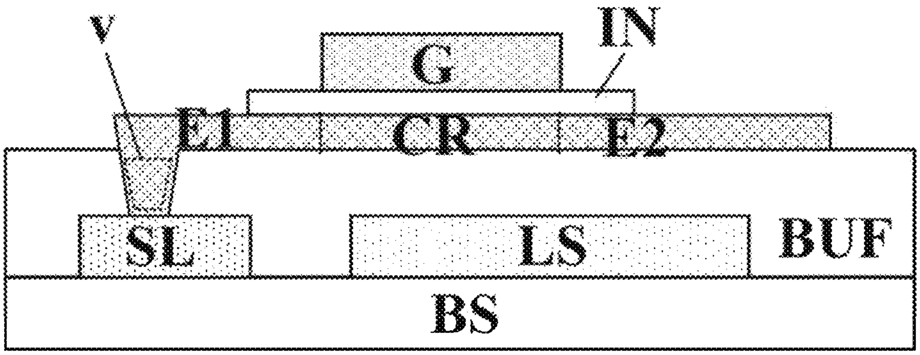
Figure 45E:
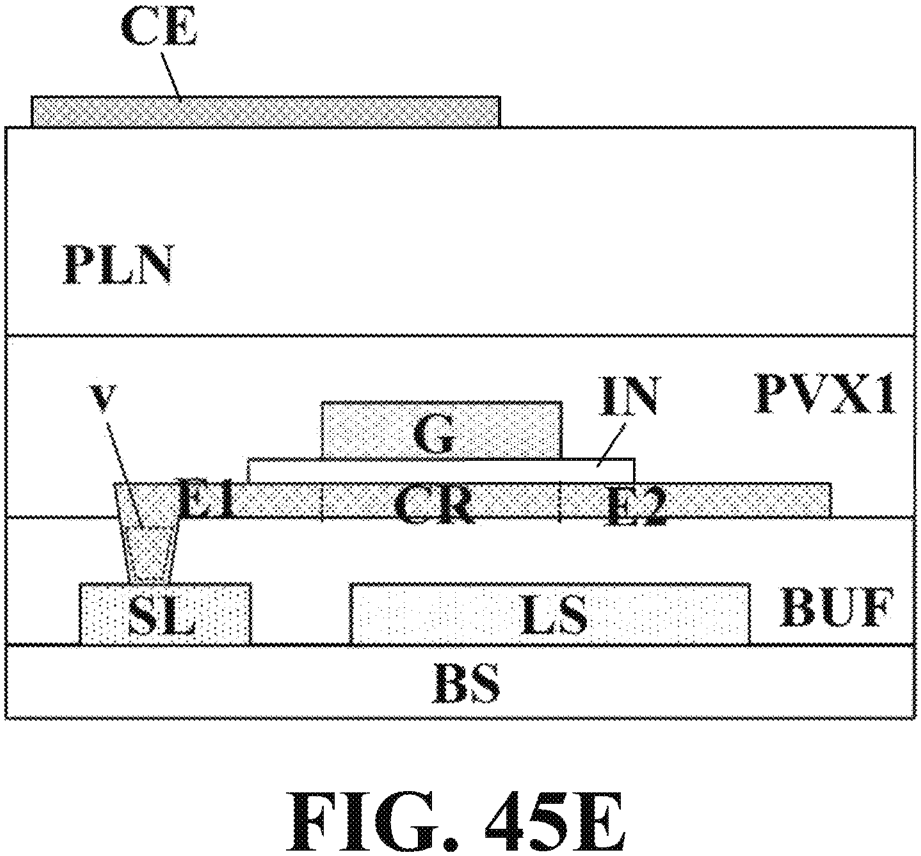
Figure 45F:
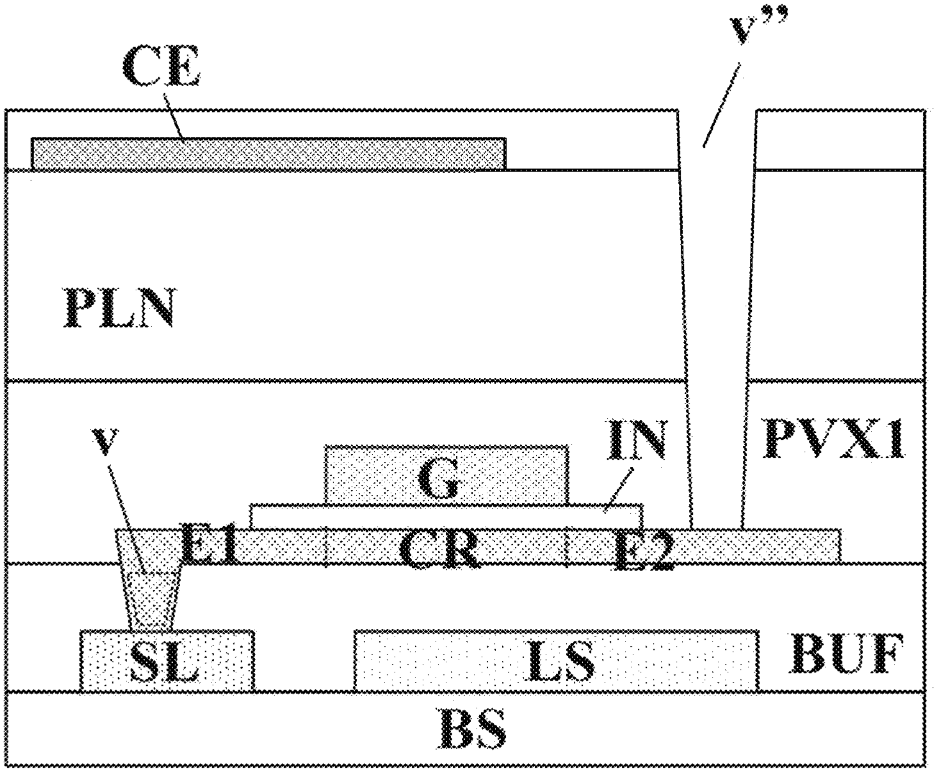
Figure 45G:
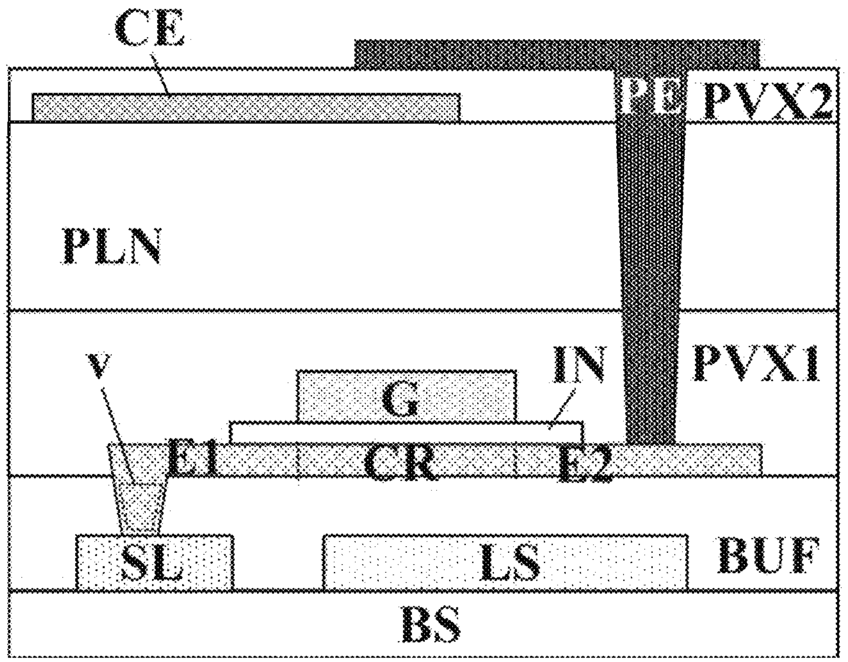
Figure 46A:
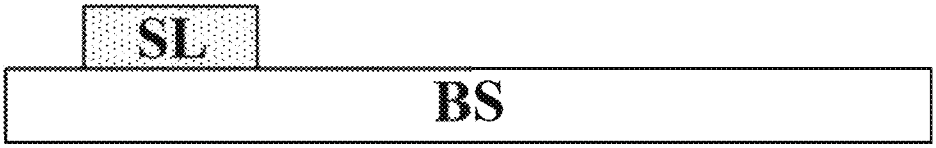
FIG. 46A to FIG. 46F illustrate a process of fabricating an array substrate in some embodiments according to the present disclosure.
Figure 46B:
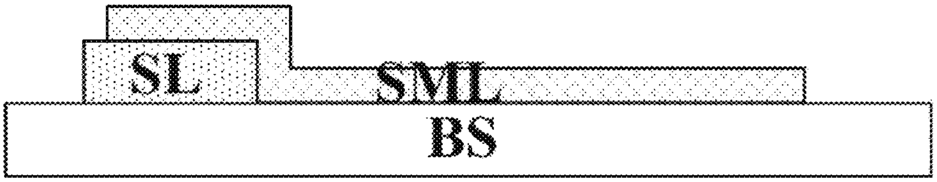
Figure 46C:
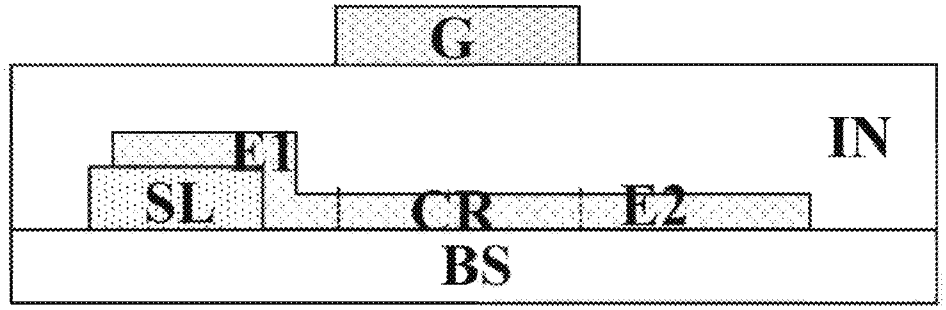
Figure 46D:
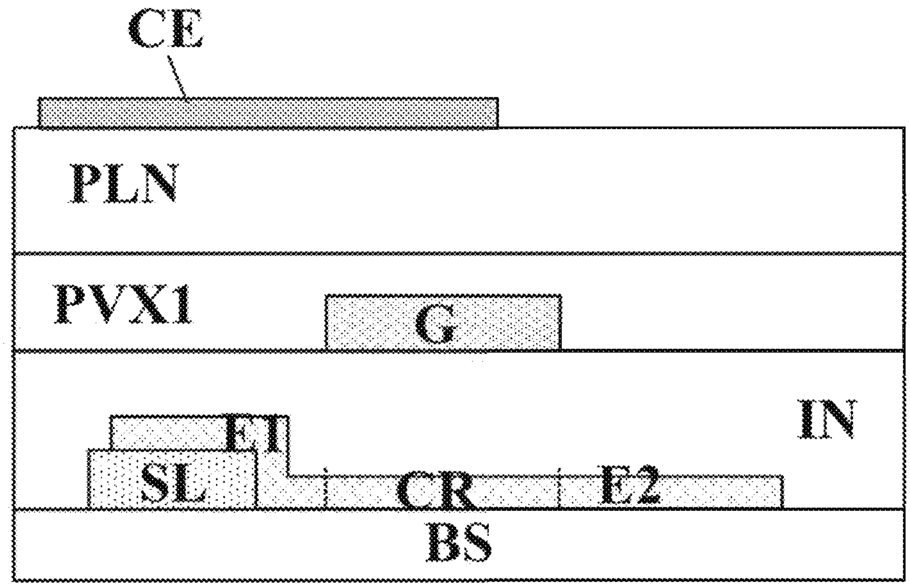
Figure 46E:
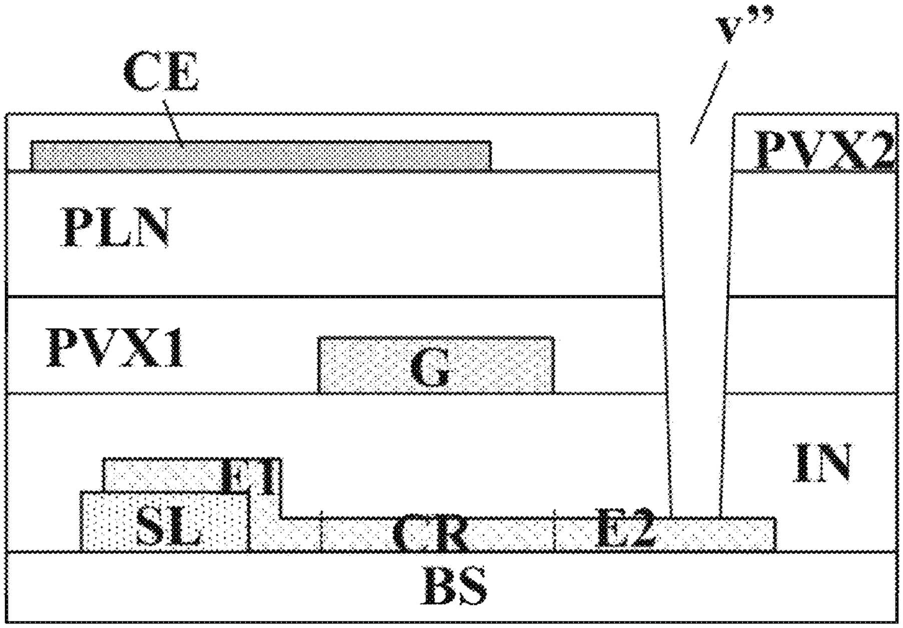
Figure 46F:
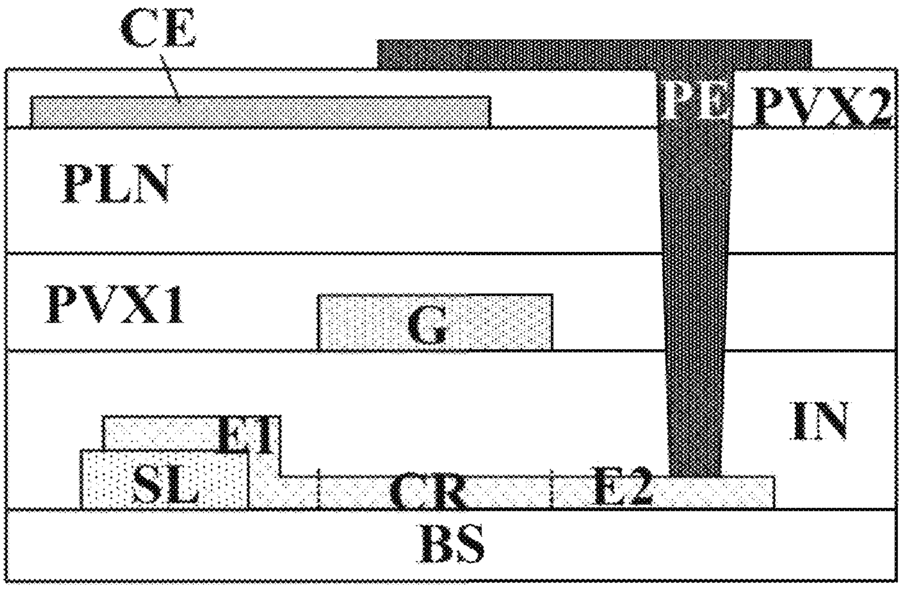
Figure 47A:
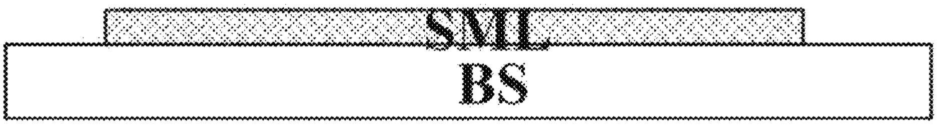
FIG. 47A to FIG. 47F illustrate a process of fabricating an array substrate in some embodiments according to the present disclosure.
Figure 47B:
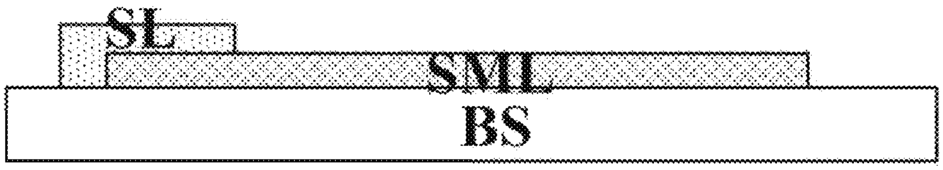
Figure 47C:
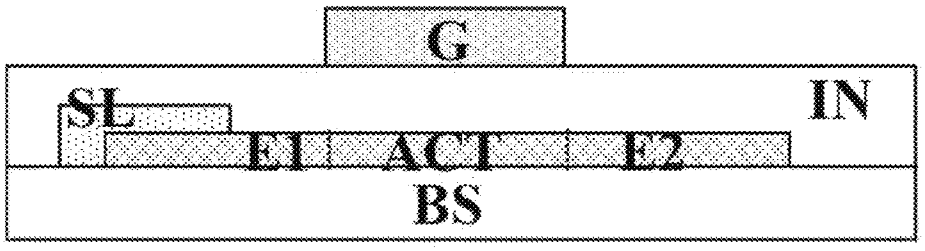
Figure 47D:
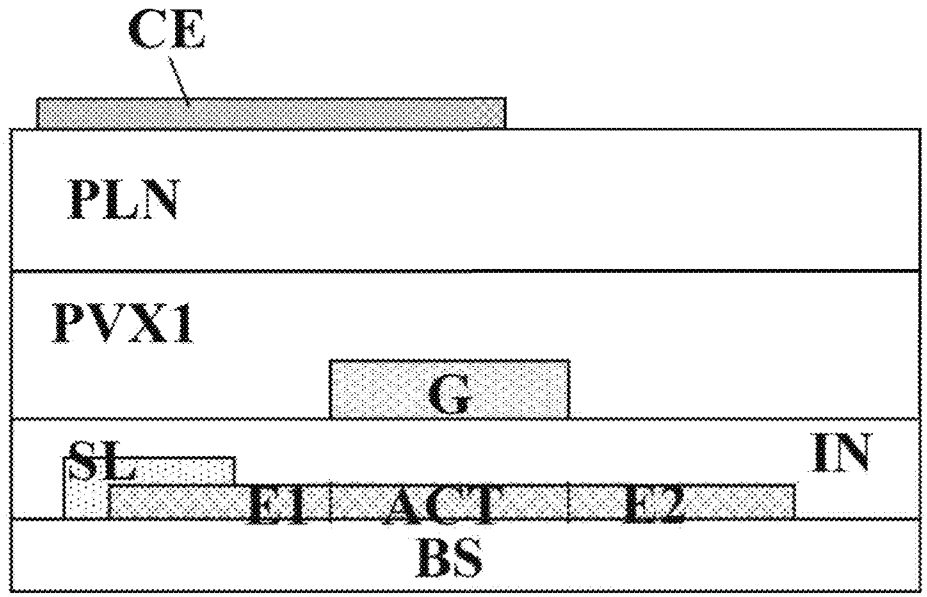
Figure 47E:
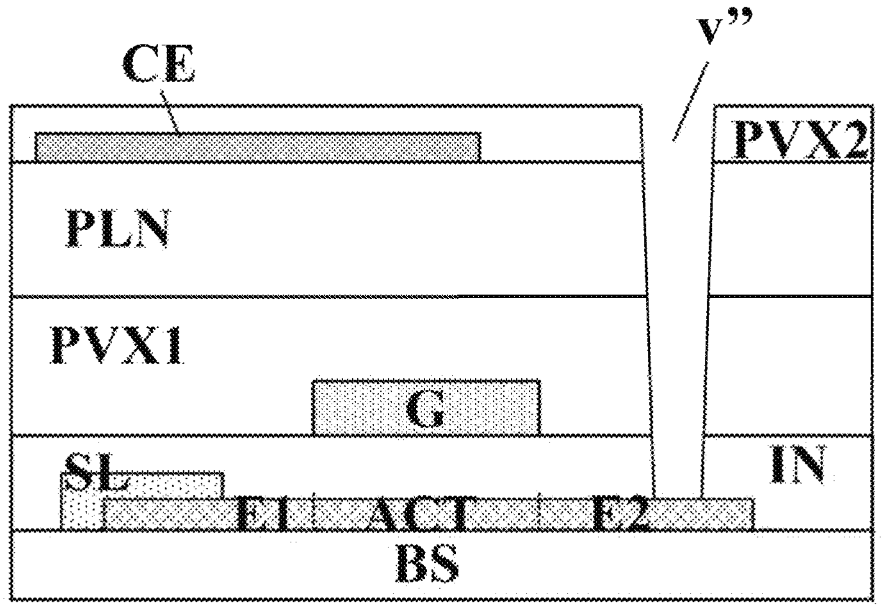
Figure 47F:
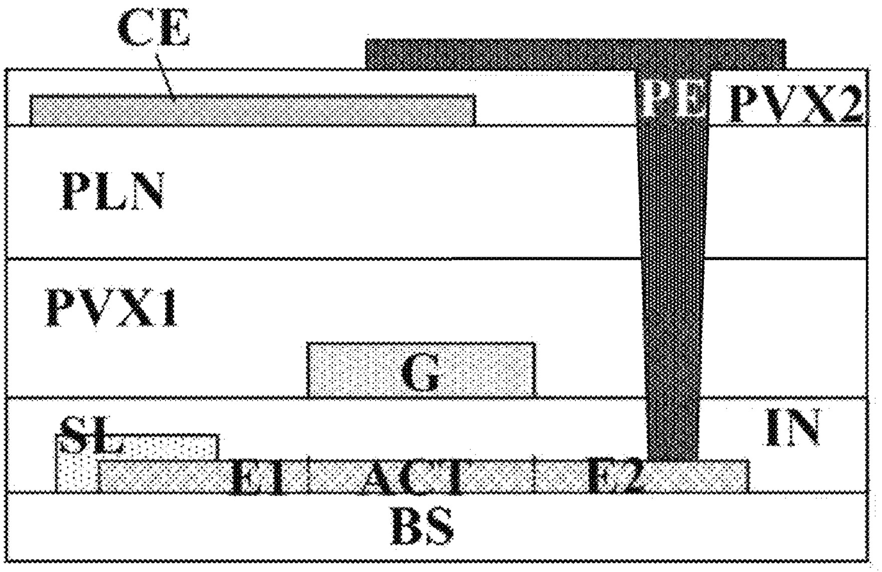
Figure 48A:
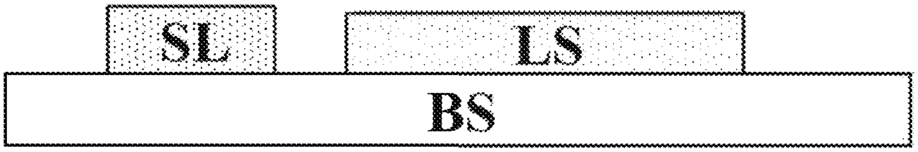
FIG. 48A to FIG. 48G illustrate a process of fabricating an array substrate in some embodiments according to the present disclosure.
Figure 48B:
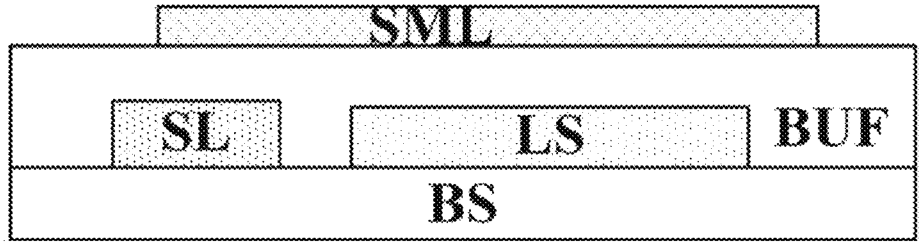
Figure 48C:
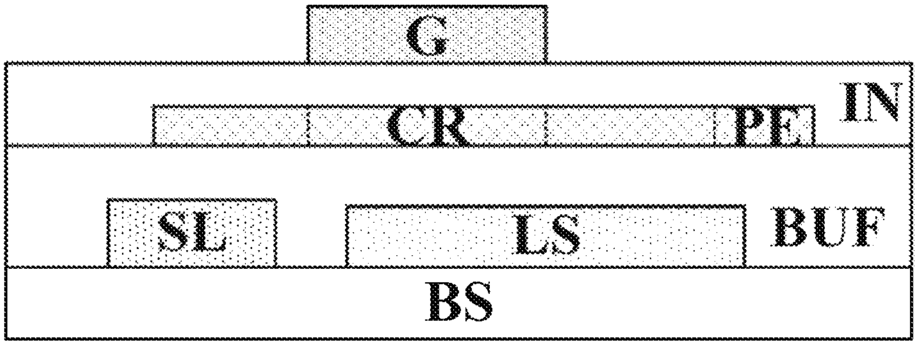
Figure 48D:
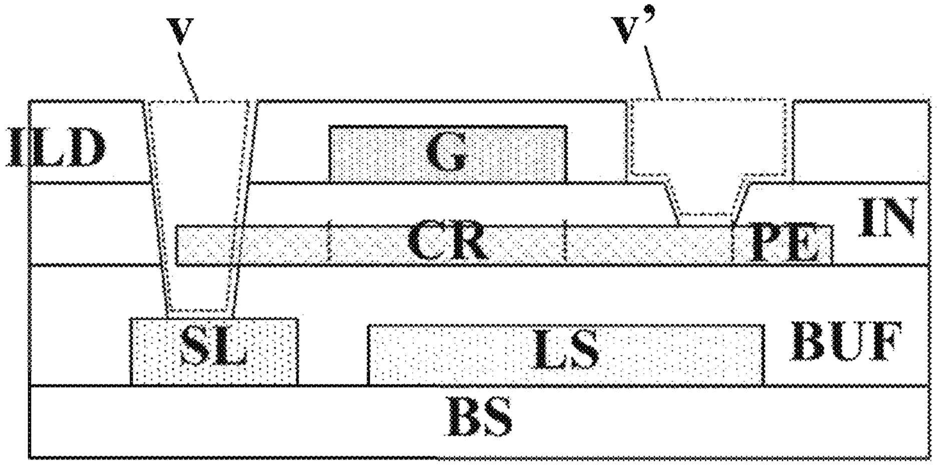
Figure 48E:
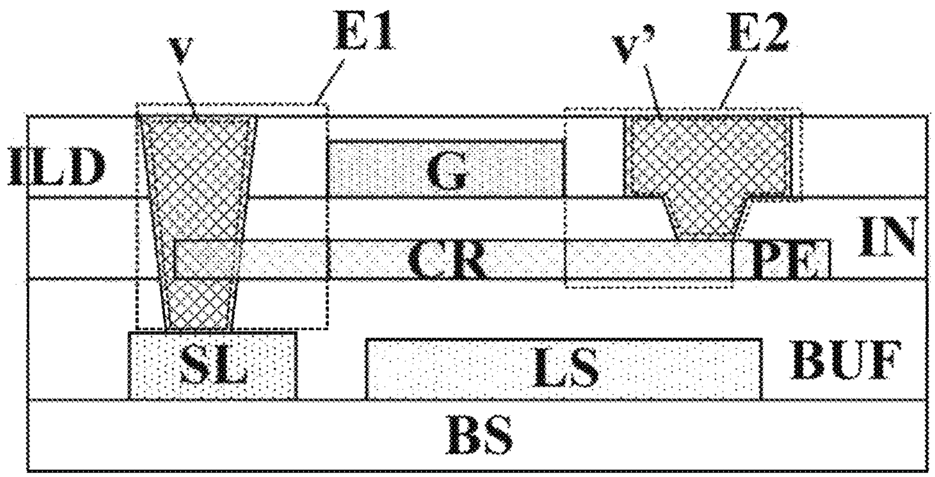
Figure 48F:
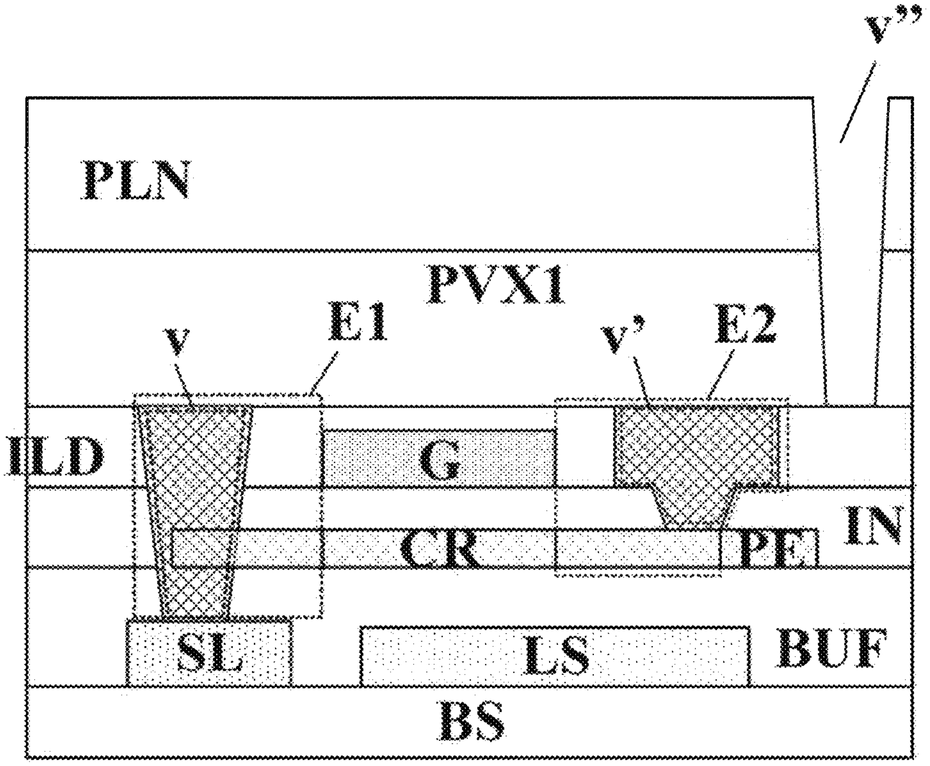
Figure 48G:
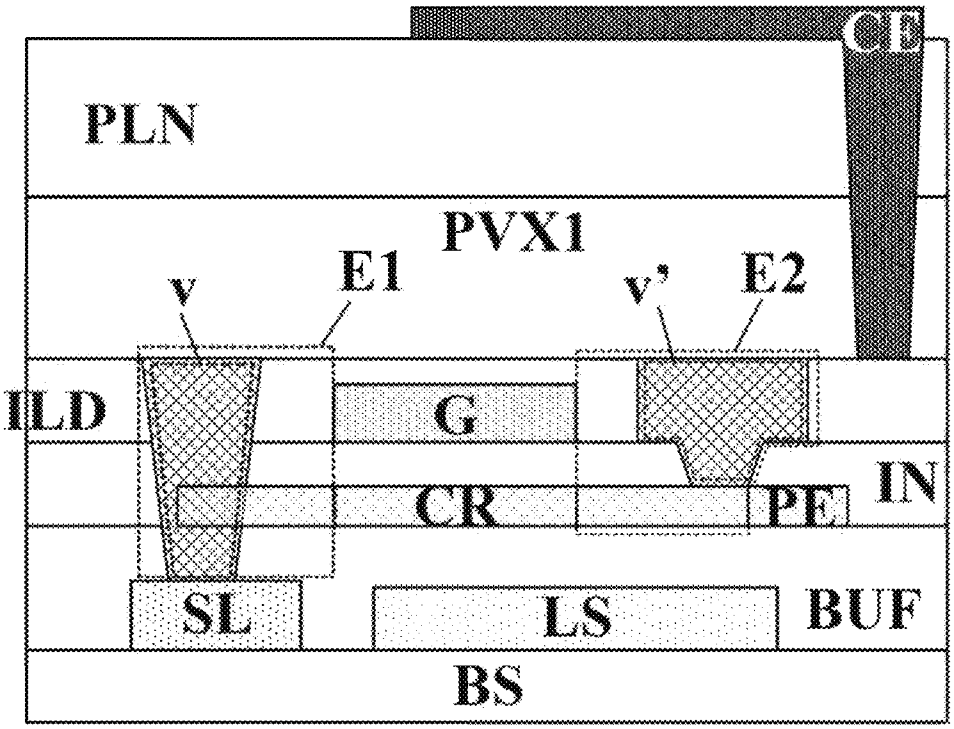
Figure 49A:
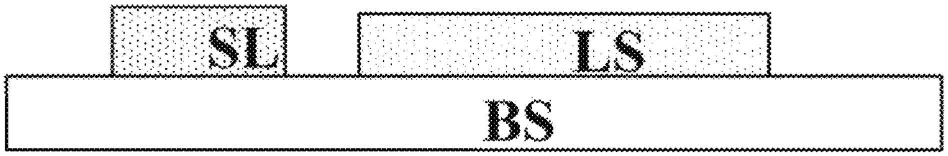
FIG. 49A to FIG. 49G illustrate a process of fabricating an array substrate in some embodiments according to the present disclosure.
Figure 49B:
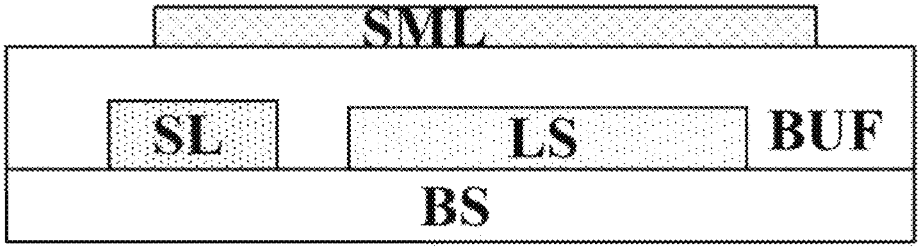
Figure 49C:
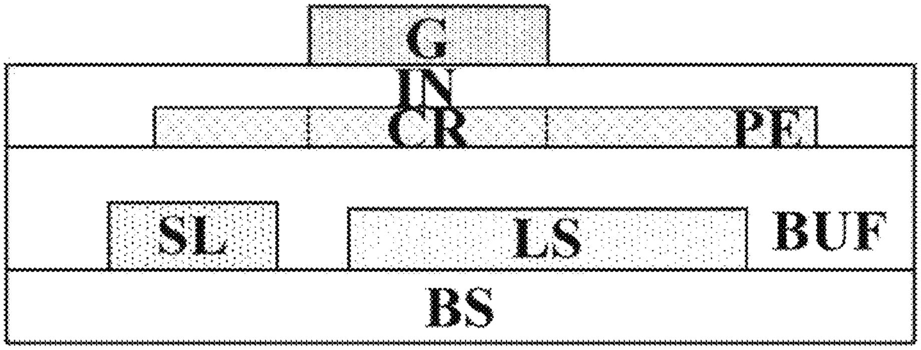
Figure 49D:
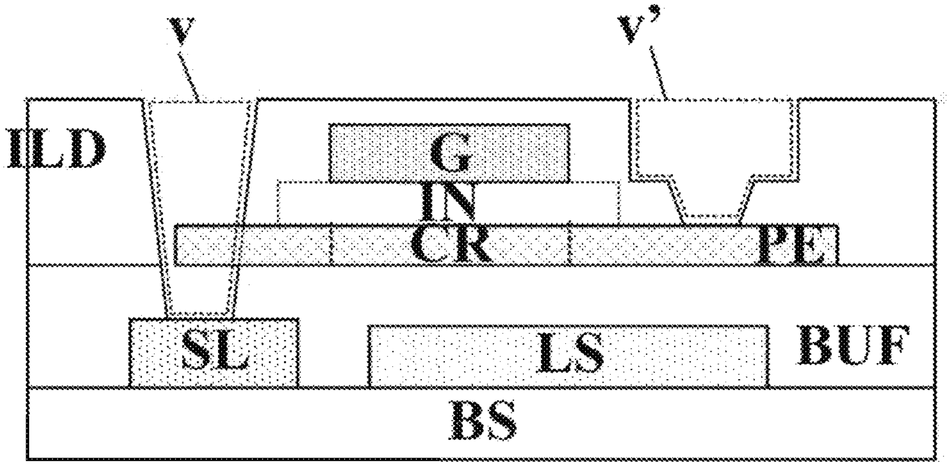
Figure 49E:
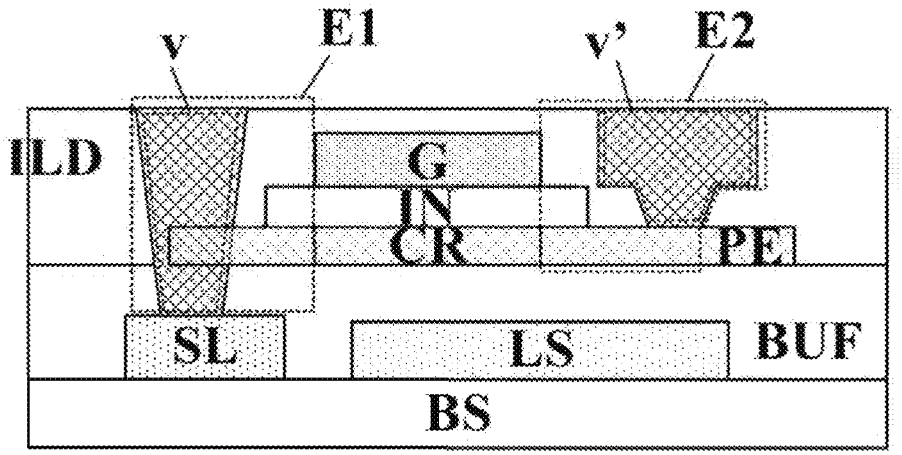
Figure 49F:
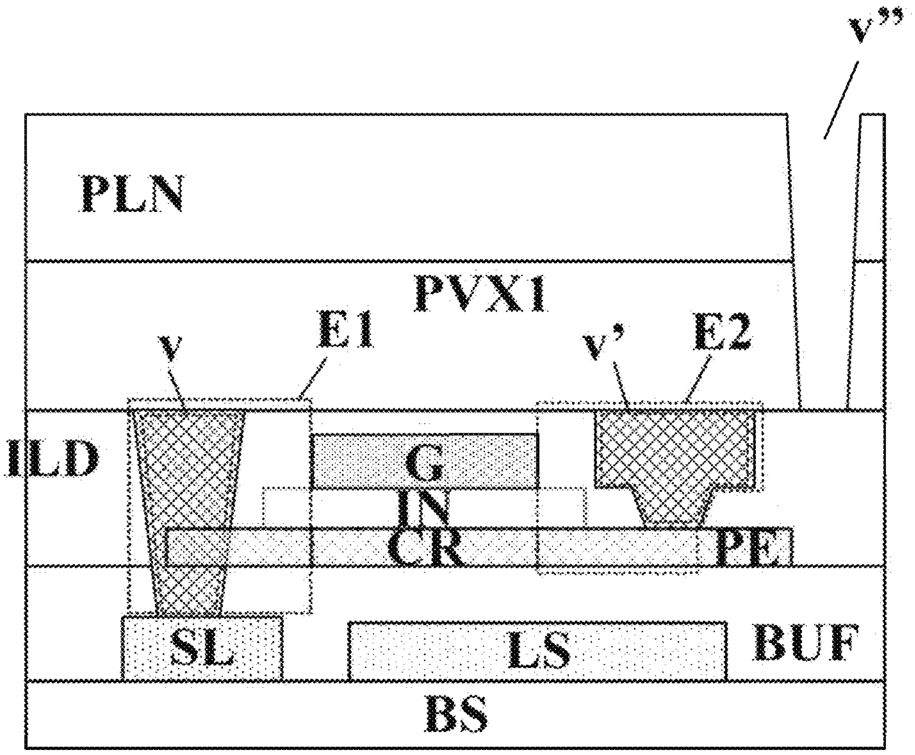
Figure 49G:
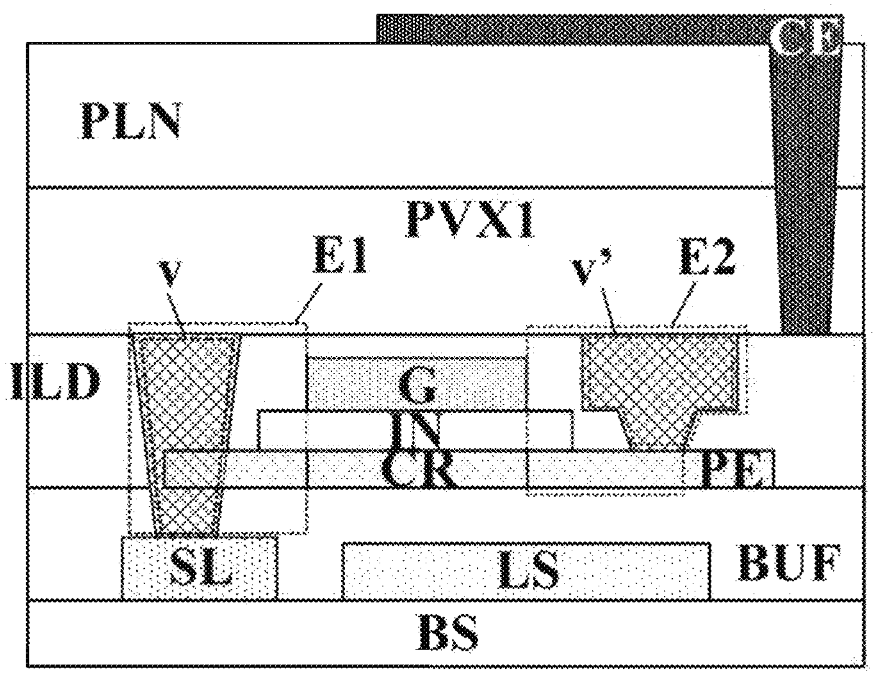
Figure 50A:
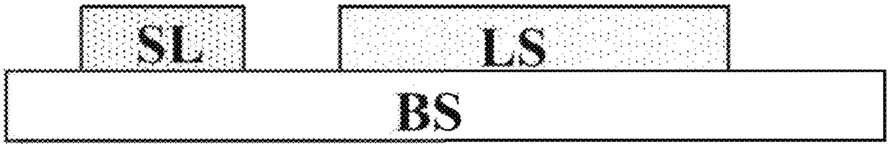
FIG. 50A to FIG. 50F illustrate a process of fabricating an array substrate in some embodiments according to the present disclosure.
Figure 50B:
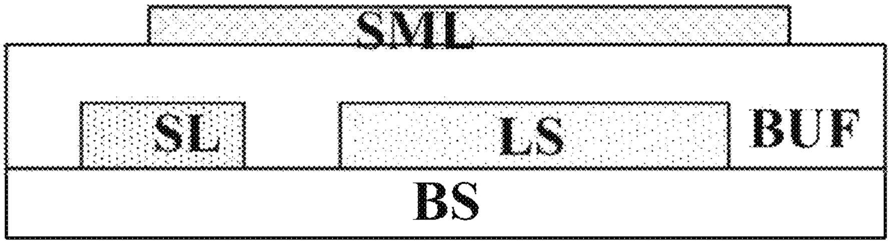
Figure 50C:
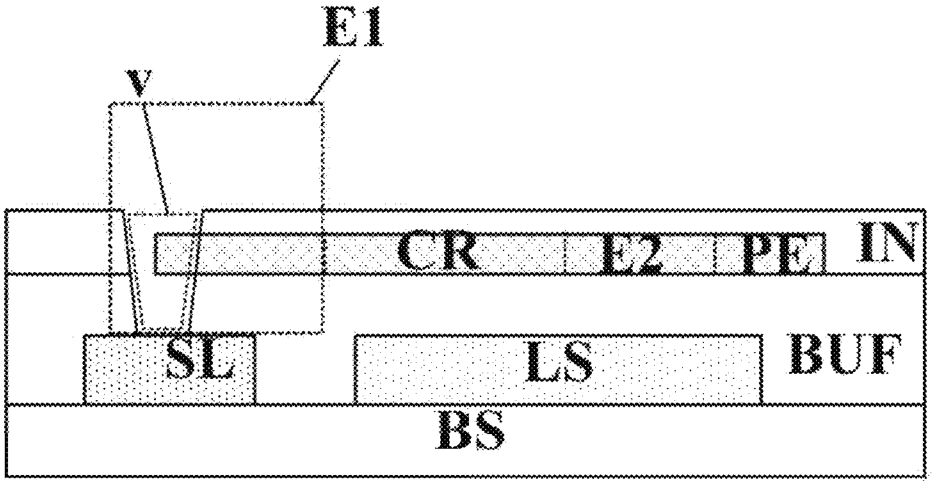
Figure 50D:
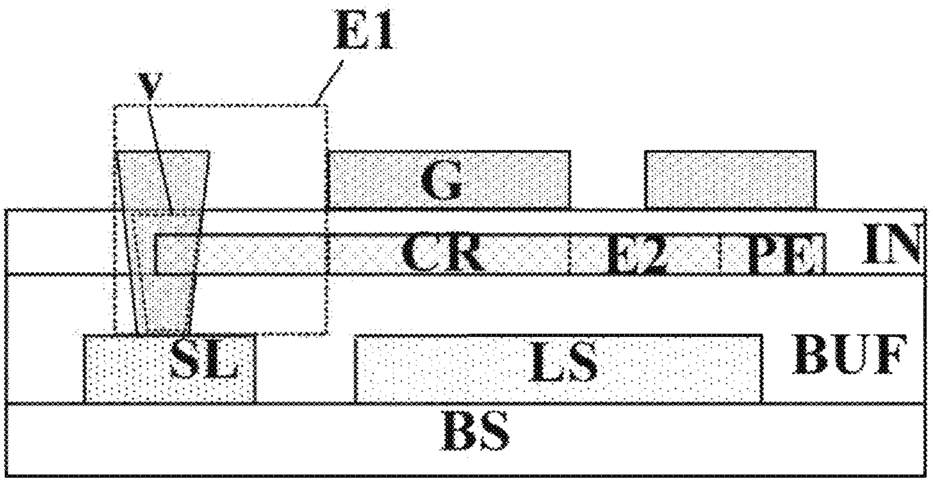
Figure 50E:
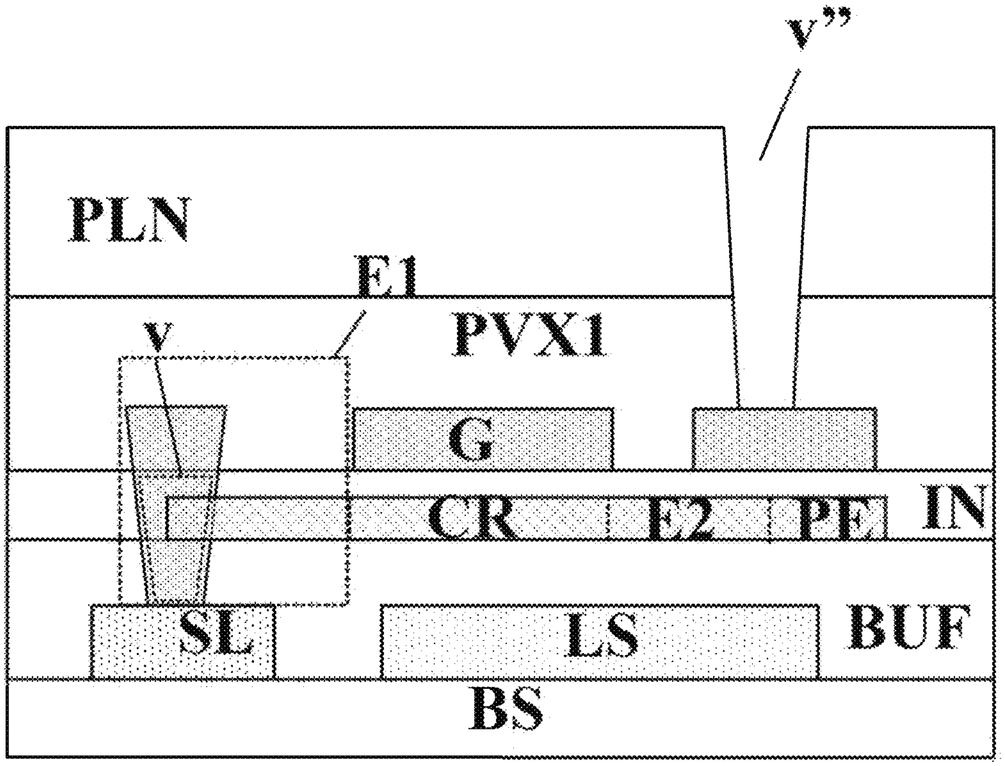
Figure 50F:
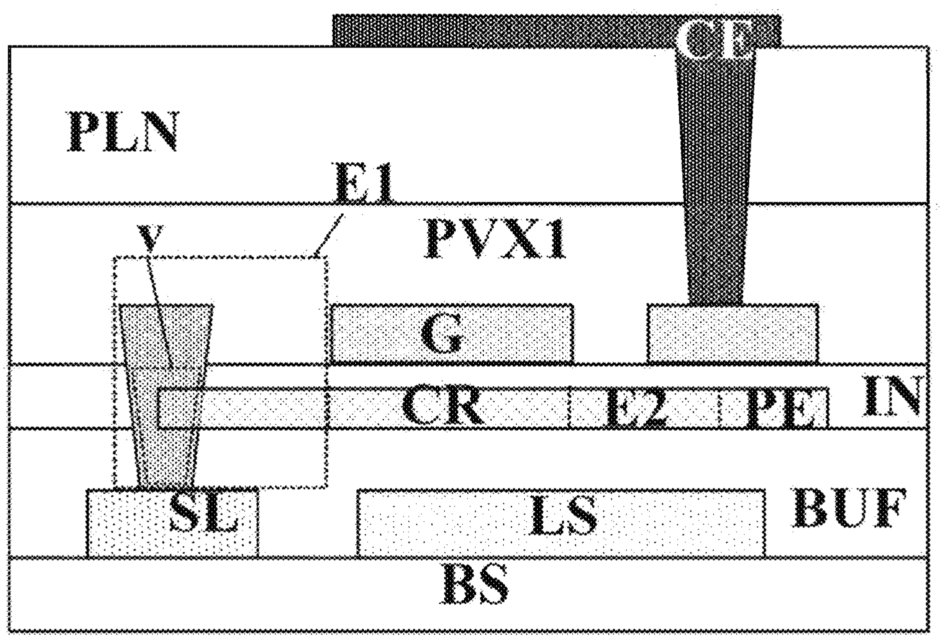
Figure 51A:
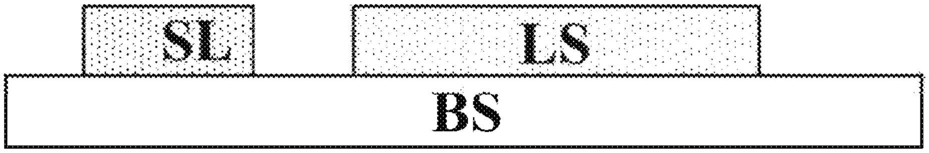
FIG. 51A to FIG. 51F illustrate a process of fabricating an array substrate in some embodiments according to the present disclosure.
Figure 51B:
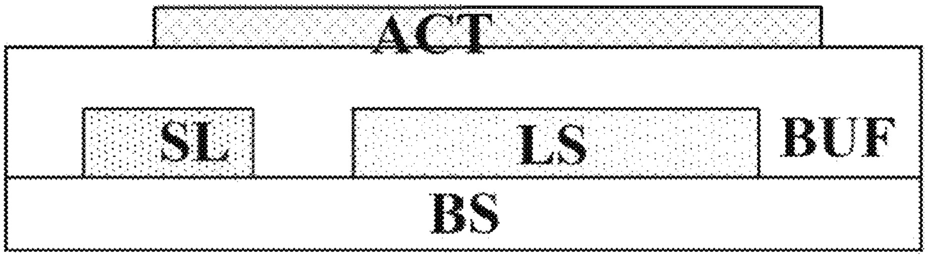
Figure 51C:
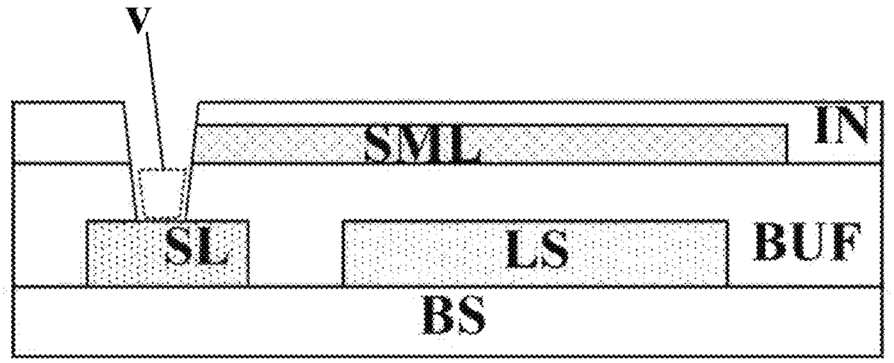
Figure 51D:
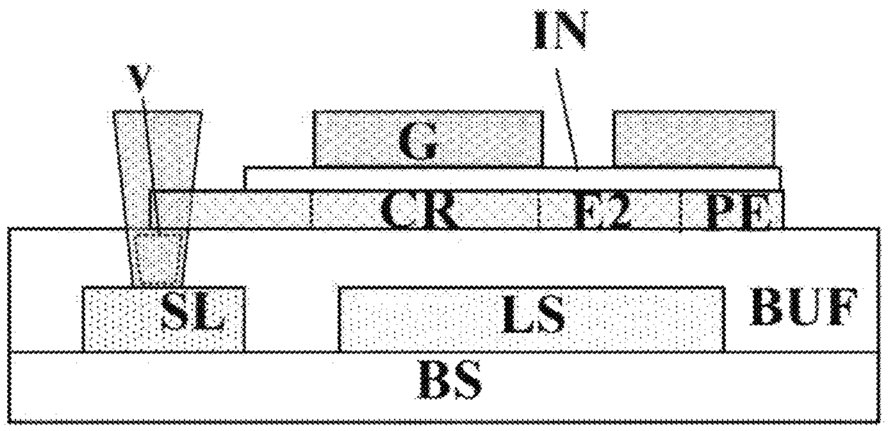
Figure 51E:
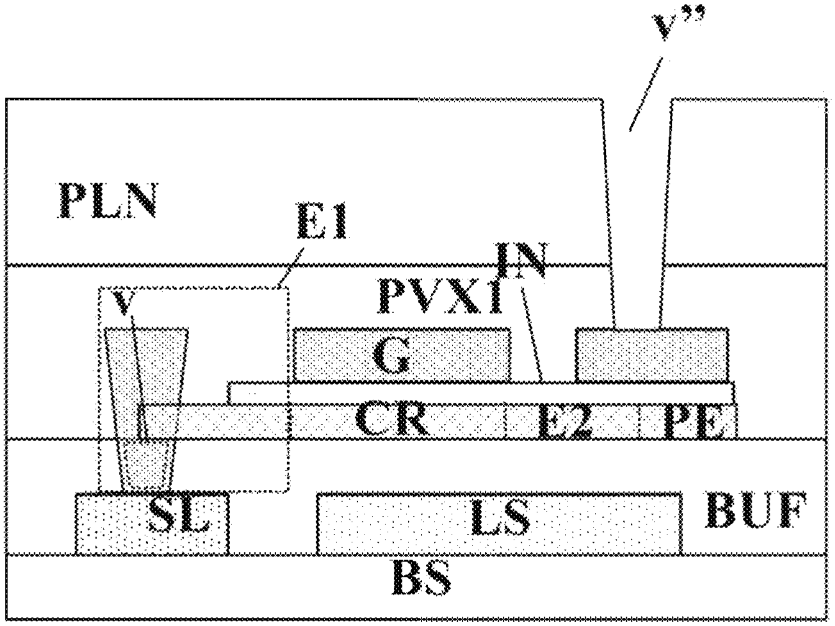
Figure 51F:
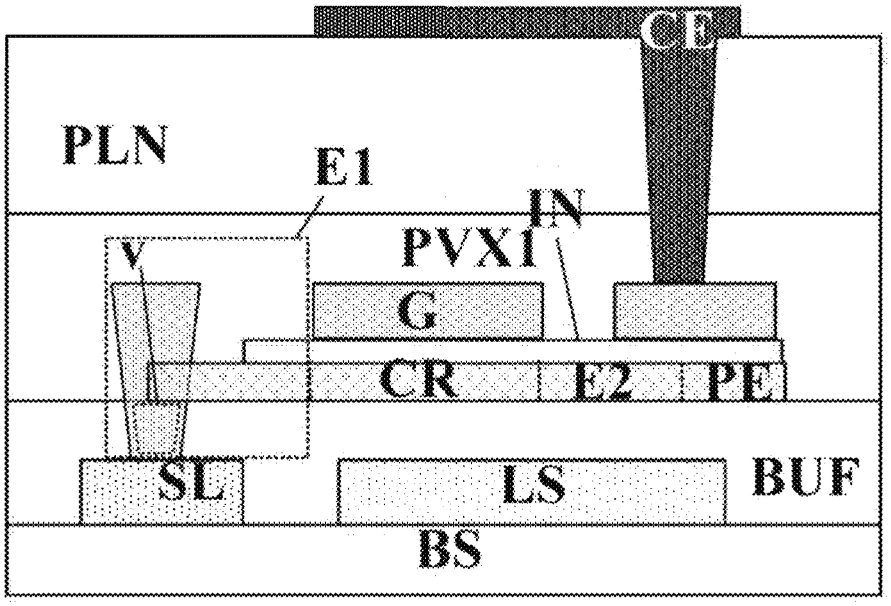
Figure 52A:
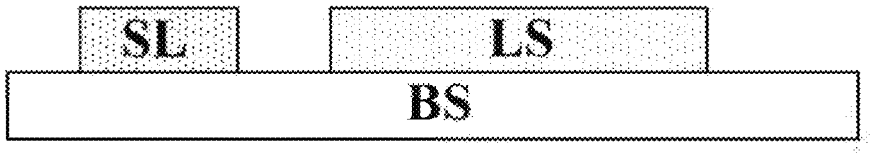
FIG. 52A to FIG. 52F illustrate a process of fabricating an array substrate in some embodiments according to the present disclosure.
Figure 52B:
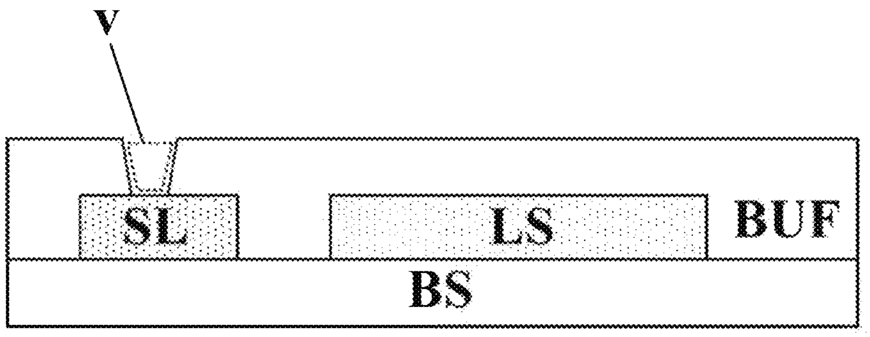
Figure 52C:
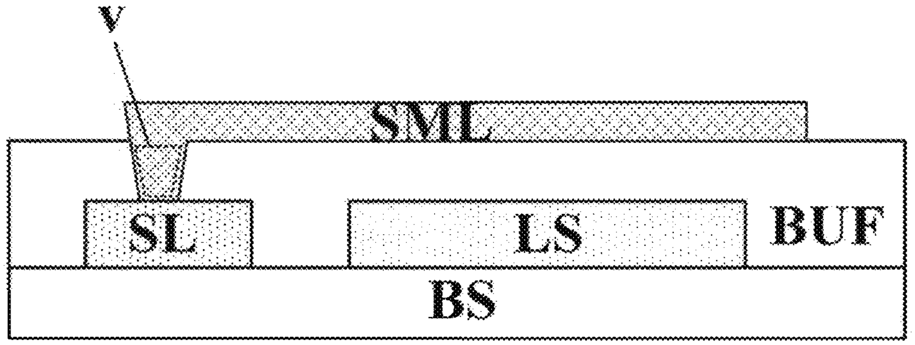
Figure 52D:
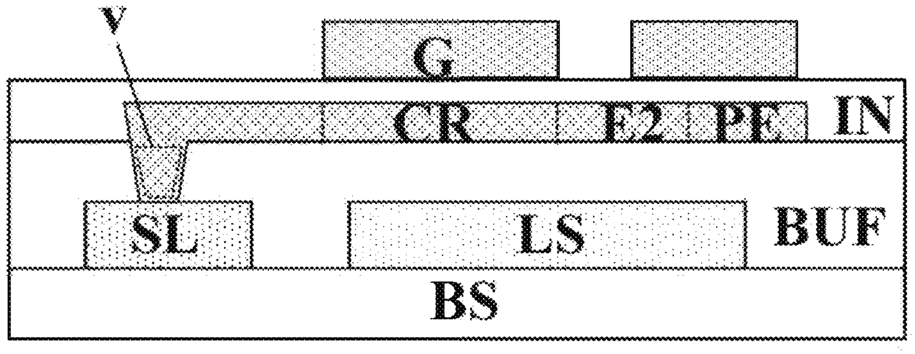
Figure 52E:
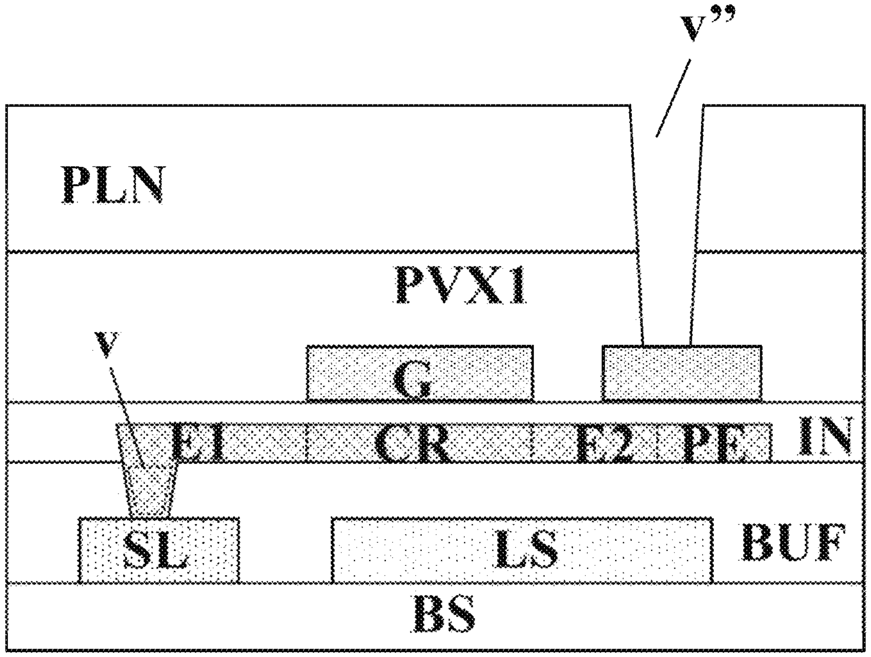
Figure 52F:
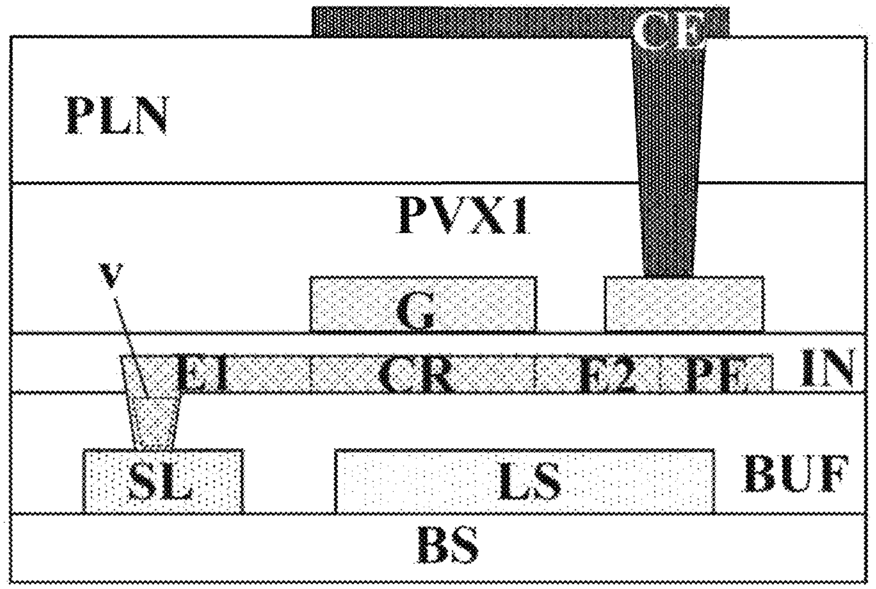
Figure 53A:
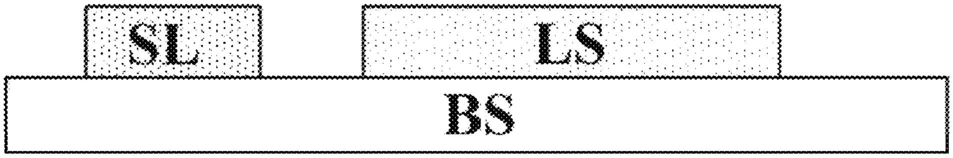
FIG. 53A to FIG. 53F illustrate a process of fabricating an array substrate in some embodiments according to the present disclosure.
Figure 53B:
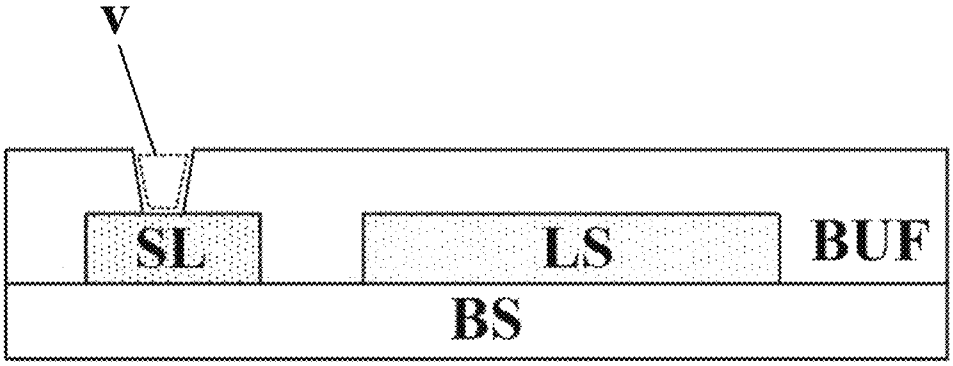
Figure 53C:
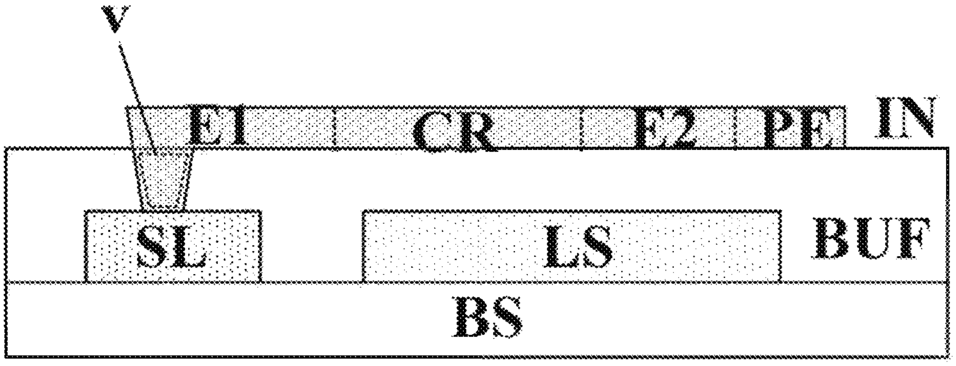
Figure 53D:
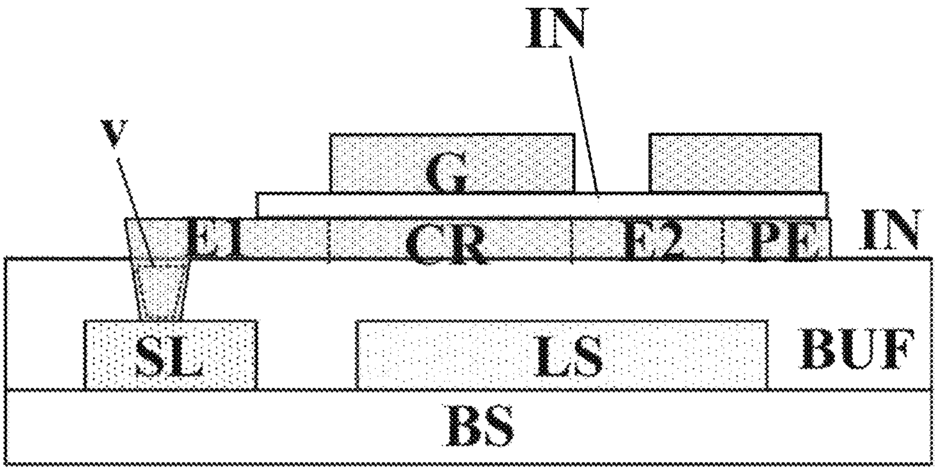
Figure 53E:
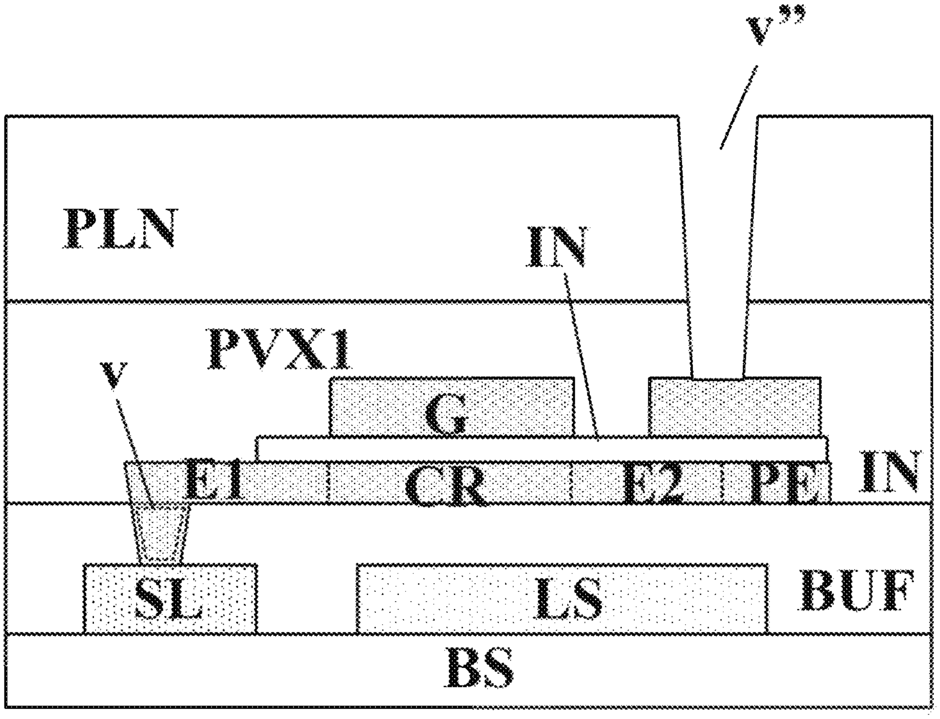
Figure 53F:
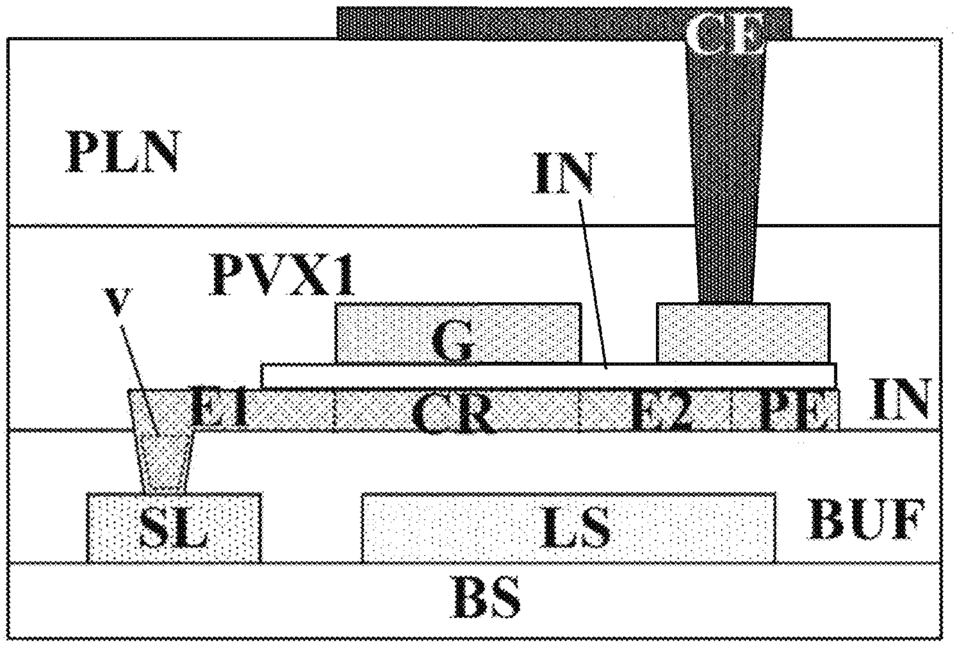
Figure 54A:
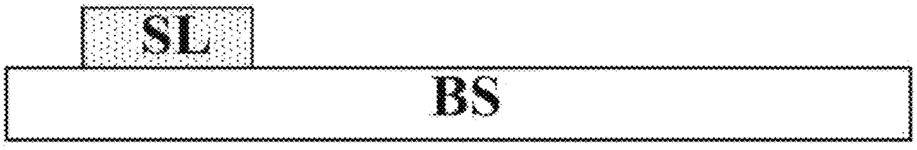
FIG. 54A to FIG. 54E illustrate a process of fabricating an array substrate in some embodiments according to the present disclosure.
Figure 54B:
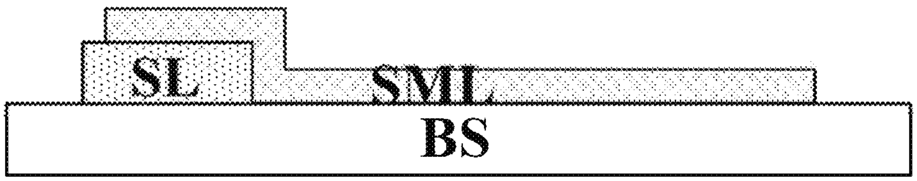
Figure 54C:
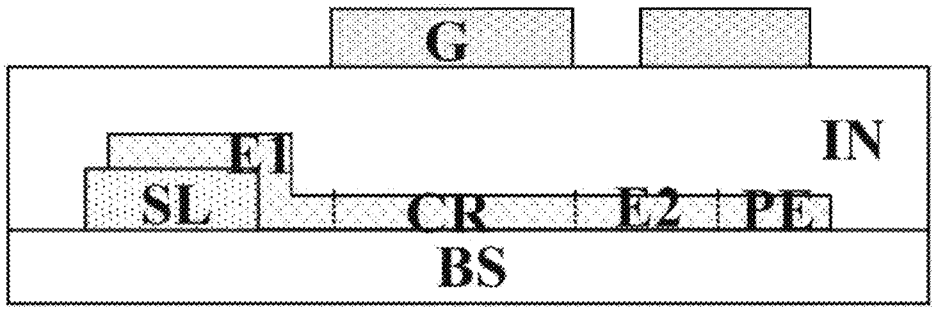
Figure 54D:
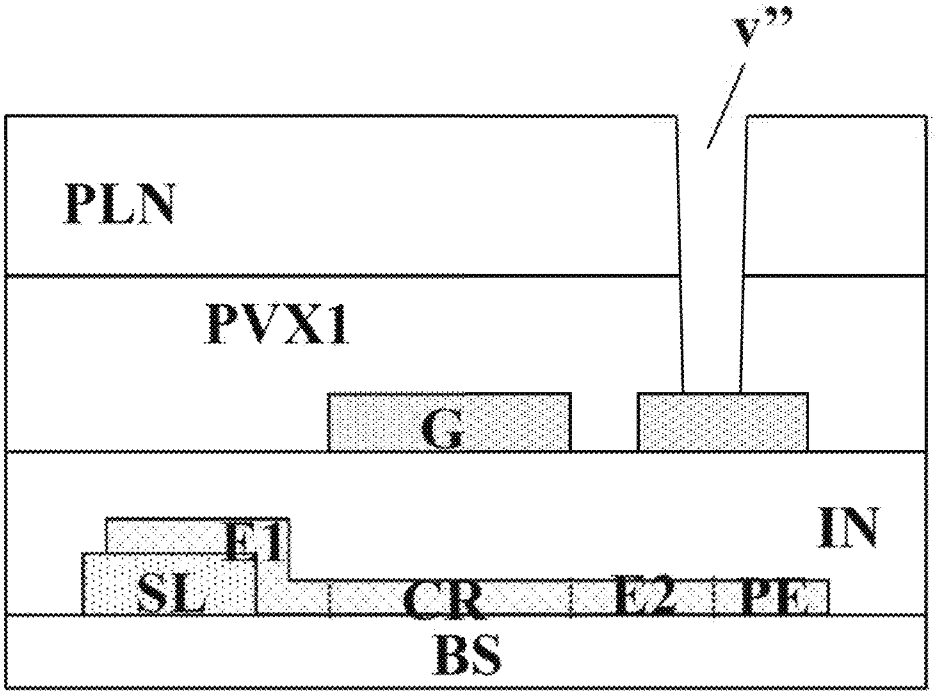
Figure 54E:
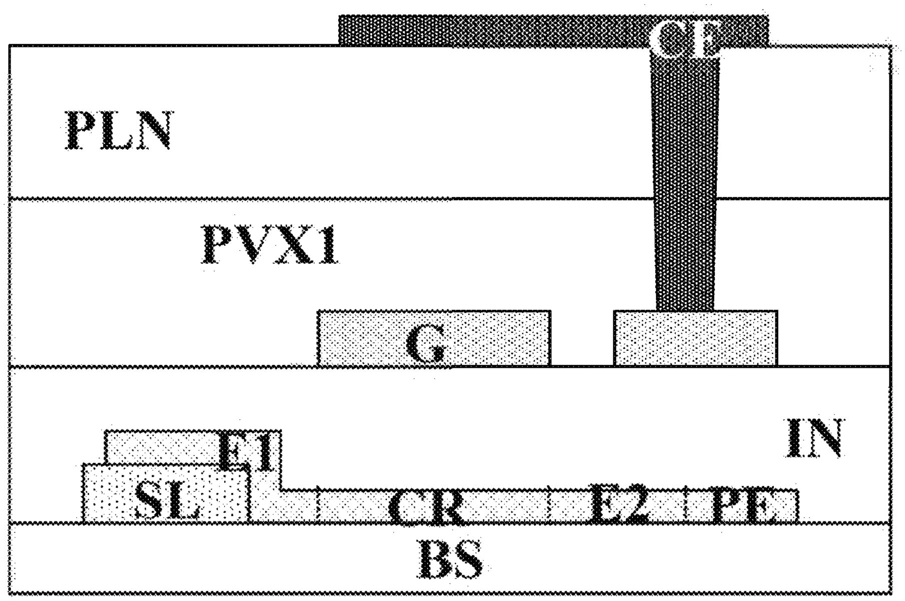
Figure 55A:
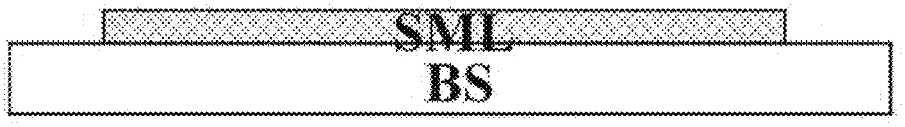
FIG. 55A to FIG. 55E illustrate a process of fabricating an array substrate in some embodiments according to the present disclosure.
Figure 55B:
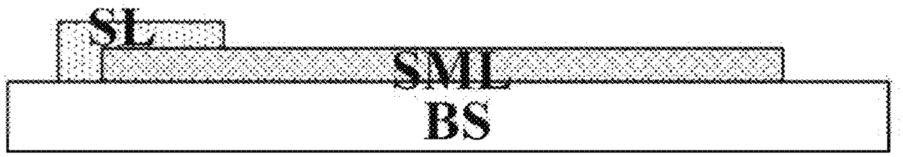
Figure 55C:
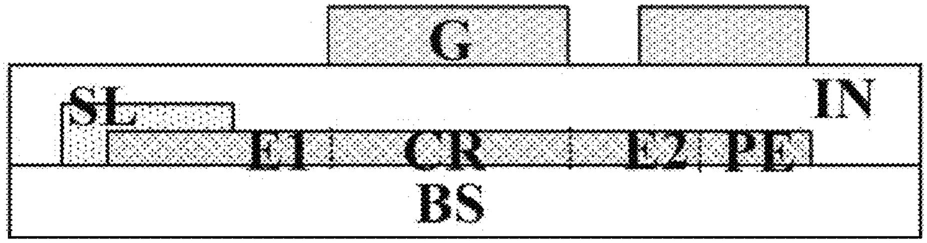
Figure 55D:
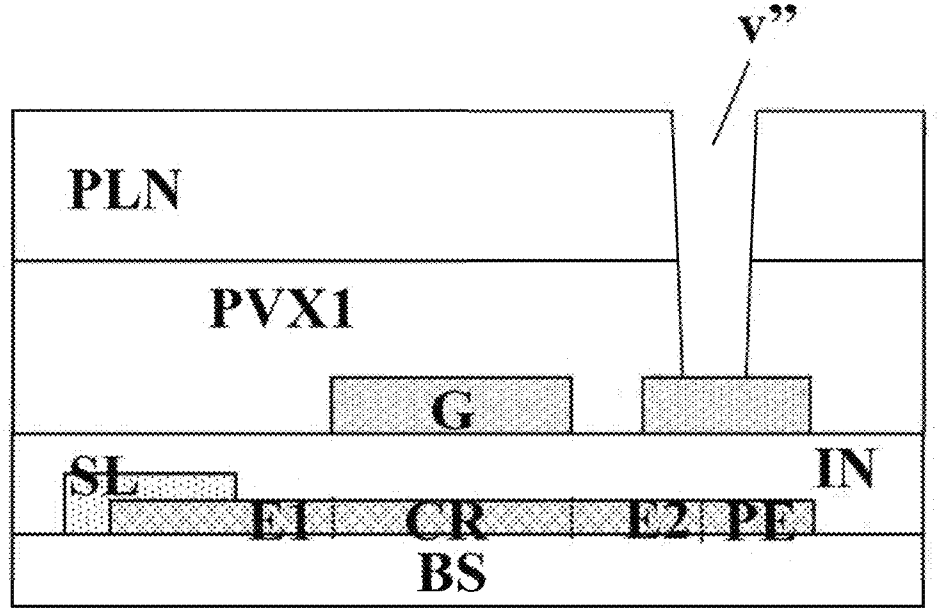
Figure 55E:
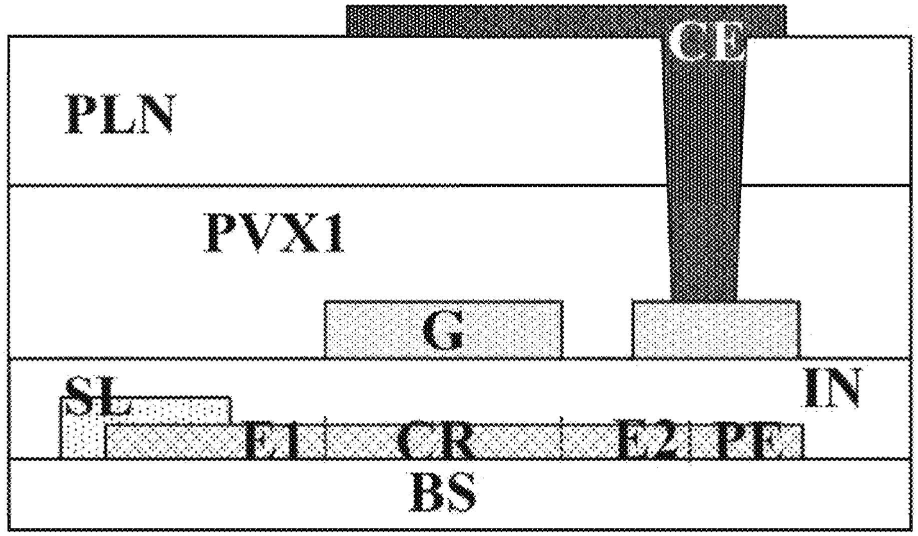
Figure 56A:
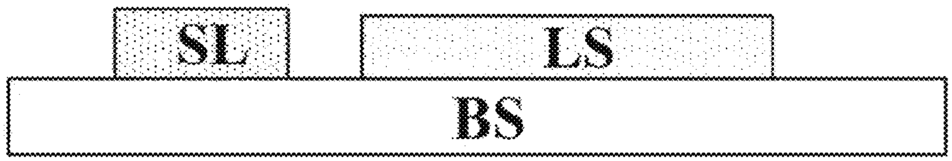
FIG. 56A to FIG. 56G illustrate a process of fabricating an array substrate in some embodiments according to the present disclosure.
Figure 56B:
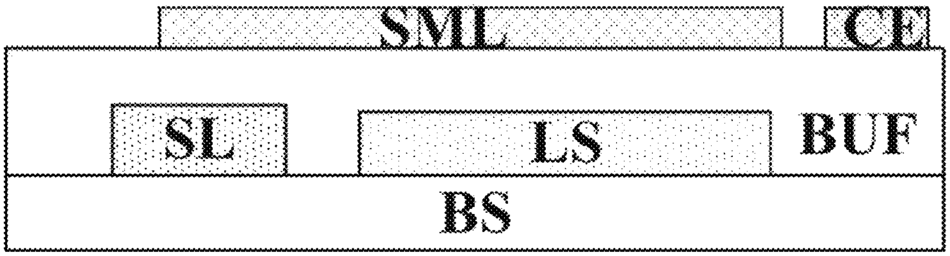
Figure 56C:
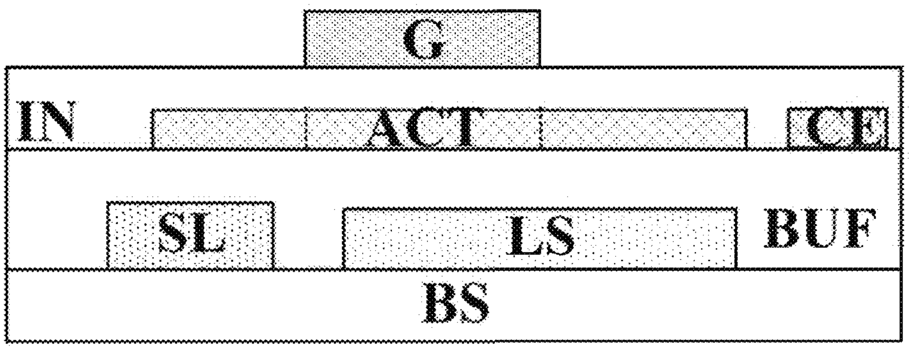
Figure 56D:
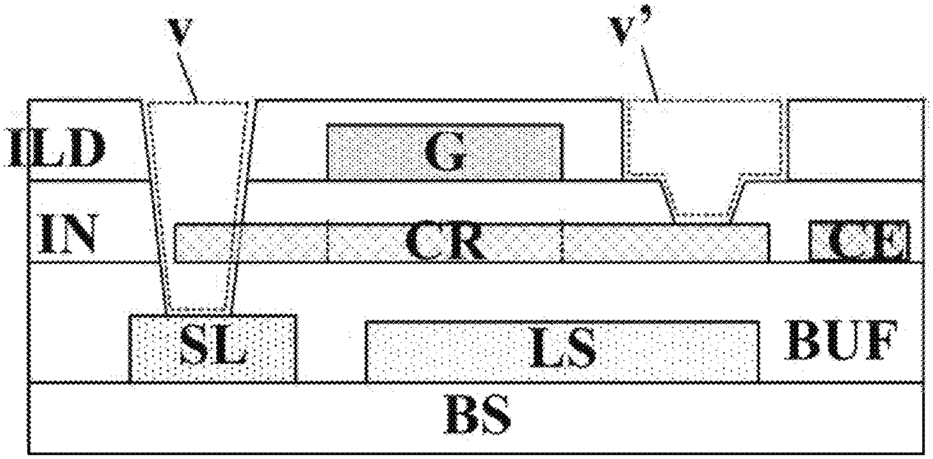
Figure 56E:
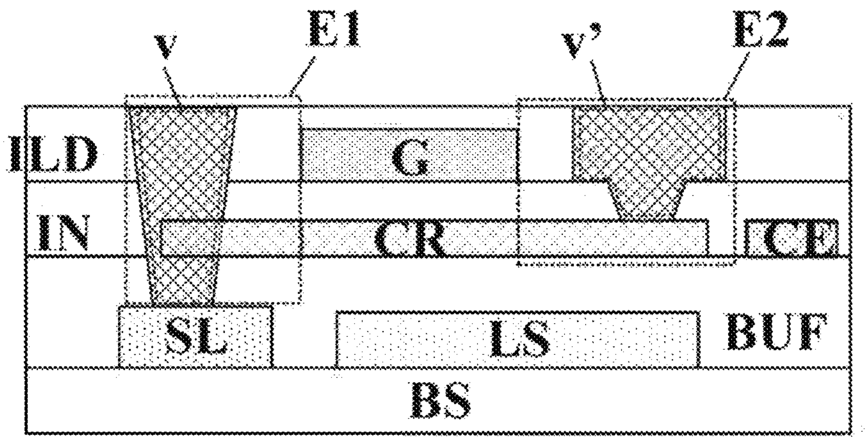
Figure 56F:
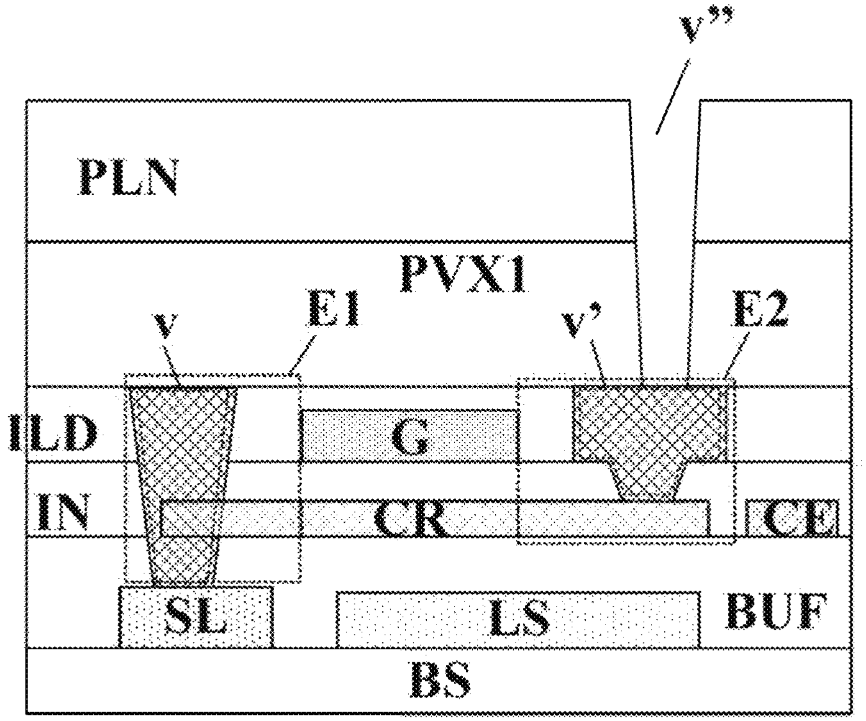
Figure 56G:
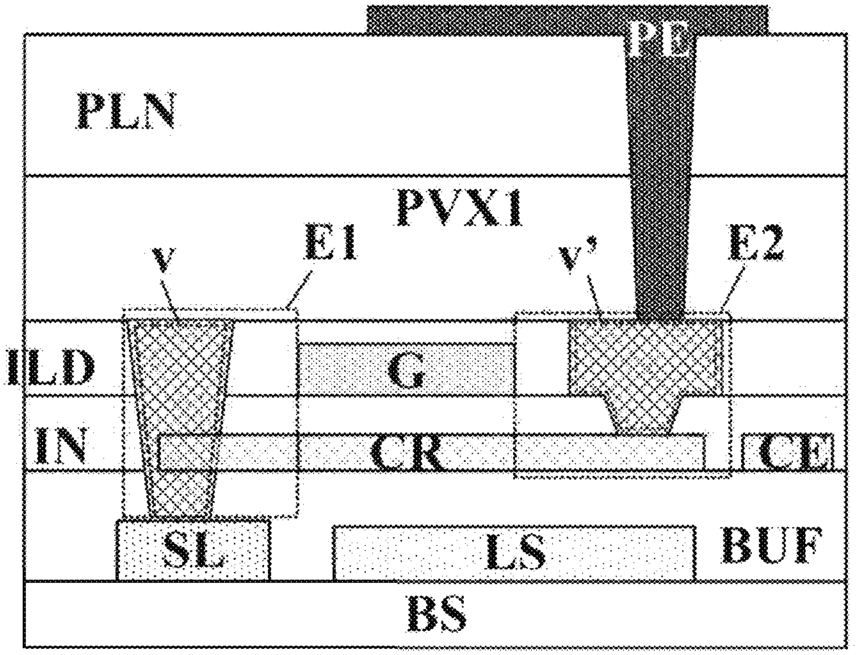
Figure 57A:
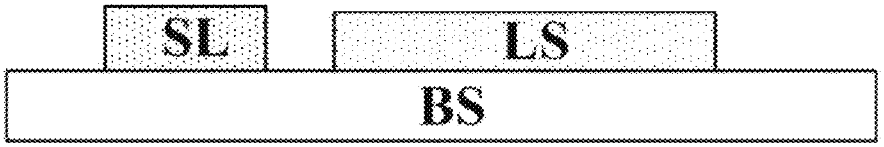
FIG. 57A to FIG. 57G illustrate a process of fabricating an array substrate in some embodiments according to the present disclosure.
Figure 57B:
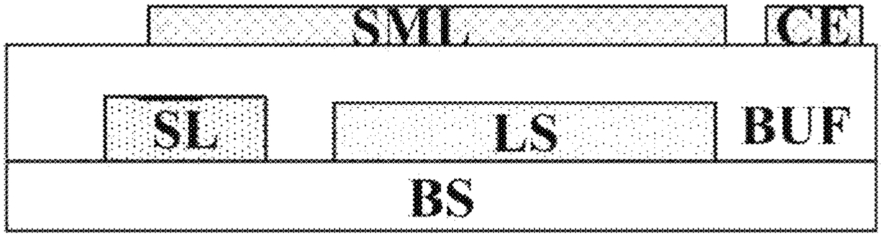
Figure 57C:
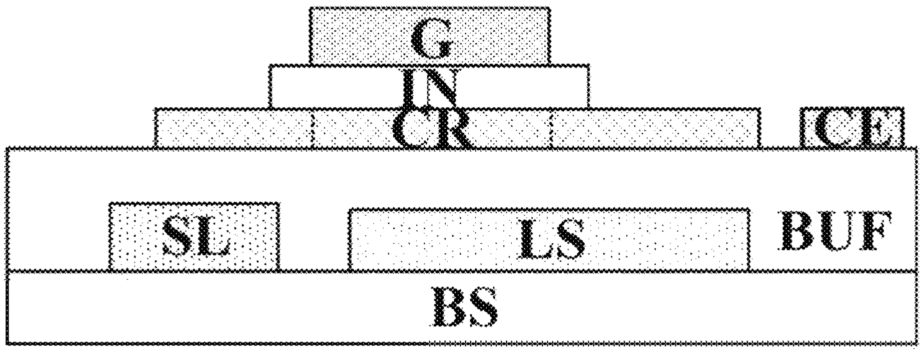
Figure 57D:
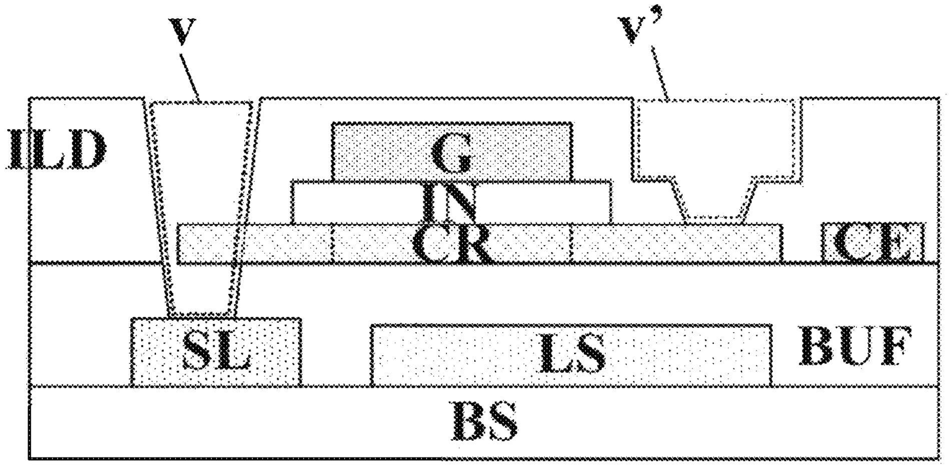
Figure 57E:
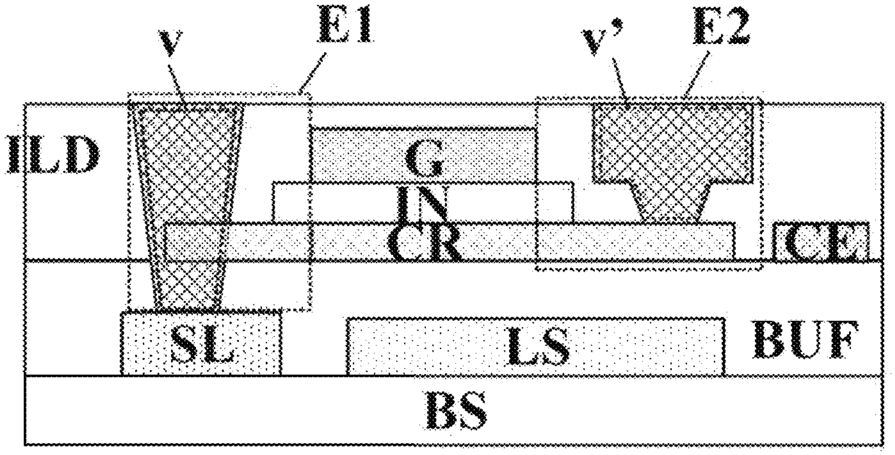
Figure 57F:
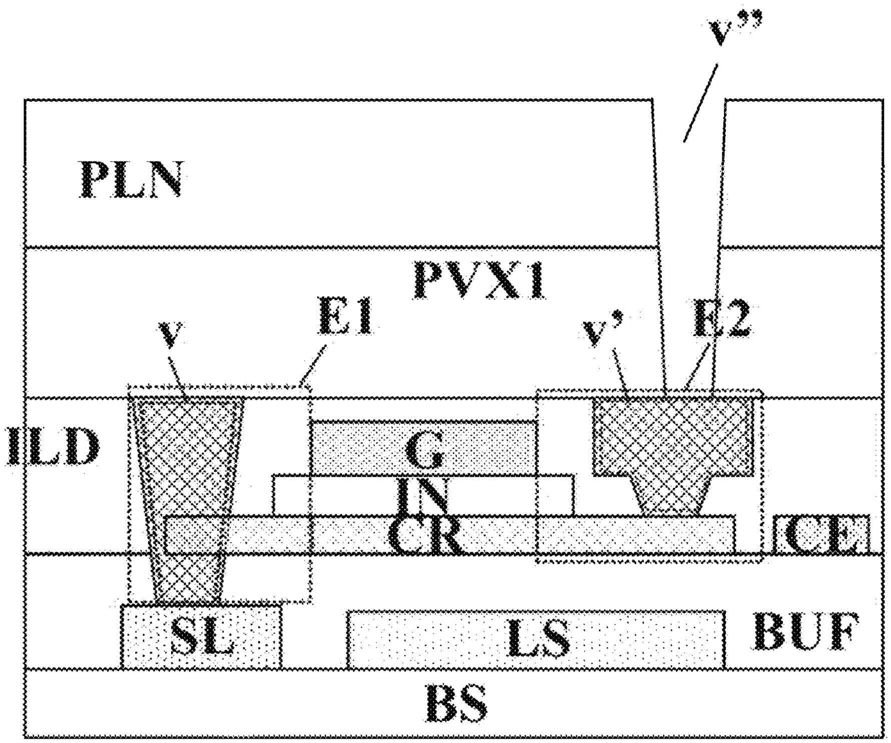
Figure 57G:
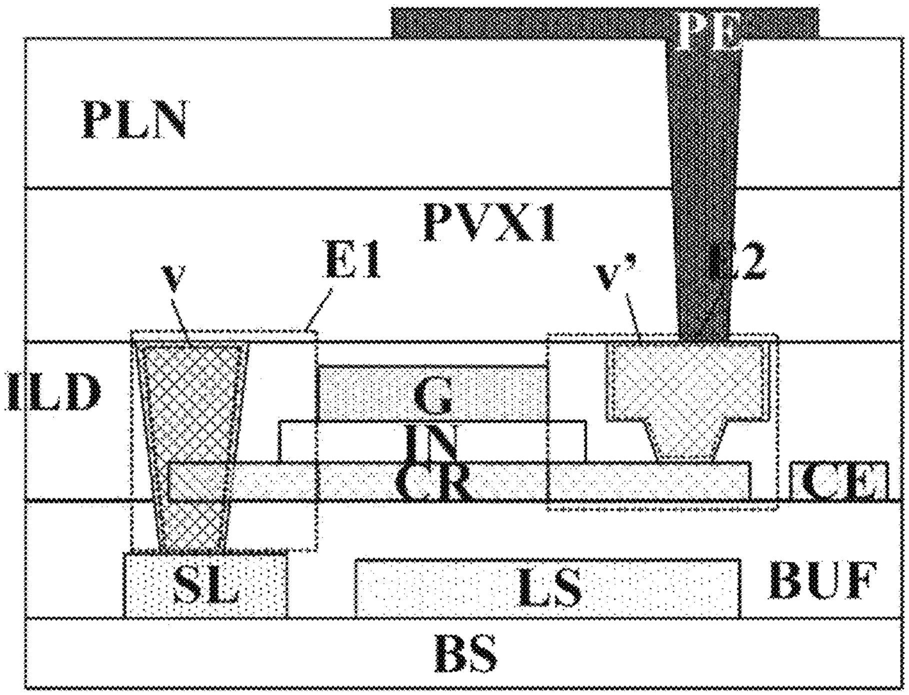
Figure 58A:
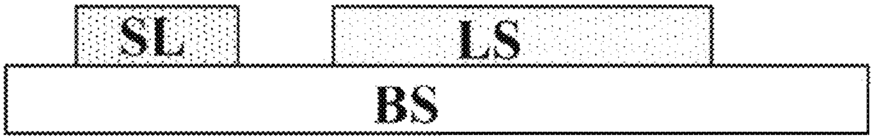
FIG. 58A to FIG. 58F illustrate a process of fabricating an array substrate in some embodiments according to the present disclosure.
Figure 58B:
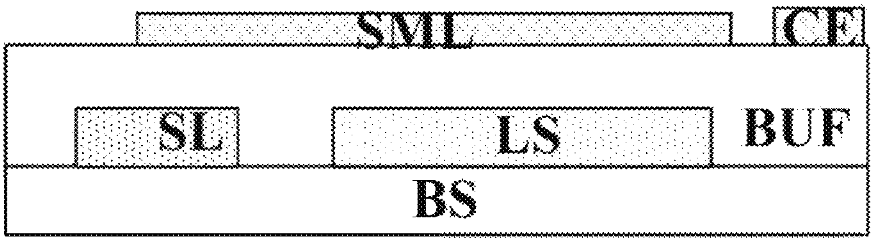
Figure 58C:
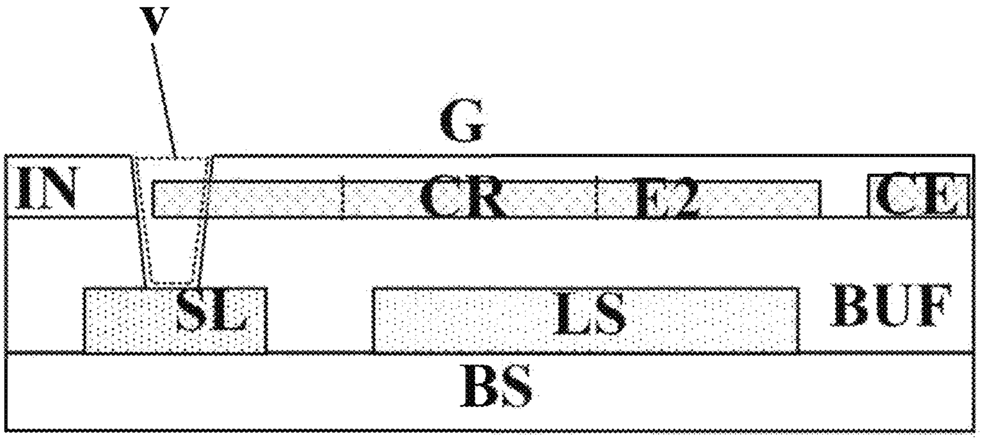
Figure 58D:
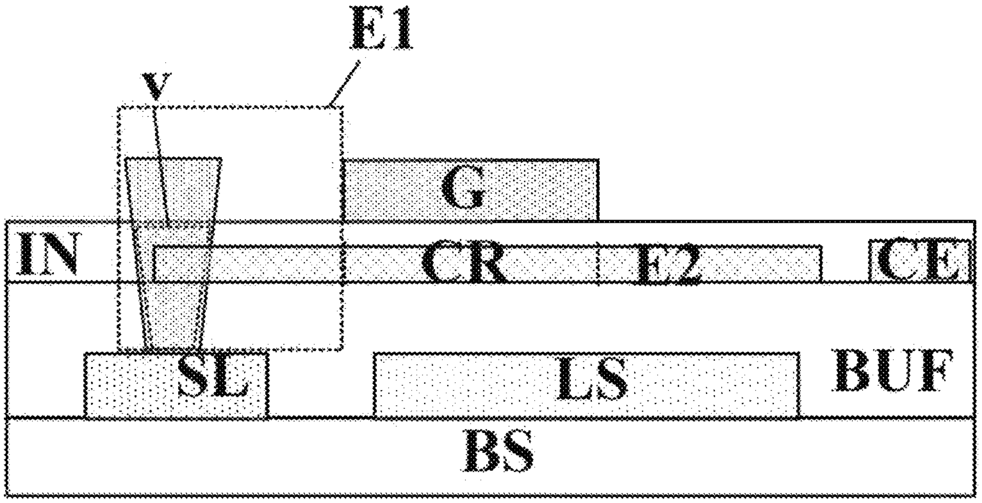
Figure 58E:
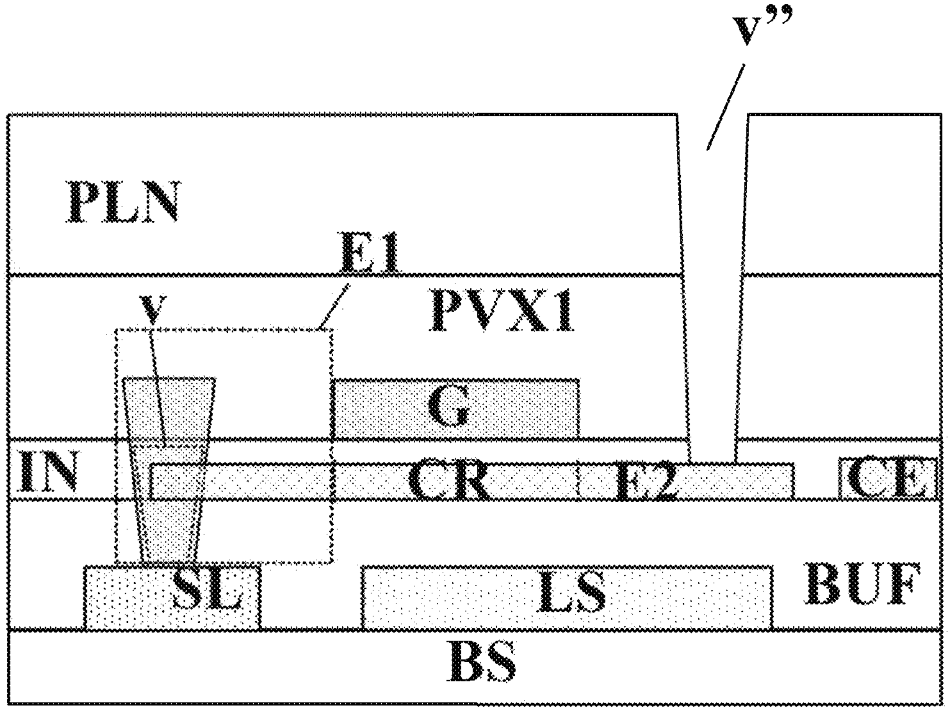
Figure 58F:
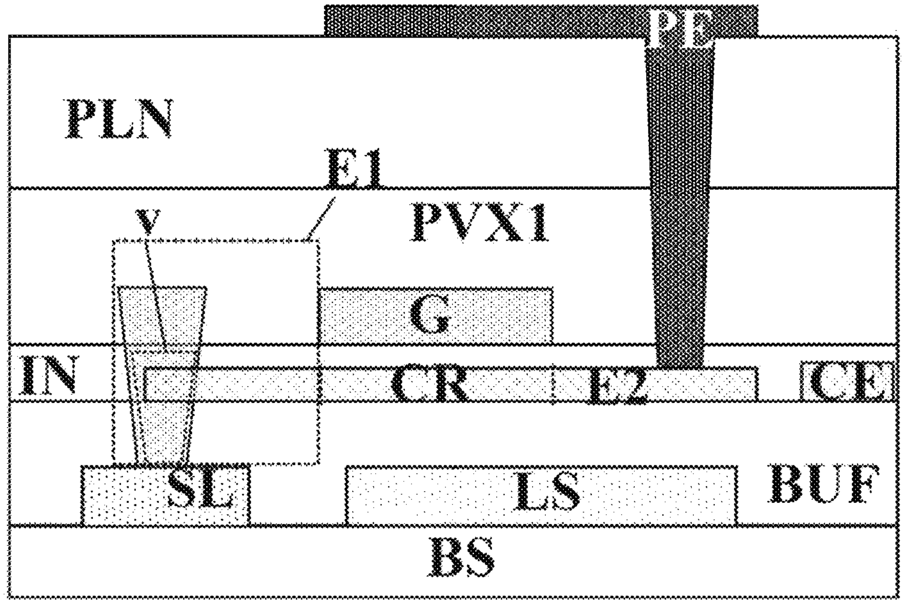
Figure 59A:
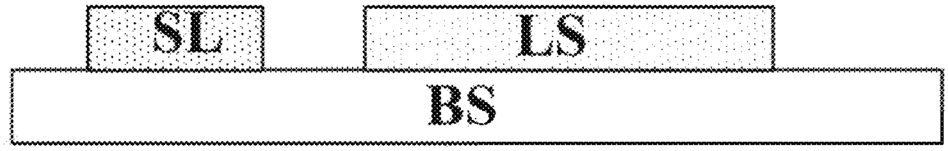
FIG. 59A to FIG. 59F illustrate a process of fabricating an array substrate in some embodiments according to the present disclosure.
Figure 59B:
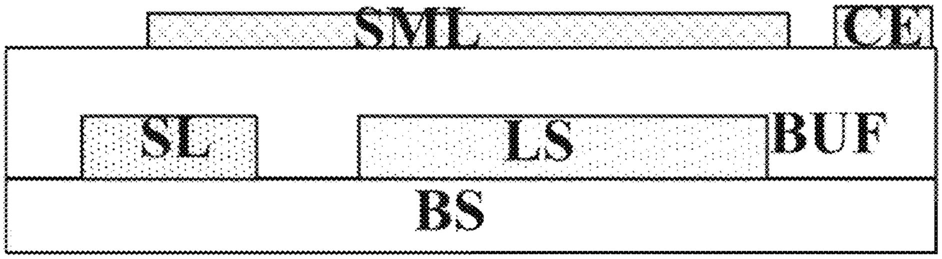
Figure 59C:
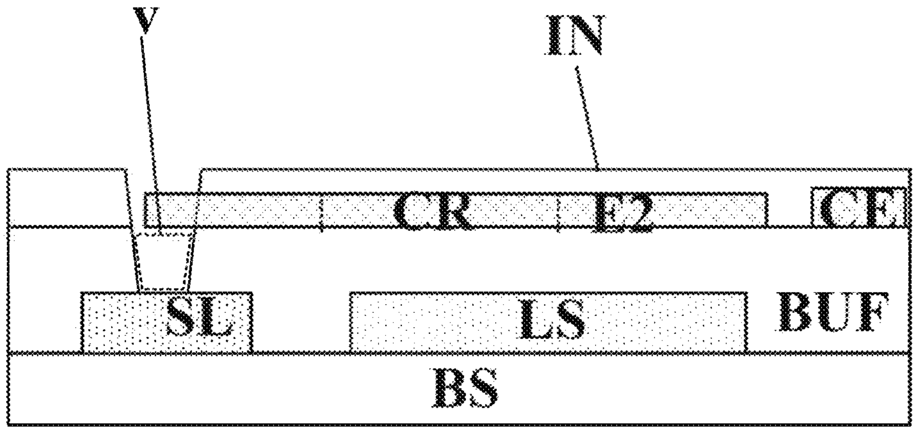
Figure 59D:
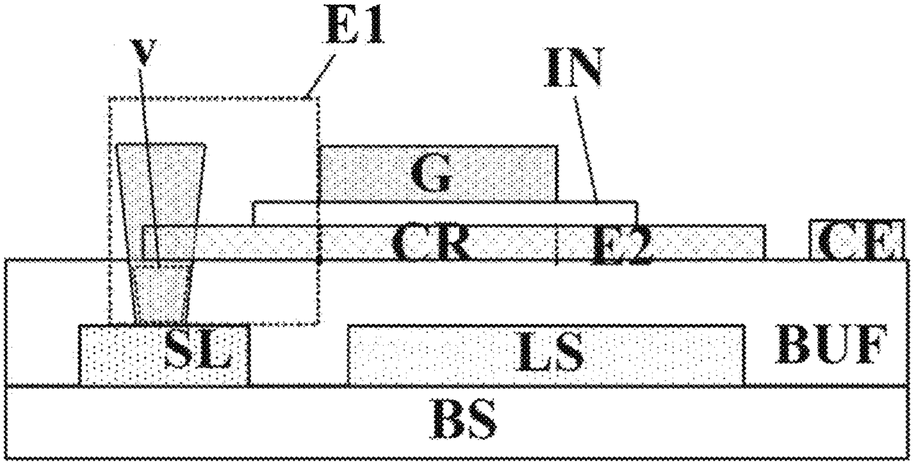
Figure 59E:
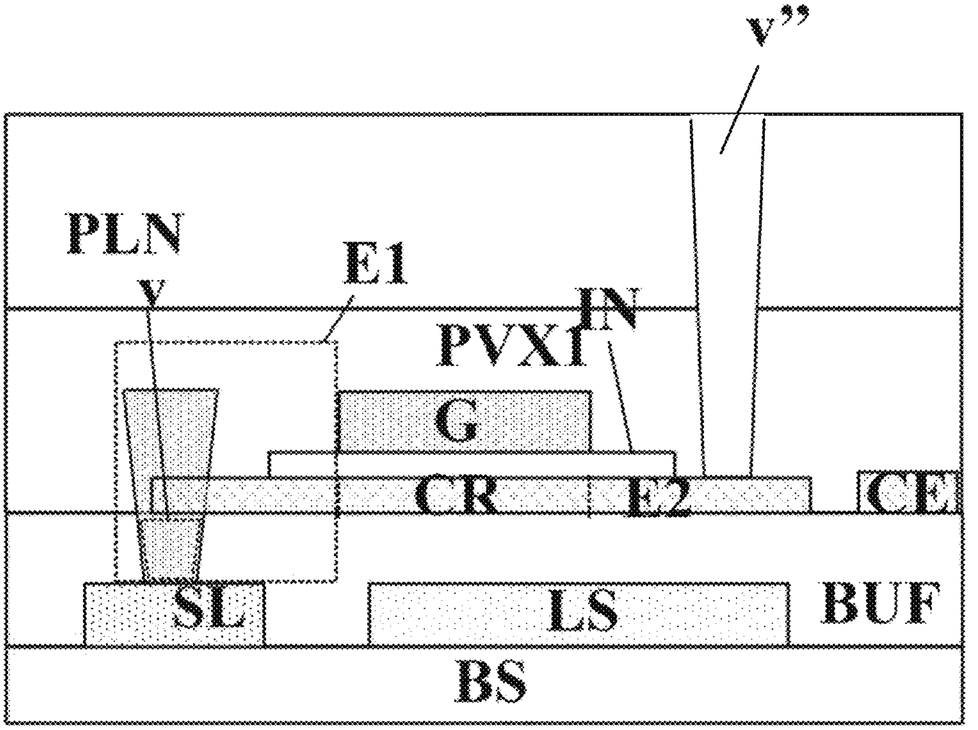
Figure 59F:
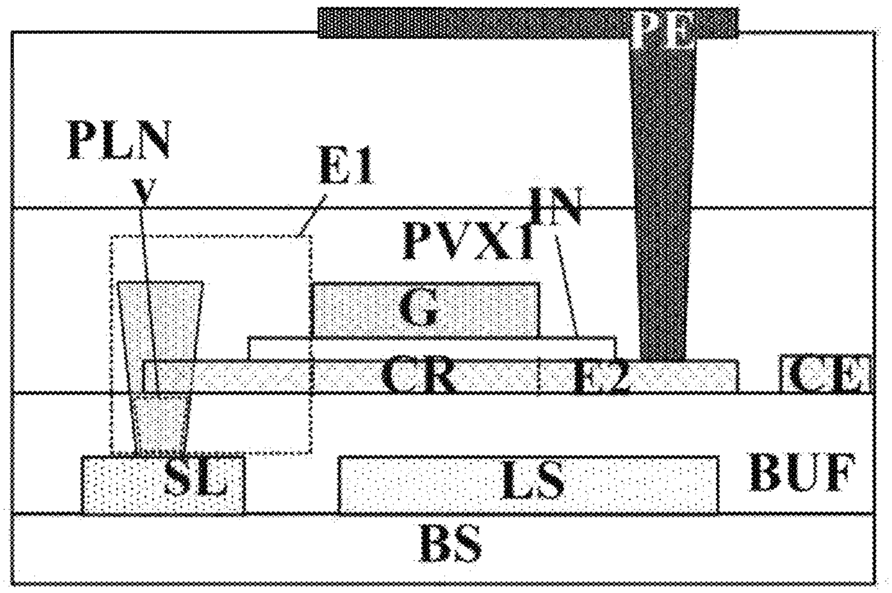
Figure 60A:
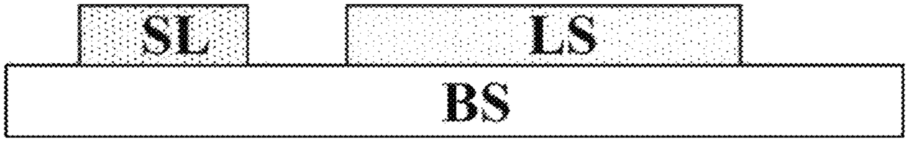
FIG. 60A to FIG. 60F illustrate a process of fabricating an array substrate in some embodiments according to the present disclosure.
Figure 60B:
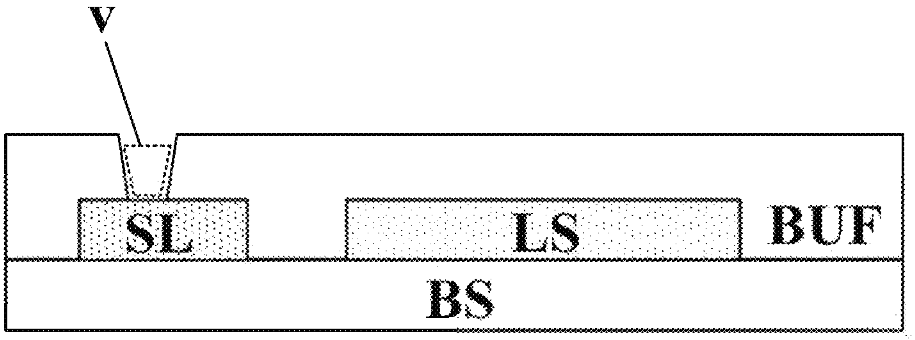
Figure 60C:
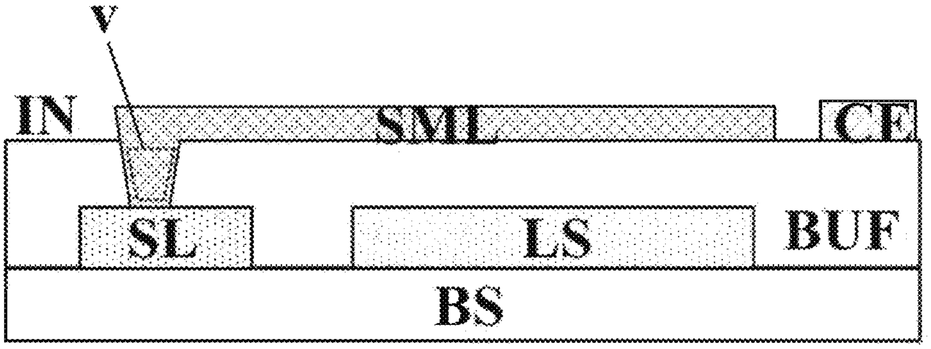
Figure 60D:
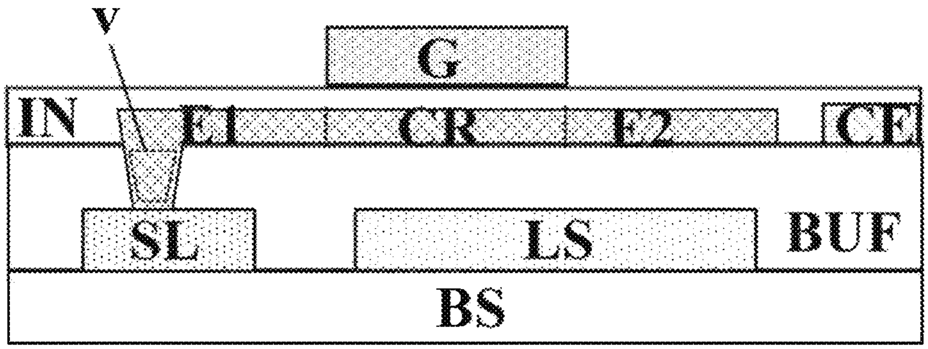
Figure 60E:
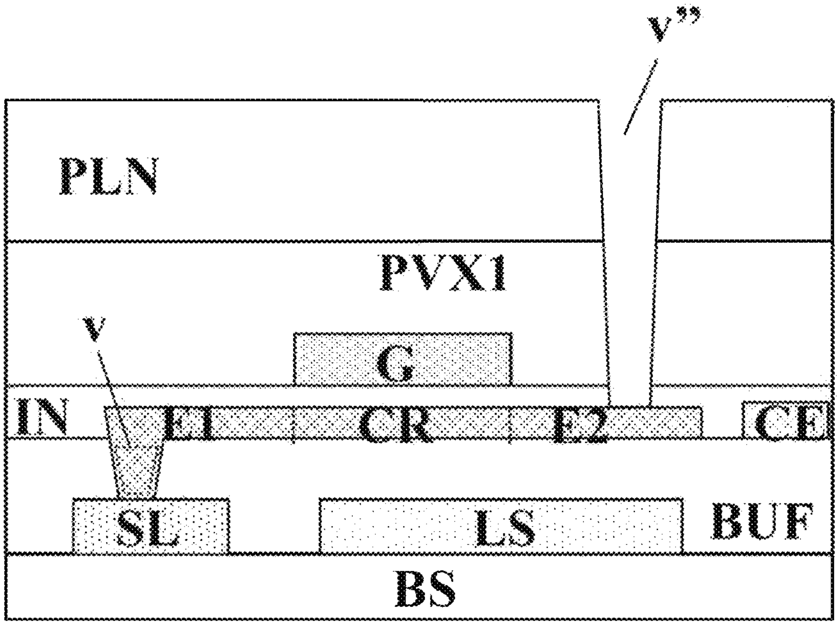
Figure 60F:
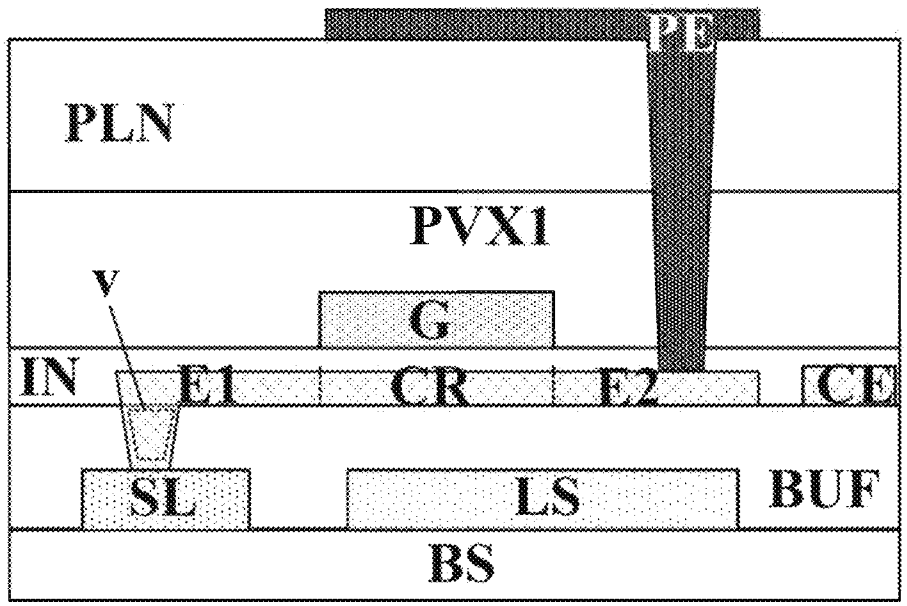
Figure 61A:
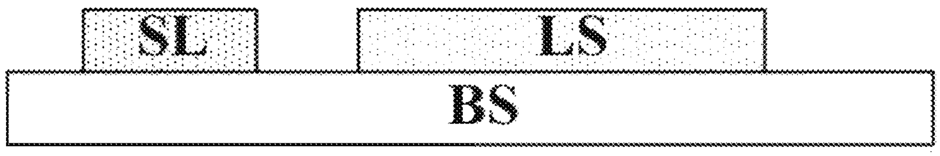
FIG. 61A to FIG. 61F illustrate a process of fabricating an array substrate in some embodiments according to the present disclosure.
Figure 61B:
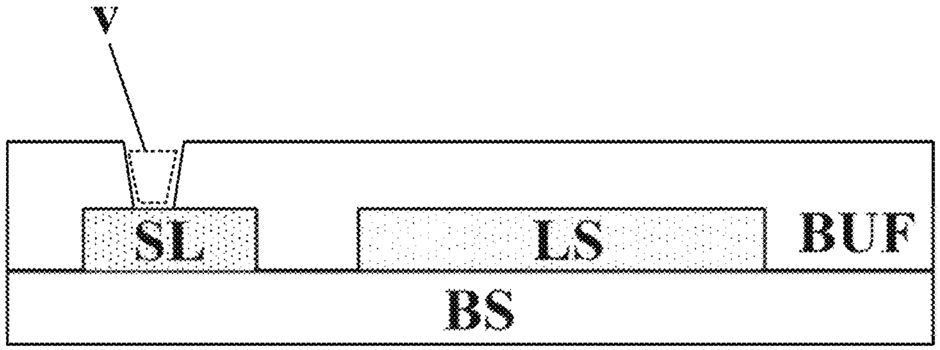
Figure 61C:
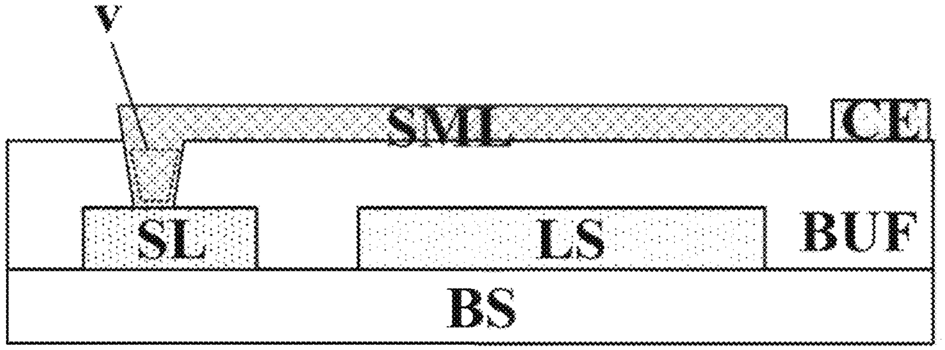
Figure 61D:
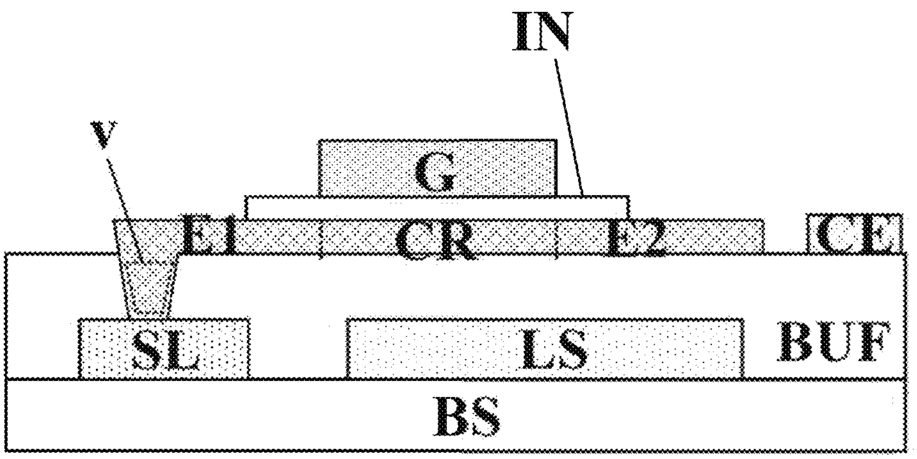
Figure 61E:
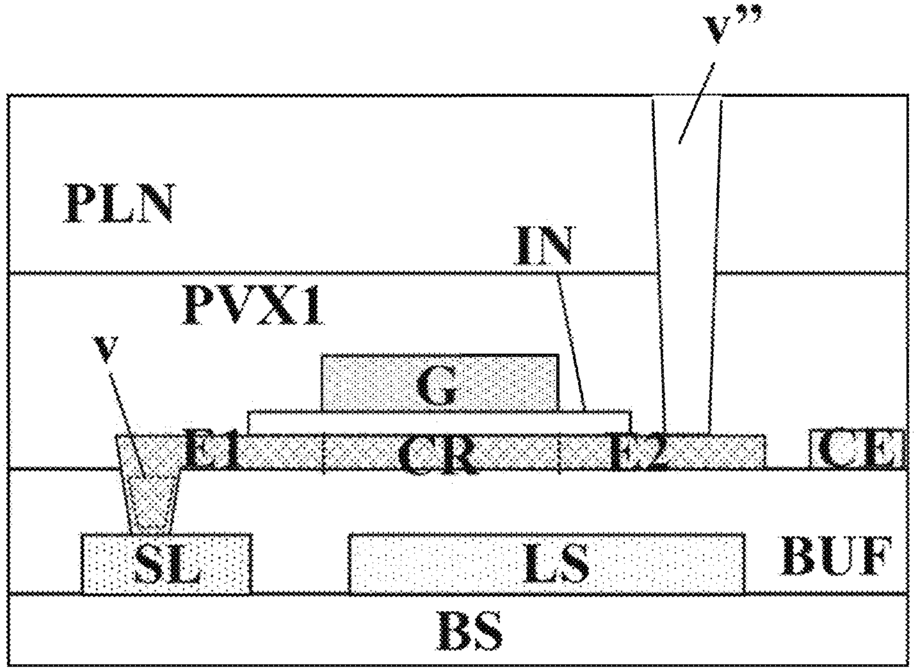
Figure 61F:
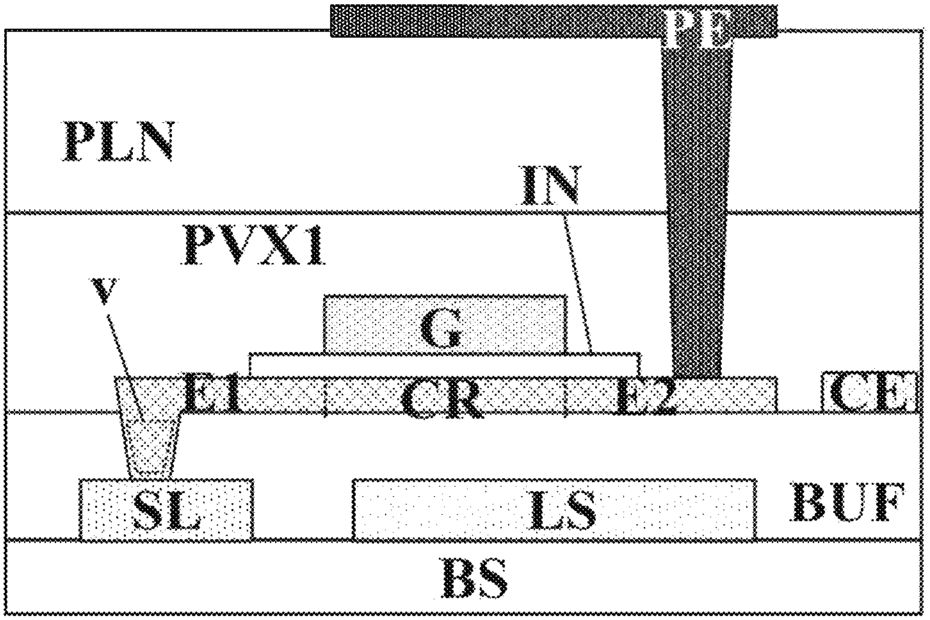
Figure 62A:
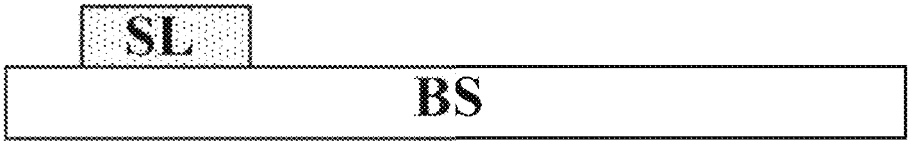
FIG. 62A to FIG. 62E illustrate a process of fabricating an array substrate in some embodiments according to the present disclosure.
Figure 62B:
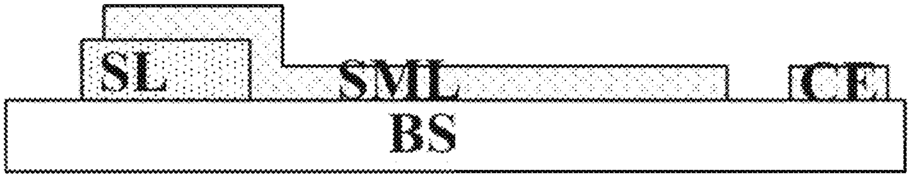
Figure 62C:
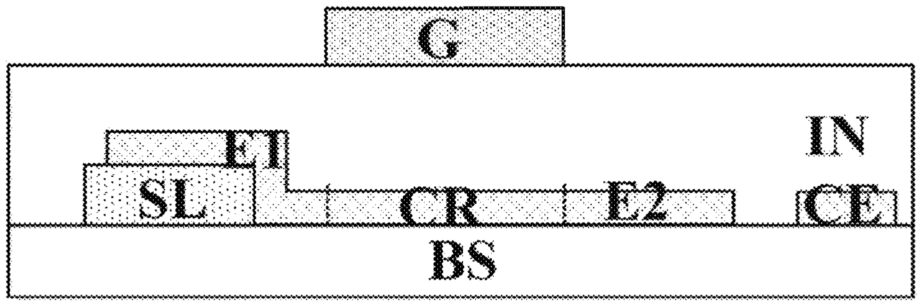
Figure 62D:
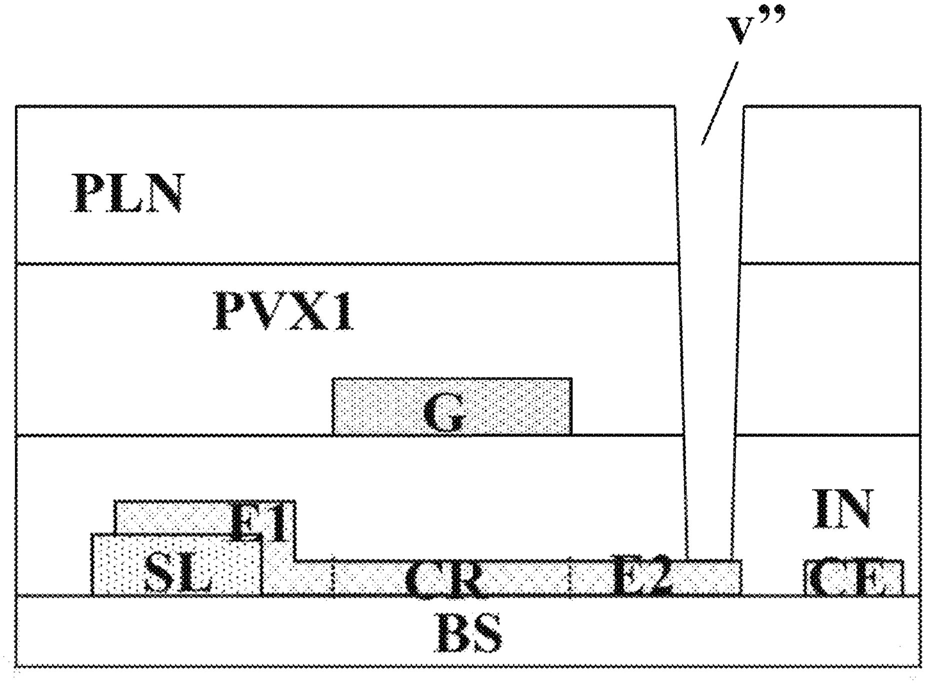
Figure 62E:
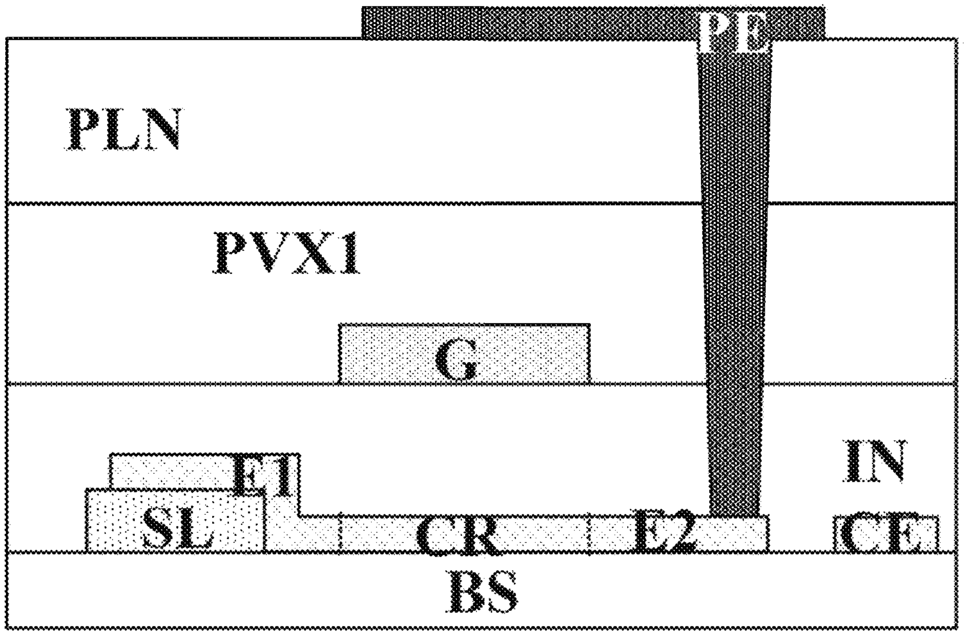
Figure 63A:
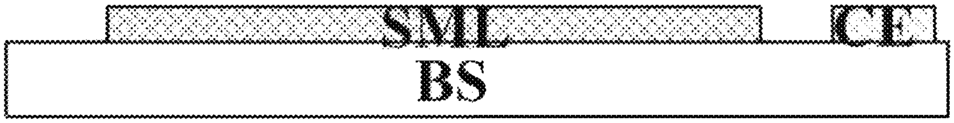
FIG. 63A to FIG. 63E illustrate a process of fabricating an array substrate in some embodiments according to the present disclosure.
Figure 63B:
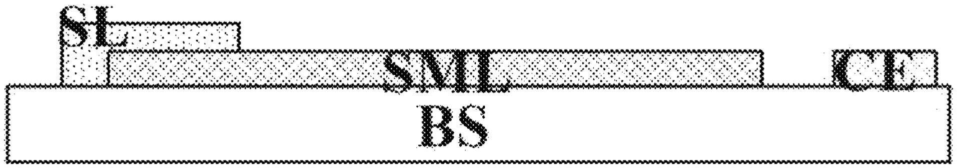
Figure 63C:
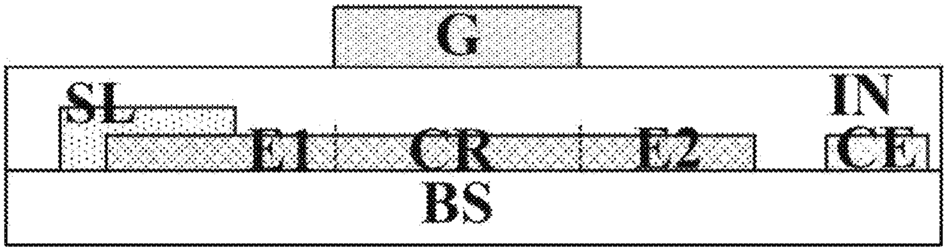
Figure 63D:
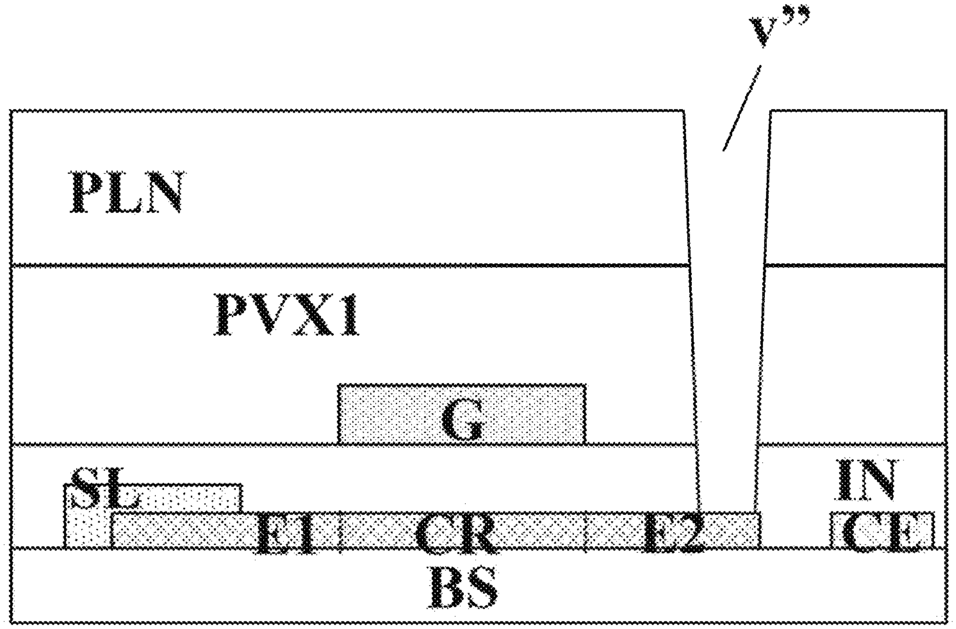
Figure 63E:
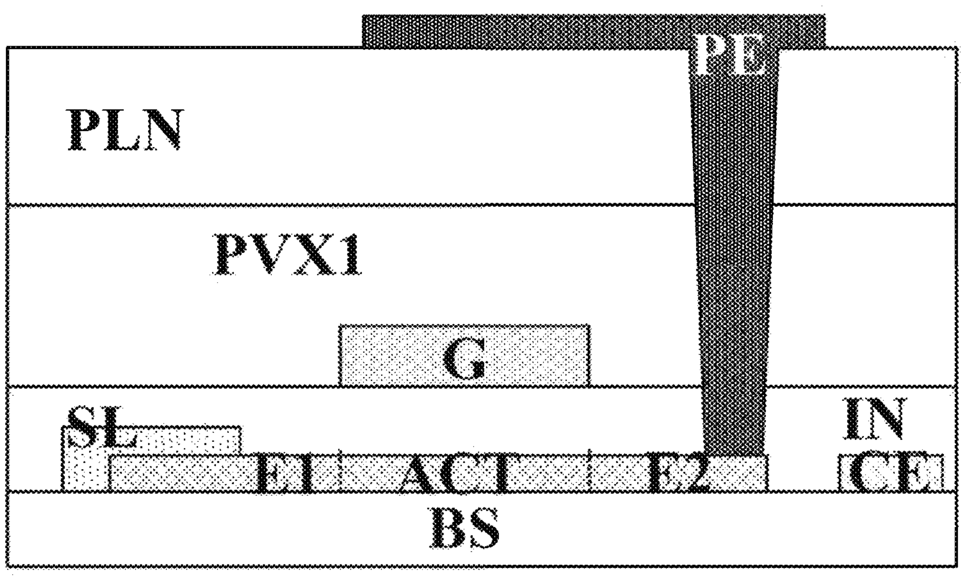

FIG. 38 is a plan view of an array substrate in some embodiments according to the present disclosure. FIG. 39 is a cross-sectional view of an array substrate in some embodiments according to the present disclosure. FIG. 39 may be a cross-section along an I-I' line in FIG. 38. Referring to FIG. 38 and FIG. 39, the array substrate in some embodiments includes a base substrate BS; a common electrode CE, a first electrode E1 (e.g., a source electrode of a transistor), a channel region CR, and a second electrode E2 (e.g., a drain electrode of a transistor) on the base substrate BS; a signal line SL (e.g., a data line configured to provide a data signal to a transistor) on a side of at least the first electrode E1 away from the base substrate BS; an insulating layer IN (e.g., a gate insulating layer) on a side of the signal line SL, the common electrode CE, the first electrode E1, the channel region CR, and the second electrode E2 away from the base substrate BS; a gate electrode G on a side of the insulating layer IN away from the base substrate BS; a first passivation layer PVX1 on a side of the gate electrode G away from the base substrate BS; a planarization layer PLN on a side of the first passivation layer PVX1 away from the insulating layer IN; and a pixel electrode PE on a side of the planarization layer PLN away from the first passivation layer PVX1.

Referring to FIG. 36, FIG. 37, FIG. 38, and FIG. 39, in some embodiments, the common electrode CE, the channel region CR, the first electrode E1, and the second electrode E2 include $M1O_aN_b$. The channel region CR, the first electrode E1, and the second electrode E2 are parts of a unitary structure. Optionally, the common electrode CE, the first electrode E1 or the second electrode E2 differs from the channel region CR in that the pixel electrode, at least a portion of the first electrode E1 or at least a portion of the second electrode E2 are subject to a process to make it more conductive.

Referring to FIG. 36, FIG. 37, FIG. 38, and FIG. 39, in some embodiments, the signal line SL is in direct contact with the first electrode E1. In the example depicted in FIG. 38 and FIG. 39, an entirety of a combination of the signal line SL, the common electrode CE, the channel region CR, the first electrode E1, and the second electrode E2 are between the insulating layer IN and the base substrate BS. The signal line SL, the common electrode CE, the channel region CR, the first electrode E1, and the second electrode E2 are all in direct contact with a surface (e.g., an upper surface) of the base substrate BS. Optionally, the signal line SL, the common electrode CE, the channel region CR, the first electrode E1, and the second electrode E2 are all in direct contact with a surface (e.g., a lower surface) of the insulating layer IN.

Referring to FIG. 36 and FIG. 37, in a cross-section along a plane perpendicular to the base substrate BS and perpendicular to a length direction LD along which the signal line SL extends, and intersecting the signal line SL (e.g., the cross-section as shown in FIG. 37), the first electrode E1 covers an upper surface of at least a portion of the signal line SL, and optionally further covers at least one of two lateral surfaces of the signal line SL. An orthographic projection of the first electrode E1 on the base substrate BS at least partially overlaps with an orthographic projection of the signal line SL on the base substrate BS.

Referring to FIG. 38 and FIG. 39, in a cross-section along a plane perpendicular to the base substrate BS and perpendicular to a length direction LD along which the signal line SL extends, and intersecting the signal line SL (e.g., the cross-section as shown in FIG. 39), the signal line SL covers an upper surface of at least a portion of the first electrode E1, and optionally further covers at least a lateral surface of the first electrode E1. An orthographic projection of the signal line SL on the base substrate BS at least partially overlaps with an orthographic projection of the first electrode E1 on the base substrate BS.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is a liquid crystal display apparatus. Optionally, the display apparatus is an organic light emitting diode display apparatus. Optionally, the display apparatus is a micro light emitting diode display apparatus. Optionally, the display apparatus is a mini light emitting diode display apparatus. In one example, the display apparatus is a High-transmittance Advanced Super Dimensional Switching (ADS) type display apparatus.

In another aspect, the present disclosure provides a method of fabricating an array substrate. In some embodiments, the method includes forming a plurality of signal lines and a plurality of second signal lines crossing over each other, defining a plurality of subpixels. The method includes forming a signal line on a base substrate; forming a buffer layer on a side of the signal line away from the base substrate; forming an active layer on a side of the buffer layer away from the base substrate; forming a second signal line on a side of the active layer away from the signal line; forming a first passivation layer on a side of the second signal line away from the base substrate; forming a planarization layer on a side of the second signal line away from the active layer; forming a pixel electrode on a side of the planarization layer away from the base substrate; forming a first via extending through at least the buffer layer, and exposing at least a part of the signal line; and forming a second via extending through at least the first passivation layer, and exposing at least a part of the pixel electrode. Optionally, with respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate.

FIG. 40A to FIG. 40H illustrate a process of fabricating an array substrate in some embodiments according to the present disclosure. FIG. 40A to FIG. 40H may be used for fabricating an array substrate depicted, e.g., in FIG. 2. Referring to FIG. 40A to FIG. 40H, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS; an insulating layer IN is formed on a side of the semiconductor material layer SML away from the buffer layer BUF; a gate electrode G is formed on a side of the insulating layer IN away from the buffer layer BUF, thereby forming a channel region in the semiconductor material layer; an inter-layer dielectric layer ILD is formed on a side of the gate electrode G away from the insulating layer IN; a via v is formed to extend through the inter-layer dielectric layer ILD, the insulating layer IN, and the buffer layer, exposing a surface of the signal line SL; a via v' is formed to extend through the inter-layer dielectric layer ILD and the insulating layer IN, exposing a surface of a portion of the semiconductor material layer outside of the channel region CR; a conductive material is deposited in the via v and the via v', thereby forming the first electrode E1 and the second electrode E2; a first passivation layer PVX1 is formed on a side of the first electrode E1 and the second electrode E2 away from the base substrate BS; a planarization layer PLN is formed on a side of the first passivation layer PVX1 away from the inter-layer dielectric layer ILD; a common electrode CE is formed on a side of the planarization layer PLN away from the first passivation layer PVX1; a second passivation layer PVX2 is formed on a side of the common electrode CE away from the planarization layer PLN; a via v" is formed to extend through the second passivation layer PVX2, the planarization layer PLN, and the first passivation layer PVX1, exposing a surface of the second electrode E2; and a pixel electrode PE is formed on a side of the second passivation layer PVX2 away from the planarization layer PLN, the pixel electrode PE extending to the via v" to connect to the second electrode E2. The processes depicted in FIG. 40A to FIG. 40H use a total of nine mask plates.

FIG. 41A to FIG. 41H illustrate a process of fabricating an array substrate in some embodiments according to the present disclosure. FIG. 41A to FIG. 41H may be used for fabricating an array substrate depicted, e.g., in FIG. 4. The processes depicted in FIG. 41A to FIG. 41H are similar to those depicted in FIG. 40A to FIG. 40H, except that the insulating layer IN is patterned, and does not extend throughout the array substrate.

FIG. 42A to FIG. 42G illustrate a process of fabricating an array substrate in some embodiments according to the present disclosure. FIG. 42A to FIG. 42G may be used for fabricating an array substrate depicted, e.g., in FIG. 5. Referring to FIG. 42A to FIG. 42G, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS; an insulating layer IN is formed on a side of the semiconductor material layer SML away from the buffer layer BUF; a via v is formed to extend through the insulating layer IN and the buffer layer, exposing a surface of the signal line SL; a conductive material is deposited and patterned, thereby forming a gate electrode G, and a portion of the first electrode E1 extending to the via v to connect to the signal line SL; a first passivation layer PVX1 is formed on a side of the first electrode E1 and the gate electrode G away from the base substrate BS; a planarization layer PLN is formed on a side of the first passivation layer PVX1 away from the inter-layer dielectric layer ILD; a common electrode CE is formed on a side of the planarization layer PLN away from the first passivation layer PVX1; a second passivation layer PVX2 is formed on a side of the common electrode CE away from the planarization layer PLN; a via v" is formed to extend through the second passivation layer PVX2, the planarization layer PLN, and the first passivation layer PVX1, exposing a surface of the second electrode E2; and a pixel electrode PE is formed on a side of the second passivation layer PVX2 away from the planarization layer PLN, the pixel electrode PE extending to the via v" to connect to the second electrode E2. The processes depicted in FIG. 42A to FIG. 42G use a total of eight mask plates.

FIG. 43A to FIG. 43G illustrate a process of fabricating an array substrate in some embodiments according to the present disclosure. FIG. 43A to FIG. 43G may be used for fabricating an array substrate depicted, e.g., in FIG. 7. The processes depicted in FIG. 43A to FIG. 43G are similar to those depicted in 42A to FIG. 42G, except that the insulating layer IN is patterned, and does not extend throughout the array substrate.

FIG. 44A to FIG. 44G illustrate a process of fabricating an array substrate in some embodiments according to the present disclosure. FIG. 44A to FIG. 44G may be used for fabricating an array substrate depicted, e.g., in FIG. 8. Referring to FIG. 44A to FIG. 44G, a signal line SL and a light shield LS are formed on a base substrate BS; a buffer layer BUF is formed on a side of the signal line SL and the light shield LS away from the base substrate BS; a via v is formed to extend through the buffer layer, exposing a surface of the signal line SL; a semiconductor material layer SML is formed on a side of the buffer layer BUF away from the base substrate BS, a portion of the semiconductor material layer SML extending to the via v to connect to the signal line SL; an insulating layer IN is formed on a side of the semiconductor material layer SML away from the buffer layer BUF; a gate electrode G is formed on a side of the insulating layer IN away from the buffer layer BUF; a first passivation layer PVX1 is formed on a side of the gate electrode G away from the base substrate BS; a planarization layer PLN is formed on a side of the first passivation layer PVX1 away from the insulating layer IN; a common electrode CE is formed on a side of the planarization layer PLN away from the first passivation layer PVX1; a second passivation layer PVX2 is formed on a side of the common electrode CE away from the planarization layer PLN; a via v" is formed to extend through the second passivation layer PVX2, the planarization layer PLN, the first passivation layer PVX1, and the insulating layer IN, exposing a surface of the second electrode E2; and a pixel electrode PE is formed on a side of the second passivation layer PVX2 away from the planarization layer PLN, the pixel electrode PE extending to the via v" to connect to the second electrode E2. The processes depicted in FIG. 44A to FIG. 44G use a total of eight mask plates.

FIG. 45A to FIG. 45G illustrate a process of fabricating an array substrate in some embodiments according to the present disclosure. FIG. 45A to FIG. 45G may be used for fabricating an array substrate depicted, e.g., in FIG. 9. The processes depicted in FIG. 45A to FIG. 45G are similar to those depicted in FIG. 44A to FIG. 44G, except that the insulating layer IN is patterned, and does not extend throughout the array substrate.

FIG. 46A to FIG. 46F illustrate a process of fabricating an array substrate in some embodiments according to the present disclosure. FIG. 46A to FIG. 46F may be used for fabricating an array substrate depicted, e.g., in FIG. 11. Referring to FIG. 46A to FIG. 46F, a signal line SL is formed on a base substrate BS; a semiconductor material layer SML is formed on a side of the signal line SL away from the base substrate BS; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN is formed on a side of the first passivation layer PVX1 away from the insulating layer IN; a common electrode CE is formed on a side of the planarization layer PLN away from the first passivation layer PVX1; a second passivation layer PVX2 is formed on a side of the common electrode CE away from the planarization layer PLN; a via v" is formed to extend through the second passivation layer PVX2, the planarization layer PLN, the first passivation layer PVX1, and the insulating layer IN, exposing a surface of the second electrode E2; and a pixel electrode PE is formed on a side of the second passivation layer PVX2 away from the planarization layer PLN, the pixel electrode PE extending to the via v" to connect to the second electrode E2. The processes depicted in FIG. 46A to FIG. 46F use a total of seven mask plates.

FIG. 47A to FIG. 47F illustrate a process of fabricating an array substrate in some embodiments according to the present disclosure. FIG. 47A to FIG. 47F may be used for fabricating an array substrate depicted, e.g., in FIG. 13. Referring to FIG. 47A to FIG. 47F, a semiconductor material layer SML is formed on a base substrate BS; a signal line SL is formed on a side of the a semiconductor material layer SML away from the base substrate BS; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN on a side of the first passivation layer PVX1 away from the insulating layer IN; a common electrode CE is formed on a side of the planarization layer PLN away from the first passivation layer PVX1; a second passivation layer PVX2 is formed on a side of the common electrode CE away from the planarization layer PLN; a via v" is formed to extend through the second passivation layer PVX2, the planarization layer PLN, the first passivation layer PVX1, and the insulating layer IN, exposing a surface of the second electrode E2; and a pixel electrode PE is formed on a side of the second passivation layer PVX2 away from the planarization layer PLN, the pixel electrode PE extending to the via v" to connect to the second electrode E2. The processes depicted in FIG. 47A to FIG. 47F use a total of seven mask plates.

FIG. 48A to FIG. 48G illustrate a process of fabricating an array substrate in some embodiments according to the present disclosure. FIG. 48A to FIG. 48G may be used for fabricating an array substrate depicted, e.g., in FIG. 15. Referring to FIG. 48A to FIG. 48G, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS, the semiconductor material layer SML being formed so that the pixel electrode PE is formed as part of the semiconductor material layer SML; an insulating layer IN is formed on a side of the semiconductor material layer SML away from the buffer layer BUF; a gate electrode G is formed on a side of the insulating layer IN away from the buffer layer BUF, thereby forming a channel region CR in the semiconductor material layer; an inter-layer dielectric layer ILD is formed on a side of the gate electrode G away from the insulating layer IN; a via v is formed to extend through the inter-layer dielectric layer ILD, the insulating layer IN, and the buffer layer, exposing a surface of the signal line SL; a via v' is formed to extend through the inter-layer dielectric layer ILD and the insulating layer IN, exposing a surface of a portion of the semiconductor material layer outside of the channel region CR; a conductive material is deposited in the via v and the via v', thereby forming the first electrode E1 and the second electrode E2; a first passivation layer PVX1 is formed on a side of the first electrode E1 and the second electrode E2 away from the base substrate BS; a planarization layer PLN is formed on a side of the first passivation layer PVX1 away from the inter-layer dielectric layer ILD; a via v" is formed to extend through the first passivation layer PVX1 and the planarization layer PLN, exposing a surface of the second electrode E2; and a common electrode CE is formed on a side of the planarization layer PLN away from the first passivation layer PVX1, the common electrode CE extending to the via v" to connect to the second electrode E2. The processes depicted in FIG. 48A to FIG. 48G use a total of eight mask plates.

FIG. 49A to FIG. 49G illustrate a process of fabricating an array substrate in some embodiments according to the present disclosure. FIG. 49A to FIG. 49G may be used for fabricating an array substrate depicted, e.g., in FIG. 17. The processes depicted in FIG. 49A to FIG. 49G are similar to those depicted in FIG. 48A to FIG. 48G, except that the insulating layer IN is patterned, and does not extend throughout the array substrate.

FIG. 50A to FIG. 50F illustrate a process of fabricating an array substrate in some embodiments according to the present disclosure. FIG. 50A to FIG. 50F may be used for fabricating an array substrate depicted, e.g., in FIG. 18. Referring to FIG. 50A to FIG. 50F, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS, the semiconductor material layer SML being formed so that the pixel electrode PE is formed as part of the semiconductor material layer SML; an insulating layer IN is formed on a side of the semiconductor material layer SML away from the buffer layer BUF; a via v is formed to extend through the insulating layer IN and the buffer layer, exposing a surface of the signal line SL; a conductive material is deposited and patterned, thereby forming a gate electrode G, and a portion of the first electrode E1 extending to the via v to connect to the signal line SL; a first passivation layer PVX1 is formed on a side of the first electrode E1 and the gate electrode G away from the base substrate BS; a planarization layer PLN is formed on a side of the first passivation layer PVX1 away from the insulating layer IN; and a common electrode CE is formed on a side of the planarization layer PLN away from the first passivation layer PVX1. The processes depicted in FIG. 50A to FIG. 50F use a total of seven mask plates.

FIG. 51A to FIG. 51F illustrate a process of fabricating an array substrate in some embodiments according to the present disclosure. FIG. 51A to FIG. 51F may be used for fabricating an array substrate depicted, e.g., in FIG. 20. The processes depicted in FIG. 51A to FIG. 51F are similar to those depicted in FIG. 50A to FIG. 50F, except that the insulating layer IN is patterned, and does not extend throughout the array substrate.

FIG. 52A to FIG. 52F illustrate a process of fabricating an array substrate in some embodiments according to the present disclosure. FIG. 52A to FIG. 52F may be used for fabricating an array substrate depicted, e.g., in FIG. 21. Referring to FIG. 52A to FIG. 52F, a signal line SL and a light shield LS are formed on a base substrate BS; a buffer layer BUF is formed on a side of the signal line SL and the light shield LS away from the base substrate BS; a via v is formed to extend through the buffer layer, exposing a surface of the signal line SL; a semiconductor material layer SML is formed on a side of the buffer layer BUF away from the base substrate BS, a portion of the semiconductor material layer SML extending to the via v to connect to the signal line SL, the semiconductor material layer SML being formed so that the pixel electrode PE is formed as part of the semiconductor material layer SML; an insulating layer IN is formed on a side of the semiconductor material layer SML away from the buffer layer BUF; a gate electrode G is formed on a side of the insulating layer IN away from the buffer layer BUF; a first passivation layer PVX1 is formed on a side of the gate electrode G away from the base substrate BS; a planarization layer PLN is formed on a side of the first passivation layer PVX1 away from the insulating layer IN; and a common electrode CE is formed on a side of the planarization layer PLN away from the first passivation layer PVX1. The processes depicted in FIG. 52A to FIG. 52F use a total of seven mask plates, FIG. 53A to FIG. 53F illustrate a process of fabricating an array substrate in some embodiments according to the present disclosure. FIG. 53A to FIG. 53F may be used for fabricating an array substrate depicted, e.g., in FIG. 22. The processes depicted in FIG. 53A to FIG. 53F are similar to those depicted in FIG. 52A to FIG. 52F, except that the insulating layer IN is patterned, and does not extend throughout the array substrate.

FIG. 54A to FIG. 54E illustrate a process of fabricating an array substrate in some embodiments according to the present disclosure. FIG. 54A to FIG. 54E may be used for fabricating an array substrate depicted, e.g., in FIG. 24. Referring to FIG. 54A to FIG. 54E, a signal line SL is formed on a base substrate BS; a semiconductor material layer SML is formed on a side of the signal line SL away from the base substrate BS, the semiconductor material layer SML being formed so that the pixel electrode PE is formed as part of the semiconductor material layer SML; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN is formed on a side of the first passivation layer PVX1 away from the insulating layer IN; and a common electrode CE is formed on a side of the planarization layer PLN away from the first passivation layer PVX1. The processes depicted in FIG. 54A to FIG. 54E use a total of six mask plates.

FIG. 55A to FIG. 55E illustrate a process of fabricating an array substrate in some embodiments according to the present disclosure. FIG. 55A to FIG. 55E may be used for fabricating an array substrate depicted, e.g., in FIG. 26. Referring to FIG. 55A to FIG. 55E, a semiconductor material layer SML is formed on a base substrate BS, the semiconductor material layer SML being formed so that the pixel electrode PE is formed as part of the semiconductor material layer SML; a signal line SL is formed on a side of the a semiconductor material layer SML away from the base substrate BS; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN is formed on a side of the first passivation layer PVX1 away from the insulating layer IN; and a common electrode CE is formed on a side of the planarization layer PLN away from the first passivation layer PVX1. The processes depicted in FIG. 55A to FIG. 55E use a total of six mask plates.

FIG. 56A to FIG. 56G illustrate a process of fabricating an array substrate in some embodiments according to the present disclosure. FIG. 56A to FIG. 56G may be used for fabricating an array substrate depicted, e.g., in FIG. 28. Referring to FIG. 56A to FIG. 56G, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS, the semiconductor material layer SML being formed so that the common electrode CE is formed as part of the semiconductor material layer SML; an insulating layer IN is formed on a side of the semiconductor material layer SML away from the buffer layer BUF; a gate electrode G is formed on a side of the insulating layer IN away from the buffer layer BUF, thereby forming a channel region CR in the semiconductor material layer; an inter-layer dielectric layer ILD is formed on a side of the gate electrode G away from the insulating layer IN; a via v is formed to extend through the inter-layer dielectric layer ILD, the insulating layer IN, and the buffer layer, exposing a surface of the signal line SL; a via v' is formed to extend through the inter-layer dielectric layer ILD and the insulating layer IN, exposing a surface of a portion of the semiconductor material layer outside of the channel region CR; a conductive material is deposited in the via v and the via v', thereby forming the first electrode E1 and the second electrode E2; a first passivation layer PVX1 is formed on a side of the first electrode E1 and the second electrode E2 away from the base substrate BS; a planarization layer PLN on a side of the first passivation layer PVX1 away from the inter-layer dielectric layer ILD; a via v'' is formed to extend through the first passivation layer PVX1 and the planarization layer PLN, exposing a surface of the second electrode E2; and a pixel electrode PE is formed on a side of the planarization layer PLN away from the first passivation layer PVX1, the pixel electrode PE extending to the via v" to connect to the second electrode E2. The processes depicted in FIG. 56A to FIG. 56G use a total of eight mask plates.

FIG. 57A to FIG. 57G illustrate a process of fabricating an array substrate in some embodiments according to the present disclosure. FIG. 57A to FIG. 57G may be used for fabricating an array substrate depicted, e.g., in FIG. 30. The processes depicted in FIG. 57A to FIG. 57G are similar to those depicted in FIG. 56A to FIG. 56G, except that the insulating layer IN is patterned, and does not extend throughout the array substrate.

FIG. 58A to FIG. 58F illustrate a process of fabricating an array substrate in some embodiments according to the present disclosure. FIG. 58A to FIG. 58F may be used for fabricating an array substrate depicted, e.g., in FIG. 31. Referring to FIG. 58A to FIG. 58F, a signal line SL and a light shield LS are formed on a base substrate BS; a buffer layer BUF is formed on a side of the signal line SL and the light shield LS away from the base substrate BS; a semiconductor material layer SML is formed on a side of the buffer layer BUF away from the base substrate BS, the semiconductor material layer SML being formed so that the common electrode CE is formed as part of the semiconductor material layer SML; an insulating layer IN is formed on a side of the semiconductor material layer SML away from the buffer layer BUF; a via v is formed to extend through the insulating layer IN and the buffer layer, exposing a surface of the signal line SL; a conductive material is deposited and patterned, thereby forming a gate electrode G, and a portion of the first electrode E1 extending to the via v to connect to the signal line SL; a first passivation layer PVX1 is formed on a side of the first electrode E1 and the gate electrode G away from the base substrate BS; a planarization layer PLN is formed on a side of the first passivation layer PVX1 away from the insulating layer IN; a via v" is formed to extend through the planarization layer PLN, the first passivation layer PVX1, and the insulating layer IN, exposing a surface of the second electrode E2; and a pixel electrode PE is formed on a side of the planarization layer PLN away from the first passivation layer PVX1, the pixel electrode PE extending to the via v" to connect to the second electrode E2. The processes depicted in FIG. 58A to FIG. 58F use a total of seven mask plates.

FIG. 59A to FIG. 59F illustrate a process of fabricating an array substrate in some embodiments according to the present disclosure. FIG. 59A to FIG. 59F may be used for fabricating an array substrate depicted, e.g., in FIG. 33. The processes depicted in FIG. 59A to FIG. 59F are similar to those depicted in FIG. 58A to FIG. 58F, except that the insulating layer IN is patterned, and does not extend throughout the array substrate.

FIG. 60A to FIG. 60F illustrate a process of fabricating an array substrate in some embodiments according to the present disclosure. FIG. 60A to FIG. 60F may be used for fabricating an array substrate depicted, e.g., in FIG. 34. Referring to FIG. 60A to FIG. 60F, a signal line SL and a light shield LS are formed on a base substrate BS; a buffer layer BUF is formed on a side of the signal line SL and the light shield LS away from the base substrate BS; a via v is formed to extend through the buffer layer, exposing a surface of the signal line SL; a semiconductor material layer SML is formed on a side of the buffer layer BUF away from the base substrate BS, a portion of the semiconductor material layer SML extending to the via v to connect to the signal line SL, the semiconductor material layer SML being formed so that the common electrode CE is formed as part of the semiconductor material layer SML; an insulating layer IN is formed on a side of the semiconductor material layer SML away from the buffer layer BUF; a gate electrode G is formed on a side of the insulating layer IN away from the buffer layer BUF; a first passivation layer PVX1 is formed on a side of the gate electrode G away from the base substrate BS; a planarization layer PLN is formed on a side of the first passivation layer PVX1 away from the insulating layer IN; a via v" is formed to extend through the planarization layer PLN, the first passivation layer PVX1, and the insulating layer IN, exposing a surface of the second electrode E2; and a pixel electrode PE is formed on a side of the planarization layer PLN away from the first passivation layer PVX1, the pixel electrode PE extending to the via v" to connect to the second electrode E2. The processes depicted in FIG. 60A to FIG. 60F use a total of seven mask plates.

FIG. 61A to FIG. 61F illustrate a process of fabricating an array substrate in some embodiments according to the present disclosure. FIG. 61A to FIG. 61F may be used for fabricating an array substrate depicted, e.g., in FIG. 35. The processes depicted in FIG. 61A to FIG. 61F are similar to those depicted in FIG. 60A to FIG. 60F, except that the insulating layer IN is patterned, and does not extend throughout the array substrate.

FIG. 62A to FIG. 62E illustrate a process of fabricating an array substrate in some embodiments according to the present disclosure. FIG. 62A to FIG. 62E may be used for fabricating an array substrate depicted, e.g., in FIG. 37. Referring to FIG. 62A to FIG. 62E, a signal line SL is formed on a base substrate BS; a semiconductor material layer SML is formed on a side of the signal line SL away from the base substrate BS, the semiconductor material layer SML being formed so that the common electrode CE is formed as part of the semiconductor material layer SML; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN on a side of the first passivation layer PVX1 away from the insulating layer IN; a via v" is formed to extend through the planarization layer PLN, the first passivation layer PVX1, and the insulating layer IN, exposing a surface of the second electrode E2; and a pixel electrode PE is formed on a side of the planarization layer PLN away from the first passivation layer PVX1, the pixel electrode PE extending to the via v" to connect to the second electrode E2. The processes depicted in FIG. 62A to FIG. 62E use a total of six mask plates.

FIG. 63A to FIG. 63E illustrate a process of fabricating an array substrate in some embodiments according to the present disclosure. FIG. 63A to FIG. 63E may be used for fabricating an array substrate depicted, e.g., in FIG. 39. Referring to FIG. 63A to FIG. 63E, a semiconductor material layer SML is formed on a base substrate BS, the semiconductor material layer SML being formed so that the common electrode CE is formed as part of the semiconductor material layer SML; a signal line SL is formed on a side of the a semiconductor material layer SML away from the base substrate BS; an insulating layer IN is formed on a side of the signal line SL and the semiconductor material layer SML away from the base substrate BS; a gate electrode G is formed on a side of the insulating layer IN away from the base substrate BS; a first passivation layer PVX1 is formed on a side of the gate electrode G away from the base substrate BS; a planarization layer PLN on a side of the first passivation layer PVX1 away from the insulating layer IN; a via v" is formed to extend through the planarization layer PLN, the first passivation layer PVX1, and the insulating layer IN, exposing a surface of the second electrode E2; and a pixel electrode PE is formed on a side of the planarization layer PLN away from the first passivation layer PVX1, the pixel electrode PE extending to the via v" to connect to the second electrode E2. The processes depicted in FIG. 63A to FIG. 63E use a total of six mask plates.

Example 1: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; sputtering indium gallium zinc oxide on the base substrate to a thickness between 10 nm to 80 nm; patterning the indium gallium zinc oxide material to form a semiconductor material layer; forming an insulating layer on a side of the semiconductor material layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure; patterning the electrode material layer; depositing (e.g., by a plasma-enhanced chemical vapor deposition process) an insulating material (silicon oxide, or silicon nitride/silicon oxide) on the base substrate to form an inter-layer dielectric layer having a thickness between 200 nm to 400 nm; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer; depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer, depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example I corresponds to the process depicted in FIG. 40A to FIG. 40H.

Example 2: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; sputtering indium gallium zinc oxide on the base substrate to a thickness between 10 nm to 80 nm; patterning the indium gallium zinc oxide material to form a semiconductor material layer; forming an insulating material layer on a side of the semiconductor material layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure: patterning the electrode material layer; depositing (e.g., by a plasma-enhanced chemical vapor deposition process) an insulating material (silicon oxide, or silicon nitride/silicon oxide) on the base substrate to form an inter-layer dielectric layer having a thickness between 200 nm to 400 nm; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer; patterning the insulating material layer to form an insulating layer, the insulating layer does not extend substantially throughout the array substrate, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate; depositing (e.g. by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 2 corresponds to the process depicted in FIG. 41A to FIG. 41H.

Example 3: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; sputtering indium gallium zinc oxide on the base substrate to a thickness between 10 nm to 80 nm; patterning the indium gallium zinc oxide material to form a semiconductor material layer, forming an insulating layer on a side of the semiconductor material layer away from the base substrate using a chemical vapor deposition process or an atomic layer deposition process and using silicon oxide as the insulating material; sputtering an electrode material layer on a side of the insulating layer and the buffer layer away from the base substrate having a thickness. between 200 nm and 1200 nm, the electrode material including a molybdenum-neodymium-copper laminated structure, a MTD-copper laminated structure, or a molybdenum-neodymium-copper-MTD laminated structure; patterning the electrode material layer; depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 3 corresponds to the process depicted in FIG. 42A to FIG. 42G.

Example 4: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; sputtering indium gallium zinc oxide on the base substrate to a thickness between 10 nm to 80 nm; patterning the indium gallium zinc oxide material to form a semiconductor material layer; forming an insulating material layer on a side of the semiconductor material layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 mm, the electrode material including a molybdenum-neodymium-copper laminated structure, a MTD-copper laminated structure, or a molybdenum-neodymium-copper-MTD laminated structure; patterning the electrode material layer; patterning the insulating material layer to form an insulating layer, the insulating layer does not extend substantially throughout the array substrate, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate; depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 4 corresponds to the process depicted in FIG. 43A to FIG. 43G.

Example 5: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; forming a via extending through the buffer layer, exposing a surface of the signal line; sputtering indium gallium zinc oxide on the base substrate to a thickness between 10 nm to 80 nm, a portion of the indium gallium zinc oxide extending to the via in the buffer layer to connect to the signal line; patterning the indium gallium zinc oxide material to form a semiconductor material layer; forming an insulating layer on a side of the semiconductor material layer away from the base substrate using a chemical vapor deposition process or an atomic layer deposition process and using silicon oxide as the insulating material;

sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure; patterning the electrode material layer, depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation laver; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 5 corresponds to the process depicted in FIG. 44A to FIG. 44G.

Example 6: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the electrode material layer to formed a light shield LS and a signal line SL on the base substrate BS; depositing (e.g., by a chemical vapor deposition process) an insulating material (silicon oxide, or silicon nitride/silicon oxide) on the base substrate to form a buffer layer having a thickness between 100 nm to 700 nm; forming a via extending through the buffer layer, exposing a surface of the signal line; sputtering indium gallium zinc oxide on the base substrate to a thickness between 10 nm to 80 nm, a portion of the indium gallium zinc oxide extending to the via in the buffer layer to connect to the signal line; patterning the indium gallium zinc oxide material to form a semiconductor material layer; forming an insulating material layer on a side of the semiconductor material layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure; patterning the electrode material layer; patterning the insulating material layer to form an insulating layer, the insulating layer does not extend substantially throughout the array substrate, an orthographic projection of the insulating layer on the base substrate is at least partially non-overlapping with an orthographic projection of the signal line on the base substrate, and is at least partially non-overlapping with an orthographic projection of the first electrode or the second electrode on the base substrate; depositing (e.g., by a plasma-enhanced chemical vapor deposition process) an insulating material (silicon oxide, or silicon nitride/ silicon oxide) on the base substrate to form a first passivation layer having a thickness between 200 nm to 400 nm; coating a resin layer having a thickness between 2 μm to 3 μm on the first passivation layer; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 6 corresponds to the process depicted in FIG. 45A to FIG. 45G.

Example 7: In one example, a method of fabricating an array substrate includes cleaning a base substrate; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; sputtering indium gallium zinc oxide on the base substrate to a thickness between 10 nm to 80 nm; patterning the indium gallium zinc oxide material to form a semiconductor material layer; patterning the electrode material layer to formed a light shield LS and a signal line SL on the base substrate BS; forming an insulating layer on a side of the semiconductor material layer and the signal line layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure; patterning the electrode material layer; depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer, depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example 7 corresponds to the process depicted in FIG. 46A to FIG. 46F.

Example 8: In one example, a method of fabricating an array substrate includes cleaning a base substrate; sputtering indium gallium zinc oxide on the base substrate to a thickness between 10 nm to 80 nm; depositing an electrode material layer having a thickness between 100 nm and 1000 nm on the base substrate, the electrode material including a molybdenum-aluminum-aluminum laminated structure, a molybdenum-neodymium-copper laminated structure, a MTD-copper laminated structure, or a molybdenum-neodymium-copper-MTD laminated structure; patterning the indium gallium zinc oxide material to form a semiconductor material layer: patterning the electrode material layer to formed a light shield LS and a signal line SL on the base substrate BS; forming an insulating layer on a side of the semiconductor material layer and the signal line layer away from the base substrate using a chemical vapor deposition process or an atomic layer deposition process and using silicon oxide as the insulating material; sputtering an electrode material layer on a side of the insulating layer and the buffer layer away from the base substrate having a thickness between 200 nm and 1200 nm, the electrode material including a molybdenum-neodymium-copper laminated structure, a MTD-copper laminated structure, or a molybdenum-neodymium-copper-MTD laminated structure; patterning the electrode material layer; depositing (e.g., by a plasma-enhanced chemical vapor deposition process) an insulating material (silicon oxide, or silicon nitride/silicon oxide) on the base substrate to form a first passivation layer having a thickness between 200 nm to 400 nm; coating a resin layer having a thickness between 2 μm to 3 μm on the first passivation layer; depositing a conductive material layer having a thickness between 40 nm to 100 nm using indium gallium zinc oxide or indium zinc oxide on the first passivation layer, and patterning the conductive material layer to form a common electrode; depositing (e.g., by a chemical vapor deposition process) an insulating material (silicon oxide, or silicon nitride/silicon oxide) on the base substrate to form a second passivation layer having a thickness between 100 nm to 300 nm; and depositing a conductive material layer having a thickness between 40 nm to 135 nm using indium tin oxide or indium zinc oxide on the second passivation layer, and patterning the conductive material layer to form a pixel electrode. The process described in Example & corresponds to the process depicted in FIG. 47A to FIG. 47F.

Figure 64:
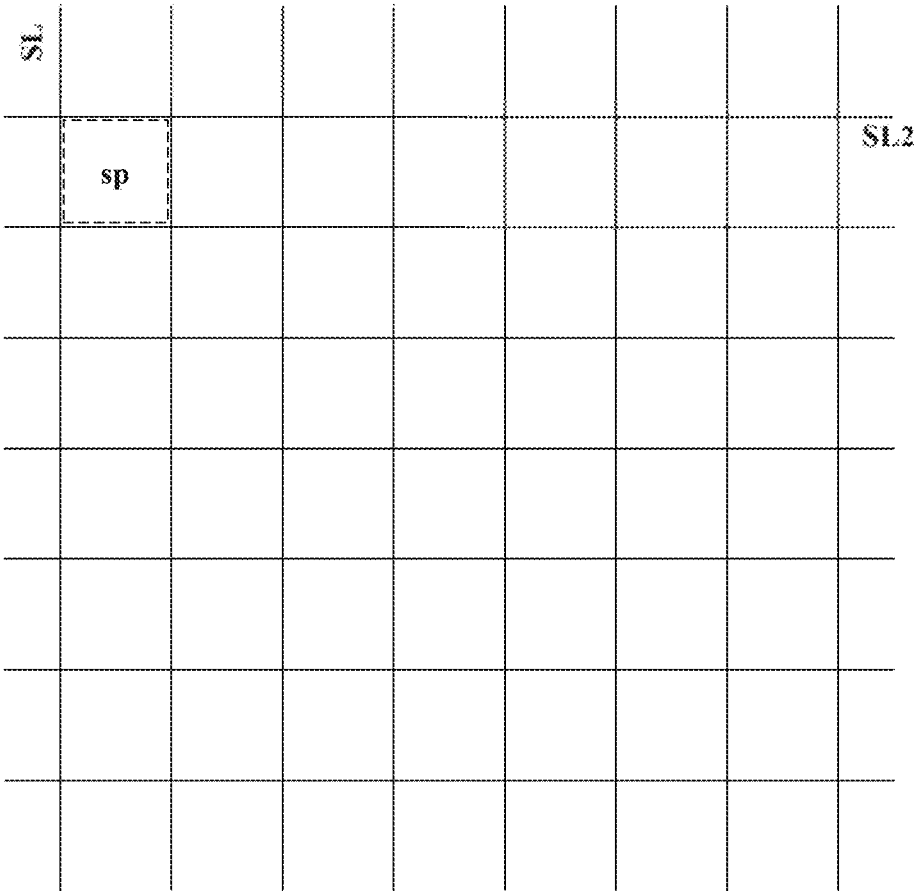
FIG. 64 illustrates a layout of signal lines in an array substrate in some embodiments according to the present disclosure.

FIG. 64 illustrates a layout of signal lines in an array substrate in some embodiments according to the present disclosure. Referring to FIG. 64, the plurality of signal lines SL and the plurality of second signal lines SL2 cross over each other, defining a plurality of subpixels sp.

Figure 65:
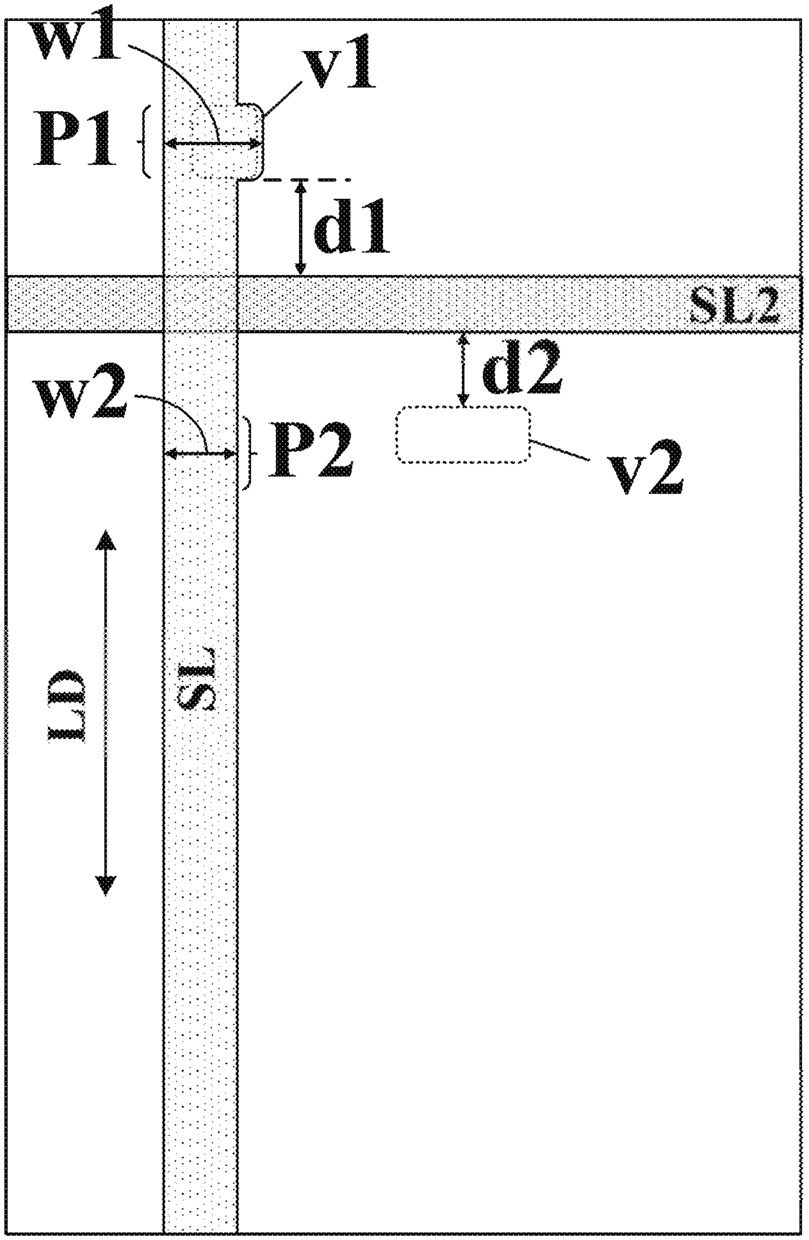
FIG. 65 illustrates relative positions of vias in an array substrate in some embodiments according to the present disclosure.

FIG. 65 illustrates relative positions of vias in an array substrate in some embodiments according to the present disclosure. Referring to FIG. 65 and FIG. 2, in some embodiments, the array substrate includes a first via v1 extending through at least the buffer layer BUF. The first electrode E1 at least partially in the first via v1. Optionally, the first electrode E1 extends to the first via v1 to connect to the signal line SL. In some embodiments, the array substrate includes a second via v2 extending through at least the first passivation layer PVX1. The pixel electrode PE is at least partially in the second via v2. Optionally, the pixel electrode PE extends to the second via v2 to connect to the second electrode E2.

In some embodiments, with respective to a same second signal line, a first minimum distance between an orthographic projection of the first via v1 on the base substrate BS and an orthographic projection of the second signal line SL2 on the base substrate BS is denoted as d1; a second minimum distance between an orthographic projection of the second via v2 on the base substrate BS and the orthographic projection of the second signal line SL2 on the base substrate BS is denoted as d2, d1 and d2 being greater than 0. In some embodiments, with respective to a same second signal line, the first minimum distance d1 is greater than the second minimum distance d2.

In some embodiments, the signal line SL includes a first portion P1 and a second portion P2. The first portion P1 is a portion of the signal line SL in the first via v1. The second portion P2 is connected to the first portion P1. In some embodiments, along an extension direction of the second signal line SL2, the first portion P1 has a first line width w1; the second portion P2 has a second line width w2. Optionally, the first line width w1 is greater than the second line width w2.

Figure 66:
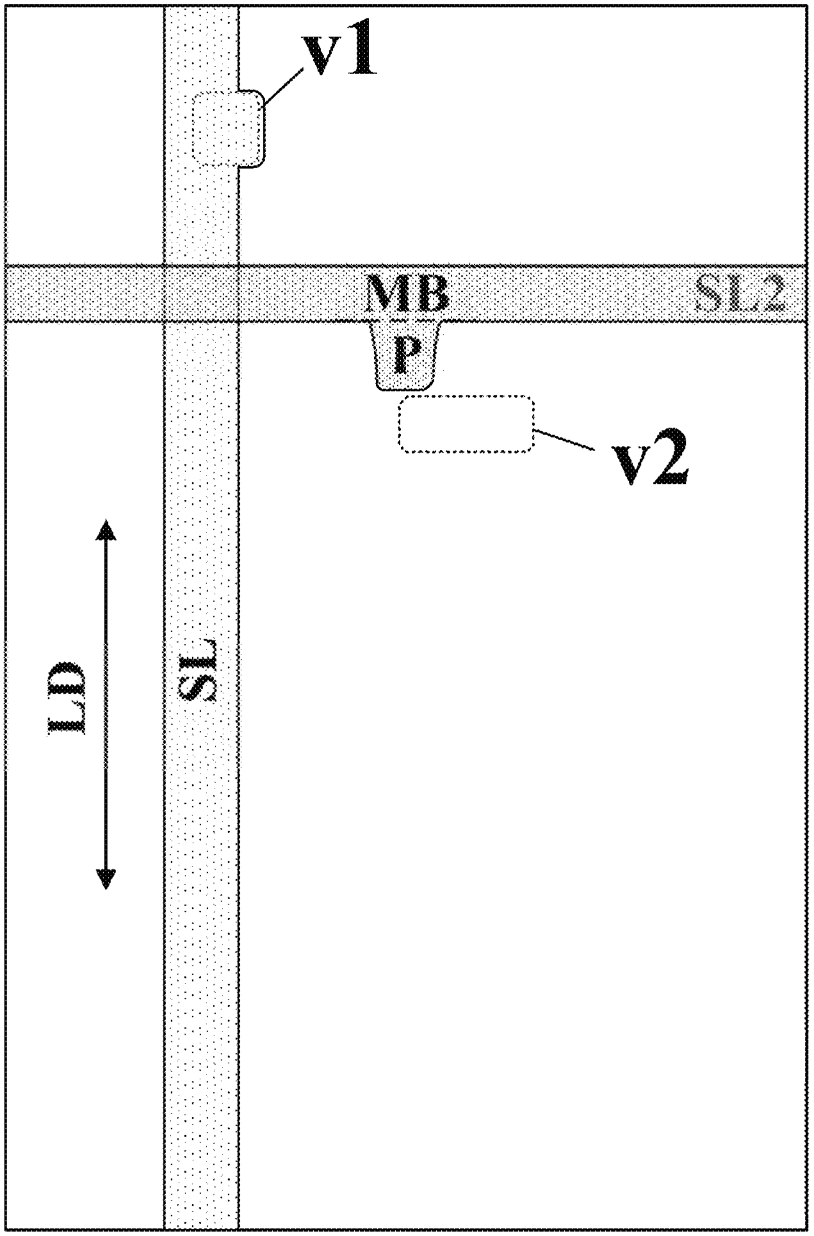
FIG. 66 illustrates the structure of a second signal line in an array substrate in some embodiments according to the present disclosure.

FIG. 66 illustrates the structure of a second signal line in an array substrate in some embodiments according to the present disclosure. Referring to FIG. 66, the second signal line SL2 in some embodiments includes a main body MB and a protrusion P protruding away from the main body MB. The protrusion P and the main body MB are in a same layer and made of a same material. Optionally, the protrusion P and the main body MB are parts of a unitary structure. The main body MB extends along an extension direction of the second signal line SL2, the protrusion P protrudes away from the main body MB along a direction different from the extension direction of the second signal line SL2.

In some embodiments, an orthographic projection of the main body MB on the base substrate spaces apart an orthographic projection of the protrusion P on the base substrate from an orthographic projection of the first via v1 on the base substrate. Optionally, the orthographic projection of the protrusion P on the base substrate spaces apart an orthographic projection of the signal line SL on the base substrate from an orthographic projection of the second via v2 on the base substrate.

Figure 67:
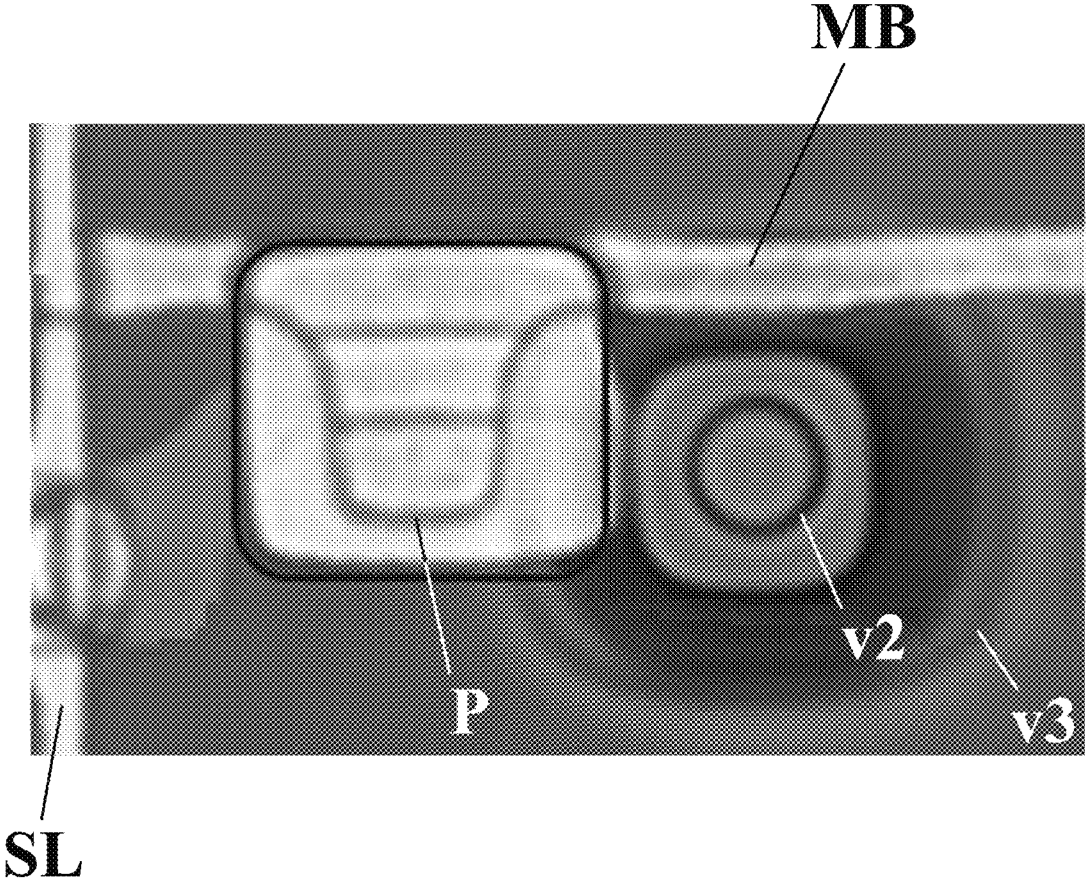
FIG. 67 is a scanning electron microscopy image of a portion of an array substrate in some embodiments according to the present disclosure.

FIG. 67 is a scanning electron microscopy image of a portion of an array substrate in some embodiments according to the present disclosure. Referring to FIG. 67, the main body MB and the protrusion P of the second signal line are denoted. The second via v2 extending through at least the first passivation layer is denoted in FIG. 67. Referring to FIG. 66 and FIG. 67, the protrusion P in some embodiments has a shape that is wider in a portion closer to the main body MB, and narrower in a portion away from the main body MB.

Figure 68:
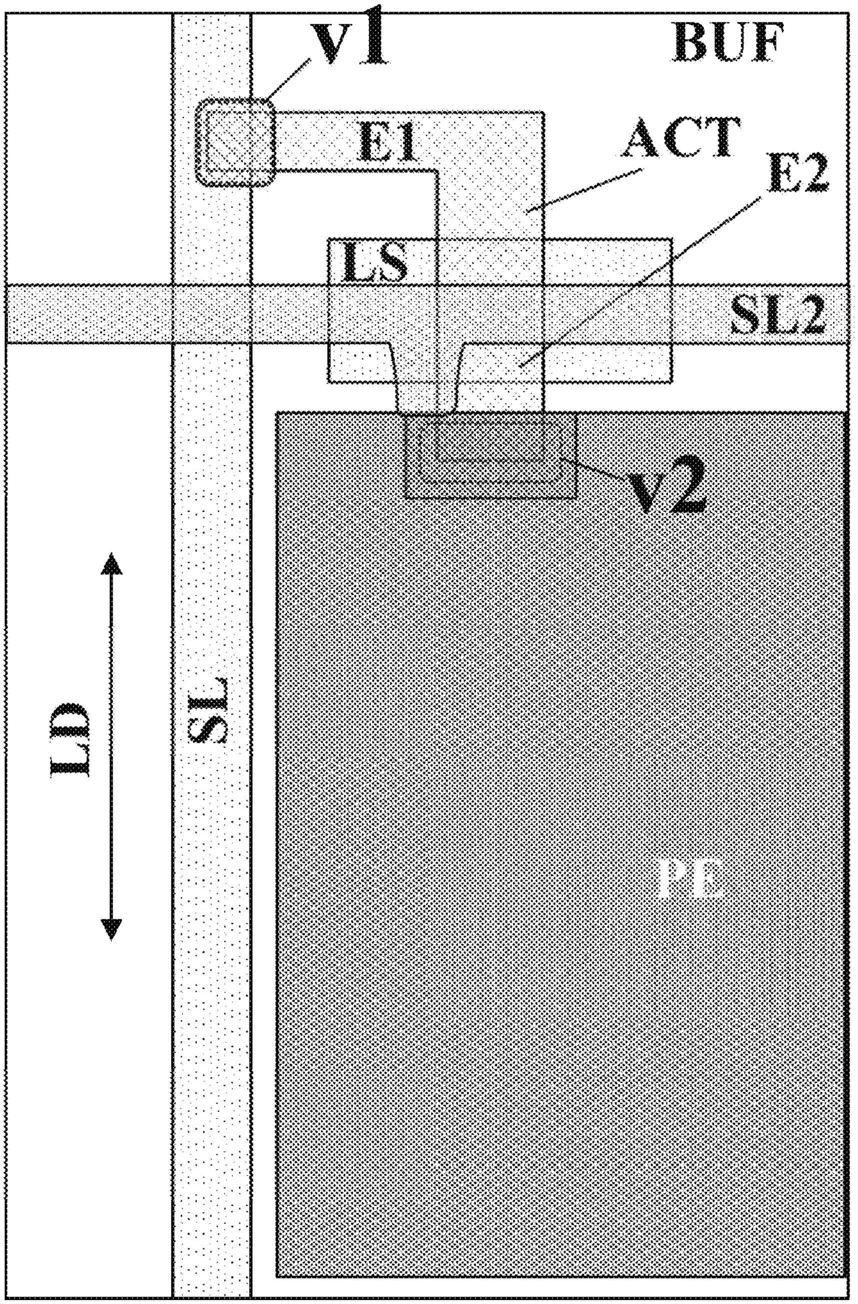
FIG. 68 is a plan view of an array substrate in some embodiments according to the present disclosure.

FIG. 68 is a plan view of an array substrate in some embodiments according to the present disclosure. Referring to FIG. 68, in some embodiments, an orthographic projection of the active layer on a base substrate at least partially overlaps with an orthographic projection of the protrusion on the base substrate.

In some embodiments, the army substrate further includes a light shield LS. In some embodiments, the light shield LS is in a same layer as the signal line SL. Optionally, an orthographic projection of the light shield LS on the base substrate at least partially overlaps with the orthographic projection of the second signal line SL2 on the base substrate. The inventors of the present disclosure discover that this unique structure is conducive to achieving a maximum aperture ratio in the array substrate.

In some embodiments, an orthographic projection of the light shield LS on the base substrate at least partially overlaps with an orthographic projection of a portion of the second signal line SL2 on the base substrate. Optionally, along the length direction LD (an extension direction of the signal line SL), at least one of two boundaries of the orthographic projection of the portion of the second signal line SL2 on the base substrate is completely between two boundaries of the orthographic projection of the light shield LS on the base substrate.

In some embodiments, a minimum distance between the light shield LS and the signal line SL is in a range of 1.0 μm to 5.0 μm, e.g., 1.0 μm to 2.0 μm, 2.0 μm to 3.0 μm, 3.0 μm to 4.0 μm, or 4.0 μm to 5.0 μm. In one example, the minimum distance is 3.0 μm. In another example, the minimum distance is 2.0 μm.

Figure 69:
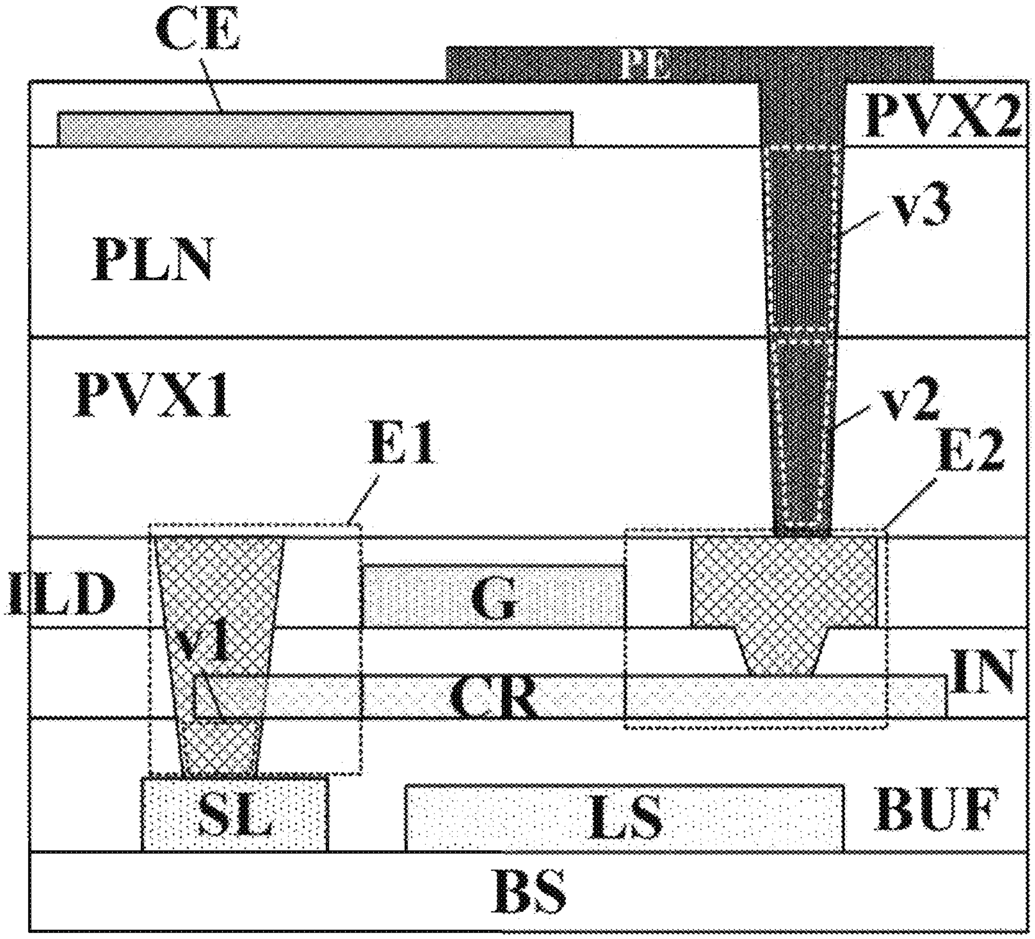
FIG. 69 is a cross-sectional view of an array substrate in some embodiments according to the present disclosure.

FIG. 69 is a cross-sectional view of an array substrate in some embodiments according to the present disclosure. Referring to FIG. 69 and FIG. 67, the array substrate in some embodiments includes a first via v1 extending through at least the buffer layer BUF; a second via v2 extending through at least the first passivation layer PVX1; and a third via v3 extending through at least the planarization layer PLN. The first electrode E1 at least partially in the first via v1. Optionally, the first electrode E1 extends to the first via v1 to connect to the signal line SL. The pixel electrode PE is at least partially in the second via v2. Optionally, the pixel electrode PE extends to the second via v2 to connect to the second electrode E2. The pixel electrode PE is at least partially in the third via v3. Optionally, the pixel electrode PE extends to the third via v3 and into the second via v2.

Figure 70:
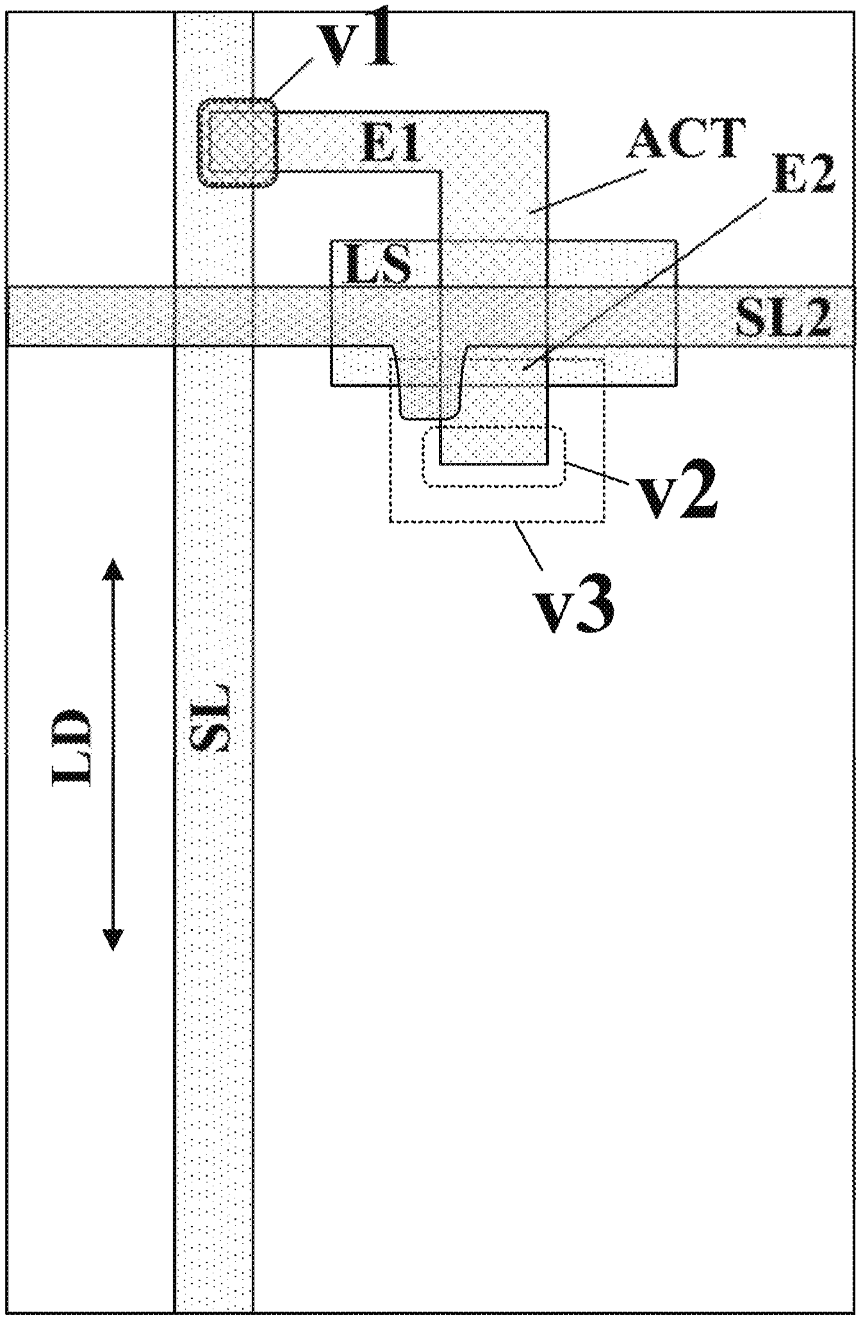
FIG. 70 illustrates relative positions of vias in an array substrate in some embodiments according to the present disclosure.

FIG. 70 illustrates relative positions of vias in an array substrate in some embodiments according to the present disclosure. Referring to FIG. 69 and FIG. 70, in some embodiments, an orthographic projection of the third via v3 on the base substrate BS partially overlaps with an orthographic projection of the light shield LS on the base substrate BS. Optionally, at least 1% (e.g., at least 5%, at least 10%, at least 20%, at least 30%, at least 40%, at least 50%, at least 60%, at least 70%, at least 80%, or at least 90%) of the orthographic projection of the third via v3 on the base substrate BS overlaps with the orthographic projection of the light shield LS on the base substrate BS. Optionally, no more than 90% (e.g., no more than 80%, no more than 70%, no more than 60%, no more than 50%, no more than 40%, no more than 30%, no more than 20%, no more than 10%, no more than 5%, or no more than 1%) of the orthographic projection of the third via v3 on the base substrate BS overlaps with the orthographic projection of the light shield LS on the base substrate BS.

Figure 71:
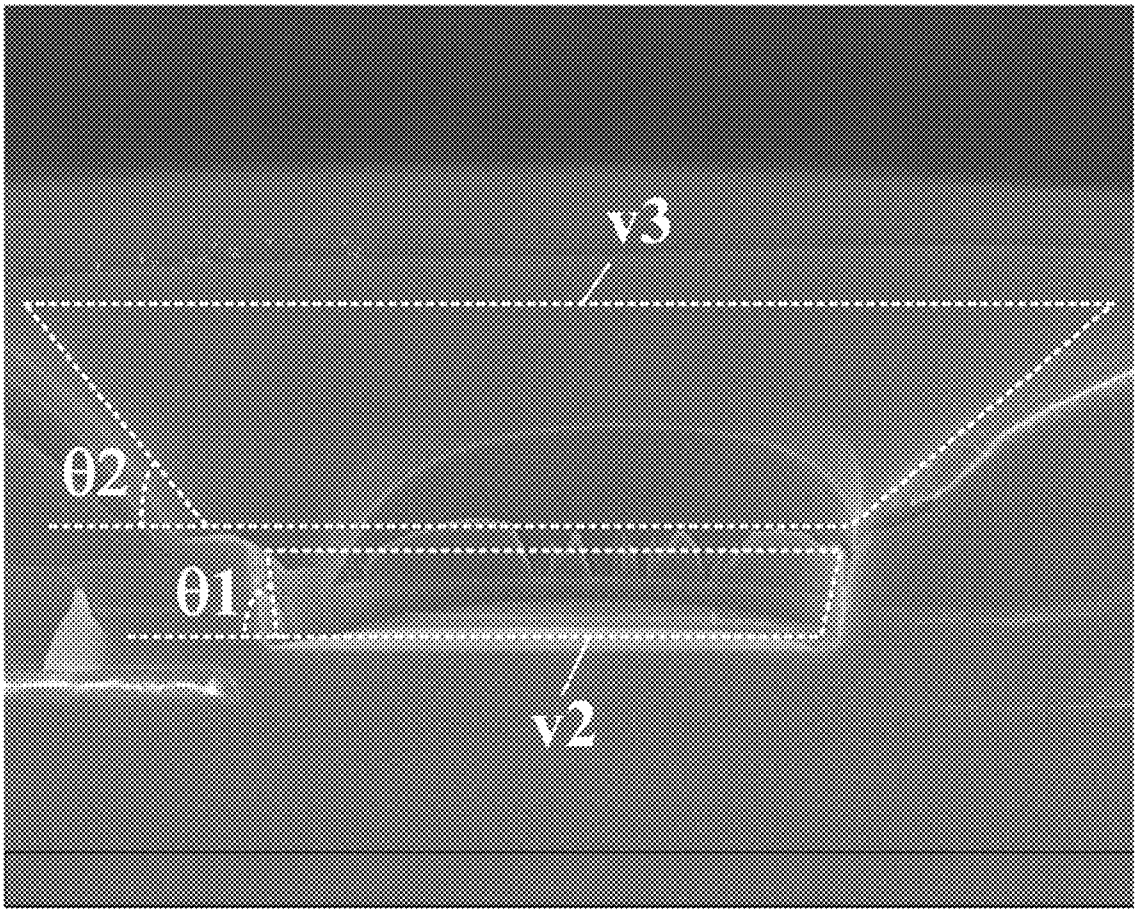
FIG. 71 is a scanning electron microscopy image of a portion of an array substrate in some embodiments according to the present disclosure.

FIG. 71 is a scanning electron microscopy image of a portion of an array substrate in some embodiments according to the present disclosure. Referring to FIG. 71, in some embodiments, the second via v2 has a first slope angle θ1, the third via v3 has a second slope angle θ2. In some embodiments, a difference between the first slope angle θ1 and the second slope angle θ2 is in a range of 0 degree to 25 degrees. In one example, the first slope angle θ1 is greater than the second slope angle θ2. In an alternative example, the second slope angle θ2 is greater than the first slope angle θ1.

In some embodiments, an orthographic projection of the third via v3 on the base substrate BS at least partially overlaps with an orthographic projection of the second via v2 on the base substrate BS. Optionally, the orthographic projection of the third via v3 on the base substrate BS is larger than the orthographic projection of the second via v2 on the base substrate BS. Optionally, the orthographic projection of the third via v3 on the base substrate BS substantially covers (e.g., at least 80% covers, at least 85% covers, at least 90% covers, at least 95% covers, at least 99% covers, or completely covers) the orthographic projection of the second via v2 on the base substrate BS.

Figure 72:
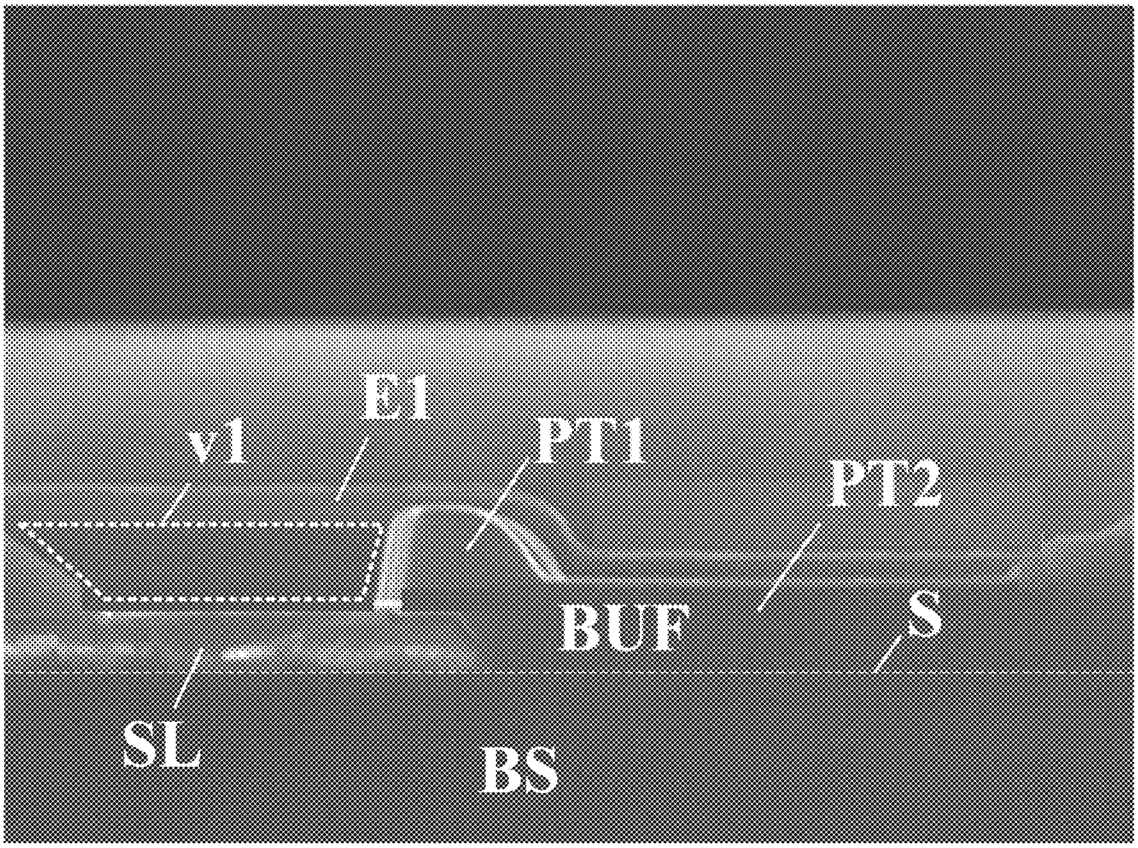
FIG. 72 is a scanning electron microscopy image of a portion of an array substrate in some embodiments according to the present disclosure.

FIG. 72 is a scanning electron microscopy image of a portion of an array substrate in some embodiments according to the present disclosure. Referring to FIG. 72, the buffer layer BUF in some embodiments includes a first part PT1 and a second part PT2. The first part PT1 is a side of the first via v1. The first part PT1 spaces apart the second part PT2 from the first via v1. An orthographic projection of the first part PT1 on the base substrate BS at least partially overlaps with an orthographic projection of the signal line SL on the base substrate BS. An orthographic projection of the second part PT2 on the base substrate BS is non-overlapping with the orthographic projection of the signal line SL on the base substrate BS.

In some embodiments, a first height of the first part PT1 relative to a surface S of the base substrate BS is greater than a second height of the second part PT2 relative to the surface S of the base substrate BS.

In some embodiments, the signal line SL has an average line width in a range of 0.7 μm to 3.5 μm, e.g., 0.7 μm to 1.0 μm, 1.0 μm to 1.5 μm, 1.5 μm to 2.0 μm, 2.0 μm to 2.5 μm, 2.5 μm to 3.0 μm, or 3.0 μm to 3.5 μm. In one example, the signal line SL has an average line width in a range of 1.0 μm to 2.5 μm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of signal lines and a plurality of second signal lines crossing over each other, defining a plurality of subpixels;

the array substrate comprises:

a base substrate;

a signal line on the base substrate;

a buffer layer on a side of the signal line away from the base substrate;

an active layer on a side of the buffer layer away from the base substrate;

a second signal line on a side of the active layer away from the signal line;

a first passivation layer on a side of the second signal line away from the base substrate;

an planarization layer on a side of the second signal line away from the active layer;

a pixel electrode on a side of the planarization layer away from the base substrate;

a first via extending through at least the buffer layer, and exposing at least a part of the signal line; and a second via extending through at least the first passivation layer, and exposing at least a part of the pixel electrode;

wherein with respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate;

wherein the second signal line includes a main body and a protrusion protruding away from the main body;

the main body extends along an extension direction of the second signal line;

the protrusion protrudes away from the main body along a direction different from the extension direction of the second signal line;

an orthographic projection of the main body on the base substrate spaces apart an orthographic projection of the protrusion on the base substrate from an orthographic projection of the first via on the base substrate; and the orthographic projection of the protrusion on the base substrate spaces apart an orthographic projection of the signal line on the base substrate from an orthographic projection of the second via on the base substrate.

2. The array substrate of claim 1, wherein the signal line comprises a first portion and a second portion;

the first portion is a portion of the signal line in the first via;

the second portion is connected to the first portion;

along an extension direction of the second signal line, the first portion has a first line width, and the second portion has a second line width; and the first line width is greater than the second line width.

3. The array substrate of claim 1, wherein an orthographic projection of the active layer on the base substrate at least partially overlaps with the orthographic projection of the protrusion on the base substrate.

4. The array substrate of claim 1, wherein the active layer comprises a first electrode region, a second electrode region, and a channel region between the first electrode region and the second electrode region; the first electrode region comprising a first electrode, and the second electrode region comprising a second electrode;

wherein the channel region, at least a portion of the first electrode, and at least a portion of the second electrode are parts of a unitary structure; and at least a portion of the first electrode and at least a portion of the second electrode comprise a same material as the channel region, and are subject to a process that make them conductive;

the first electrode extends to the first via to connect to the signal line; and the pixel electrode extends to the second via to connect to the second electrode.

5. The array substrate of claim 4, wherein the channel region, at least a portion of the first electrode, and at least a portion of the second electrode comprise $M1O_aN_b$, wherein M1 is a single metal or a combination of metals, a>0, and b≥0; and at least a portion of the first electrode and at least a portion of the second electrode are subject to a lightly doped drain process.

6. The array substrate of claim 1, further comprising a light shield;

wherein the light shield is in a same layer as the signal line; and an orthographic projection of the light shield on the base substrate at least partially overlaps with the orthographic projection of the second signal line on the base substrate.

7. The array substrate of claim 1, further comprising a light shield;

wherein an orthographic projection of the light shield on the base substrate at least partially overlaps with an orthographic projection of a portion of the second signal line on the base substrate; and along an extension direction of the signal line, at least one of two boundaries of the orthographic projection of the portion of the second signal line on the base substrate is completely between two boundaries of the orthographic projection of the light shield on the base substrate.

8. The array substrate of claim 1, further comprising a light shield;

wherein a minimum distance between the light shield and the signal line is in a range of 1.0 μm to 5.0 μm.

9. The array substrate of claim 1, further comprising a third via extending through at least the planarization layer;

wherein an orthographic projection of the third via on the base substrate partially overlaps with an orthographic projection of the light shield on the base substrate.

10. The array substrate of claim 1, wherein the buffer layer comprises a first part and a second part;

the first part is a side of the first via;

the first part spaces apart the second part from the first via;

an orthographic projection of the first part on the base substrate at least partially overlaps with an orthographic projection of the signal line on the base substrate;

an orthographic projection of the second part on the base substrate is non-overlapping with the orthographic projection of the signal line on the base substrate; and a first height of the first part relative to a surface of the base substrate is greater than a second height of the second part relative to the surface of the base substrate.

11. The array substrate of claim 1, wherein the signal line has an average line width in a range of 0.7 μm to 3.5 μm.

12. A display apparatus, comprising the array substrate of claim 1, and one or more integrated circuits connected to the array substrate.

13. An array substrate, comprising a plurality of signal lines and a plurality of second signal lines crossing over each other, defining a plurality of subpixels;

the array substrate comprises:

a base substrate;

a signal line on the base substrate;

a buffer layer on a side of the signal line away from the base substrate;

an active layer on a side of the buffer layer away from the base substrate;

a second signal line on a side of the active layer away from the signal line;

a first passivation layer on a side of the second signal line away from the base substrate;

an planarization layer on a side of the second signal line away from the active layer;

a pixel electrode on a side of the planarization layer away from the base substrate;

a first via extending through at least the buffer layer, and exposing at least a part of the signal line; and a second via extending through at least the first passivation layer, and exposing at least a part of the pixel electrode:

wherein with respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate;

wherein the active layer comprises a first electrode region, a second electrode region, and a channel region between the first electrode region and the second electrode region;

the first electrode region comprising a first electrode, and the second electrode region comprising a second electrode;

wherein the channel region, at least a portion of the first electrode, and at least a portion of the second electrode are parts of a unitary structure; and at least a portion of the first electrode and at least a portion of the second electrode comprise a same material as the channel region, and are subject to a process that make them conductive;

the first electrode extends to the first via to connect to the signal line; and the pixel electrode extends to the second via to connect to the second electrode;

wherein the first electrode comprises a first electrode part and a second electrode part electrically connected together; and the first electrode part and the second electrode part are made of different materials.

14. The array substrate of claim 13, wherein the first electrode part comprises $M1O_aN_b$, wherein M1 is a single metal or a combination of metals, a>0, and b≥0;

the second electrode part comprises a metallic material; and the first electrode part, at least a portion of the second electrode, and the channel region are parts of the unitary structure.

15. The array substrate of claim 13, wherein the first electrode part at least partially extends into the second electrode part.

16. The array substrate of claim 13, further comprising:

an insulating layer on a side of the active layer away from the base substrate;

a gate electrode on a side of the insulating layer away from the active layer; and a via extending through the insulating layer and the buffer layer, exposing a surface of a portion of the signal line;

wherein the first electrode part is in a same layer as the gate electrode;

the first electrode part extends to the via to connect to the signal line.

17. The array substrate of claim 13, further comprising:

an insulating layer on a side of the active layer away from the base substrate;

a gate electrode on a side of the insulating layer away from the active layer;

an inter-layer dielectric layer on a side of the gate electrode away from the insulating layer; and a via extending through the inter-layer dielectric layer, the insulating layer and the buffer layer, exposing a surface of a portion of the signal line;

wherein the first electrode part is in a layer on a side of the inter-layer dielectric layer away from the insulating layer; and the first electrode part extends to the via to connect to the signal line.

18. An array substrate, comprising a plurality of signal lines and a plurality of second signal lines crossing over each other, defining a plurality of subpixels;

the array substrate comprises:

a base substrate;

a signal line on the base substrate;

a buffer layer on a side of the signal line away from the base substrate;

an active layer on a side of the buffer layer away from the base substrate;

a second signal line on a side of the active layer away from the signal line;

a first passivation layer on a side of the second signal line away from the base substrate;

an planarization layer on a side of the second signal line away from the active layer;

a pixel electrode on a side of the planarization layer away from the base substrate;

a first via extending through at least the buffer layer, and exposing at least a part of the signal line; and a second via extending through at least the first passivation layer, and exposing at least a part of the pixel electrode;

wherein with respective to a same second signal line, a first minimum distance between an orthographic projection of the first via on the base substrate and an orthographic projection of the second signal line on the base substrate is greater than a second minimum distance between an orthographic projection of the second via on the base substrate and the orthographic projection of the second signal line on the base substrate;

wherein the active layer comprises a first electrode region, a second electrode region, and a channel region between the first electrode region and the second electrode region;

the first electrode region comprising a first electrode, and the second electrode region comprising a second electrode;

wherein the channel region, at least a portion of the first electrode, and at least a portion of the second electrode are parts of a unitary structure; and at least a portion of the first electrode and at least a portion of the second electrode comprise a same material as the channel region, and are subject to a process that make them conductive;

the first electrode extends to the first via to connect to the signal line; and the pixel electrode extends to the second via to connect to the second electrode;

wherein the second electrode comprises a third electrode part and a fourth electrode part electrically connected together; and the third electrode part and the fourth electrode part are made of different materials.

19. The array substrate of claim 18, wherein the third electrode part comprises $M1O_aN_b$, wherein M1 is a single metal or a combination of metals, a>0, and b≥0;

the fourth electrode part comprises a metallic material; and at least a portion of the first electrode, the channel region, and the third electrode part, are parts of the unitary structure.

* * * * *